(12) United States Patent
Mauck et al.

(10) Patent No.: US 11,975,546 B2
(45) Date of Patent: *May 7, 2024

(54) GAS ENCLOSURE ASSEMBLY AND SYSTEM

(71) Applicant: Kateeva, Inc., Newark, CA (US)

(72) Inventors: Justin Mauck, Belmont, CA (US); Alexander Sou-Kang Ko, Santa Clara, CA (US); Eliyahu Vronsky, Los Altos, CA (US); Shandon Alderson, San Carlos, CA (US)

(73) Assignee: Kateeva, Inc., Newark, CA (US)

( * ) Notice: Subject to any disclaimer, the term of this patent is extended or adjusted under 35 U.S.C. 154(b) by 236 days.

This patent is subject to a terminal disclaimer.

(21) Appl. No.: 17/302,841

(22) Filed: May 13, 2021

(65) Prior Publication Data
US 2021/0331499 A1   Oct. 28, 2021

Related U.S. Application Data

(63) Continuation of application No. 16/287,577, filed on Feb. 27, 2019, now Pat. No. 11,034,176, which is a
(Continued)

(51) Int. Cl.
*B41J 29/377* (2006.01)
*B41J 2/165* (2006.01)
(Continued)

(52) U.S. Cl.
CPC ........... *B41J 29/13* (2013.01); *B41J 2/16523* (2013.01); *B41J 29/17* (2013.01); *B41J 29/377* (2013.01);
(Continued)

(58) Field of Classification Search
CPC ........... B41J 29/377; B41J 29/17; B41J 29/13
See application file for complete search history.

(56) References Cited

U.S. PATENT DOCUMENTS 3,216,858 A   11/1965   Bogdanowski
3,251,139 A   5/1966   Strimling
(Continued)

FOREIGN PATENT DOCUMENTS

CN   1416365 A   5/2003
CN   1445089 A   10/2003
(Continued)

OTHER PUBLICATIONS

Final Office Action dated Jun. 10, 2014 to U.S. Appl. No. 13/773,649.
(Continued)

*Primary Examiner* — Daniel J Colilla
(74) *Attorney, Agent, or Firm* — Hauptman Ham, LLP

(57) ABSTRACT

The present teachings relate to various embodiments of an hermetically-sealed gas enclosure assembly and system that can be readily transportable and assemblable and provide for maintaining a minimum inert gas volume and maximal access to various devices and apparatuses enclosed therein. Various embodiments of an hermetically-sealed gas enclosure assembly and system of the present teachings can have a gas enclosure assembly constructed in a fashion that minimizes the internal volume of a gas enclosure assembly, and at the same time optimizes the working space to accommodate a variety of footprints of various OLED printing systems. Various embodiments of a gas enclosure assembly so constructed additionally provide ready access to the interior of a gas enclosure assembly from the exterior during processing and readily access to the interior for maintenance, while minimizing downtime.

20 Claims, 56 Drawing Sheets

Related U.S. Application Data continuation of application No. 15/184,755, filed on Jun. 16, 2016, now Pat. No. 10,442,226, which is a continuation of application No. 14/637,301, filed on Mar. 3, 2015, now Pat. No. 9,387,709, which is a continuation of application No. 13/802,304, filed on Mar. 13, 2013, now Pat. No. 9,048,344, which is a continuation-in-part of application No. 13/720,830, filed on Dec. 19, 2012, now Pat. No. 8,899,171, which is a continuation-in-part of application No. 12/652,040, filed on Jan. 5, 2010, now Pat. No. 8,383,202, which is a continuation-in-part of application No. 12/139,391, filed on Jun. 13, 2008, now abandoned.

(60) Provisional application No. 61/764,973, filed on Feb. 14, 2013, provisional application No. 61/732,173, filed on Nov. 30, 2012, provisional application No. 61/579,233, filed on Dec. 22, 2011, provisional application No. 61/142,575, filed on Jan. 5, 2009.

(51) Int. Cl.

| | |
|---|---|
| *B41J 29/13* | (2006.01) |
| *B41J 29/17* | (2006.01) |
| *F24F 3/163* | (2021.01) |
| *H01L 21/67* | (2006.01) |
| *H01L 33/00* | (2010.01) |
| *H10K 71/00* | (2023.01) |
| *H10K 71/13* | (2023.01) |

(52) U.S. Cl.
CPC .......... *F24F 3/163* (2021.01); *H01L 21/6719* (2013.01); *H01L 33/005* (2013.01); *H10K 71/00* (2023.02); *H10K 71/135* (2023.02); *H10K 71/811* (2023.02); *B41J 2/16508* (2013.01); *B41J 2/1652* (2013.01); *B41J 2/16535* (2013.01); *H01L 2924/0002* (2013.01); *Y10T 29/49718* (2015.01)

(56) References Cited

U.S. PATENT DOCUMENTS

| | | |
|---|---|---|
| 3,498,343 A | 3/1970 | Sperberg |
| 3,632,374 A | 1/1972 | Greiller |
| 3,670,466 A | 6/1972 | Lynch |
| 3,885,362 A | 5/1975 | Pollack |
| 4,226,897 A | 10/1980 | Coleman |
| 4,238,807 A | 12/1980 | Bovio et al. |
| 4,409,889 A | 10/1983 | Burleson |
| 4,581,478 A | 4/1986 | Pugh et al. |
| 4,587,002 A | 5/1986 | Bok |
| 4,676,144 A | 6/1987 | Smith |
| 4,693,175 A | 9/1987 | Hashimoto |
| 4,721,121 A | 1/1988 | Adams |
| 4,751,531 A | 6/1988 | Saito et al. |
| 4,788,447 A | 11/1988 | Kiyono et al. |
| 5,016,363 A | 5/1991 | Krieger |
| 5,029,518 A | 7/1991 | Austin |
| 5,041,161 A | 8/1991 | Cooke et al. |
| 5,053,355 A | 10/1991 | Campe |
| 5,065,169 A | 11/1991 | Vincent et al. |
| 5,116,148 A | 5/1992 | Ohara et al. |
| 5,141,918 A | 8/1992 | Hirano |
| 5,155,502 A | 10/1992 | Kimura et al. |
| 5,172,139 A | 12/1992 | Sekiya et al. |
| 5,202,659 A | 4/1993 | DeBonte et al. |
| 5,247,190 A | 9/1993 | Friend et al. |
| 5,314,377 A | 5/1994 | Pelosi |
| 5,344,365 A | 9/1994 | Scott et al. |
| 5,388,944 A | 2/1995 | Takanabe et al. |
| 5,405,710 A | 4/1995 | Dodabalapur et al. |
| 5,562,539 A | 10/1996 | Hashimoto et al. |
| 5,574,485 A | 11/1996 | Anderson et al. |
| 5,623,292 A | 4/1997 | Shrivastava et al. |
| 5,633,133 A | 5/1997 | Long et al. |
| 5,651,625 A | 7/1997 | Smith et al. |
| 5,703,436 A | 12/1997 | Forrest et al. |
| 5,707,745 A | 1/1998 | Forrest et al. |
| 5,731,828 A | 3/1998 | Ishinaga et al. |
| 5,781,210 A | 7/1998 | Hirano et al. |
| 5,788,447 A | 8/1998 | Yonemitsu et al. |
| 5,801,721 A | 9/1998 | Gandy et al. |
| 5,834,893 A | 11/1998 | Bulovic et al. |
| 5,844,363 A | 12/1998 | Gu et al. |
| 5,865,860 A | 2/1999 | Delnick |
| 5,896,154 A | 4/1999 | Mitani et al. |
| 5,947,022 A | 9/1999 | Freeman et al. |
| 5,951,770 A | 9/1999 | Perlov et al. |
| 5,956,051 A | 9/1999 | Davies et al. |
| 6,013,982 A | 1/2000 | Thompson et al. |
| 6,023,899 A | 2/2000 | Mecozzi |
| 6,049,167 A | 4/2000 | Onitsuka et al. |
| 6,065,825 A | 5/2000 | Anagnostopoulos et al. |
| 6,086,195 A | 7/2000 | Bohorquez et al. |
| 6,086,196 A | 7/2000 | Ando et al. |
| 6,086,679 A | 7/2000 | Lee et al. |
| 6,087,196 A | 7/2000 | Sturm et al. |
| 6,089,282 A | 7/2000 | Spiegelman et al. |
| 6,091,195 A | 7/2000 | Forrest et al. |
| 6,095,630 A | 8/2000 | Horii et al. |
| 6,097,147 A | 8/2000 | Baldo et al. |
| 6,189,989 B1 | 2/2001 | Hirabayashi et al. |
| 6,228,171 B1 | 5/2001 | Shirakawa |
| 6,250,747 B1 | 6/2001 | Hauck |
| 6,257,706 B1 | 7/2001 | Ahn |
| 6,294,398 B1 | 9/2001 | Kim et al. |
| 6,303,238 B1 | 10/2001 | Thompson et al. |
| 6,312,083 B1 | 11/2001 | Moore |
| 6,326,224 B1 | 12/2001 | Xu et al. |
| 6,337,102 B1 | 1/2002 | Forrest et al. |
| 6,375,304 B1 | 4/2002 | Aldrich et al. |
| 6,431,702 B2 | 8/2002 | Ruhe |
| 6,437,351 B1 | 8/2002 | Smick et al. |
| 6,444,400 B1 | 9/2002 | Cloots et al. |
| 6,453,810 B1 | 9/2002 | Rossmeisl et al. |
| 6,460,972 B1 | 10/2002 | Trauernicht et al. |
| 6,468,819 B1 | 10/2002 | Kim et al. |
| 6,472,687 B1 | 10/2002 | Wu et al. |
| 6,472,962 B1 | 10/2002 | Guo et al. |
| 6,498,802 B1 | 12/2002 | Chu et al. |
| 6,513,903 B2 | 2/2003 | Sharma et al. |
| 6,548,956 B2 | 4/2003 | Forrest et al. |
| 6,562,405 B2 | 5/2003 | Eser et al. |
| 6,576,134 B1 | 6/2003 | Agner |
| 6,586,763 B2 | 7/2003 | Marks et al. |
| 6,601,936 B2 | 8/2003 | McDonald |
| 6,604,810 B1 | 8/2003 | Silverbrook |
| 6,666,548 B1 | 12/2003 | Sadasivan et al. |
| 6,781,684 B1 | 8/2004 | Ekhoff |
| 6,811,896 B2 | 11/2004 | Aziz et al. |
| 6,824,262 B2 | 11/2004 | Kubota et al. |
| 6,861,800 B2 | 3/2005 | Tyan et al. |
| 6,869,636 B2 | 3/2005 | Chung |
| 6,896,346 B2 | 5/2005 | Trauernicht et al. |
| 6,896,436 B2 | 5/2005 | McDevitt |
| 6,911,671 B2 | 6/2005 | Marcus et al. |
| 6,917,159 B2 | 7/2005 | Tyan et al. |
| 6,939,212 B1 | 9/2005 | Pham |
| 6,982,005 B2 | 1/2006 | Eser et al. |
| 7,023,013 B2 | 4/2006 | Ricks et al. |
| 7,037,810 B2 | 5/2006 | Hayashi |
| 7,077,513 B2 | 7/2006 | Kimura et al. |
| 7,247,394 B2 | 7/2007 | Hatwar et al. |
| 7,258,768 B2 | 8/2007 | Yamazaki |
| 7,326,300 B2 | 2/2008 | Sun et al. |
| 7,374,984 B2 | 5/2008 | Hoffman et al. |
| 7,377,616 B2 | 5/2008 | Sakurai |
| 7,384,662 B2 | 6/2008 | Takano et al. |
| 7,387,662 B2 | 6/2008 | Ahman et al. |
| 7,404,862 B2 | 7/2008 | Shtein et al. |

(56) References Cited

U.S. PATENT DOCUMENTS

| | | |
|---|---|---|
| 7,406,761 B2 | 8/2008 | Jafri et al. |
| 7,410,240 B2 | 8/2008 | Kadomatsu et al. |
| 7,410,251 B2 | 8/2008 | Chung et al. |
| 7,431,435 B2 | 10/2008 | Lopez et al. |
| 7,431,968 B1 | 10/2008 | Shtein et al. |
| 7,517,549 B2 | 4/2009 | Hayashi |
| 7,530,778 B2 | 5/2009 | Yassour et al. |
| 7,603,028 B2 | 10/2009 | Yassour et al. |
| 7,603,439 B2 | 10/2009 | Dilley et al. |
| 7,604,439 B2 | 10/2009 | Yassour et al. |
| 7,635,244 B2 | 12/2009 | Sakiya |
| 7,648,230 B2 | 1/2010 | Kachi |
| 7,677,690 B2 | 3/2010 | Takatsuka |
| 7,802,537 B2 | 9/2010 | Kang |
| 7,857,121 B2 | 12/2010 | Yassour |
| 7,883,832 B2 | 2/2011 | Colburn et al. |
| 7,908,885 B2 | 3/2011 | Devitt |
| 7,989,025 B2 | 8/2011 | Sakai et al. |
| 8,128,753 B2 | 3/2012 | Bulovic et al. |
| 8,383,202 B2 | 2/2013 | Somekh et al. |
| 8,414,688 B1 | 4/2013 | Delgado et al. |
| 8,592,251 B2 | 11/2013 | Hosoba et al. |
| 8,720,366 B2 | 5/2014 | Somekh et al. |
| 8,802,186 B2 | 8/2014 | Somekh et al. |
| 8,802,195 B2 | 8/2014 | Somekh et al. |
| 8,807,071 B2 | 8/2014 | Somekh et al. |
| 8,875,648 B2 | 11/2014 | Somekh et al. |
| 8,899,171 B2 | 12/2014 | Mauck et al. |
| 9,048,344 B2 | 6/2015 | Mauck et al. |
| 9,174,433 B2 | 11/2015 | Somekh et al. |
| 9,248,643 B2 | 2/2016 | Somekh et al. |
| 9,278,564 B2 | 3/2016 | Mauck et al. |
| 9,343,678 B2 | 5/2016 | Ko et al. |
| 9,387,709 B2 | 7/2016 | Mauck et al. |
| 9,550,383 B2 | 1/2017 | Lowrance et al. |
| 9,579,905 B2 | 2/2017 | Ko et al. |
| 9,656,491 B1 | 5/2017 | Lowrance et al. |
| 10,537,911 B2 | 1/2020 | Ko et al. |
| 2001/0041530 A1 | 11/2001 | Hara |
| 2001/0045973 A1 | 11/2001 | Sharma et al. |
| 2002/0008732 A1 | 1/2002 | Moon et al. |
| 2002/0033860 A1 | 3/2002 | Kubota et al. |
| 2002/0053589 A1 | 5/2002 | Owen et al. |
| 2002/0071745 A1 | 6/2002 | Mainberger et al. |
| 2002/0079057 A1 | 6/2002 | Yoshioka et al. |
| 2002/0084464 A1 | 7/2002 | Yamazaki et al. |
| 2002/0113846 A1 | 8/2002 | Wang et al. |
| 2002/0124906 A1 | 9/2002 | Suzuki et al. |
| 2002/0191063 A1 | 12/2002 | Gelbart et al. |
| 2002/0197145 A1 | 12/2002 | Yamamoto et al. |
| 2003/0000476 A1 | 1/2003 | Matsunaga et al. |
| 2003/0040061 A1 | 2/2003 | Baker et al. |
| 2003/0040193 A1 | 2/2003 | Bailey et al. |
| 2003/0097929 A1 | 5/2003 | Watanabe et al. |
| 2003/0175414 A1 | 9/2003 | Hayashi |
| 2003/0196597 A1 | 10/2003 | Yamazaki et al. |
| 2003/0230980 A1 | 12/2003 | Forrest et al. |
| 2004/0021762 A1 | 2/2004 | Seki et al. |
| 2004/0048000 A1 | 3/2004 | Shtein et al. |
| 2004/0048183 A1 | 3/2004 | Teshima |
| 2004/0050325 A1 | 3/2004 | Samoilov et al. |
| 2004/0056244 A1 | 3/2004 | Marcus et al. |
| 2004/0056915 A1 | 3/2004 | Miyazawa |
| 2004/0062856 A1 | 4/2004 | Marcus et al. |
| 2004/0075112 A1 | 4/2004 | Yamazaki et al. |
| 2004/0075385 A1 | 4/2004 | Tao |
| 2004/0086631 A1 | 5/2004 | Han et al. |
| 2004/0115339 A1 | 6/2004 | Ito |
| 2004/0118309 A1 | 6/2004 | Fedor et al. |
| 2004/0123804 A1 | 7/2004 | Yamazaki et al. |
| 2004/0202794 A1 | 10/2004 | Yoshida |
| 2004/0206307 A1 | 10/2004 | Boroson et al. |
| 2004/0254297 A1 | 12/2004 | Hsu et al. |
| 2005/0005850 A1 | 1/2005 | Yamazaki |
| 2005/0040338 A1 | 2/2005 | Weiss et al. |
| 2005/0062773 A1 | 3/2005 | Fouet |
| 2005/0079278 A1 | 4/2005 | Burrows et al. |
| 2005/0104945 A1 | 5/2005 | Chung et al. |
| 2005/0140764 A1 | 6/2005 | Chang et al. |
| 2005/0156956 A1 | 7/2005 | Silverbrook et al. |
| 2005/0190220 A1 | 9/2005 | Lim et al. |
| 2005/0223994 A1 | 10/2005 | Blomiley et al. |
| 2005/0255249 A1 | 11/2005 | Schlatterbeck et al. |
| 2006/0008591 A1 | 1/2006 | Sun et al. |
| 2006/0012290 A1 | 1/2006 | Kang |
| 2006/0045669 A1 | 3/2006 | Namioka et al. |
| 2006/0054774 A1 | 3/2006 | Yassour et al. |
| 2006/0057750 A1 | 3/2006 | Aoki et al. |
| 2006/0096395 A1 | 5/2006 | Weiss et al. |
| 2006/0099328 A1 | 5/2006 | Waite et al. |
| 2006/0100776 A1 | 5/2006 | Weiss et al. |
| 2006/0115585 A1 | 6/2006 | Bulovic et al. |
| 2006/0119669 A1 | 6/2006 | Sharma et al. |
| 2006/0219605 A1 | 10/2006 | Devitt |
| 2006/0236938 A1 | 10/2006 | Powell et al. |
| 2006/0273713 A1 | 12/2006 | Mehta et al. |
| 2007/0004328 A1 | 1/2007 | Balzer |
| 2007/0021050 A1 | 1/2007 | Kennedy |
| 2007/0024686 A1 | 2/2007 | Kadomatsu et al. |
| 2007/0026151 A1 | 2/2007 | Higginson et al. |
| 2007/0040877 A1 | 2/2007 | Kachi |
| 2007/0044713 A1 | 3/2007 | Yasui et al. |
| 2007/0046185 A1 | 3/2007 | Kim |
| 2007/0058010 A1 | 3/2007 | Nagashima |
| 2007/0098891 A1 | 5/2007 | Tyan et al. |
| 2007/0099310 A1 | 5/2007 | Vepa et al. |
| 2007/0134512 A1 | 6/2007 | Klubek et al. |
| 2007/0172292 A1 | 7/2007 | Silverbrook et al. |
| 2007/0195653 A1 | 8/2007 | Yassour et al. |
| 2007/0234952 A1 | 10/2007 | Kojima |
| 2007/0257033 A1 | 11/2007 | Yamada |
| 2007/0286944 A1 | 12/2007 | Yokoyama et al. |
| 2008/0079958 A1* | 4/2008 | Niimi .................. B41J 3/543 358/1.1 |
| 2008/0085652 A1 | 4/2008 | Winters |
| 2008/0145190 A1 | 6/2008 | Yassour et al. |
| 2008/0174235 A1 | 7/2008 | Kim et al. |
| 2008/0206036 A1 | 8/2008 | Smith et al. |
| 2008/0238310 A1 | 10/2008 | Forrest et al. |
| 2008/0241587 A1 | 10/2008 | Ohmi et al. |
| 2008/0259101 A1 | 10/2008 | Kurita et al. |
| 2008/0260938 A1 | 10/2008 | Ikeda et al. |
| 2008/0273072 A1 | 11/2008 | Chung et al. |
| 2008/0299311 A1 | 12/2008 | Shtein et al. |
| 2008/0308037 A1 | 12/2008 | Bulovic et al. |
| 2008/0311289 A1 | 12/2008 | Bulovic et al. |
| 2008/0311296 A1 | 12/2008 | Shtein et al. |
| 2008/0311307 A1 | 12/2008 | Bulovic et al. |
| 2009/0031579 A1 | 2/2009 | Piatt et al. |
| 2009/0045739 A1 | 2/2009 | Kho et al. |
| 2009/0047103 A1 | 2/2009 | Inamasu et al. |
| 2009/0058915 A1 | 3/2009 | Hayashi et al. |
| 2009/0078204 A1 | 3/2009 | Kerr et al. |
| 2009/0081885 A1 | 3/2009 | Levy et al. |
| 2009/0115706 A1 | 5/2009 | Hwang et al. |
| 2009/0167162 A1 | 7/2009 | Lin et al. |
| 2009/0220680 A1 | 9/2009 | Winters |
| 2009/0244510 A1 | 10/2009 | Domanowski |
| 2009/0295857 A1 | 12/2009 | Kikuchi et al. |
| 2009/0324368 A1 | 12/2009 | Koparal et al. |
| 2009/0326703 A1 | 12/2009 | Presley et al. |
| 2010/0055810 A1 | 3/2010 | Sung et al. |
| 2010/0079513 A1 | 4/2010 | Taira et al. |
| 2010/0171780 A1 | 7/2010 | Madigan et al. |
| 2010/0182359 A1 | 7/2010 | Kim et al. |
| 2010/0188457 A1 | 7/2010 | Madigan et al. |
| 2010/0255184 A1 | 10/2010 | Yamazaki et al. |
| 2010/0282271 A1 | 11/2010 | Devitt |
| 2010/0301377 A1 | 12/2010 | Kato et al. |
| 2010/0310424 A1 | 12/2010 | Rose et al. |
| 2011/0008541 A1 | 1/2011 | Madigan et al. |
| 2011/0043554 A1 | 2/2011 | Silverbrook et al. |
| 2011/0057171 A1 | 3/2011 | Adamovich et al. |
| 2011/0096124 A1 | 4/2011 | North et al. |

(56) References Cited

U.S. PATENT DOCUMENTS

| | | |
|---|---|---|
| 2011/0100394 A1 | 5/2011 | Yi et al. |
| 2011/0148985 A1 | 6/2011 | Albertalli et al. |
| 2011/0181644 A1 | 7/2011 | Bulovic et al. |
| 2011/0267390 A1 | 11/2011 | Bulovic et al. |
| 2011/0293818 A1 | 12/2011 | Madigan et al. |
| 2011/0305824 A1 | 12/2011 | Chesterfield et al. |
| 2011/0318503 A1 | 12/2011 | Adams et al. |
| 2012/0056923 A1 | 3/2012 | Vronsky et al. |
| 2012/0080666 A1 | 4/2012 | Hayashi et al. |
| 2012/0089180 A1 | 4/2012 | Fathi et al. |
| 2012/0128890 A1 | 5/2012 | Mirchev |
| 2012/0154473 A1 | 6/2012 | Tennis et al. |
| 2012/0156365 A1 | 6/2012 | Ohara |
| 2012/0201749 A1 | 8/2012 | Crawshaw et al. |
| 2012/0306951 A1 | 12/2012 | Somekh et al. |
| 2012/0326139 A1 | 12/2012 | Chen |
| 2013/0004656 A1 | 1/2013 | Chen et al. |
| 2013/0005076 A1 | 1/2013 | Vronsky |
| 2013/0038649 A1 | 2/2013 | Lowrance et al. |
| 2013/0040061 A1 | 2/2013 | Lowrance et al. |
| 2013/0082263 A1 | 4/2013 | Honda et al. |
| 2013/0096124 A1 | 4/2013 | Nanchen et al. |
| 2013/0164438 A1 | 6/2013 | Somekh et al. |
| 2013/0164439 A1 | 6/2013 | Somekh et al. |
| 2013/0203269 A1 | 8/2013 | Yokouchi |
| 2013/0206058 A1 | 8/2013 | Mauck et al. |
| 2013/0206671 A1 | 8/2013 | Ohira et al. |
| 2013/0209199 A1 | 8/2013 | Maeda et al. |
| 2013/0209669 A1 | 8/2013 | Somekh et al. |
| 2013/0209670 A1 | 8/2013 | Somekh et al. |
| 2013/0209671 A1 | 8/2013 | Somekh et al. |
| 2013/0240844 A1 | 9/2013 | Nakatsuka et al. |
| 2013/0252533 A1 | 9/2013 | Mauck et al. |
| 2013/0258709 A1 | 10/2013 | Thompson et al. |
| 2013/0284354 A1 | 10/2013 | Lee et al. |
| 2013/0293621 A1 | 11/2013 | Tunmore et al. |
| 2013/0307898 A1 | 11/2013 | Somekh et al. |
| 2013/0316182 A1 | 11/2013 | Mori |
| 2014/0134776 A1 | 5/2014 | Furutani |
| 2014/0253616 A1 | 9/2014 | Tremel |
| 2014/0290567 A1 | 10/2014 | Mauck et al. |
| 2014/0311405 A1 | 10/2014 | Mauck et al. |
| 2015/0259756 A1 | 9/2015 | Patterson |
| 2015/0259786 A1 | 9/2015 | Ko et al. |
| 2015/0314325 A1 | 11/2015 | Ko et al. |
| 2016/0207313 A1 | 7/2016 | Somekh et al. |
| 2017/0004983 A1 | 1/2017 | Madigan et al. |
| 2017/0080730 A1 | 3/2017 | Mauck et al. |
| 2017/0130315 A1 | 5/2017 | Somekh et al. |
| 2017/0136793 A1 | 5/2017 | Lowrance et al. |
| 2017/0141310 A1 | 5/2017 | Madigan et al. |
| 2017/0144462 A1 | 5/2017 | Lowrance et al. |
| 2017/0189935 A1 | 7/2017 | Ko et al. |
| 2017/0232462 A1 | 8/2017 | Ko et al. |
| 2017/0239966 A1 | 8/2017 | Mauck et al. |
| 2017/0321911 A1 | 11/2017 | Mauck et al. |
| 2018/0326767 A1 | 11/2018 | Lowrance et al. |
| 2018/0370263 A1 | 12/2018 | Mauck et al. |

FOREIGN PATENT DOCUMENTS

| | | |
|---|---|---|
| CN | 1722918 A | 1/2006 |
| CN | 1956209 A | 5/2007 |
| CN | 101032887 A | 9/2007 |
| CN | 101088141 A | 12/2007 |
| CN | 101119849 A | 2/2008 |
| CN | 101189271 A | 5/2008 |
| CN | 101243543 A | 8/2008 |
| CN | 101357541 A | 2/2009 |
| CN | 201446232 U | 5/2010 |
| CN | 101754861 A | 6/2010 |
| CN | 101794076 A | 8/2010 |
| CN | 101809193 A | 8/2010 |
| CN | 201812332 U | 4/2011 |
| CN | 102271922 A | 12/2011 |
| CN | 102328317 A | 1/2012 |
| CN | 101911281 B | 8/2012 |
| CN | 102983289 A | 3/2013 |
| CN | 105818540 A | 8/2016 |
| CN | 103171286 B | 9/2016 |
| EP | 1626103 B1 | 10/2009 |
| EP | 2315501 A1 | 4/2011 |
| EP | 2973676 A2 | 1/2016 |
| JP | 57135184 | 8/1982 |
| JP | 62098783 | 6/1987 |
| JP | 2005502487 A | 4/1993 |
| JP | 549294 | 6/1993 |
| JP | H09503704 A | 4/1997 |
| JP | H10249237 A | 9/1998 |
| JP | H11312640 A | 11/1999 |
| JP | 2000223548 A | 8/2000 |
| JP | 2001223077 A | 8/2001 |
| JP | 2001326162 A | 11/2001 |
| JP | 2002069650 A | 3/2002 |
| JP | 2002093878 A | 3/2002 |
| JP | 2003173871 A | 6/2003 |
| JP | 2003266007 A | 9/2003 |
| JP | 2003270417 A | 9/2003 |
| JP | 2003272847 A | 9/2003 |
| JP | 2004047452 A | 2/2004 |
| JP | 2004146369 A | 5/2004 |
| JP | 2004164873 A | 6/2004 |
| JP | 2004241751 A | 8/2004 |
| JP | 2004253332 A | 9/2004 |
| JP | 2004291456 A | 10/2004 |
| JP | 2004362854 A | 12/2004 |
| JP | 2004535956 A | 12/2004 |
| JP | 2005074299 A | 3/2005 |
| JP | 2005209631 A | 8/2005 |
| JP | 2005218899 A | 8/2005 |
| JP | 2005254038 A | 9/2005 |
| JP | 2005286069 A | 10/2005 |
| JP | 2006026463 A | 2/2006 |
| JP | 2006511916 A | 4/2006 |
| JP | 2006123551 A | 5/2006 |
| JP | 2006150900 A | 6/2006 |
| JP | 2006159116 | 6/2006 |
| JP | 2007013140 A | 1/2007 |
| JP | 2007076168 A | 3/2007 |
| JP | 2007095343 A | 4/2007 |
| JP | 2007095377 A | 4/2007 |
| JP | 2007122914 A | 5/2007 |
| JP | 2007511890 | 5/2007 |
| JP | 2007175703 A | 7/2007 |
| JP | 2007273093 A | 10/2007 |
| JP | 2007299616 A | 11/2007 |
| JP | 2007299785 A | 11/2007 |
| JP | 2008004919 A | 1/2008 |
| JP | 2008047340 A | 2/2008 |
| JP | 2008511146 A | 4/2008 |
| JP | 2008216401 A | 9/2008 |
| JP | 2009501083 A | 1/2009 |
| JP | 2009112889 A | 5/2009 |
| JP | 2009248918 A | 10/2009 |
| JP | 4423082 B2 | 3/2010 |
| JP | 2010134315 A | 6/2010 |
| JP | 2010533057 A | 10/2010 |
| JP | 2010250198 A | 11/2010 |
| JP | 2010540775 A | 12/2010 |
| JP | 2011065967 A | 3/2011 |
| JP | 2011088101 A | 5/2011 |
| JP | 2011092855 A | 5/2011 |
| JP | 2011129275 A | 6/2011 |
| JP | 2011225355 A | 11/2011 |
| JP | 2011255366 A | 12/2011 |
| JP | 2012074370 A | 4/2012 |
| JP | 4954162 B2 | 6/2012 |
| JP | 2012170846 A | 9/2012 |
| JP | 2012525505 A | 10/2012 |
| JP | 2013508560 A | 3/2013 |
| JP | 2013069701 A | 4/2013 |
| JP | 2013084946 A | 5/2013 |
| JP | 5255630 B2 | 8/2013 |
| JP | 2013175486 A | 9/2013 |

(56) References Cited

FOREIGN PATENT DOCUMENTS

| | | |
|---|---|---|
| JP | 2014026764 A | 2/2014 |
| JP | 2014191337 A | 10/2014 |
| JP | 2014199806 A | 10/2014 |
| JP | 2014221935 A | 11/2014 |
| JP | 2016518675 A | 6/2016 |
| JP | 6122201 B1 | 4/2017 |
| JP | 2020202388 A | 12/2020 |
| KR | 100232852 B1 | 12/1999 |
| KR | 100244041 B1 | 2/2000 |
| KR | 1020010015386 | 2/2001 |
| KR | 20040072383 A | 8/2004 |
| KR | 1020050047313 | 5/2005 |
| KR | 20050092369 A | 9/2005 |
| KR | 1020060031968 A | 4/2006 |
| KR | 20060044265 A | 5/2006 |
| KR | 20060084048 A | 7/2006 |
| KR | 20060088909 A | 8/2006 |
| KR | 20070042272 A | 4/2007 |
| KR | 1020070042272 A | 4/2007 |
| KR | 1020070079834 A | 8/2007 |
| KR | 1020080060111 A | 7/2008 |
| KR | 1020070106472 B1 | 10/2009 |
| KR | 20090126568 A | 12/2009 |
| KR | 20110039133 A | 4/2011 |
| KR | 1020110058008 | 6/2011 |
| KR | 1020120001852 | 1/2012 |
| KR | 20120022197 A | 3/2012 |
| KR | 1020120040070 A | 4/2012 |
| KR | 20120128996 A | 11/2012 |
| KR | 1020130079682 A | 11/2013 |
| TW | 504941 B | 10/2002 |
| TW | 200301665 A | 7/2003 |
| TW | 200302678 A | 8/2003 |
| TW | 200303829 A | 9/2003 |
| TW | 200504798 A | 2/2005 |
| TW | 200504828 A | 2/2005 |
| TW | 200508124 A | 3/2005 |
| TW | I247554 B | 1/2006 |
| TW | 200618308 B | 6/2006 |
| TW | 200714652 A | 4/2007 |
| TW | 200400537 A | 11/2007 |
| TW | 201107432 A | 3/2011 |
| TW | 201208891 A | 3/2012 |
| TW | 201208892 A | 3/2012 |
| TW | 201210844 A | 3/2012 |
| TW | 201210845 A | 3/2012 |
| TW | 201229621 A | 7/2012 |
| TW | 201316593 A | 4/2013 |
| TW | 201322518 A | 6/2013 |
| WO | 2001060623 A1 | 8/2001 |
| WO | 2002041240 A1 | 5/2002 |
| WO | 2004088740 A1 | 10/2004 |
| WO | 2005090085 A2 | 9/2005 |
| WO | 2006021568 A1 | 3/2006 |
| WO | 2006041240 A1 | 4/2006 |
| WO | 2007009000 A3 | 5/2007 |
| WO | 2011118652 A1 | 9/2011 |
| WO | 2012001741 A1 | 1/2012 |
| WO | 2013023099 A1 | 2/2013 |
| WO | 2013120054 A1 | 8/2013 |
| WO | 2014017194 A1 | 1/2014 |
| WO | 2015112454 A1 | 7/2015 |
| WO | 2015168036 A1 | 11/2015 |
| WO | 2017154085 A1 | 9/2017 |

OTHER PUBLICATIONS

Final Office Action dated Jun. 12, 2014 to U.S. Appl. No. 13/773,643.
Final Office Action dated Jun. 18, 2014 to U.S. Appl. No. 13/774,577.
Final Office Action dated Mar. 1, 2018 to U.S. Appl. No. 15/106,907.
Final Office Action dated Mar. 22, 2019 to U.S. Appl. No. 15/446,984.
Final Office Action dated Mar. 3, 2020 for JP Patent Application No. 2018-156034.
Final Office Action dated Mar. 7, 2018 to U.S. Appl. No. 14/543,786.
Final Office Action dated May 14, 2018 to JP Patent Application No. 2016-148189.
Final Office Action dated Nov. 21, 2018 to JP Patent Application No. 2016-090252.
Final Office Action dated Nov. 8, 2013 to U.S. Appl. No. 13/551,209.
Final Office Action dated Oct. 14, 2016 for U.S. Appl. No. 14/205,340.
Final Office Action dated Oct. 25, 2019 to U.S. Appl. No. 15/409,844.
Final Office Action dated Oct. 7, 2016 for U.S. Appl. No. 14/275,637.
Final Office action dated Sep. 17, 2018 to U.S. Appl. No. 15/417,583.
First Examination Report dated Mar. 2, 2017 for EP Patent Application No. 15740186.0.
Forrest, Stephen R., "The Path to Ubiquitous and Low-cost Organic Electronic Appliances on Plastic," Nature, Apr. 29, 2004, vol. 428, 8 pages.
International Preliminary Report on Patentability dated Dec. 17, 2009 for PCT Application No. PCT/US08/066991.
International Search Report and Written Opinion dated Apr. 17, 2015 to PCT Application PCT/US15/11854.
International Search Report and Written Opinion dated Apr. 3, 2015 to PCT Application No. PCT/US14/72263.
International Search Report and Written Opinion dated Aug. 4, 2015 for PCT Application No. PCT/US15/27835.
International Search Report and Written Opinion dated Dec. 22, 2014 for PCT Application No. PCT/US14/023820.
International Search Report and Written Opinion dated Feb. 26, 2013 for PCT Application No. PCT/US12/70717.
International Search Report and Written Opinion dated Mar. 11, 2014 for PCT Application No. PCT/US13/063128.
International Search Report and Written Opinion dated Oct. 8, 2014 for PCT Application No. PCT/US2014/037722.
International Search Report dated Feb. 1, 2017 for PCT Application No. PCT/US16/61932.
J. C. Belmonte, et al. "High-temperature Low-power Performing Micromachined Suspended Micro-hotplate for Gas Sensing Applicationse<" Sensors and Actuators B, 2006, vol. 114, pp. 826-835.
J. Lee, et al. "Cavity Effects on Light Extraction in Organic Light emitting Devices," Applied Physics Letters, Jan. 24, 2008, vol. 92, No. 3, 5 pages.
J. Lee, et al. "Differential Scanning Calorimeter Based on Suspended Membrane Single Crystal Silicon Microhotplate," Journal of Microelectromechanical Systems, Dec. 2008, vol. 17, No. 6, pp. 1513-1525.
Examination Report dated Sep. 15, 2021 for TW Patent Application No. 109109239.
JP Notice of Reason for Refusal dated Jun. 28, 2021 for JP Patent Application No. 2020-144660.
JP Office Action dated Apr. 26, 2017 for JP Patent Application No. 2016-90252.
JP Office Action dated Jun. 1, 2017 to JP Patent Application No. 2016-501353.
KR Notice of First (Non-Final) Refusal dated May 31, 2017 for KR Patent Application No. 10-2016-7015302.
KR Provisional Rejection dated Aug. 28, 2017 to KR Patent Application No. 10-2016-7019863.
Leblanc et al., "Micromachined Printheads for the Evaporative Patterning of Organic Materials and Metals," Journal of Microelectromechanical Systems, Apr. 2007, vol. 16, No. 2, 7 pp. 1-139.
Indermann et al., "Thermal Bubble Jet Printhead with Integrated Nozzle Plate," NIP20: International Conference on Digital Printing Technologies, Oct. 2004, pp. 834-839.
MBRAUN HP Stack.
Non-Final Office Action dated Apr. 12, 2018 to U.S. Appl. No. 15/417,583.
Non-Final Office Action dated Apr. 15, 2015 to U.S. Appl. No. 13/776,602.
Non-Final Office Action dated Apr. 17, 2015 to U.S. Appl. No. 13/774,693.
Non-Final Office Action dated Apr. 24, 2013 to U.S. Appl. No. 13/551,209.
Non-Final Office Action dated Apr. 27, 2016 to U.S. Appl. No. 14/543,786.

(56) References Cited

OTHER PUBLICATIONS

Non-Final Office Action dated Apr. 28, 2014 to U.S. Appl. No. 13/720,830.
Non-Final Office Action dated Apr. 4, 2016 to U.S. Appl. No. 14/205,340.
Non-Final Office Action dated Aug. 3, 3015 to U.S. Appl. No. 14/727,602.
Non-Final Office Action dated Aug. 31, 2017 for U.S. Appl. No. 15/351,424.
Non-Final Office Action dated Aug. 9, 2017 for U.S. Appl. No. 15/106,907.
Non-Final Office Action dated Aug. 9, 2019 for U.S. Appl. No. 14/543,786.
Non-Final Office Action dated Dec. 15, 2017 to U.S. Appl. No. 15/421,190.
KR Office Action dated Jul. 1, 2022 for Application No. 10-2022-7013035.
Non-final Office Action dated Apr. 5, 2022 for JP Patent Application No. 2020-144660.
Non-Final-Office Action dated Aug. 19, 2022 for JP Patent Application No. JP2021-143917.
Notice of Allowance dated Jun. 9, 2022 for U.S. Appl. No. 16/574,334.
Notice of Submission of Opinion dated Mar. 28, 2022 in KR Patent Application No. 10-2021-7041315.
CN Office Action dated Sep. 26, 2022 for CN Patent Application No. 202010333896.0.
Non-final Office Action dated Aug. 8, 2022 for JP Patent Application No. 2021-143917.
Non-final Office Action dated Oct. 5, 2022 for U.S. Appl. No. 17/247,591.
Office Action dated Dec. 16, 2021 for KR Patent Application No. 10-2021-7030501.
Office Action dated Dec. 10, 2021 for KR Patent Application No. 10-2021-7036621.
Supplemental Notice of Allowability dated Feb. 28, 2019 to U.S. Appl. No. 15/184,755.
Supplemental Notice of Allowability dated Jun. 7, 2017 for U.S. Appl. No. 14/543,786.
Non-Final Office Action dated Dec. 3, 2018 to U.S. Appl. No. 15/417,583.
Non-Final Office Action dated Dec. 31, 2013 for U.S. Appl. No. 13/774,577.
Non-Final Office Action dated Feb. 17, 2017 for U.S. Appl. No. 15/409,844.
Non-Final Office Action dated Feb. 28, 2014 to U.S. Appl. No. 13/773,649.
Non-Final Office Action dated Jan. 17, 2017 for U.S. Appl. No. 14/996,086.
Non-Final Office action dated Jan. 26, 2018 to U.S. Appl. No. 15/184,755.
Non-Final Office Action dated Jan. 7, 2014 to U.S. Appl. No. 13/773,643.
Non-Final Office Action dated Jul. 1, 2014 for U.S. Appl. No. 13/773,654.
Non-Final Office Action dated Jun. 14, 2012 to U.S. Appl. No. 12/652,040.
Non-Final Office Action dated Jun. 20, 2013 to U.S. Appl. No. 13/551,209.
Non-Final Office Action dated Jun. 29, 2018 to U.S. Appl. No. 15/605,806.
Non-Final Office Action dated Mar. 10, 2016 to U.S. Appl. No. 14/275,637.
Non-Final Office Action dated Mar. 22, 2019 to U.S. Appl. No. 15/421,190.
Non-Final Office Action dated Mar. 24, 2021 for U.S. Appl. No. 16/553,909.
Non-Final Office Action dated Mar. 28, 2019 to U.S. Appl. No. 16/102,392.
Non-Final Office Action dated May 16, 2014 to U.S. Appl. No. 13/802,304.
Non-Final Office Action dated May 23, 2019 for U.S. Appl. No. 15/409,844.
Non-Final Office Action dated Nov. 20, 2015 for U.S. Appl. No. 14/637,301.
Non-Final Office Action dated Nov. 4, 2016 for U.S. Appl. No. 14/543,786.
Non-Final Office Action dated Oct. 17, 2018 to U.S. Appl. No. 15/446,984.
Non-Final Office Action dated Oct. 3, 2019 to U.S. Appl. No. 16/362,595.
Non-Final Office Action dated Oct. 5, 2017 to U.S. Appl. No. 15/594,856.
Non-Final Office Action dated Oct. 8, 2014 to U.S. Appl. No. 13/571,166.
Non-Final Office Action dated Sep. 18, 2017 to U.S. Appl. No. 14/543,786.
Non-Final Office action dated Sep. 28, 2018 to U.S. Appl. No. 15/106,907.
Notice of Allowance dated Apr. 26, 2021 for U.S. Appl. No. 16/421,834.
Notice of Allowance dated Aug. 5, 2019 to U.S. Appl. No. 15/446,984.
Notice of Allowance dated Dec. 14, 2016 for U.S. Appl. No. 14/697,370.
Notice of Allowance dated Dec. 16, 2015 to U.S. Appl. No. 14/727,602.
Notice of Allowance dated Dec. 7, 2012 to U.S. Appl. No. 12/652,040.
Notice of Allowance dated Dec. 9, 2014 for U.S. Appl. No. 13/802,304.
Notice of Allowance dated Feb. 20, 2014 for U.S. Appl. No. 13/551,209.
Notice of Allowance dated Jan. 15, 2020 to U.S. Appl. No. 15/409,844.
Notice of Allowance dated Jan. 24, 2019 to U.S. Appl. No. 14/275,637.
Notice of Allowance dated Jan. 31, 2017 for U.S. Appl. No. 14/205,340.
Notice of Allowance dated Jan. 6, 2020 to U.S. Appl. No. 14/543,786.
Notice of Allowance dated Jul. 1, 2014 to U.S. Appl. No. 13/773,649.
Notice of Allowance dated Jul. 10, 2019 for U.S. Appl. No. 15/106,907.
Notice of Allowance dated Jul. 14, 2017 to U.S. Appl. No. 15/385,803.
Notice of Allowance dated Jul. 17, 2015 for U.S. Appl. No. 13/570,154.
Notice of Allowance dated Jul. 2, 2014 to U.S. Appl. No. 13/774,577.
Notice of Allowance dated Jul. 2, 2018 for U.S. Appl. No. 15/351,424.
Notice of Allowance dated Jun. 24, 2019 for U.S. Appl. No. 15/184,755.
Notice of Allowance dated Jun. 30, 2014 to U.S. Appl. No. 13/773,643.
Notice of Allowance dated Mar. 29, 2017 to U.S. Appl. No. 15/423,169.
Notice of Allowance dated Mar. 7, 2019 to U.S. Appl. No. 15/605,806.
Notice of Allowance dated Mar. 8, 2019 to U.S. Appl. No. 14/275,637.
Notice of Allowance dated Mar. 9, 2018 to U.S. Appl. No. 15/594,856.
Notice of Allowance dated May 16, 2016 to U.S. Appl. No. 14/637,301.
Provisional Rejection dated Apr. 4, 2019 to KR Patent Application No. 10-2019-7008155.
Provisional Rejection dated Dec. 10, 2018 to KR Patent Application No. 10-2017-7031818.
Provisional Rejection dated Feb. 25, 2019 for KR Patent Application No. 20187027231.
Provisional Rejection dated Jan. 18, 2018 to KR Patent Application No. 10-2017-7018732.
Provisional Rejection dated Jan. 7, 2020 to KR Patent Application No. 10-2019-7037354.
Provisional Rejection dated Jul. 18, 2018 to KR Patent Application No. 10-2018-7019221.
Provisional Rejection dated Jul. 6, 2018 to KR Patent Application No. 10-2016-7000033.
Provisional Rejection dated Nov. 14, 2018 to KR Patent Application No. 10-2018-7019537.
Provisional Rejection dated Oct. 14, 2016 for KR Patent Application No. 10-2016-7015302.

(56) References Cited

OTHER PUBLICATIONS

Provisional Rejection dated Oct. 17, 2017 to KR Patent Application No. 10-2015-7027963.
Rejection Decision dated Jul. 25, 2018 to TW Patent Application No. 103117122.
S.H. Kim et al. "Fabrication and Characterization of co-planar type MEMS Structures on SiO2/sl3n4 Membrane for Gas Sensrors with Dispensing Method Guided by Micromachined Wells," Journal of Electroceramicx, 2006, vol. 17, No. 2-4, pp. 995-998.
Second Office Action dated Sep. 27, 2017 for CN Patent Application No. 201610181336.1.
Second Office Action dated Aug. 14, 2018 to CN Patent Application No. 201710368338.6.
Second Office Action dated Feb. 6, 2018 to CN Patent Application No. 201480071004.7.
Second Office Action dated Jan. 31, 2019 to JP Patent Application No. 2017-114390.
Second Office Action dated Jul. 2, 2019 to CN Patent Application No. 201710914561.6.
Second Office Action dated Jul. 31, 2017 for CN Patent Application No. 20140027671.5.
Second Office Action dated Jun. 26, 2018 for CN Patent Application No. 201710427402.3.
Second Office Action dated Mar. 2, 2017 to CN Patent Application No. 201380052559.2.
Second Office Action dated Mar. 5, 2019 to CN Patent Application No. 201580023550.8.
Second Office Action dated Oct. 8, 2015 to CN Patent Application No. 201210596572.
Street et al., "Jet Printing of Active-Matrix TFT Backplanes for Displays and Sensors", IS&T Archiving, Dec. 2005, vol. 20, No. 5, 16 pages.
Supplemental Search Report dated Nov. 7, 2016 for EP Patent Application No. 15740186.0.
TW Examination Report and Search Report dated Mar. 13, 2017 for TW Patent Application No. 105144240.
TW Examination Report dated Jun. 6, 2017 for TW Patent Application No. 104113869.
Notice of Allowance dated Oct. 5, 2021 for U.S. Appl. No. 16/949,412.
Chen et al., "Ambient Environment Patterning of Organic Thin Films by a Second Generation Molecular Jet (MoJet) Printer," Progress Report 2006-2007, Oct. 2007, pp. 26-6; 26-7.
Chen et al., "Evaporative Deposition of Molecular Organics in Ambient with a Molecular Jet Printer," Digital Fabrication, Sep. 2006, pp. 63-65.
Chen, Jianglong, "Novel Patterning Techniques for Manufacturing Organic and Nanostructured Electronics," M.S. Materials Science and Engineering, Massachusetts Institute of Technology, 2003, pp. 1-206.
Chen, Jingkuang et al., "A High-Resolution Silicon Monolithic Nozzle Array for Inkjet Printing," IEEE Transactions on Electron Devices, vol. 44, No. 9, Sep. 1997, pp. 1401-1409.
Chin, Byung Doo, "Effective Hole Transport Layer Structure for Top Emitting Devices Based on Laser Transfer Patterning," Journal of Physics D: Applied Physics, 2007, vol. 40, pp. 5541-5546.
CN First Office Action dated Apr. 5, 2017 for CN Patent Application No. 80071004.7.
CN Office Action dated Dec. 17, 2010 for CN Patent Application No. 200880020151.6.
CN Office Action dated Jan. 12, 2011 for CN Patent Application No. 200880019902.6.
CN Office Action dated Jan. 23, 2017 for CN Patent Application No. 201480027671.5.
CN Second Office Action dated Apr. 6, 2017 for CN Patent Application 201580002316.7.
CN Second Office Action dated Oct. 8, 2019 for CN Patent Application No. 201810257998.1.
Corrected Notice of Allowability dated Oct. 23, 2018 to U.S. Appl. No. 14/996,086.
Corrected Notice of Allowability dated Oct. 31, 2014 for U.S. Appl. No. 13/720,830.
Decision on Rejection dated Aug. 13, 2018 CN Patent Application No. 201480071004.7.
Elwenspoek et al., "Silicon Micromachining," Aug. 2004, Cambridge University, Cambridge, U.K. ISBN 0521607671. [Abstract].
EP Examination Report dated Jul. 13, 2010 for EP Patent Application No. 08771068.7.
EP Examination Report dated Jul. 13, 2010 for EP Patent Application No. 08771084.4.
EP Examination Report dated Jul. 13, 2010 for EP Patent Application No. 08771094.3.
EP Extended Search Report dated Aug. 24, 2021 for EP Patent Application No. 21167787.7.
EP Extended Search Report dated May 4, 2017 for EP Patent Application No. 14873900.6.
EP Search Report dated Mar. 25, 2019 to EP Patent Application No. 18201256.7.
European Search Report dated Apr. 17, 2019 for EP Patent Application No. 19162637.3.
Examination Report dated Apr. 19, 2017 for TW Patent Application No. 103108995.
Examination Report dated Apr. 26, 2016 to TW Patent Application No. 101148932.
Examination Report dated Aug. 13, 2015 for CN Patent Application No. 201310704315.X.
Examination Report dated Mar. 22, 2018 to TW Patent Application No. 103117122.
Examination Report dated Mar. 23, 2018 to TW Patent Application No. 106120173.
Examination Report dated Mar. 27, 2019 for TW Patent Application No. 107102956.
Examination Report dated May 2, 2019 for TW Patent Application No. 107116642.
Examination Report dated May 20, 2019 for EP Patent Application No. 14810543.0.
Extended European Search Report dated Apr. 12, 2017 for EP Patent Application No. 14810543.0.
Extended European Search Report dated Jul. 1, 2016 for EP Patent Application No. 13585304.2.
Extended European Search Report dated Jun. 19, 2017 for EP Patent Application No. 14779907.6.
Extended EuropeanSearch Report dated Dec. 15, 2017 to EP Patent Application No. 15786568.4.
Final Office Action dated Aug. 5, 2019 to U.S. Appl. No. 16/102,392.
Final Office Action dated Jan. 7, 2020 to U.S. Appl. No. 16/362,595.
Final Office Action dated Jul. 28, 2017 for U.S. Appl. No. 14/996,086.
Final Office Action dated Jul. 3, 2018 to U.S. Appl. No. 15/421,190.
Final Office Action dated Jul. 9, 2019 to U.S. Appl. No. 14/996,086.
Notice of Allowance dated Nov. 19, 2015 to U.S. Appl. No. 13/776,602.
Notice of Allowance dated Oct. 23, 2019 to U.S. Appl. No. 16/102,392.
Notice of Allowance dated Oct. 4, 2019 to U.S. Appl. No. 15/417,583.
Notice of Allowance dated Oct. 6, 2014 for U.S. Appl. No. 13/720,830.
Notice of Allowance dated Sep. 29, 2014 to U.S. Appl. No. 13/773,654.
Notice of Allowance dated Sep. 29, 2020 for U.S. Appl. No. 16/362,595.
Notice of Allowance dated Sep. 9, 2015 to U.S. Appl. No. 13/774,693.
Notice of Final Rejection dated Jul. 29, 2021 to KR Patent Application No. 10-2020-7032729.
Notice of Final Rejection dated Mar. 23, 2021 in KR Patent Application No. 10-2019-7026574.
Notice of First Refusal dated Jul. 19, 2019 for KR Patent Application No. 10-2017-7031818.
Notice of Reason for Refusal dated Oct. 1, 2021 for JP Patent Application No. 2020-181803.
Notice of Reason of Refusal dated Feb. 22, 2021 for JP Patent Application No. 2020-070776.
Notice of Reason of Refusal dated Feb. 22, 2021 to JP Patent Application No. 2020-88797.

(56) References Cited

OTHER PUBLICATIONS

Notice of Reasons for Refusal dated Aug. 1, 2021 in KR Patent Application No. 10-2021-7018547.
Notice of Reasons for Refusal dated Feb. 22, 2021 in JP Patent Application No. 2020-088797.
Notification of First Refusal dated Oct. 23, 2018 to KR Patent Application No. 10-2017-7018730.
Notification of First Refusal dated Oct. 23, 2018 to KR Patent Application No. 10-2017-7018732.
Notification of Provisional Rejection dated Aug. 22, 2016 to KR Patent Application No. 10-2015-7003107.
Notification of Provisional Rejection dated May 25, 2017 for KR Patent Application No. 10-2014-7020478.
Notification of Reason for Refusal dated Dec. 14, 2020 in KR Patent Application No. 10-2020-7027327.
Office Action dated Apr. 23, 2019 for JP Patent Application No. 2018-140175.
Office Action dated Aug. 3, 2017 for JP Patent Application No. 2016-148189.
Office Action dated Dec. 18, 2019 for CN Patent Application No. 201811010130.8.
Office Action dated Dec. 24, 2019 for JP Patent Application No. 2018-140175.
Office Action dated Feb. 13, 2018 to CN Patent Application No. 201710368338.6.
Office Action dated Feb. 2, 2018 to JP Patent Application No. 2016-519508.
Office Action dated Feb. 28, 2019 to CN Patent Application No. 201810257998.1.
Office Action dated Jan. 28, 2016 to JP Patent Application No. 2015-526775.
Office Action dated Jul. 16, 2019 to JP Patent Application No. 2018-115532.
Office Action dated Jun. 22, 2016 to CN Patent Application No. 201480045349.5.
Office Action dated Jun. 23, 2016 to CN Patent Application No. 201380052559.2.
Office Action dated Jun. 26, 2018 for CN Patent Application No. 201710427402.3.
Office Action dated Jun. 28, 2019 to JP Patent Application No. 2018-156034.
Office Action dated Jun. 28, 2020 to CN Patent Application No. 201710914561.6.
Office Action dated Mar. 2, 2018 to JP Patent Application No. 2016-563454.
Office Action dated Mar. 25, 2015 to CN Patent Application No. 201210596572.
Office Action dated May 7, 2019 for JP Patent Application No. 2018-142544.
Office Action dated Nov. 28, 2018 to CN Patent Application No. 201710914561.6.
Office Action dated Sep. 3, 2018 to CN Patent Application No. 201580023550.8.
Office Action dated Sep. 3, 2018 to CN Patent Application No. 201710428301.8.
Official Action dated Aug. 29, 2017 for Japanese Patent Application No. 2016-537494.
Official Action dated Jul. 28, 2016 for Japanese Patent Application No. 2014-548852.
Official Action dated Jul. 30, 2019 to Japanese Patent Application No. 2018-107016.
Official Letter issued Jul. 17, 2018 to TW Patent Application No. 106120173.
Official Letter issued Sep. 28, 2018 to TW Application No. 106111554.
Penultimate Office Action dated Aug. 29, 2019 to JP Patent Application No. 2017-114390.
Penultimate Office Action dated Mar. 22, 2018 to JP Patent Application No. 2016-90252.
Provisional Rejection dated Apr. 18, 2018 for KR Patent Application No. 10-2016-7033463.
Final Office Action dated Apr. 14, 2022 for U.S. Appl. No. 17/247,591.
JP Non-final Office Action dated Apr. 5, 2022 for Application No. 2020-144660.
Non-final Office Action dated Mar. 28, 2022 for U.S. Appl. No. 16/574,334.
Notification of Reason for Refusal dated Feb. 22, 2022 in KR Patent Application No. 10-2021-7018547.
Notification of Reason for Refusal dated Feb. 22, 2022 for KR Patent Application No. 10-2021-7018547.
Notification of Reason for Refusal dated Mar. 28, 2022 in KR Patent Application No. 10-2021-7041315.
CN First Office Action dated Dec. 2, 2022 for CN Patent Application No. 201910510788.3.
Examination Report dated Nov. 18, 2022 for TW Patent Application No. 110120648.
Final Office Action dated Dec. 19, 2022 for JP Patent Application No. 2021-143917.
Final Office Action dated Nov. 18, 2022 for JP Patent Application No. 2020-144660.
KR Decision of Rejection dated Feb. 17, 2023 for Application No. 10-2021-7041315.
KR Office Action dated Nov. 17, 2022 for KR Patent Application No. 10-2022-7029657.
Non-Final Office Action dated Dec. 5, 2022 in JP Patent Application No. 2022-008873.

\* cited by examiner

| Valve Positions for Various Modes of Operation | | | | | |
|---|---|---|---|---|---|
| | Panel Solenoid Valves | | | | Comp. Valve |
| MODE | Valve 2502 | Valve 2504 | Valve 2506 | Valve 2508 | Valve 2530 |
| Process | Closed | Open | Closed | Open | Open |
| Maintenance / Recovery | Open | Closed | Open | Closed | Closed |
| Purge | Open | Open | Closed | Open | Closed |
| No Flow | Closed | Closed | Closed | Closed | Closed |
| Leak Test | Closed | Closed | Open | Closed | Open |

FIG. 40

GAS ENCLOSURE ASSEMBLY AND SYSTEM

CROSS-REFERENCE TO RELATED APPLICATIONS

This application is a continuation of U.S. patent application Ser. No. 16/287,577, filed on Feb. 27, 2019, which is a continuation of U.S. patent application Ser. No. 15/184,755, filed on Jun. 16, 2016, now U.S. Pat. No. 10,442,226, issued on Oct. 15, 2019, which is a continuation of U.S. patent application Ser. No. 14/637,301, filed on Mar. 3, 2015, now U.S. Pat. No. 9,387,709, issued on Jul. 12, 2016, which is a continuation of U.S. patent application Ser. No. 13/802,304, filed on Mar. 13, 2013, now U.S. Pat. No. 9,048,344, issued on Jun. 2, 2015, which claims priority from U.S. Provisional Application No. 61/764,973, filed on Feb. 14, 2013. U.S. patent application Ser. No. 13/802,304 is a continuation-in-part of U.S. patent application Ser. No. 13/720,830, filed on Dec. 12, 2019, now U.S. Pat. No. 8,899,171, issued on Dec. 2, 2014, which claims priority from U.S. Provisional Application No. 61/279,233, filed on Dec. 22, 2011 and U.S. Provisional Application No. 61/732,173, filed on Nov. 30, 2012. U.S. patent application Ser. No. 13/720,830 is a continuation-in-part of U.S. patent application Ser. No. 12/652,040, filed on Jan. 5, 2010, now U.S. Pat. No. 8,383,202, issued on Feb. 26, 2013, which claims priority from U.S. Provisional Application No. 61/142,575, filed on Jan. 5, 2009. U.S. patent application Ser. No. 12/652,040 is also a continuation-in-part to U.S. application Ser. No. 12/139,391, filed on Jun. 13, 2008. All cross-referenced applications listed herein are incorporated by reference in their entirety.

FIELD

The present teachings relate to various embodiments of an hermetically-sealed gas enclosure assembly and system that can be readily transportable and assemblable and provide for maintaining a minimum inert gas volume and maximal access to various devices and apparatuses enclosed therein.

BACKGROUND

Interest in the potential of OLED display technology has been driven by OLED display technology attributes that include demonstration of display panels that have highly saturated colors, are high-contrast, ultrathin, fast-responding, and energy efficient. Additionally, a variety of substrate materials, including flexible polymeric materials, can be used in the fabrication of OLED display technology. Though the demonstration of displays for small screen applications; primarily for cell phones, has served to emphasize the potential of the technology, challenges remain in scaling the fabrication to larger formats. For example, fabrication of OLED displays on substrates larger than Gen 5.5 substrates, which have dimensions of about 130 cm×150 cm, have yet to be demonstrated.

An organic light-emitting diode (OLED) device may be manufactured by the printing of various organic thin films, as well as other materials on a substrate using an OLED printing system. Such organic materials can be susceptible to damage by oxidation and other chemical processes. Housing an OLED printing system in a fashion that can be scaled for various substrate sizes and can be done in an inert, substantially particle-free printing environment can present a variety of challenges. As the equipment for printing large-format panel substrate printing requires substantial space, maintaining a large facility under an inert atmosphere continuously requiring gas purification to remove reactive atmospheric species, such as water vapor and oxygen, as well as organic solvent vapors presents significant engineering challenges. For example, providing a large facility that is hermetically sealed can present engineering challenges. Additionally, various cabling, wiring and tubing feeding into and out of an OLED printing system for operating the printing system can present challenges for effectively bringing a gas enclosure into specification with respect to levels of atmospheric constituents, such as oxygen and water vapor, as they can create significant dead volume in which such reactive species can be occluded. Further, it is desirable for such a facility kept in an inert environment for processing to provide ready access for maintenance with minimum downtime. In addition to being substantially free of reactive species, a printing environment for OLED devices requires a substantially low particle environment. In that regard, providing and maintaining a substantially particle-free environment in an entire enclosed system provides additional challenges not presented by particle reduction for processes that can be done in atmospheric conditions, such as under open air, high flow laminar flow filtration hoods.

Accordingly, there exists a need for various embodiments of a gas enclosure that can house an OLED printing system, in an inert, substantially particle-free environment, and that can be readily scaled to provide for fabrication of OLED panels on a variety of substrates sizes and substrate materials, while also providing for ready access to an OLED printing system from the exterior during processing and ready access to the interior for maintenance with minimal downtime.

BRIEF DESCRIPTION OF THE DRAWINGS

A better understanding of the features and advantages of the present disclosure will be obtained by reference to the accompanying drawings, which are intended to illustrate, not limit, the present teachings.

FIG. 6A is a rear perspective view of a gloveport cap, while

FIG. 7A is an expanded perspective view of a bayonet latch of a gloveport capping assembly, while

FIG. 18A is a schematic representation showing bundles of cables, wires, and tubings, and the like.

FIG. 40 is a table showing valve positions for various modes of operation of a gas enclosure assembly and system that can utilize an external gas loop in accordance with various embodiments of the present teachings.

DETAILED DESCRIPTION OF THE DISCLOSURE

Figure 1:
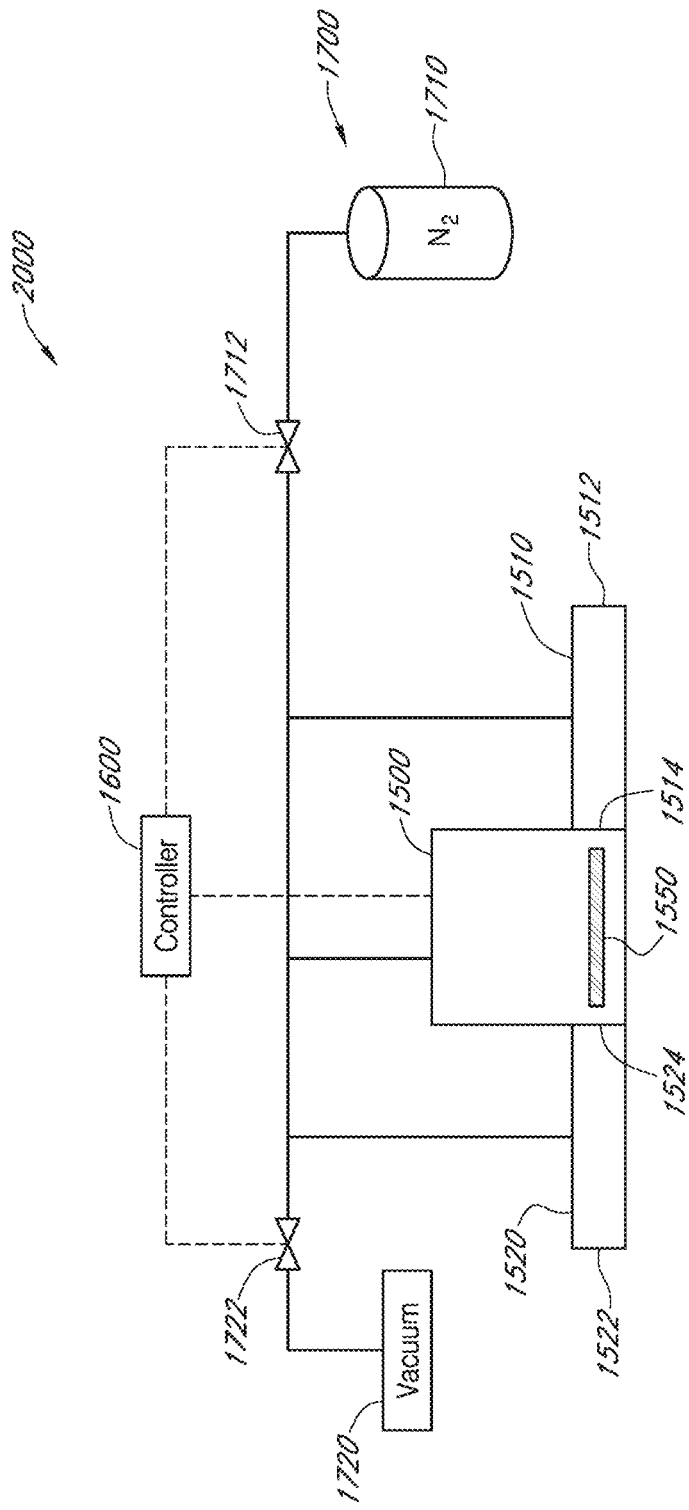
FIG. 1 is a schematic of a gas enclosure assembly and system in accordance with various embodiments of the present teachings.

The present teachings disclose various embodiments of a gas enclosure assembly that can be sealably constructed and integrated with gas circulation, filtration and purification components to form a gas enclosure assembly and system that can sustain an inert, substantially particle-free environment for processes requiring such an environment. Such embodiments of a gas enclosure assembly and system can maintain levels for each species of various reactive species, including various reactive atmospheric gases, such as water vapor and oxygen, as well as organic solvent vapors at 100 ppm or lower, for example, at 10 ppm or lower, at 1.0 ppm or lower, or at 0.1 ppm or lower. Further, various embodiments of a gas enclosure assembly can provide a low particle environment meeting ISO 14644 Class 3 and Class 4 clean room standards.

One of ordinary skill in a variety of arts may recognize the utility of embodiments of a gas enclosure assembly to a variety of technology areas. While vastly different arts such as chemistry, biotechnology, high technology and pharmaceutical arts may benefit from the present teachings, OLED printing is used to exemplify the utility of various embodiments of a gas enclosure assembly and system according to the present teachings. Various embodiments of a gas enclosure assembly system that may house an OLED printing system can provide features such as, but not limited by, sealing providing an hermetic-sealed enclosure through cycles of construction and deconstruction, minimization of enclosure volume, and ready access from the exterior to the interior during processing, as well as during maintenance. As will be discussed subsequently, such features of various embodiments of a gas enclosure assembly may have an impact on functionality, such as, but not limited by, structural integrity providing ease of maintaining low levels of reactive species during processing, as well as rapid enclosure-volume turnover minimizing downtime during maintenance cycles. As such, various features and specifications providing utility for OLED panel printing may also provide benefit to a variety of technology areas.

As previously mentioned, fabrication of OLED displays on substrates larger than Gen 5.5 substrates, which have dimensions of about 130 cm×150 cm, have yet to be demonstrated. Generations of mother glass substrate sizes have been undergoing evolution for flat panel displays fabricated by other-than OLED printing since about the early 1990's. The first generation of mother glass substrates, designated as Gen 1, is approximately 30 cm×40 cm, and therefore could produce a 15" panel. Around the mid-1990's, the existing technology for producing flat panel displays had evolved to a mother glass substrate size of Gen 3.5, which has dimensions of about 60 cm×72 cm.

As generations have advanced, mother glass sizes for Gen 7.5 and Gen 8.5 are in production for other-than OLED printing fabrication processes. A Gen 7.5 mother glass has dimensions of about 195 cm×225 cm, and can be cut into eight 42" or six 47" flat panels per substrate. The mother glass used in Gen 8.5 is approximately 220×250 cm, and can be cut to six 55" or eight 46" flat panels per substrate. The promise of OLED flat panel display for qualities such as truer color, higher contrast, thinness, flexibility, transparency, and energy efficiency have been realized, at the same time that OLED manufacturing is practically limited to G 3.5 and smaller. Currently, OLED printing is believed to be the optimal manufacturing technology to break this limitation and enable OLED panel manufacturing for not only mother glass sizes of Gen 3.5 and smaller, but at the largest mother glass sizes, such as Gen 5.5, Gen 7.5, and Gen 8.5. One of ordinary skill in the art will appreciate that one of the features of OLED panel printing includes that a variety of substrate materials can be used, for example, but not limited by, a variety of glass substrate materials, as well as a variety of polymeric substrate materials. In that regard, sizes recited from the terminology arising from the use of glass-based substrates can be applied to substrates of any material suitable for use in OLED printing.

With respect to OLED printing, according to the present teachings, maintaining substantially low levels of reactive species, for example, but not limited by, atmospheric constituents such as oxygen and water vapor, as well as various organic solvent vapors used in OLED inks, has been found to correlate to providing OLED flat panel displays meeting the requisite lifetime specifications. The lifetime specification is of particular significance for OLED panel technology, as this correlates directly to display product longevity; a product specification for all panel technologies, which is currently challenging for OLED panel technology to meet. In order to provide panels meeting requisite lifetime specifications, levels of each of a reactive species, such as water vapor, oxygen, as well as organic solvent vapors, can be maintained at 100 ppm or lower, for example, at 10 ppm or lower, at 1.0 ppm or lower, or at 0.1 ppm or lower with various embodiments of a gas enclosure assembly system of the present teachings. Additionally, OLED printing requires a substantially particle-free environment. Maintaining a substantially particle-free environment for OLED printing is of particular importance, as even very small particles can lead to a visible defect on an OLED panel. Currently, it is a challenge for OLED displays to meet the required low defect levels for commercialization. Maintaining a substantially particle-free environment in an entire enclosed system provides additional challenges not presented by particle reduction for processes that can be done in atmospheric conditions, such as under open air, high flow laminar flow filtration hoods. As such, maintaining the requisite specifications for an inert, particle-free environment in a large facility can present a variety of challenges.

The need for printing an OLED panel in a facility in which the levels of each of a reactive species, such as water vapor, oxygen, as well as organic solvent vapors, can be maintained at 100 ppm or lower, for example, at 10 ppm or lower, at 1.0 ppm or lower, or at 0.1 ppm or lower, can be illustrated in reviewing the information summarized in Table 1. The data summarized on Table 1 resulted from the testing of each of a test coupon comprising organic thin film compositions for each of red, green, and blue, fabricated in a large-pixel, spin-coated device format. Such test coupons are substantially easier to fabricate and test for the purpose of rapid evaluation of various formulations and processes. Though test coupon testing should not be confused with lifetime testing of a printed panel, it can be indicative of the impact of various formulations and processes on lifetime. The results shown in the table below represent variation in the process step in the fabrication of test coupons in which only the spin-coating environment varied for test coupons fabricated in a nitrogen environment where reactive species were less than 1 ppm compared to test coupons similarly fabricated but in air instead of a nitrogen environment.

It is evident through the inspection of the data in Table 1 for test coupons fabricated under different processing environments, particularly in the case of red and blue, that printing in an environment that effectively reduces exposure of organic thin film compositions to reactive species may have a substantial impact on the stability of various ELs, and hence on lifetime.

TABLE 1

Impact of inert gas processing on lifetime for OLED panels

| Color | Process Environment | V @ 10 mA/cm$^2$ | Cd/A | CIE (x,y) @ 1000 Cd/m$^2$ | T95 | T80 | T50 |
|---|---|---|---|---|---|---|---|
| Red | Nitrogen | 6 | 9 | (0.61,0.38) | 200 | 1750 | 10400 |
| | Air | 6 | 8 | (0.60,0.39) | 30 | 700 | 5600 |
| Green | Nitrogen | 7 | 66 | (0.32,0.63) | 250 | 3700 | 32000 |
| | Air | 7 | 61 | (0.32,0.62) | 250 | 2450 | 19700 |
| Blue | Nitrogen | 4 | 5 | (0.14,0.10) | 150 | 750 | 3200 |
| | Air | 4 | 5 | (0.14,0.10) | 15 | 250 | 1800 |

As such, challenges exist in scaling OLED printing from Gen 3.5 to Gen 8.5 and greater, and at the same time providing for a robust enclosure system that can contain an OLED printing system in an inert, substantially particle-free gas enclosure environment. It is contemplated that according to the present teachings, such a gas enclosure would have attributes that include, for example, but are not limited by, a gas enclosure that can be readily scaled to provide an optimized working space for an OLED printing system, while providing minimized inert gas volume, and additionally providing ready access to an OLED printing system from the exterior during processing, while providing access to the interior for maintenance with minimal downtime.

According to various embodiments of the present teachings, a gas enclosure assembly for various air-sensitive processes that require an inert environment is provided that can include a plurality of wall frame and ceiling frame members that can be sealed together. In some embodiments, a plurality of wall frame and ceiling frame members can be fastened together using reusable fasteners, for example, bolts and threaded holes. For various embodiments of a gas enclosure assembly according to the present teachings, a plurality of frame members, each frame member comprising a plurality of panel frame sections, can be constructed to define a gas enclosure frame assembly.

A gas enclosure assembly of the present teachings can be designed to accommodate a system, such as an OLED printing system, in a fashion that can minimize the volume of the enclosure around a system. Various embodiments of a gas enclosure assembly can be constructed in a fashion that minimizes the internal volume of a gas enclosure assembly, and at the same time optimizes the working space to accommodate various footprints of various OLED printing systems. Various embodiments of a gas enclosure assembly so constructed additionally provide ready access to the interior of a gas enclosure assembly from the exterior during processing and readily access to the interior for maintenance, while minimizing downtime. In that regard, various embodiments of a gas enclosure assembly according to the present teachings can be contoured with respect to various footprints of various OLED printing systems. According to various embodiments, once the contoured fame members are constructed to form a gas enclosure frame assembly, various types of panels may be sealably installed in a plurality of panel sections comprising a frame member to complete the installation of a gas enclosure assembly. In various embodiments of a gas enclosure assembly, a plurality of frame members including, for example, but not limited by, a plurality of wall frame members and at least one ceiling frame member, as well as a plurality of panels for installation in panel frame sections, may be fabricated at one location or locations, and then constructed at another location. Moreover, given the transportable nature of components used to construct a gas enclosure assembly of the present teachings, various embodiments of a gas enclosure assembly can be repeatedly installed and removed through cycles of construction and deconstruction.

In order to ensure that a gas enclosure is hermetically sealed, various embodiments of a gas enclosure assembly of the present teaching provide for joining each frame member to provide frame sealing. The interior can be sufficiently sealed, for example, hermetically sealed, by tight-fitting intersections between the various frame members, which include gaskets or other seals. Once fully constructed, a sealed gas enclosure assembly can comprise an interior and a plurality of interior corner edges, at least one interior corner edge provided at the intersection of each frame member with an adjacent frame member. One or more of the frame members, for example, at least half of the frame members, can comprise one or more compressible gaskets fixed along one or more respective edges thereof. The one or more compressible gaskets can be configured to create an hermetically sealed gas enclosure assembly once a plurality of frame members are joined together, and gas-tight panels installed. A sealed gas enclosure assembly can be formed having corner edges of frame members sealed by a plurality of compressible gaskets. For each frame member, for example, but not limited by, an interior wall frame surface, a top wall frame surface, a vertical side wall frame surface, a bottom wall frame surface, and a combination thereof can be provided with one or more compressible gaskets.

For various embodiments of a gas enclosure assembly, each frame member can comprise a plurality of sections framed and fabricated to receive any of a variety of panel types that can be sealably installed in each section to provide a gas-tight panel seal for each panel. In various embodiments of a gas enclosure assembly of the present teachings, each section frame can have a section frame gasket that, with selected fasteners, ensures each panel installed in each section frame can provide a gas-tight seal for each panel, and therefore for a fully-constructed gas enclosure. In various embodiments, a gas enclosure assembly can have one or more of a window panel or service window in each of a wall panel; where each window panel or service window can have at least one gloveport. During assembly of a gas enclosure assembly, each gloveport can have a glove attached, so that the glove can extend into the interior. According to various embodiments, each gloveport can have hardware for mounting a glove, wherein such hardware utilizes gasket seals around each gloveport that provide a gas-tight seal to minimize leakage or molecular diffusion through the gloveport. For various embodiments of a gas enclosure assembly of the present teachings, the hardware is further designed for providing ease of capping and uncapping a gloveport to an end-user.

Various embodiments of a gas enclosure assembly and system according to the present teachings can include a gas enclosure assembly formed from a plurality of frame members and panel sections, as well as gas circulation, filtration and purification components. For various embodiments of a gas enclosure assembly and system, ductwork may be installed during the assembly process. According to various embodiments of the present teachings, ductwork can be installed within a gas enclosure frame assembly, which has been constructed from a plurality of frame members. In various embodiments, ductwork can be installed on a plurality of frame members before they are joined to form a gas enclosure frame assembly. Ductwork for various embodiments of a gas enclosure assembly and system can be configured such that substantially all gas drawn into the ductwork from one or more ductwork inlets is moved through various embodiments of a gas circulation and filtration loop for removing particulate matter internal to a gas enclosure assembly and system. Additionally, ductwork of various embodiments of a gas enclosure assembly and system can be configured to separate the inlets and outlets of a gas purification loop that is external to a gas enclosure assembly from a gas circulation and filtration loop that is internal to a gas enclosure assembly.

For example, a gas enclosure assembly and system can have a gas circulation and filtration system internal to a gas enclosure assembly. Such an internal filtration system can have a plurality of fan filter units within the interior, and can be configured to provide a laminar flow of gas within the interior. The laminar flow can be in a direction from a top of the interior to a bottom of the interior, or in any other direction. Although a flow of gas generated by a circulating system need not be laminar, a laminar flow of gas can be used to ensure thorough and complete turnover of gas in the interior. A laminar flow of gas can also be used to minimize turbulence, such turbulence being undesirable as it can cause particles in the environment to collect in such areas of turbulence, preventing the filtration system from removing those particles from the environment. Further, to maintain a desired temperature in the interior, a thermal regulation system utilizing a plurality of heat exchangers can be provided, for example, operating with, adjacent to, or used in conjunction with, a fan or another gas circulating device. A gas purification loop can be configured to circulate gas from within the interior of a gas enclosure assembly through at least one gas purification component exterior the enclosure. In that regard, a circulation and filtration system internal to a gas enclosure assembly in conjunction with a gas purification loop external to a gas enclosure assembly can provide continuous circulation of a substantially low-particulate inert gas having substantially low levels of reactive species throughout a gas enclosure assembly. The gas purification system can be configured to maintain very low levels of undesired components, for example, organic solvents and vapors thereof, as well as water, water vapor, oxygen, and the like.

In addition to providing for the gas circulation, filtration and purification components, the ductwork can be sized and shaped to accommodate therein at least one of an electrical wire, a wire bundle, as well as various fluid-containing tubings, which when bundled can have a considerable dead volume in which atmospheric constituents, such as water, water vapor, oxygen, and the like, can be trapped and difficult to remove by the purification system. In some embodiments, a combination of any of cables, electrical wires and wire bundles, and fluid-containing tubing can be disposed substantially within the ductwork and can be operatively associated with at least one of an electrical system, a mechanical system, a fluidic system and a cooling system, respectively, disposed within the interior. As the gas circulation, filtration and purification components can be configured such that substantially all circulated inert gas is drawn through the ductwork, atmospheric constituents trapped in the dead volume of variously bundled materials can be effectively purged from the considerable dead volume of such bundled materials by having such bundled materials contained within the ductwork.

Various embodiments of a gas enclosure assembly and system according to the present teachings can include a gas enclosure assembly formed from a plurality of frame members and panel sections, as well as gas circulation, filtration and purification components, and additionally various embodiments of a pressurized inert gas recirculation system. Such a pressurized inert gas recirculation system can be utilized in the operation of an OLED printing system for various pneumatically-driven devices and apparatuses, as will be discussed in more detail subsequently.

According to the present teachings, several engineering challenges were addressed in order to provide for various embodiments of a pressurized inert gas recirculation system in a gas enclosure assembly and system. First, under typical operation of a gas enclosure assembly and system without a pressurized inert gas recirculation system, a gas enclosure assembly can be maintained at a slightly positive internal pressure relative to an external pressure in order to safeguard against outside gas or air from entering the interior should any leaks develop in a gas enclosure assembly and system. For example, under typical operation, for various embodiments of a gas enclosure assembly and system of the present teachings, the interior of a gas enclosure assembly can be maintained at a pressure relative to the surrounding atmosphere external to the enclosure system, for example, of at least 2 mbarg, for example, at a pressure of at least 4 mbarg, at a pressure of at least 6 mbarg, at a pressure of at least 8 mbarg, or at a higher pressure. Maintaining a pressurized inert gas recirculation system within a gas enclosure assembly system can be challenging, as it presents a dynamic and ongoing balancing act regarding maintaining a slight positive internal pressure of a gas enclosure assembly and system, while at the same time continuously introducing pressurized gas into a gas enclosure assembly and system. Further, variable demand of various devices and apparatuses can create an irregular pressure profile for various gas enclosure assemblies and systems of the present teachings. Maintaining a dynamic pressure balance for a gas enclosure assembly held at a slight positive pressure relative to the external environment under such conditions can provide for the integrity of an ongoing OLED printing process.

For various embodiments of a gas enclosure assembly and system, a pressurized inert gas recirculation system according to the present teachings can include various embodiments of a pressurized inert gas loop that can utilize at least one of a compressor, an accumulator, and a blower, and combinations thereof. Various embodiments of a pressurized inert gas recirculation system that include various embodiments of a pressurized inert gas loop can have a specially designed pressure-controlled bypass loop that can provide internal pressure of an inert gas in a gas enclosure assembly and system of the present teachings at a stable, defined value. In various embodiments of a gas enclosure assembly and system, a pressurized inert gas recirculation system can be configured to recirculate pressurized inert gas via a pressure-controlled bypass loop when a pressure of an inert gas in an accumulator of a pressurized inert gas loop exceeds a pre-set threshold pressure. The threshold pressure can be, for example, within a range from between about 25 psig to about 200 psig, or more specifically within a range of between about 75 psig to about 125 psig, or more specifically within a range from between about 90 psig to about 95 psig. In that regard, a gas enclosure assembly and system of the present teachings having a pressurized inert gas recirculation system with various embodiments of a specially designed pressure-controlled bypass loop can maintain a balance of having a pressurized inert gas recirculation system in an hermetically sealed gas enclosure.

According to the present teachings, various devices and apparatuses can be disposed in the interior and in fluid communication with various embodiments of a pressurized inert gas recirculation system having various pressurized inert gas loops that can utilize a variety of pressurized gas sources, such as at least one of a compressor, a blower, and combinations thereof. For various embodiments of a gas enclosure and system of the present teachings, the use of various pneumatically operated devices and apparatuses can be provide low-particle generating performance, as well as being low maintenance. Exemplary devices and apparatuses that can be disposed in the interior of a gas enclosure assembly and system and in fluid communication with various pressurized inert gas loops can include, for example, but not limited by, one or more of a pneumatic robot, a substrate floatation table, an air bearing, an air bushing, a compressed gas tool, a pneumatic actuator, and combinations thereof. A substrate floatation table, as well as air bearings can be used for various aspects of operating an OLED printing system in accordance with various embodiments of a gas enclosure assembly of the present teachings. For example, a substrate floatation table utilizing air-bearing technology can be used to transport a substrate into position in a print head chamber, as well as to support a substrate during an OLED printing process.

As previously discussed, various embodiments of a substrate floatation table, as well as air bearings can be useful for the operation of various embodiments of an OLED printing system housed in a gas enclosure assembly according to the present teachings. As shown schematically in FIG. 1 for gas enclosure assembly and system 2000, a substrate floatation table utilizing air-bearing technology can be used to transport a substrate into position in a print head chamber, as well support a substrate during an OLED printing process. In FIG. 1, a gas enclosure assembly 1500 can be a load-locked system that can have an inlet chamber 1510 for receiving a substrate through first inlet gate 1512 and gate 1514 for moving a substrate from inlet chamber 1510 to gas enclosure assembly 1500 for printing. Various gates according to the present teachings can be used for isolating the chambers from each other and from the external surroundings. According to the present teachings, various gates can be a selected from a physical gate and a gas curtain.

During the substrate-receiving process, gate 1512 can be open, while gate 1514 can be in the closed position in order to prevent atmospheric gases from entering gas enclosure assembly 1500. Once a substrate is received in inlet chamber 1510, both gate 1512 and 1514 can be closed and inlet chamber 1510 can be purged with an inert gas, such as nitrogen, any of the noble gases, and any combination thereof, until reactive atmospheric gases are at a low of level of 100 ppm or lower, for example, at 10 ppm or lower, at 1.0 ppm or lower, or at 0.1 ppm or lower. After atmospheric gases have reached a sufficiently low level, gate 1514 can be opened, while 1512 remains closed, to allow substrate 1550, to be transported from inlet chamber 1510 to gas enclosure assembly chamber 1500, as depicted in FIG. 1. The transport of the substrate from inlet chamber 1510 to gas enclosure assembly chamber 1500 can be via, for example, but not limited by, a floatation table provided in chambers 1500 and 1510. The transport of the substrate from inlet chamber 1510 to gas enclosure assembly chamber 1500 can also be via, for example, but not limited by, a substrate transport robot, which can place substrate 1550 onto a floatation table provided in chamber 1500. Substrate 1550 can remain supported on a substrate floatation table during the printing process.

Various embodiments of gas enclosure assembly and system 2000 can have outlet chamber 1520 in fluid communication with gas enclosure assembly 1500 through gate 1524. According to various embodiments of gas enclosure assembly and system 2000, after the printing process is complete, substrate 1550 can be transported from gas enclosure assembly 1500 to outlet chamber 1520 through gate 1524. The transport of the substrate from gas enclosure assembly chamber 1500 to outlet chamber 1520 can be via, for example, but not limited by, a floatation table provided in chambers 1500 and 1520. The transport of the substrate from gas enclosure assembly chamber 1500 to outlet chamber 1520 can also be via, for example, but not limited by, a substrate transport robot, which can pick up substrate 1550 from a floatation table provided in chamber 1500 and transport it into chamber 1520. For various embodiments of gas enclosure assembly and system 2000, substrate 1550 can be retrieved from outlet chamber 1520 via gate 1522, when gate 1524 is in a closed position in order to prevent reactive atmospheric gases from entering gas enclosure assembly 1500.

In addition to a load-locked system that includes an inlet chamber 1510 and an outlet chamber 1520, which are in fluid communication with gas enclosure assembly 1500 via gates 1514 and 1524 respectively, gas enclosure assembly and system 2000 can include system controller 1600. System controller 1600 can include one or more processor circuits (not shown) in communication with one or more memory circuits (not shown). System controller 1600 can also communicate with a load-locked system that includes an inlet chamber 1510 and an outlet chamber 1520 and ultimately with a print nozzle of an OLED printing system. In this manner, system controller 1600 can coordinate opening and closing of gates 1512, 1514, 1522 and 1524. System controller 1600 can also control ink dispensing to a print nozzle of an OLED printing system. Substrate 1550 can be transported through various embodiments of a load-locked system of the present teachings that includes an inlet chamber 1510 and an outlet chamber 1520, which are in fluid communication with gas enclosure assembly 1500 via gates 1514 and 1524 respectively, via for example, but not limited by, a substrate floatation table utilizing air-bearing technology or a combination of floatation tables utilizing air-bearing technology and substrate transport robots.

Various embodiments of a load-locked system of FIG. 1 can also include pneumatic control system 1700, which can include a vacuum source and an inert gas source that can include nitrogen, any of the noble gases, and any combination thereof. A substrate floatation system housed within gas enclosure assembly and system 2000 can include multiple vacuum ports and gas bearing ports, which are typically arranged on a flat surface. Substrate 1550 can be lifted and kept off of a hard surface by the pressure of an inert gas such as nitrogen, any of the noble gases, and any combination thereof. The flow out of the bearing volume is accomplished by means of multiple vacuum ports. The floating height of substrate 1550 over a substrate floatation table is typically a function of gas pressure and gas flow. Vacuum and pressure of pneumatic control system 1700 can be used to support substrate 1550 during handling inside the gas enclosure assembly 1500 in the load-locked system of FIG. 1, for example, during printing. Control system 1700 can also be used to support substrate 1550 during transport through load-locked system of FIG. 1 that includes an inlet chamber 1510 and an outlet chamber 1520, which are in fluid communication with gas enclosure assembly 1500 via gates 1514 and 1524 respectively. To control transporting substrate 1550 through gas enclosure assembly and system 2000, system controller 1600 communicates with inert gas source 1710 and vacuum 1720 through valves 1712 and 1722, respectively. Additional vacuum and inert gas supply lines and valving, not shown, can be provided to the gas enclosure assembly and system 2000, illustrated by the lock-locked system in FIG. 1, to further provide the various gas and vacuum facilities needed for controlling the enclosed environment.

Figure 2:
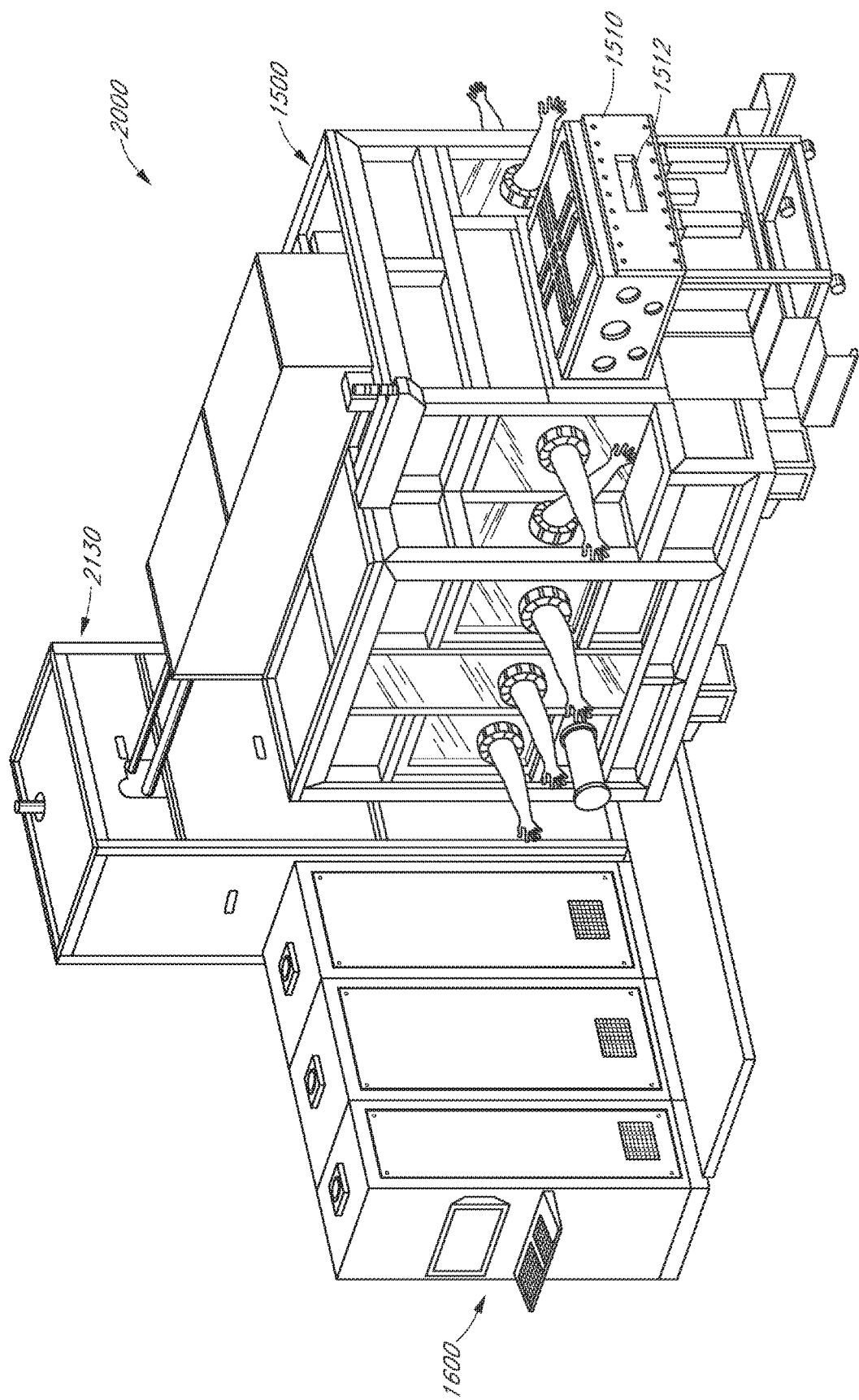
FIG. 2 is left, front perspective view of a gas enclosure assembly and system in accordance with various embodiments of the present teachings.

To lend a more dimensional perspective to various embodiments of a gas enclosure assembly and system according to the present teachings, FIG. 2 is a left front perspective view of various embodiments of gas enclosure assembly and system 2000. FIG. 2 depicts a load-locked system including gas enclosure assembly 1500, inlet chamber 1510, and first gate 1512. Gas enclosure assembly and system 2000 of FIG. 2 can include a gas purification system 2130 for providing gas enclosure assembly 1500 with a constant supply of inert gas having substantially low levels of reactive atmospheric species, such as water vapor and oxygen, as well as organic solvent vapors that result from an OLED printing process. Gas enclosure assembly and system 2000 of FIG. 2 also has controller system 1600 for system control functions, as previously discussed.

Figure 3:
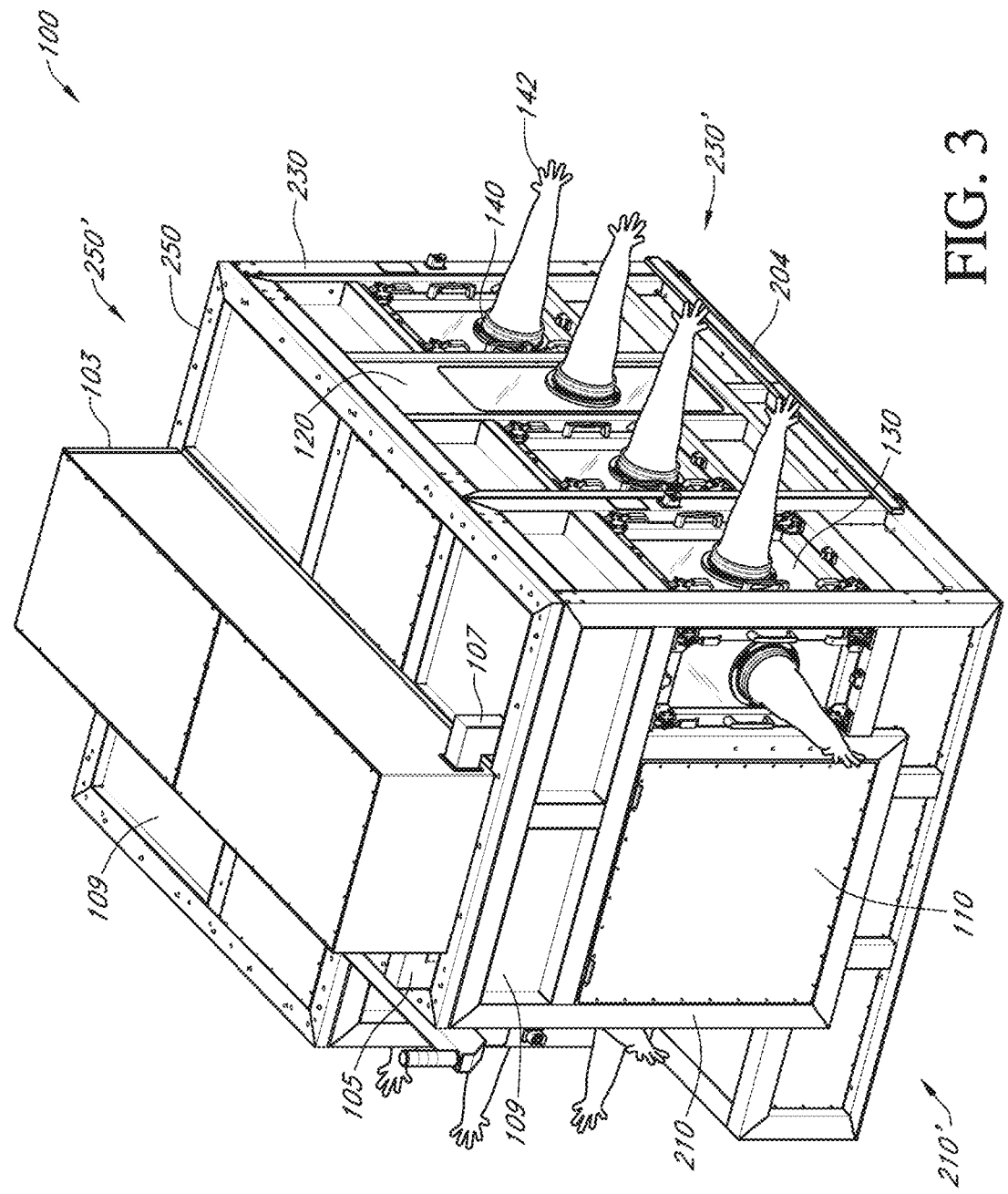
FIG. 3 is right, front perspective view of a gas enclosure assembly in accordance with various embodiments of the present teachings.

FIG. 3 is a right, front perspective view of a fully-constructed gas enclosure assembly 100 according to various embodiments of the present teachings. Gas enclosure assembly 100 can contain one or more gases for maintaining an inert environment in a gas enclosure assembly interior. A gas enclosure assembly and system of the present teachings can be useful in maintaining an inert gas atmosphere in the interior. An inert gas may be any gas that does not undergo a chemical reaction under a defined set of conditions. Some commonly used examples of an inert gas can include nitrogen, any of the noble gases, and any combination thereof. Gas enclosure assembly 100 is configured to encompass and protect an air-sensitive process, such as the printing of an organic light emitting diode (OLED) ink using an industrial printing system. Examples of atmospheric gases that are reactive to OLED inks include water vapor and oxygen. As previously discussed, gas enclosure assembly 100 can be configured to maintain a sealed atmosphere and allow the component or printing system to operate effectively while avoiding contamination, oxidation, and damage to otherwise reactive materials and substrates.

As depicted in FIG. 3, various embodiments of a gas enclosure assembly can comprise component parts including a front or first wall panel 210', a left, or second wall panel (not shown), a right or third wall panel 230', a back or forth wall panel (not shown), and ceiling panel 250', which gas enclosure assembly can be attached to pan 204, which rests on a base (not shown). As will be discussed in more detail subsequently, various embodiments of a gas enclosure assembly 100 of FIG. 1 can be constructed from a front or first wall frame 210, a left, or second wall frame (not shown), a right or third wall frame 230, a back or forth wall panel (not shown), and a ceiling frame 250. Various embodiments of a ceiling frame 250 can include a fan filter unit cover 103, as well as first ceiling frame duct 105, and first ceiling frame duct 107. According to embodiments of the present teachings, various types of section panels may be installed in any of a plurality of panel section comprising a frame member. In various embodiments of gas enclosure assembly 100 of FIG. 1, sheet metal panel sections 109 can be welded into a frame member during the construction of a frame. For various embodiments of gas enclosure assembly 100, types of section panels can that can be repeatedly installed and removed through cycles of construction and deconstruction of a gas enclosure assembly can include an inset panel 110, as indicated for wall panel 210', as well as a window panel 120 and readily-removable service window 130, as indicated for wall panel 230'.

Though readily-removable service window 130 can provide ready access to the interior of enclosure 100, any panel that is removable can be used to provide access to the interior of a gas enclosure assembly and system for the purpose of repair and regular service. Such access for service or repair is differentiated from the access provided by panels such as window panel 120 and readily-removable service window 130, which can provide an end-user glove access to the interior of a gas enclosure assembly during use from the exterior of a gas enclosure assembly. For example, any of the gloves, such as glove 142, which is attached to gloveport 140, as shown in FIG. 3 for panel 230, can provide an end-user access to the interior during use of a gas enclosure assembly system.

Figure 4:
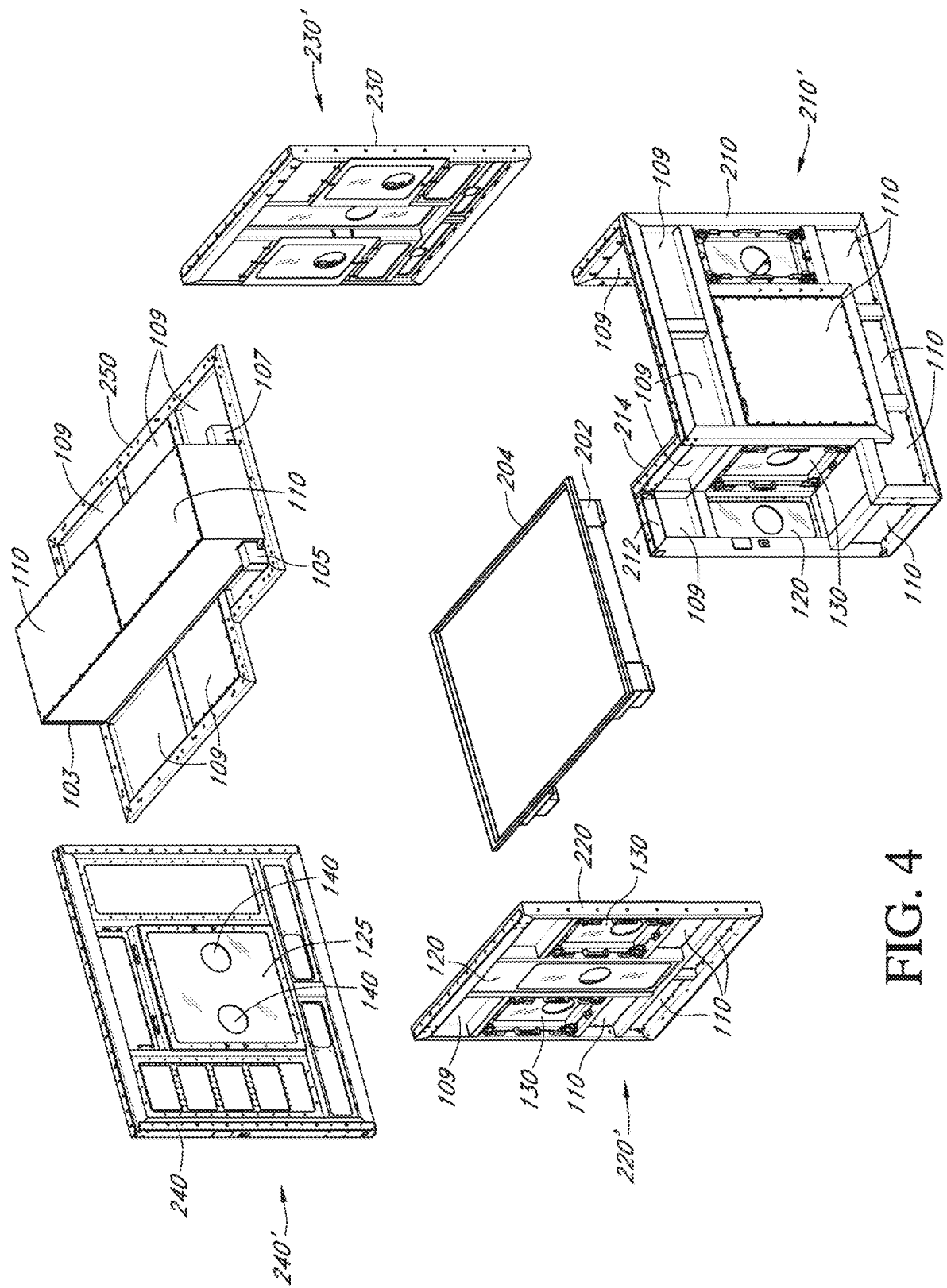
FIG. 4 depicts an exploded view of a gas enclosure assembly in accordance with various embodiments of the present teachings.

FIG. 4 depicts an exploded view of various embodiments of a gas enclosure assembly as depicted in FIG. 3. Various embodiments of a gas enclosure assembly can have a plurality of wall panels, including outside perspective view of front wall panel 210', outside perspective view of left wall panel 220', interior perspective view of a right wall panel 230', interior perspective view of rear wall panel 240', and top perspective view of ceiling panel 250', which as shown in FIG. 3 can be attached to pan 204, which rests upon base 202. An OLED printing system can mounted on top of pan 204, which printing processes are known to be sensitive to atmospheric conditions. According to the present teachings, a gas enclosure assembly can be constructed from frame members, for example, wall frame 210 of wall panel 210', wall frame 220 of wall panel 220', wall frame 230 of wall panel 230', wall frame 240 of wall panel 240', and ceiling frame 250 of ceiling panel 250', in which a plurality of section panels can then be installed. In that regard, it can be desirable to streamline the design of section panels that can be repeatedly installed and removed through cycles of construction and deconstruction of various embodiments of a gas enclosure assembly of the present teachings. Moreover, contouring of a gas enclosure assembly 100 can be done to accommodate a footprint of various embodiments of an OLED printing system in order to minimize the volume of inert gas required in a gas enclosure assembly, as well as providing ready access to an end-user; both during use of a gas enclosure assembly, as well as during maintenance.

Using front wall panel 210' and left wall panel 220' as exemplary, various embodiments of a frame member can have sheet metal panel sections 109 welded into a frame member during frame member construction. Inset panel 110, window panel 120 and readily-removable service window 130 can be installed in each of a wall frame member, and can be repeatedly installed and removed through cycles of construction and deconstruction of gas enclosure assembly 100 of FIG. 4. As can be seen; in the example of wall panel 210' and wall panel 220', a wall panel can have a window panel 120 proximal to a readily-removable service window 130. Similarly, as depicted in the example rear wall panel 240', a wall panel can have a window panel such as window panel 125, which has two adjacent gloveports 140. For various embodiments of wall frame members according to the present teachings, and as seen for gas enclosure assembly 100 of FIG. 3, such an arrangement of gloves provides easy access from the exterior of a gas enclosure to component parts within an enclosed system. Accordingly, various embodiments of a gas enclosure can provide two or more gloveports so that an end-user can extend a left glove and a right glove into the interior and manipulate one or more items in the interior, without disturbing the composition of the gaseous atmosphere within the interior. For example, any of window panel 120 and service window 130 can be positioned to facilitate easy access from the exterior of a gas enclosure assembly to an adjustable component in the interior of a gas enclosure assembly. According to various embodiments of a window panel, such as window panel 120 and service window 130, when end-user access through a gloveport glove is not indicated, such windows may not include a gloveport and gloveport assembly.

Various embodiments of wall and ceiling panels, as depicted in FIG. 4, can have a plurality of an inset panel 110. As can be seen in FIG. 4, inset panels can have a variety of shapes and aspect ratios. In addition to inset panels, ceiling panel 250' can have a fan filter unit cover 103 as well as first ceiling frame duct 105, and second ceiling frame duct 107, mounted, bolted, screwed, fixed, or otherwise secured to ceiling frame 250. As will be discussed in more detail subsequently, ductwork in fluid communication with duct 107 of ceiling panel 250' can be installed within the interior of a gas enclosure assembly. According to the present teachings, such ductwork can be part of a gas circulation system internal to a gas enclosure assembly, as well as providing for separating the flow stream exiting a gas enclosure assembly for circulation through at least one gas purification component external to a gas enclosure assembly.

Figure 5:
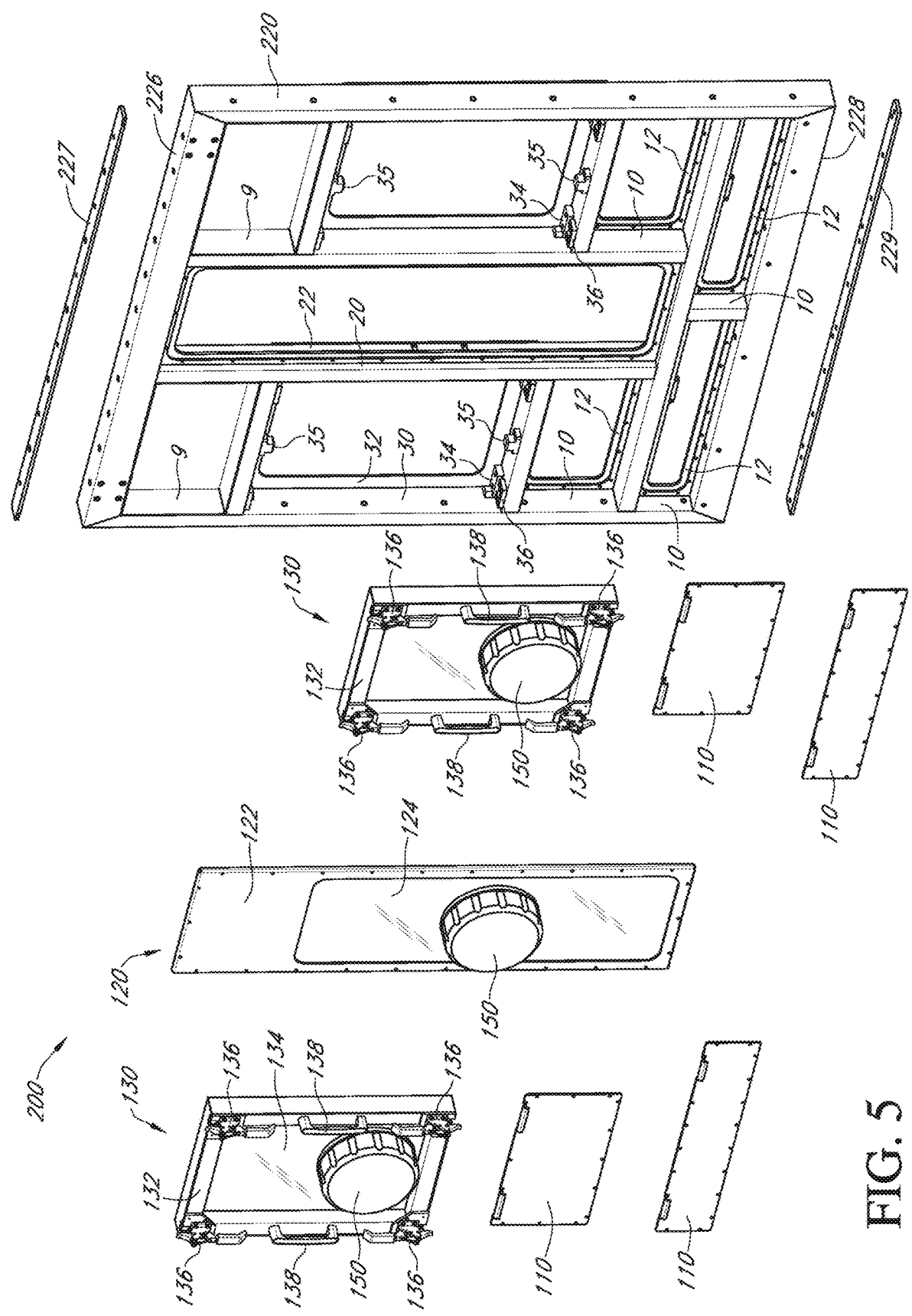
FIG. 5 is an exploded front perspective view of a frame member assembly depicting various panel frame sections, and section panels in accordance with various embodiments of the present teachings.

FIG. 5 is an exploded front perspective view of frame member assembly 200, in which wall frame 220 can be constructed to include a complete complement of panels. Though not limited to the design shown, frame member assembly 200, using wall frame 220, can be used as exemplary for various embodiments of a frame member assembly according to the present teachings. Various embodiments of a frame member assembly can be comprised of various frame members and section panels installed in various frame panel sections of various frame members according to the present teachings.

According to various embodiments of various frame member assemblies of the present teachings, frame member assembly 200 can be comprised of a frame member, such as wall frame 220. For various embodiments of a gas enclosure assembly, such as gas enclosure assembly 100 of FIG. 3, processes that may utilize equipment housed in such a gas enclosure assembly may not only require an hermetically sealed enclosure providing an inert environment, but an environment substantially free of particulate matter. In that regard, a frame member according to the present teachings may utilize variously dimensioned metal tube materials for the construction of various embodiments of a frame. Such metal tube materials address desired material attributes, including, but not limited by, a high-integrity material that will not degrade to produce particulate matter, as well as producing a frame member having high strength, yet optimal weight, providing for ready transport, construction, and deconstruction from one site to another site of a gas enclosure assembly comprising various frame members and panel sections. One of ordinary skill in the art can readily understand that any material satisfying these requirements can be utilized for creating various frame members according to the present teachings.

For example, various embodiments of a frame member according to the present teachings, such as frame member assembly 200, can be constructed from extruded metal tubing. According to various embodiments of a frame member, aluminum, steel, and a variety of metal composite materials may be utilized for constructing a frame member. In various embodiments, metal tubing having dimensions of, for example, but not limited by, 2"w×2"h, 4"w×2"h and 4"w×4"h and having ⅛" to ¼" wall thickness can be used to construct various embodiments of frame members according to the present teachings. Additionally, a variety of reinforced fiber polymeric composite materials of a variety of tube or other forms are available that have the material attributes including, but not limited by, a high-integrity material that will not degrade to produce particulate matter, as well as producing a frame member having high strength, yet optimal weight, providing for ready transport, construction, and deconstruction from one site to another site.

Regarding construction of various frame members from variously dimensioned metal tube materials, it is contemplated that welding to create various embodiments of frame weldments can be done. Additionally, construction of various frame members from variously dimensioned building materials can be done using an appropriate industrial adhesive. It is contemplated that the construction of various frame members should be done in a fashion that would not intrinsically create leak paths through a frame member. In that regard, construction of various frame members can be done using any approach that does not intrinsically create leak paths through a frame member for various embodiments of a gas enclosure assembly. Further, various embodiments of frame members according to the present teachings, such as wall frame 220 of FIG. 4, may be painted or coated. For various embodiments of a frame member made from a metal tubing material prone, for example, to oxidation, where material formed at the surface may create particulate matter, painting or coating, or other surface treatment, such as anodizing, to prevent the formation of particulate matter can be done.

A frame member assembly, such as frame member assembly 200 of FIG. 5, can have a frame member, such as wall frame 220. Wall frame 220 can have top 226, upon which a top wall frame spacer plate 227 can be fastened, as well as a bottom 228, upon which a bottom wall frame spacer plate 229 can be fastened. As will be discussed in more detail subsequently, spacer plates mounted on surfaces of a frame member are a part of a gasket sealing system, which in conjunction with the gasket sealing of panels mounted in frame member sections, provides for hermetic sealing of various embodiments of a gas enclosure assembly according to the present teachings. A frame member, such as wall frame 220 of frame member assembly 200 of FIG. 5, can have several panel frame sections, where each section can be fabricated to receive various types of panels, such as, but not limited by, an inset panel 110, a window panel 120 and a readily-removable service window 130. Various types of panel sections can be formed in the construction of a frame member. Types of panel sections can include, for example, but not limited by, an inset panel section 10, for receiving inset panel 110, a window panel section 20, for receiving window panel 120, and a service window panel section 30, for receiving readily-removable service window 130.

Each type of panel section can have a panel section frame to receive a panel, and can provide that each panel can be sealably fastened into each panel section in accordance with the present teachings for constructing an hermetically sealed gas enclosure assembly. For example, in FIG. 5 depicting a frame assembly according to the present teachings, inset panel section 10 is shown to have frame 12, window panel section 20 is shown to have frame 22, and service window panel section 30 is shown to have frame 32. For various embodiments of a wall frame assembly of the present teachings, various panel section frames can be a metal sheet material welded into the panel sections with a continuous weld-bead to provide a hermetic seal. For various embodiments of a wall frame assembly, various panel section frames can be made from a variety of sheet materials, including building materials selected from reinforced fiber polymeric composite materials, which can be mounted in a panel section using an appropriate industrial adhesive. As will be discussed in more detail in subsequent teachings concerning sealing, each panel section frame can have a compressible gasket disposed thereon to ensure that a gas-tight seal can be formed for each panel installed and fastened in each panel section. In addition to a panel section frame, each frame member section can have hardware related to positioning a panel, as well as to securely fastening a panel in a panel section.

Various embodiments of inset panel 110 and panel frame 122 for window panel 120 can be constructed from sheet metal material, such as, but not limited by, aluminum, various alloys of aluminum and stainless steel. The attributes for the panel material can be the same as they are for the structural material constituting various embodiments of frame members. In that regard, materials having attributes for various panel members include, but are not limited by, a high integrity material that will not degrade to produce particulate matter, as well as producing a panel having high strength, yet optimal weight, in order to provide for ready transport, construction, and deconstruction from one site to another site. Various embodiments of, for example, honeycomb core sheet material can have the requisite attributes for use as panel material for construction of inset panel 110 and panel frame 122 for window panel 120. Honeycomb core sheet material can be made of a variety of materials; both metal, as well as metal composite and polymeric, as well as polymer composite honeycomb core sheet material. Various embodiments of removable panels when fabricated from a metal material can have ground connections included in the panel to ensure that when a gas enclosure assembly is constructed that the entire structure is grounded.

Given the transportable nature of gas enclosure assembly components used to construct a gas enclosure assembly of the present teachings, any of the various embodiments of section panels of the present teachings can be repeatedly installed and removed during use of a gas enclosure assembly and system to provide access to the interior of a gas enclosure assembly.

For example, panel section 30 for receiving a readily-removable service window panel 130 can have a set of four spacers, of which one is indicated as window guide spacer 34. Additionally, panel section 30, which is constructed for receiving a readily-removable service window panel 130, can have a set of four clamping cleats 36, which can be used to clamp service window 130 into service window panel section 30 using a set of four of a reverse acting toggle clamp 136 mounted on service window frame 132 for each of a readily removable service window 130. Further, two of each of a window handle 138 can be mounted on readily-removable service window frame 132 to provide an end-user ease of removal and installation of service window 130. The number, type, and placement of removable service window handles can be varied. Additionally, service window panel section 30 for receiving a readily-removable service window panel 130 can have at least two of a window clamp 35, selectively installed in each service window panel section 30. Though depicted as in the top and bottom of each of service window panel section 30, at least two window clamps can be installed in any fashion that acts to secure service window 130 in panel section frame 32. A tool can be used to remove and install window clamp 35, in order to allow service window 130 to be removed and reinstalled.

Reverse acting toggle clamp 136 of service window 130, as well as hardware installed on panel section 30, including clamping cleat 36, window guide spacer 34, and window clamp 35, can be constructed of any suitable material, as well as combination of materials. For example, one or more such elements can comprise at least one metal, at least one ceramic, at least one plastic, and a combination thereof. Removable service window handle 138 can be constructed of any suitable material, as well as a combination of materials. For example, one or more such elements can comprise at least one metal, at least one ceramic, at least one plastic, at least one rubber, and a combination thereof. Enclosure windows, such as window 124 of window panel 120, or window 134 of service window 130, can comprise any suitable material as well as a combination of materials. According to various embodiments of a gas enclosure assembly of the present teachings, enclosure windows can comprise a transparent and a translucent material. In various embodiments of a gas enclosure assembly, enclosure windows can comprise silica-based materials, for example, but not limited by, such as glass and quartz, as well as various types of polymeric-based materials, for example, but not limited by, such as various classes of polycarbonate, acrylic, and vinyl. One of ordinary skill in the art can understand that various composites and combinations thereof of exemplary window materials can also be useful as transparent and translucent materials according to the present teachings.

As can be seen in FIG. 5 for frame member assembly 200, readily-removable service window panel 130 can have a gloveport with cap 150. Though FIG. 3 is shown with all gloveports having gloves extended outwardly, as shown in FIG. 5, gloveports can also be capped depending on whether or not an end-user requires remote access to the interior of a gas enclosure assembly. Various embodiments of a capping assembly, as depicted in FIGS. 6A-7B, provide for securely latching a cap over a glove when a glove, is not in use by an end-user, and at the same time providing for ready access when an end-user wishes to use a glove.

Figure 6B:
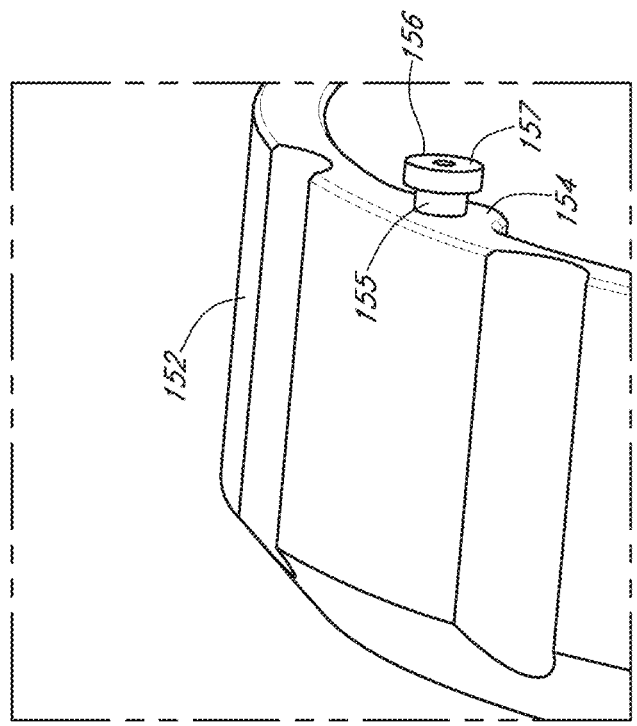
FIG. 6B is an expanded view of a shoulder screw of a gloveport cap according to various embodiments of a gas enclosure assembly of the present teachings.
Figure 6A:
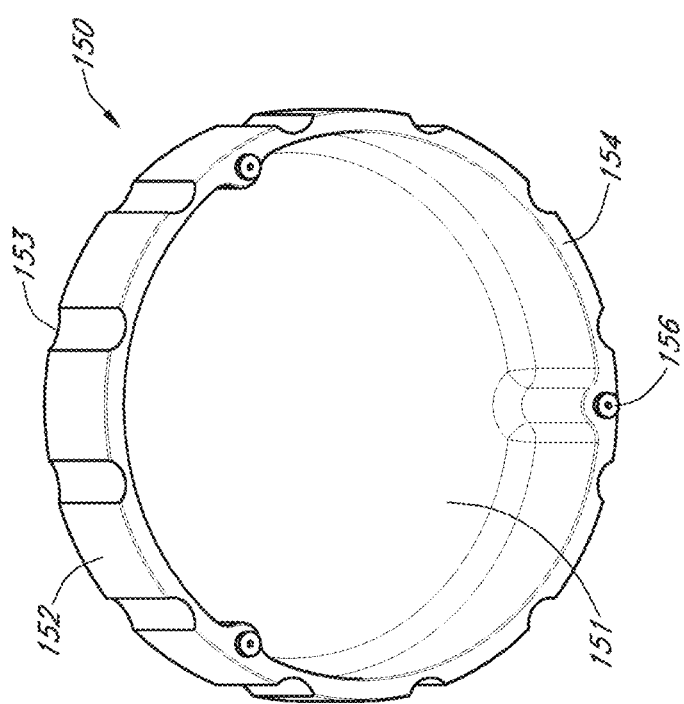
Figure 7A:
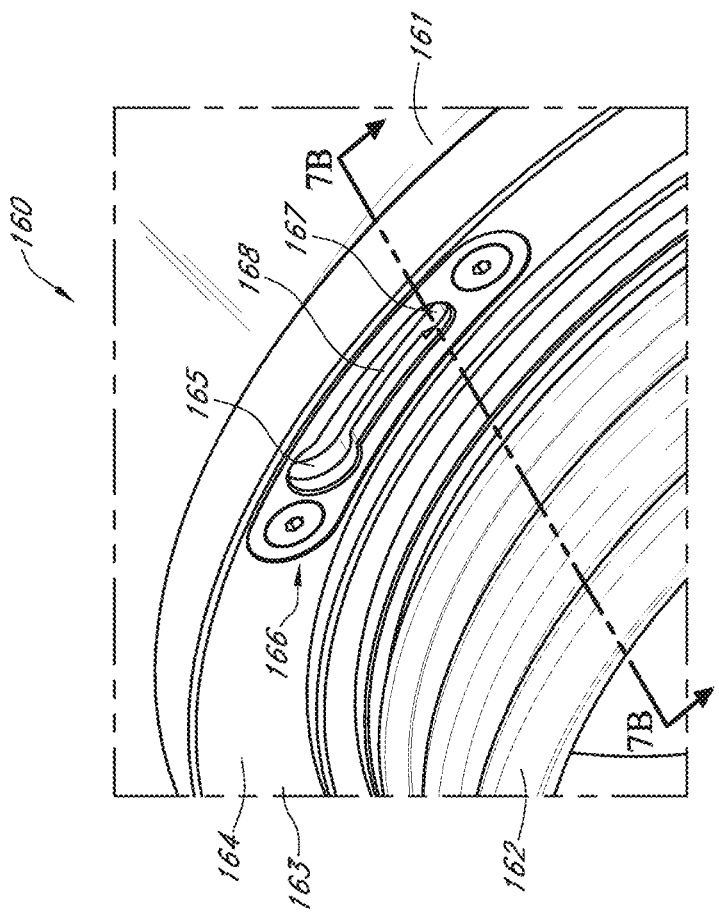
Figure 7B:
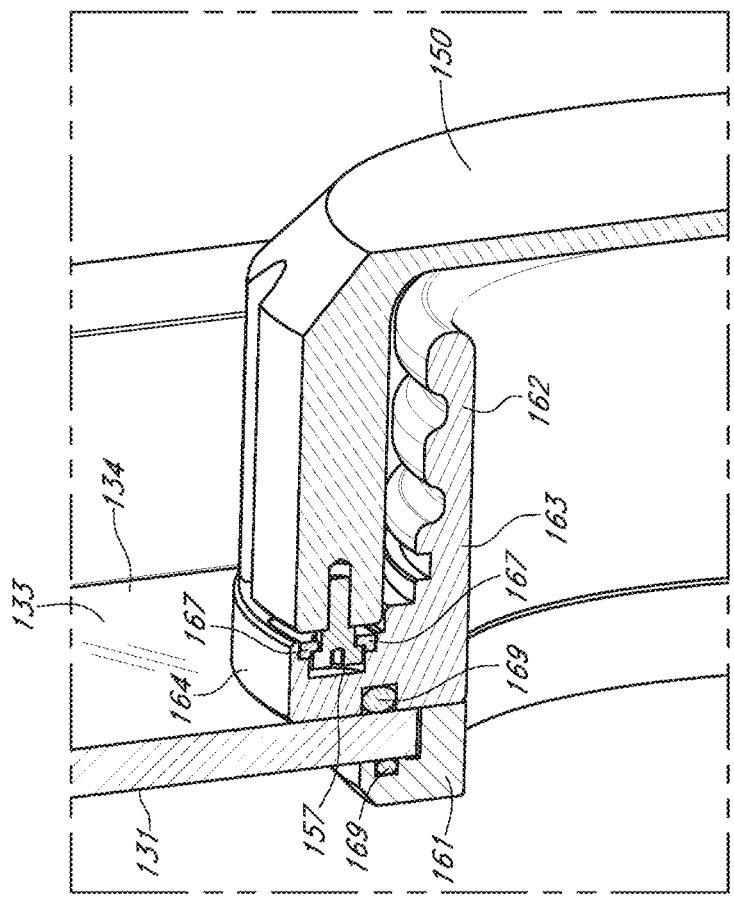
FIG. 7B is a section view of a gloveport capping assembly showing the engagement of the head of a shoulder screw with the recess in a bayonet latch.

In FIG. 6A, cap 150 is shown, which can have interior surface 151, exterior surface 153 and side 152 that can be contoured for gripping. Extending from rim 154 of cap 150 are three shoulder screws 156. As shown in FIG. 6B, each shoulder screw is set in rim 154, such that shank 155 extends a set distance from rim 154, so that head 157 is not abutted to rim 154. In FIG. 7A-7B, gloveport hardware assembly 160 can be modified to provide a capping assembly that includes a locking mechanism for capping a gloveport when the enclosure is pressurized to have a positive pressure relative to the enclosure exterior.

For various embodiments of gloveport hardware assembly 160 of FIG. 6A, bayonet clamping can provide closure of cap 150 over gloveport hardware assembly 160, and at the same time provides a quick-coupling design for ready access to a glove by an end-user. In the top expanded view of gloveport hardware assembly 160 shown in FIG. 7A, gloveport assembly 160 can comprise a back plate 161, and front plate 163, having a threaded screw head 162 for mounting a glove and a flange 164. On flange 164 is shown bayonet latch 166 having slot 165 for receiving shoulder screw head 157 of shoulder screw 156 (FIG. 6B). Each of a shoulder screw 156 can be aligned and engage with each of a bayonet latch 166 of gloveport hardware assembly 160. Slot 168 of bayonet latch 166 has opening 165 at one end and locking recess 167 at the other end of slot 168. Once each shoulder screw head 157 is inserted into each opening 165, cap 150 can be rotated until shoulder screw head is abutted at the end of slot 168 proximal to locking recess 167. The section view shown in FIG. 7B depicts a locking feature for capping a glove while a gas enclosure assembly system is in use. During use, the internal gas pressure of an inert gas in the enclosure is greater by a set amount than the pressure exterior a gas enclosure assembly. The positive pressure can fill the gloves (FIG. 3), so that when a glove is compressed under cap 150 during use of a gas enclosure assembly of the present teachings, shoulder screw head 157 is moved into locking recess 167, ensuring that the gloveport window will be securely capped. However, an end-use can grip cap 150 by side 152 contoured for gripping, and easily disengage the cap secured in the bayonet latch when not in use. FIG. 7B additionally shows back plate 161 on interior surface 131 of window 134, as well as front plate 163 on exterior surface of window 134, both plates of which have O-ring seals 169.

As will be discussed in the following teachings for FIGS. 8A-9B, wall and ceiling frame member seals in conjunction with gas-tight section panel frame seals together provide for various embodiments of an hermetically-sealed gas enclosure assembly for air-sensitive processes that require an inert environment. Components of a gas enclosure assembly and system that contribute to providing substantially low concentrations of reactive species, as well as substantially low particulate environment can include, but are not limited by, an hermetically sealed gas enclosure assembly, as well as a highly effective gas circulation and particle filtration system, including ductwork. Providing effective hermetic seals for a gas enclosure assembly can be challenging; especially where three frame members come together to form a three-sided joint. As such, three-sided joint sealing presents a particularly difficult challenge with respect to providing readily-installable hermetic sealing for a gas enclosure assembly that can be assembled and disassembled through cycles of construction and deconstruction In that regard, various embodiments of a gas enclosure assembly according to the present teachings provide for hermetic sealing of a fully-constructed gas enclosure assembly and system through effective gasket sealing of joints, as well as providing effective gasket sealing around load bearing building components. Unlike conventional joint sealing, joint sealing according to the present teachings: 1) includes uniform parallel alignment of abutted gasket segments from orthogonally oriented gasket lengths at top and bottom terminal frame joint junctures where three frame members are joined, thereby avoiding angular seam alignment and sealing, 2) provides for forming the abutted lengths across an entire width of a joint, thereby increasing the sealing contact area at three-sided joint junctures, 3) is designed with spacer plates that provide uniform compression force across all vertical, and horizontal, as well as top and bottom three-sided joint gasket seals. Additionally, the selection of the gasket material can impact the effectiveness of providing an hermetic seal, which will be discussed subsequently.

Figure 8A:
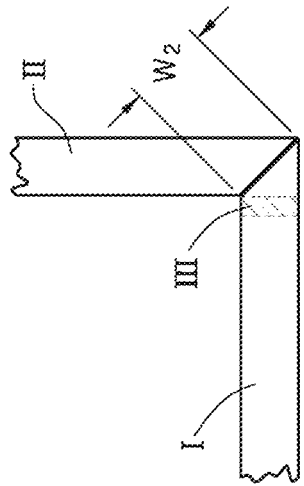
FIGS. 8A-8C are top schematic views of various embodiments of gasket seals for forming joints.
Figure 8B:
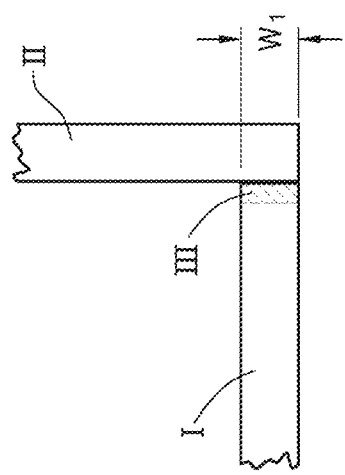
Figure 8C:
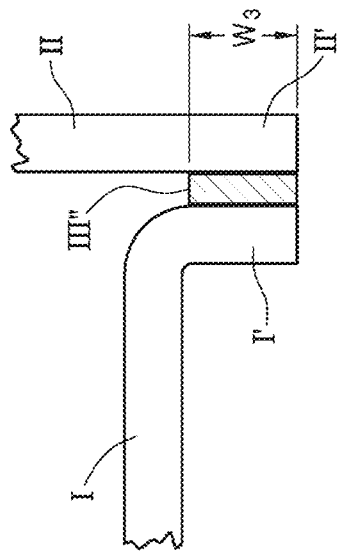

FIGS. 8A-8C are top schematic views that depict a comparison of conventional three-sided joint seals to three-sided joint seals according to the present teachings. According to various embodiments of a gas enclosure assembly the present teachings, there can be, for example, but not limited by, at least four wall frame members, a ceiling frame member and a pan, that can be joined to form a gas enclosure assembly, creating a plurality of vertical, horizontal, and three-sided joints requiring hermetic sealing. In FIG. 8A, a top schematic view of a conventional three-sided gasket seal formed from a first gasket I, which is orthogonally oriented to gasket II in the X-Y plane. As shown in FIG. 8A, a seam formed from the orthogonal orientation in the X-Y plane has a contact length $W_1$ between the two segments defined by the dimension of width of the gasket. Additionally, a terminal end portion of gasket III, which is a gasket orthogonally oriented to both gasket I and gasket II in the vertical direction, can abut gasket I and gasket II, as indicated by the hatching. In FIG. 8B, a top schematic view of a conventional three-sided joint gasket seal formed from a first gasket length l, which is orthogonal to a second gasket length II, and has a seam joining 45° faces of both lengths, where the seam has a contact length $W_2$ between the two segments that is greater than the width of the gasket material. Similarly to the configuration of FIG. 8A, an end portion of gasket III, which is orthogonal to both gasket I and gasket II in the vertical direction can abut gasket I and gasket II, as indicated by the hatching. Assuming that the gaskets widths are the same in FIG. 8A and FIG. 8B, the contact length $W_2$ for FIG. 8B is greater than the contact length $W_1$ for FIG. 8A.

FIG. 8C is a top schematic view of a three-sided joint gasket seal according to the present teachings. A first gasket length l can have a gasket segment l' formed orthogonally to the direction of gasket length l, where gasket segment l' has a length that can be approximately the dimension of the width of a structural component being joined, such as a 4"w×2"h or 4"w×4"h metal tube used to form various wall frame members of a gas enclosure assembly of the present teachings. Gasket II is orthogonal to gasket I in the X-Y plane, and has gasket segment II', which has an overlapping length with gasket segment I' that is approximately the width of structural components being joined. The width of gasket segments I' and II' are the width of a compressible gasket material selected. Gasket III is orthogonally oriented to both gasket I and gasket II in the vertical direction. Gasket segment III' is an end portion of gasket III. Gasket segment III' is formed from the orthogonal orientation of gasket segment III' to the vertical length of gasket III. Gasket segment III' can be formed so that it has approximately the same length as gasket segments I' and II', and a width that is the thickness of a compressible gasket material selected. In that regard, the contact length $W_3$ for the three aligned segments shown in FIG. 8C is greater than for the conventional three-corner joint seals shown in either FIG. 8A or FIG. 8B, having contact length $W_1$ and $W_2$, respectively.

In that regard, three-sided joint gasket sealing according to the present teachings creates uniform parallel alignment of gasket segments at terminal joint junctures from what would otherwise be orthogonally aligned gaskets, as shown in the case of FIG. 8A and FIG. 8B. Such uniform parallel alignment of the three-sided joint gasket sealing segments provides for applying a uniform lateral sealing force across the segments to promote an hermetic three-sided joint seal at the top and bottom corners of joints formed from wall frame members. Additionally, each segment of the uniformly aligned gasket segments for each three-sided joint seal is selected to be approximately the width of the structural components being joined, providing for a maximum length of contact of the uniformly aligned segments. Moreover, joint sealing according to the present teachings is designed with spacer plates that provide a uniform compression force across all vertical, horizontal, and three-sided gasket seals of a building joint. It may be argued that the width of the gasket material selected for conventional three-sided seals given for the examples of FIGS. 8A and 8B could be at least the width of structural components being joined.

Figure 9A:
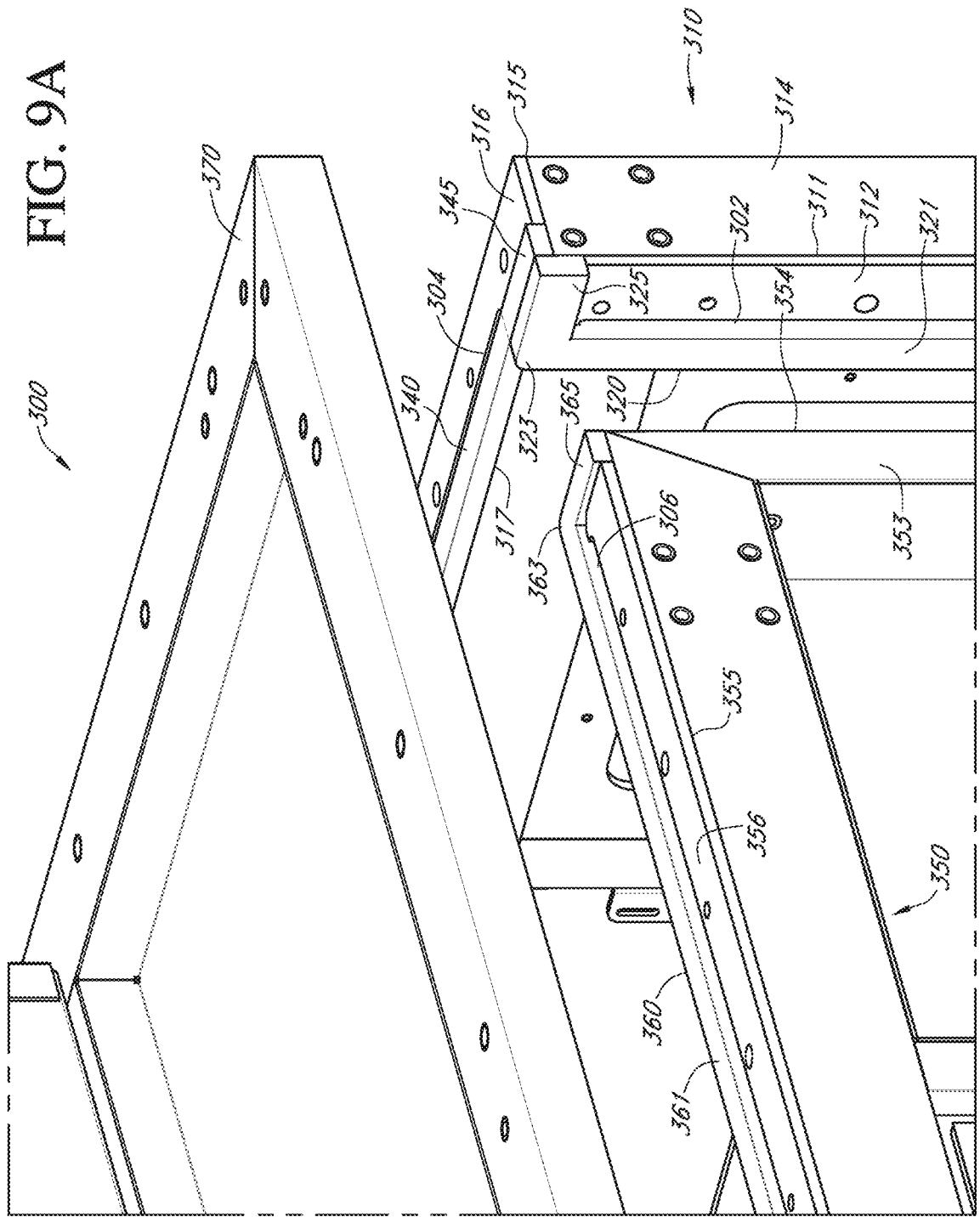
FIG. 9A and FIG. 9B are various perspective views that depict sealing of frame members according to various embodiments of a gas enclosure assembly of the present teachings.
Figure 9B:
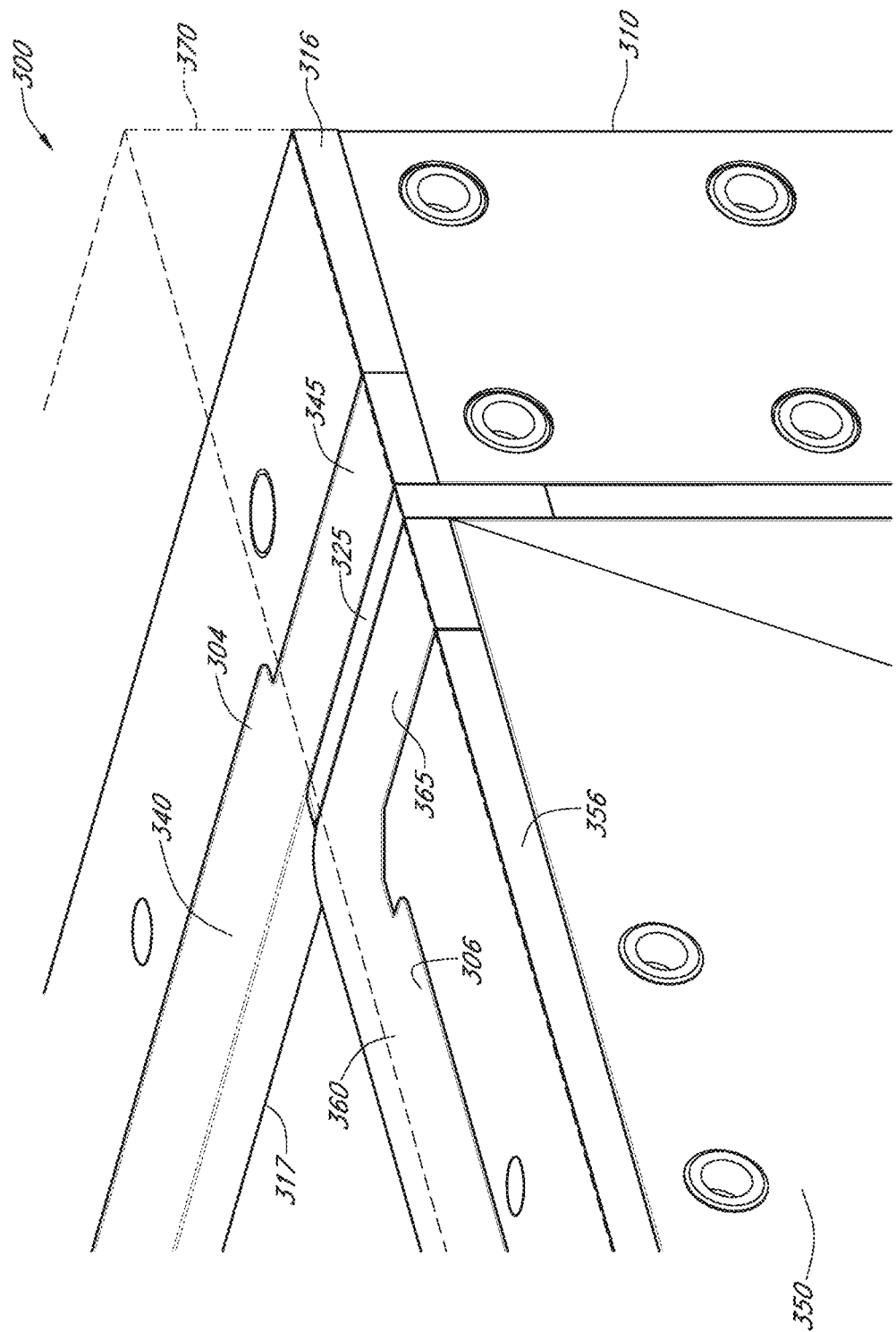

The exploded perspective view of FIG. 9A, depicts sealing assembly 300 according to the present teachings before all frame members have been joined, so that the gaskets are depicted in an uncompressed state. In FIG. 9A, a plurality of wall frame members, such as wall frame 310, wall frame 350, as well as ceiling frame 370 can be sealably joined in a first step of the construction of a gas enclosure from various components of a gas enclosure assembly. Frame member sealing according to the present teachings is a substantial part of providing that a gas enclosure assembly once fully constructed is hermetically sealed, as well as providing sealing that can be implemented through cycles of construction and deconstruction of a gas enclosure assembly. Though the example given in the following teachings for FIGS. 9A-9B are for the sealing of a portion of a gas enclosure assembly, one of ordinary skill in the art will appreciate that such teachings apply to the entirety of any of a gas enclosure assembly of the present teachings.

First wall frame 310 depicted in FIG. 9A can have interior side 311 on which spacer plate 312 is mounted, vertical side 314, and top surface 315 on which spacer plate 316 is mounted. First wall frame 310 can have first gasket 320 disposed in and adhered to a space formed from spacer plate 312. Gap 302, remaining after first gasket 320 is disposed in and adhered to a space formed from spacer plate 312, can run a vertical length of first gasket 320, as shown in FIG. 9A. As depicted in FIG. 9A, compliant gasket 320 can be disposed in and adhered to the space formed from spacer plate 312, and can have vertical gasket length 321, curvilinear gasket length 323, and gasket length 325 that is formed 90° in plane to vertical gasket length 321 on interior frame member 311 and terminates at vertical side 314 of wall frame 310. In FIG. 9A, first wall frame 310 can have top surface 315 on which spacer plate 316 is mounted, thereby forming a space on surface 315 on which second gasket 340 is disposed in and adhered to proximal to inner edge 317 of wall frame 310. Gap 304, remaining after second gasket 340 is disposed in and adhered to a space formed from spacer plate 316, can run a horizontal length of second gasket 340, as shown in FIG. 9A. Further, as indicated by the hatched line, length 345 of gasket 340 is uniformly parallel and contiguously aligned with length 325 of gasket 320.

Second wall frame 350 depicted in FIG. 9A can have exterior frame side 353, vertical side 354, and top surface 355 on which spacer plate 356 is mounted. Second wall frame 350 can have first gasket 360 disposed in and adhered to first gasket a space, which is formed from spacer plate 356. Gap 306, remaining after first gasket 360 is disposed in and adhered to a space formed from spacer plate 356, can run a horizontal length of first gasket 360, as shown in FIG. 9A. As depicted in FIG. 9A, compliant gasket 360 can have horizontal length 361, curvilinear length 363, and length 365 that is formed 90° in plane on top surface 355 and terminates at exterior frame member 353.

As indicated in the exploded perspective view of FIG. 9A, interior frame member 311 of wall frame 310 can be joined to vertical side 354 of wall frame 350 to form one building joint of a gas enclosure frame assembly. Regarding the sealing of a building joint so formed, in various embodiments of gasket sealing at terminal joint junctures of wall frame members according to the present teachings as depicted in FIG. 9A, length 325 of gasket 320, length 365 of gasket 360 and length 345 of gasket 340 are all contiguously and uniformly aligned. Additionally, as will be discussed in more detail subsequently, various embodiments of a spacer plate of the present teachings can provide for a uniform compression of between about 20% to about 40% deflection of a compressible gasket material used for hermetically sealing various embodiments of a gas enclosure assembly of the present teachings.

FIG. 9B depicts sealing assembly 300 according to the present teachings after all frame members have been joined, so that the gaskets are depicted in a compressed state. FIG. 9B is perspective view that shows the detail of corner seal of a three-sided joint formed at the top terminal joint juncture between first wall frame 310, second wall frame 350 and ceiling frame 370; which is shown in phantom view. As shown in FIG. 9B, the gasket spaces defined by the spacer plates can be determined to be a width, such that upon joining wall frame 310, wall frame 350 and ceiling frame 370; shown in phantom view, a uniform compression of between about 20% to about 40% deflection of a compressible gasket material for forming vertical, horizontal, and three-sided gasket seals ensures that gasket sealing at all surfaces sealed at joints of wall frame members can provide hermetic sealing. Additionally gasket gaps 302, 304, and 306 (not shown) are dimensioned, so that upon optimal compression of between about 20% to about 40% deflection of a compressible gasket material, each gasket can fill a gasket gap as shown for gasket 340 and gasket 360 in FIG. 9B. As such, in addition to providing uniform compression by defining a space in which each gasket is disposed in and adhered to, various embodiments of a spacer plate designed to provide a gap also ensure that each compressed gasket can conform within the spaces defined by a spacer plate without wrinkling or bulging or otherwise irregularly forming in a compressed state in a fashion that could form leak paths.

According to various embodiments of a gas enclosure assembly of the present teachings, various types of section panels can be sealed using compressible gasket material disposed on each of a panel section frame. In conjunction with the frame member gasket sealing, the locations and materials of the compressible gaskets used to form seals between the various section panels and panel section frames can provide for an hermetically sealed gas enclosure assembly with little or no gas leakage. Additionally, the sealing design for all types of panels, such as inset panel 110, window panel 120 and readily-removable service window 130 of FIG. 5, can provide for durable panel sealing after repeated removal and installation of such panels that may be required as to access the interior of a gas enclosure assembly, for example, for maintenance.

Figure 10A:
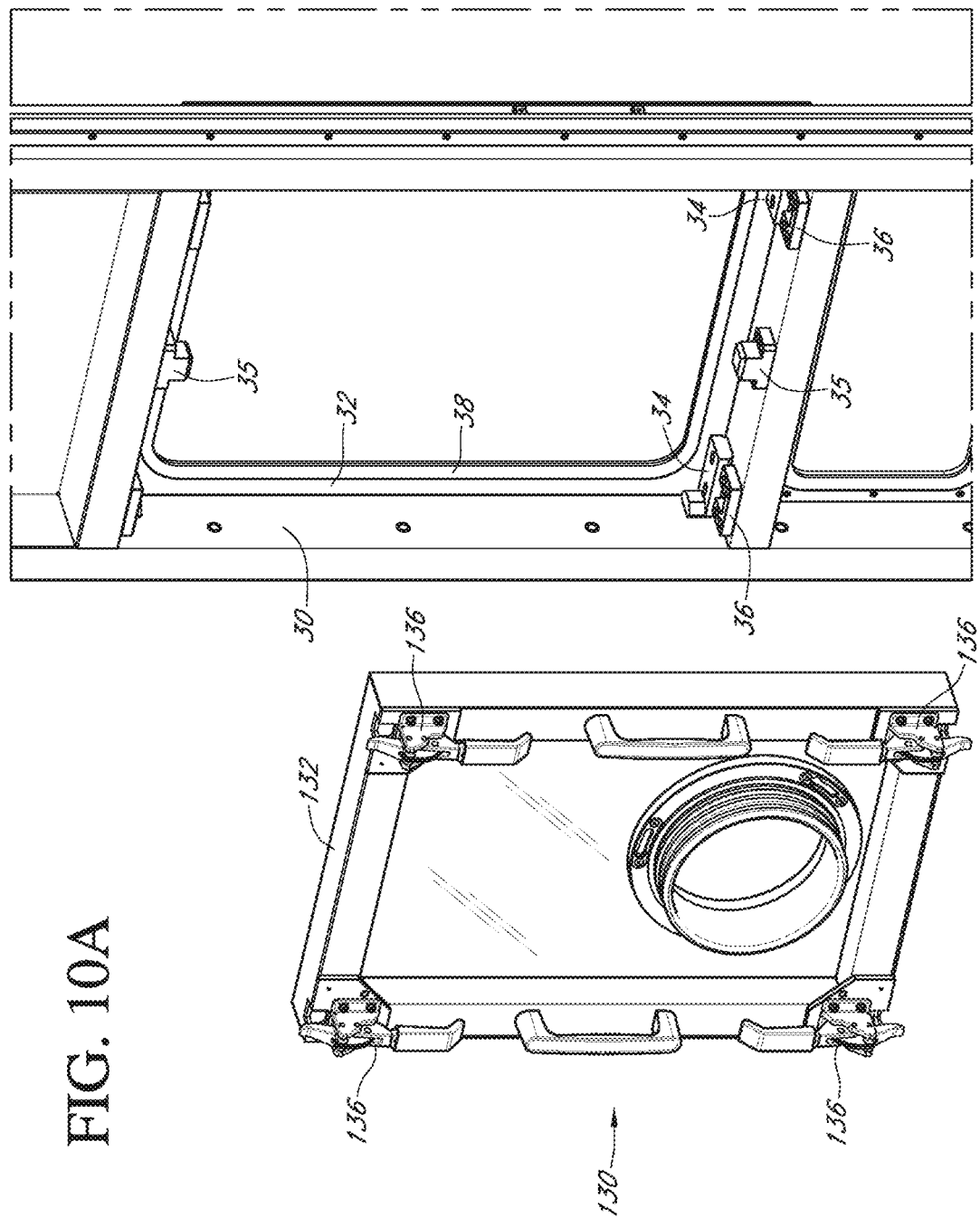
FIGS. 10A-10B are various views relating to sealing of a section panel for receiving a readily-removable service window according to various embodiments of a gas enclosure assembly of the present teachings.

For example, FIG. 10A, is an exploded view depicting service window panel section 30, and readily-removable service window 130. As previously discussed, service window panel section 30 can be fabricated for receiving readily-removable service window 130. For various embodiments of a gas enclosure assembly, a panel section, such as removable service panel section 30, can have panel section frame 32, as well as compressible gasket 38 disposed on panel section frame 32. In various embodiments, hardware related to fastening readily-removable service window 130 in removable service window panel section 30 can provide ease of installation and reinstallation to an end-user, and at the same time ensure that a gas-tight seal is maintained when readily-removable service window 130 is installed and reinstalled in panel section 30 as needed by an end-user requiring direct access to the interior of a gas enclosure assembly. Readily-removable service window 130 can include rigid window frame 132, which can be constructed from, for example, but not limited by, a metal tube material as described for constructing any of the frame members of the present teachings. Service window 130 can utilize quick-acting fastening hardware, for example, but not limited by reverse acting toggle clamp 136 in order to provide an end-user ready removal and reinstallation of service window 130. Shown in FIG. 10A is the previously mentioned gloveport hardware assembly 160 of FIGS. 7A-7B, showing a set of 3 bayonet latches 166.

Figure 10B:
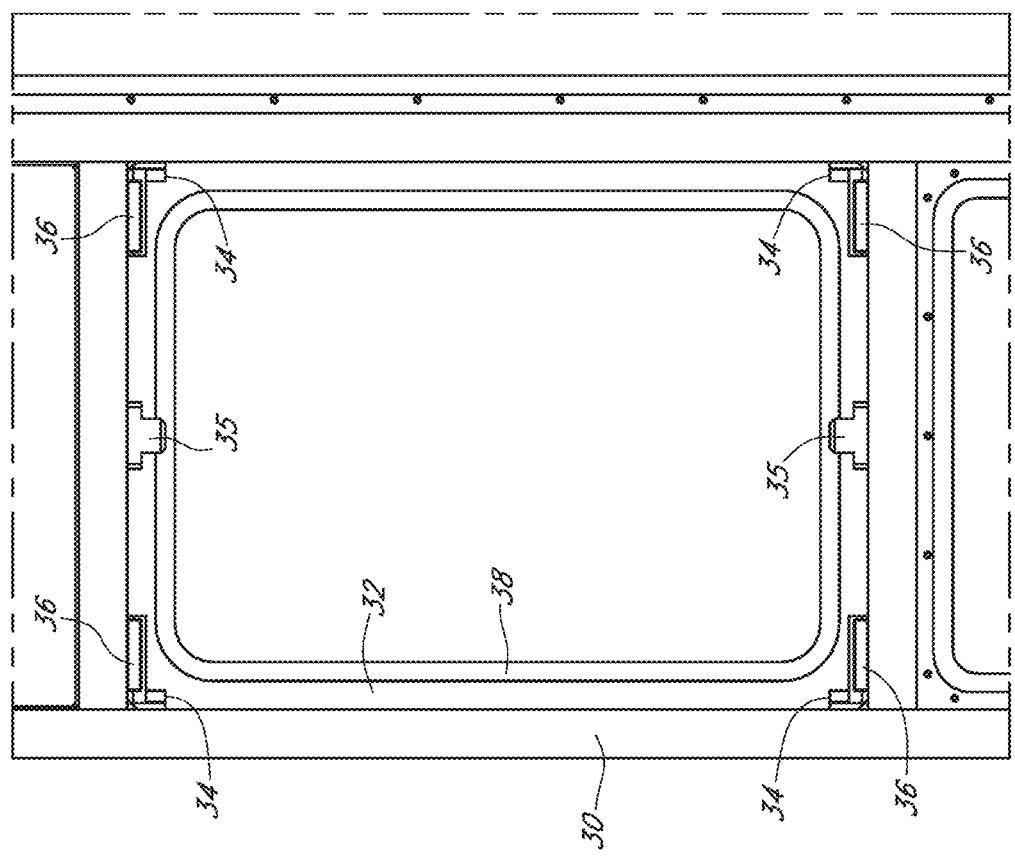

As shown in front view of removable service window panel section 30 of FIG. 10A, readily-removable service window 130 can have a set of four toggle clamps 136 secured on window frame 132. Service window 130 can be positioned into panel section frame 30 at a defined distance for insuring a proper compression force against gasket 38. Using a set of four window guide spacers 34, as shown in FIG. 10B, of which can be installed in each corner of panel section 30 for positioning service window 130 in panel section 30. A set of each of a clamping cleat 36 can be provided to receive reverse acting toggle clamp 136 of readily removable service window 136. According to various embodiments for the hermetic sealing of service window 130 through cycles of installation and removal, the combination of the mechanical strength of service window frame 132, in conjunction with the defined position of service window 130 provided by a set of window guide spacers 34 with respect to compressible gasket 38 can ensure that once service window 130 is secured in place with, for example, but not limited by, using reverse action toggle clamps 136 fastened in respective clamping cleats 36, service window frame 132 can provide an even force over panel section frame 32 with defined compression as set by a set of window guide spacers 34. The set of window guide spacers 34 are positioned so that the compression force of window 130 on gasket 38 deflects compressible gasket 38 between about 20% to about 40%. In that regard, the construction of service window 130, as well as fabrication of panel section 30 provide for a gas-tight seal of service window 130 in panel section 30. As previously discussed, window clamps 35 can be installed into panel section 30 after service window 130 is fastened into panel section 30, and removed when service window 130 needs to be removed.

Reverse acting toggle clamp 136 can be secured to a readily-removable service window frame 132 using any suitable means, as well as a combination of means. Examples of suitable securing means that can be used include at least one adhesive, for example, but not limited by an epoxy, or a cement, at least one bolt, at least one screw, at least one other fastener, at least one slot, at least one track, at least one weld, and a combination thereof. Reverse acting toggle clamp 136 can be directly connected to removable service window frame 132 or indirectly through an adaptor plate. Reverse acting toggle clamp 136, clamping cleat 36, window guide spacer 34, and window clamp 35 can be constructed of any suitable material, as well as a combination of materials. For example, one or more such elements can comprise at least one metal, at least one ceramic, at least one plastic, and a combination thereof.

In addition to sealing a readily-removable service window, gas-tight sealing can also be provided for inset panels and window panels. Other types of section panels that can be repeatedly installed and removed in panel sections include, for example, but not limited by, inset panels 110 and window panels 120, as shown in FIG. 5. As can be seen in FIG. 5, panel frame 122 of window panel 120 is constructed similarly to inset panel 110. As such, according to various embodiments of a gas enclosure assembly, the fabrication of panel sections for receiving inset panels and window panels can be the same. In that regard, the sealing of inset panels and window panel can be implemented using the same principles.

Figure 11B:
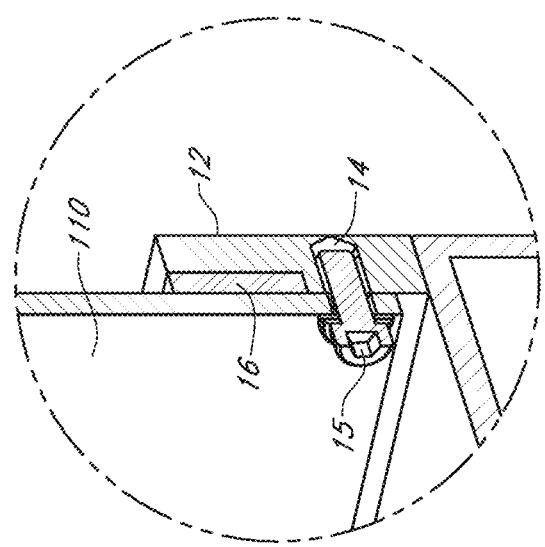
FIGS. 11A-11B are enlarged perspective section views relating to sealing of a section panel for receiving an inset panel or window panel according to various embodiments of the present teachings.
Figure 11A:
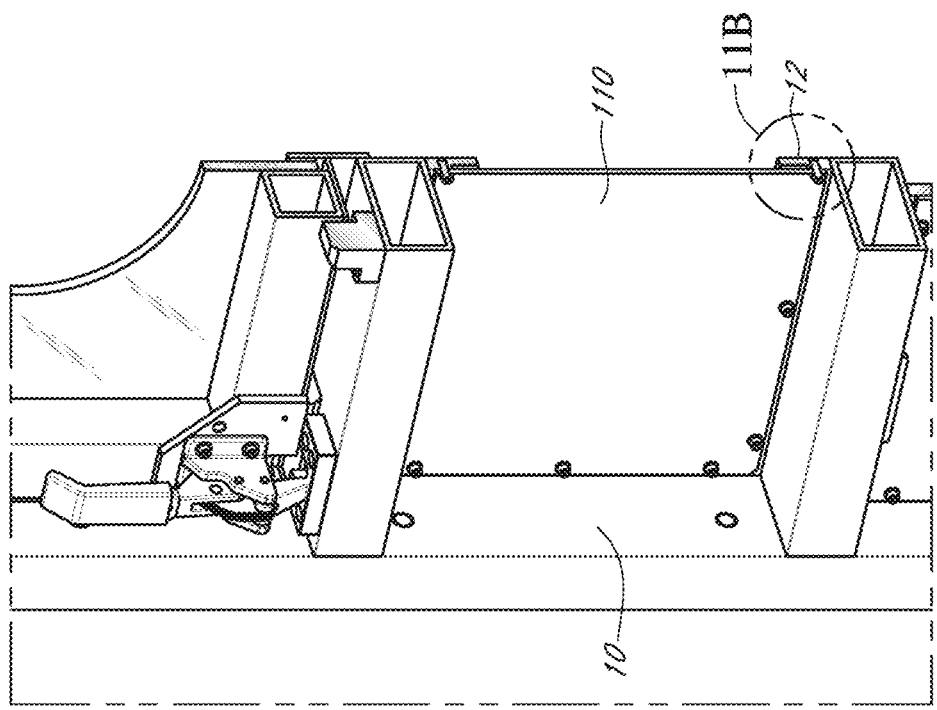

With reference to FIG. 11A and FIG. 11B, and according to various embodiments of the present teachings, any of the panels of gas enclosure, such as gas enclosure assembly 100 of FIG. 3, can include one or more inset panel sections 10, which can have frames 12 configured to receive a respective inset panel 110. FIG. 11A is a perspective view indicating an enlarged portion shown in FIG. 11B. In FIG. 11A inset panel 110 is depicted positioned with respect to inset frame 12. As can be seen in FIG. 11B, inset panel 110 is affixed to frame 12, where frame 12 can be, for example, constructed of a metal. In some embodiments, the metal can comprise aluminum, steel, copper, stainless steel, chromium, an alloy, and combinations thereof, and the like. A plurality of a blind tapped hole 14 can be made in inset panel section frame 12. Panel section frame 12 is constructed so as to comprise a gasket 16 between inset panel 110 and frame 12, in which compressible gasket 18 can be disposed. Blind tapped hole 14 can be of the M5 variety. Screw 15 can be received by blind tapped hole 14, compressing gasket 16 between inset panel 110 and frame 12. Once fastened into place against gasket 16, inset panel 110 forms a gas-tight seal within inset panel section 10. As previously discussed, such panel sealing can be implemented for a variety of section panels, including, but not limited by, inset panels 110 and window panels 120, as shown in FIG. 5.

According to various embodiments of compressible gaskets according to the present teachings, compressible gasket material for frame member sealing and panel sealing can be selected from a variety of compressible polymeric materials, for example, but not limited by, any in the class of closed-cell polymeric materials, also referred to in the art as expanded rubber materials or expanded polymer materials. Briefly, a closed-cell polymer is prepared in a fashion whereby gas is enclosed in discrete cells; where each discrete cell is enclosed by the polymeric material. Properties of compressible closed-cell polymeric gasket materials that are desirable for use in gas-tight sealing of frame and panel components include, but are not limited by, that they are robust to chemical attack over a wide range of chemical species, possess excellent moisture-barrier properties, are resilient over a broad temperature range, and they are resistant to a permanent compression set. In general, compared to open-cell-structured polymeric materials, closed-cell polymeric materials have higher dimensional stability, lower moisture absorption coefficients, and higher strength. Various types of polymeric materials from which closed-cell polymeric materials can be made include, for example, but not limited by, silicone, neoprene, ethylene-propylene-diene terpolymer (EPT); polymers and composites made using ethylene-propylene-diene-monomer (EPDM), vinyl nitrile, styrene-butadiene rubber (SBR), and various copolymers and blends thereof.

The desirable material properties of closed-cell polymers are maintained only if the cells comprising the bulk material remain intact during use. In that regard, using such material in a fashion that can exceed material specifications set for a closed-cell polymer, for example, exceeding the specification for use within a prescribed temperature or compression range, may cause degradation of a gasket seal. In various embodiments of closed-cell polymer gaskets used for sealing frame members and section panels in frame panel sections, compression of such materials should not exceed between about 50% to about 70% deflection, and for optimal performance can be between about 20% to about 40% deflection.

In addition to close-cell compressible gasket materials, another example of a class of compressible gasket material having desired attributes for use in constructing embodiments of a gas enclosure assembly according to the present teachings includes the class of hollow-extruded compressible gasket materials. Hollow-extruded gasket materials as a class of materials have the desirable attributes, including, but not limited by, that they are robust to chemical attack over a wide range of chemical species, possess excellent moisture-barrier properties, are resilient over a broad temperature range, and they are resistant to a permanent compression set. Such hollow-extruded compressible gasket materials can come in a wide variety of form factors, such as for example, but not limited by, U-cell, D-cell, square-cell, rectangular-cell, as well as any of a variety of custom form factor hollow-extruded gasket materials. Various hollow-extruded gasket materials can be fabricated from polymeric materials that are used for closed-cell compressible gasket fabrication. For example, but not limited by, various embodiments of hollow-extruded gaskets can be fabricated from silicone, neoprene, ethylene-propylene-diene terpolymer (EPT); polymers and composites made using ethylene-propylene-diene-monomer (EPDM), vinyl nitrile, styrene-butadiene rubber (SBR), and various copolymers and blends thereof. Compression of such hollow cell gasket materials should not exceed about 50% deflection in order to maintain the desired attributes.

One of ordinary skill in the art can readily understand that while the class of close-cell compressible gasket materials and the class of hollow-extruded compressible gasket materials have been given as examples, that any compressible gasket material having the desired attributes can be used for sealing structural components, such as various wall and ceiling frame members, as well as sealing various panels in panel section frames, as provided by the present teachings.

The construction of a gas enclosure assembly, such as gas enclosure assembly 100 of FIG. 3 and FIG. 4, or as will be discussed subsequently, gas enclosure assembly 1000 of FIG. 23 and FIG. 24, from a plurality of frame members can be done to minimize the risk of damage system components such as, for example, but not limited by, gasket seals, frame members, ducting, and section panels. Gasket seals, for example, are components that can be prone to damage during construction of a gas enclosure from a plurality of frame members. In accordance with various embodiments of the present teachings, materials and methods are provided for minimizing or eliminating risks of damage to various components of a gas enclosure assembly during construction of a gas enclosure according to the present teachings.

Figure 12B:
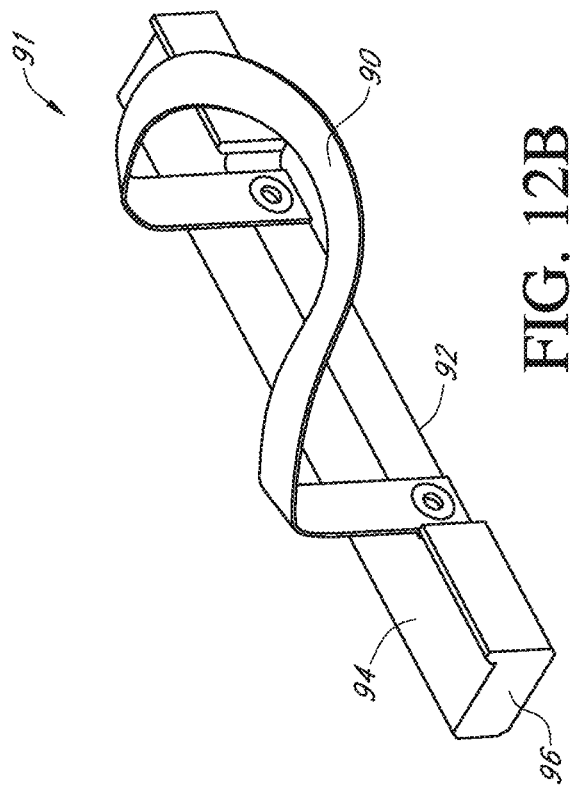
FIG. 12B is an expanded perspective view of a spacer block as indicated in FIG. 12A.
Figure 12A:
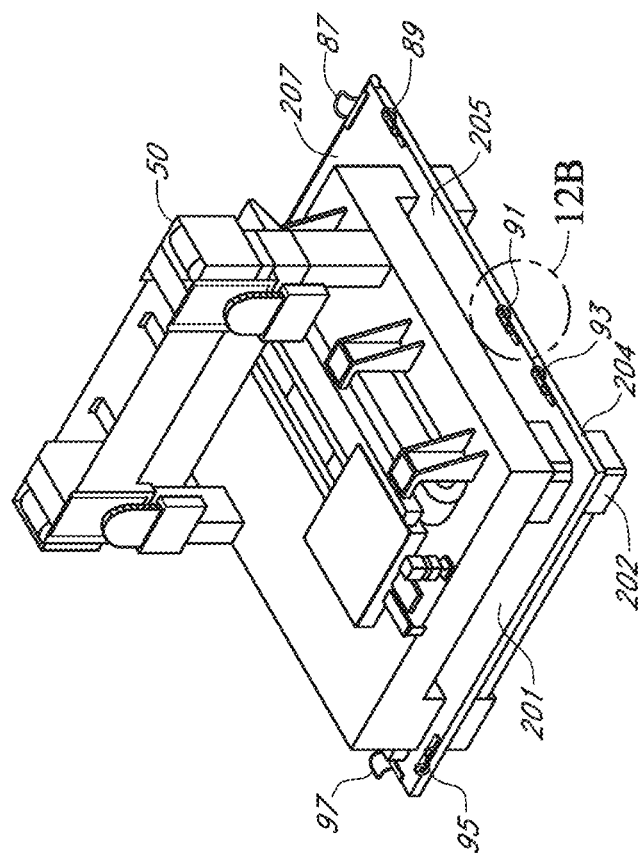
FIG. 12A is a base including a pan and a plurality of spacer blocks resting thereon in accordance with various embodiments of the present teachings.

FIG. 12A is a perspective view of an initial phase of construction of a gas enclosure assembly, such as gas enclosure assembly 100 of FIG. 3. Though a gas enclosure assembly, such as gas enclosures assembly 100 is used to exemplify construction of a gas enclosure assembly of the present teachings, one of ordinary skill can recognize that such teachings apply to various embodiments of a gas enclosure assembly. As depicted in FIG. 12A, during an initial phase of construction of a gas enclosure assembly, a plurality of spacer blocks are first placed on pan 204, which is supported by base 202. The spacer blocks can be thicker than a compressible gasket material disposed on various wall frame members that are mounted onto pan 204. A series of spacer blocks can be placed on a peripheral edge of pan 204 at locations where the various wall frame members of a gas enclosure assembly can be placed on a series of spacer blocks and into position proximal to pan 204 during assembly without contacting pan 204. It is desirable to assemble various wall frame members on pan 204 in a fashion that can protect any damage to compressible gasket material disposed on various wall frame members for the purpose of sealing with pan 204. Accordingly, the use of spacer blocks on which various wall panel components can be placed into an initial position on pan 204 prevents such damage to a compressible gasket material disposed on various wall frame members for the purpose of forming an hermetic seal with pan 204. For example, but not limited by, as shown in FIG. 12A front peripheral edge 201 can have spacers 93, 95 and 97 upon which a front wall frame member can rest, right peripheral edge 205 can have spacers 89 and 91 upon which a right wall frame member can rest and back peripheral edge 207 can have two spacers upon which back wall frame spacer can rest, of which spacer 87 is shown. Any number, type, and combination of spacer blocks can be used. One of ordinary skill in the art will understand that the spacer blocks can be positioned on pan 204 according to the present teachings, even though distinct spacer blocks are not illustrated in each of FIG. 12A-FIG. 14B.

An exemplary spacer block according to various embodiments of the present teachings for the assembly of a gas enclosure from component frame members is shown in FIG. 12B, which is a perspective view of third spacer block 91 shown in circled portion of FIG. 9A. Exemplary spacer block 91 can include a spacer block strap 90 attached to a lateral side 92 of the spacer block. The spacer blocks can be made of any suitable material, as well as a combination of materials. For example, each spacer block can comprise ultrahigh molecular weight polyethylene. Spacer block strap 90 can be made of any suitable material, as well as a combination of materials. In some embodiments, spacer block strap 90 comprises a nylon material, a polyalkylene material, or the like. Spacer block 91 has a top surface 94 and a bottom surface 96. Spacer blocks 87, 89, 93, 95, 97, and any other used can be configured in the same or a similar physical attributes and can comprise the same or a similar material. The spacer blocks can be rested, clamped or otherwise readily disposed in a fashion that allows stable placement, yet ready removal to a peripheral upper edge of pan 204.

Figure 13:
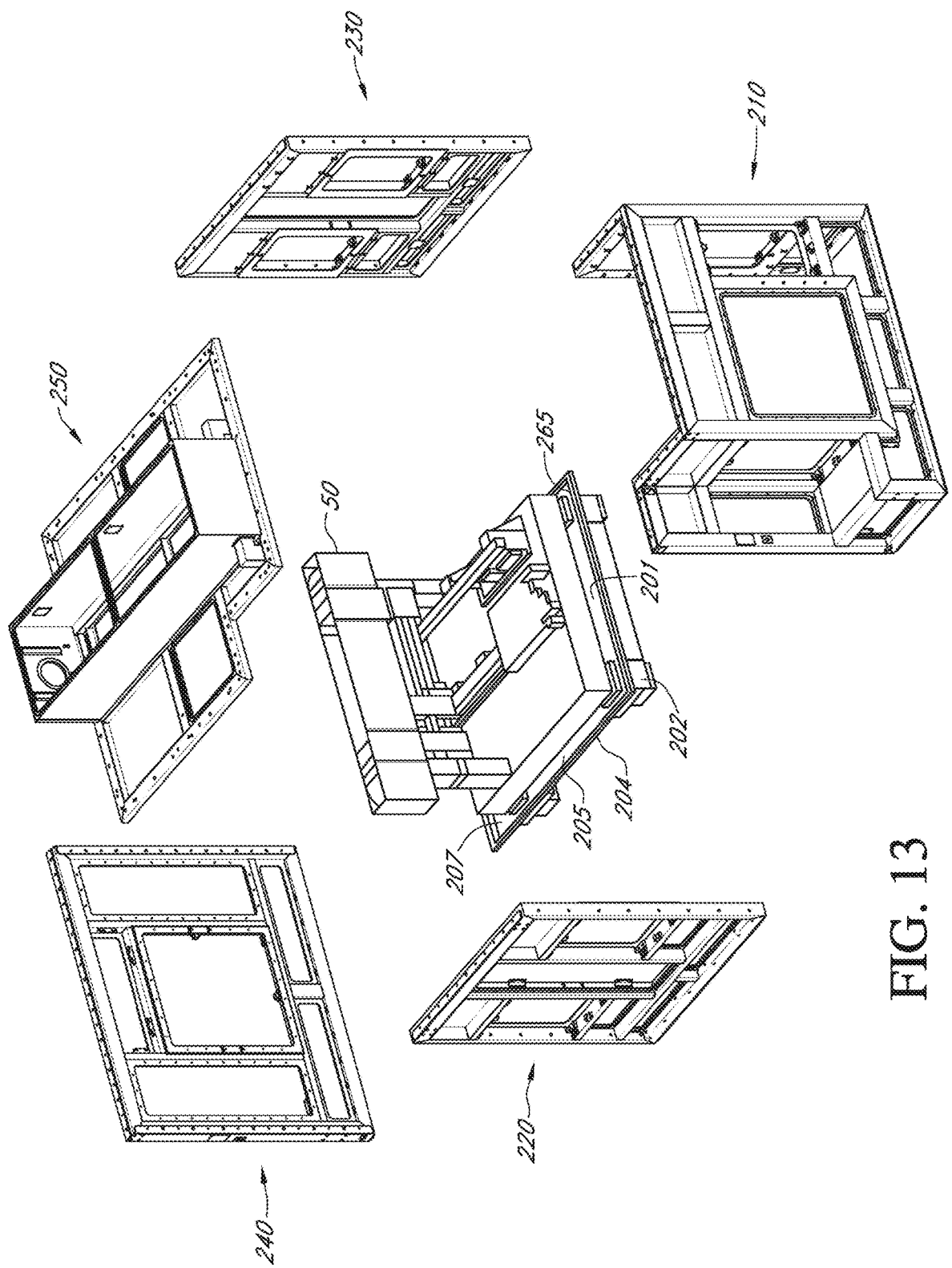
FIG. 13 is an exploded view of wall frame members and a ceiling member in relationship to a pan in accordance with various embodiments of the present teachings.

In the exploded perspective view rendered in FIG. 13, frame members can comprise a front wall frame 210, a left wall frame 220, a right wall frame 230, a rear wall frame 240, and a ceiling or top frame 250, which can be attached to pan 204, which rests on base 202. An OLED printing system 50 can mounted on top of pan 204.

An OLED printing system 50 according to various embodiments of a gas enclosure assembly and system of the present teachings, can comprise, for example, a granite base, a moveable bridge that can support an OLED printing device, one or more devices and apparatuses running from various embodiments of a pressurized inert gas recirculation system, such as a substrate floatation table, air bearings, tracks, rails, an ink-jet printer system for depositing OLED film-forming material onto substrates, including an OLED ink supply subsystem and an inkjet printhead, one or more robots, and the like. Given the variety of components that can comprise OLED printing system 50, various embodiments of OLED printing system 50 can have a variety of footprints and form factors.

AN OLED inkjet printing system can be comprised of several devices and apparatuses, which allow the reliable placement of ink drops onto specific locations on a substrate. These devices and apparatuses can include, but are not limited to, a print head assembly, ink delivery system, motion system, substrate support apparatus, such as a floatation table or chuck, substrate loading and unloading system, and print head maintenance system. A print head assembly consists of at least one ink jet head, with at least one orifice capable of ejecting droplets of ink at a controlled rate, velocity, and size. The inkjet head is fed by an ink supply system which provides ink to the inkjet head. Printing requires relative motion between the print head assembly and the substrate. This is accomplished with a motion system, typically a gantry or split axis XYZ system. Either the print head assembly can move over a stationary substrate (gantry style), or both the print head and substrate can move, in the case of a split axis configuration. In another embodiment, the print station can be fixed, and the substrate can move in the X and Y axes relative to the print heads, with Z axis motion provided either at the substrate or the print head. As the print heads move relative to the substrate, droplets of ink are ejected at the correct time to be deposited in the desired location on the substrate. The substrate is inserted and removed from the printer using a substrate loading and unloading system. Depending on the printer configuration, this can be accomplished with a mechanical conveyor, a substrate floatation table, or a robot with end effector. A print head maintenance system can be comprised of several subsystems which allow for such maintenance tasks as drop volume calibration, wiping of the inkjet nozzle surface, priming for ejecting ink into a waste basin.

According to various embodiments of the present teachings for the assembly of a gas enclosure, front or first wall frame 210, left, or second wall frame 220, right or third wall frame 230, back or forth wall frame 250, and a ceiling frame 250 as shown in FIG. 13 may be constructed together in a systematic order, and then attached to pan 204, which is mounted upon base 202. Various embodiments of a frame member can be positioned on the spacer blocks in order to prevent damage to compressible gasket material, as previously discussed, using a gantry crane. For example, using a gantry crane, front wall frame 210 can be rested on at least three spacer blocks, such as spacer blocks 93, 95 and 97 on peripheral upper edge 201 of pan 204 as shown in FIG. 12A. Following the placement of front wall frame 210 on spacer blocks, wall frame 220 and wall frame 230 may be placed, successively or sequentially in any order, on spacer blocks that have been set on peripheral edge 203 and peripheral edge 205, respectively of pan 204. According to various embodiments of the present teachings for the assembly of a gas enclosure from component frame members, front wall frame 210 can be placed on spacer blocks, followed by the placement of left wall frame 220 and right wall frame 230 on spacer blocks, so that they are in position to be bolted or otherwise fastened to front wall frame 210. In various embodiments, rear wall frame 240 can be placed on spacer blocks, so that it is in position to be bolted or fastened to left wall frame 220 and right wall frame 230. For various embodiments, once wall frame members have been secured together to form a contiguous wall frame enclosure assembly, top ceiling frame 250 can be affixed to such a wall frame enclosure assembly to form a complete gas enclosure frame assembly. In various embodiments of the present teachings for the construction of a gas enclosure assembly, a complete gas enclosure frame assembly at this stage of assembly is resting on the plurality of spacer blocks in order to protect the integrity of various frame member gaskets.

Figure 14B:
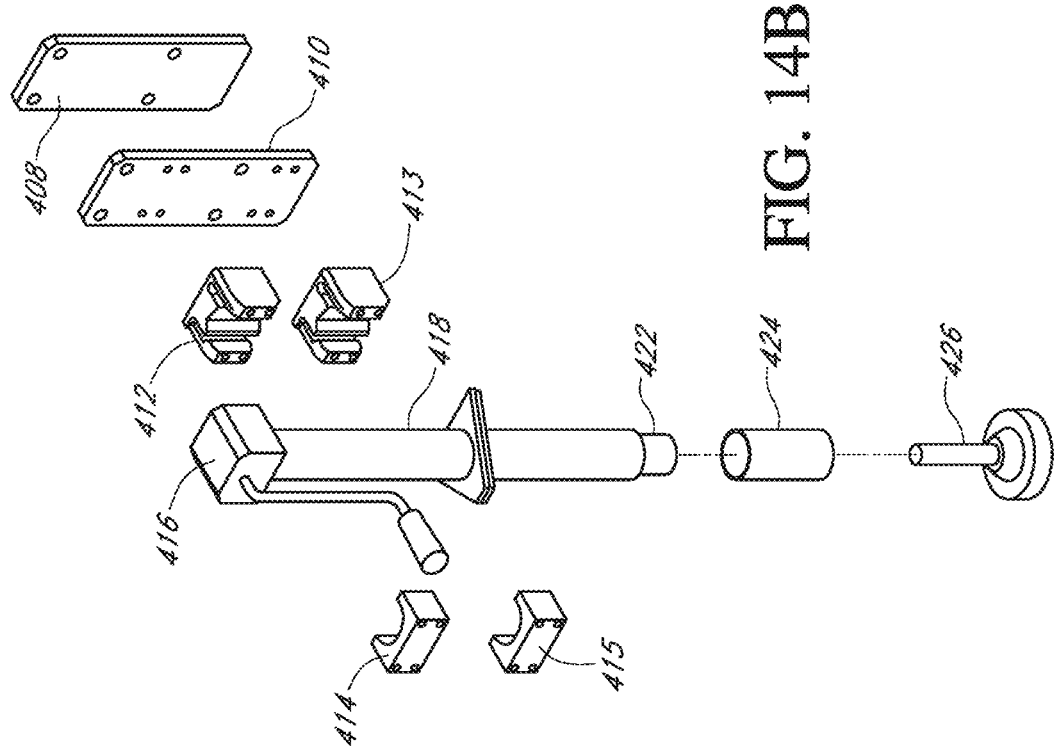
FIG. 14B is an exploded view of a lifter assembly as indicated in FIG. 14A.
Figure 14A:
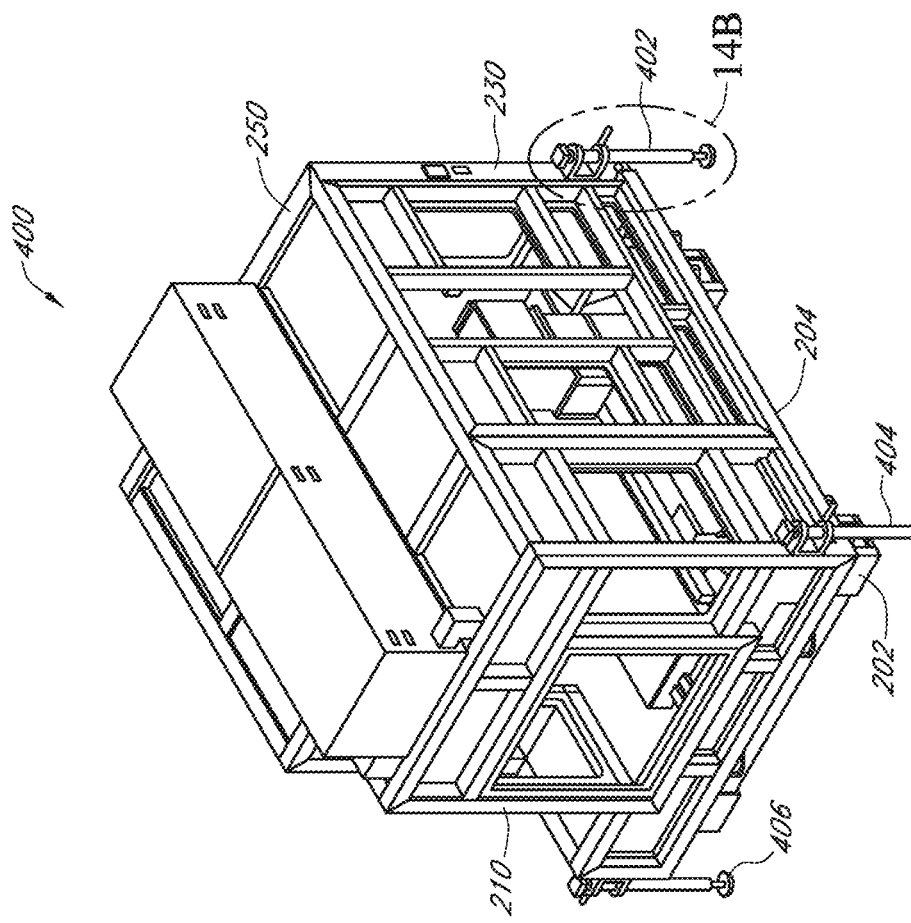
FIG. 14A is a perspective view of a stage of construction of a gas enclosure assembly with lifter assemblies in a raised position in accordance with various embodiments of the present teachings.

As shown in FIG. 14A, for various embodiments of the present teachings for the construction of a gas enclosure assembly, gas enclosure frame assembly 400 can then be positioned so that spacers can be removed in preparation for attaching gas enclosure frame assembly 400 to pan 204. FIG. 14A depicts gas enclosure frame assembly 400 raised to a position elevated from and off of the spacer blocks using lifter assembly 402, lifter assembly 404, and lifter assembly 406. In various embodiments of the present teachings, lifter assemblies 402, 404, and 406 can be attached around the perimeter of gas enclosure frame assembly 400. After the lifter assemblies are attached, a fully-constructed gas enclosure frame assembly can be lifted off of the spacer blocks by actuating each lifter assembly to elevate or extend each of the lifter assemblies, thereby elevating gas enclosure frame assembly 400. As shown in FIG. 14A, gas enclosure frame assembly 400 is shown lifted above the plurality of spacer blocks on which it had previously rested. The plurality of spacer blocks can then be removed from their resting positions on pan 204 so that the frame can then be lowered onto pan 204, and then attached to pan 204.

FIG. 14B is an exploded view of a same lifter assembly 402, according to various embodiments of a lifter assembly of the present teachings, and as depicted in FIG. 11A. As shown, lifter assembly 402 includes a scuff pad 408, a mount plate 410, a first clamp mount 412, and a second clamp mount 413. A first clamp 414 and a second clamp 415 are shown in line with respective clamp mounts 412 and 413. A jack crank 416 is attached to the top of a jack shaft 418. A trailer jack 520 is shown perpendicular and attached to jack shaft 418. A jack base 422 is shown as part of the lower end of jack shaft 418. Below jack base 422 is a foot mount 424 that is configured to receive and be connectable to the lower end of jack shaft 418. Leveling foot 426 is also shown and is configured to be received by foot mount 424. One of ordinary skill in the art can readily recognize that any means suitable for a lifting operation can be used to raise a gas enclosure frame assembly from the spacer blocks so that the spacer blocks can be removed and an intact gas enclosure assembly can be lowered onto a pan. For example, instead of one or more lifter assemblies such as 402, 404, and 406 described above, hydraulic, pneumatic, or electric lifters can be used.

According to various embodiments of the present teachings for the construction of a gas enclosure assembly, a plurality of fasteners can be provided and configured to fasten the plurality of frame members together, and then fasten a gas enclosure frame assembly to a pan. The plurality of fasteners can include one or more fastener parts disposed along each edge of each frame member at a location where the respective frame member is configured to intersect with an adjacent frame member of a plurality of frame members. The plurality of fasteners and the compressible gaskets can be configured such that, when the frame members are joined together, the compressible gaskets are disposed proximal the interior and the hardware is proximal the exterior in order that the hardware does not provide a plurality of leak paths for a gas-tight enclosure assembly of the present teachings.

The plurality of fasteners can comprise a plurality of bolts along the edge of one or more of the frame members, and the plurality of threaded holes along the edge of one or more different frame members of a plurality of frame members. The plurality of fasteners can comprise a plurality of captured bolts. The bolts can comprise bolt heads extending away from an outer surface of the respective panel. The bolts can be sunken into recesses in a frame member. Clamps, screws, rivets, adhesives, and other fasteners can be used to secure the frame members together. The bolts or other fasteners can extend through the outer wall of one or more of the frame members and into threaded holes or other complementary fastener features in a side wall or top wall of one or more adjacent frame members.

Figure 15:
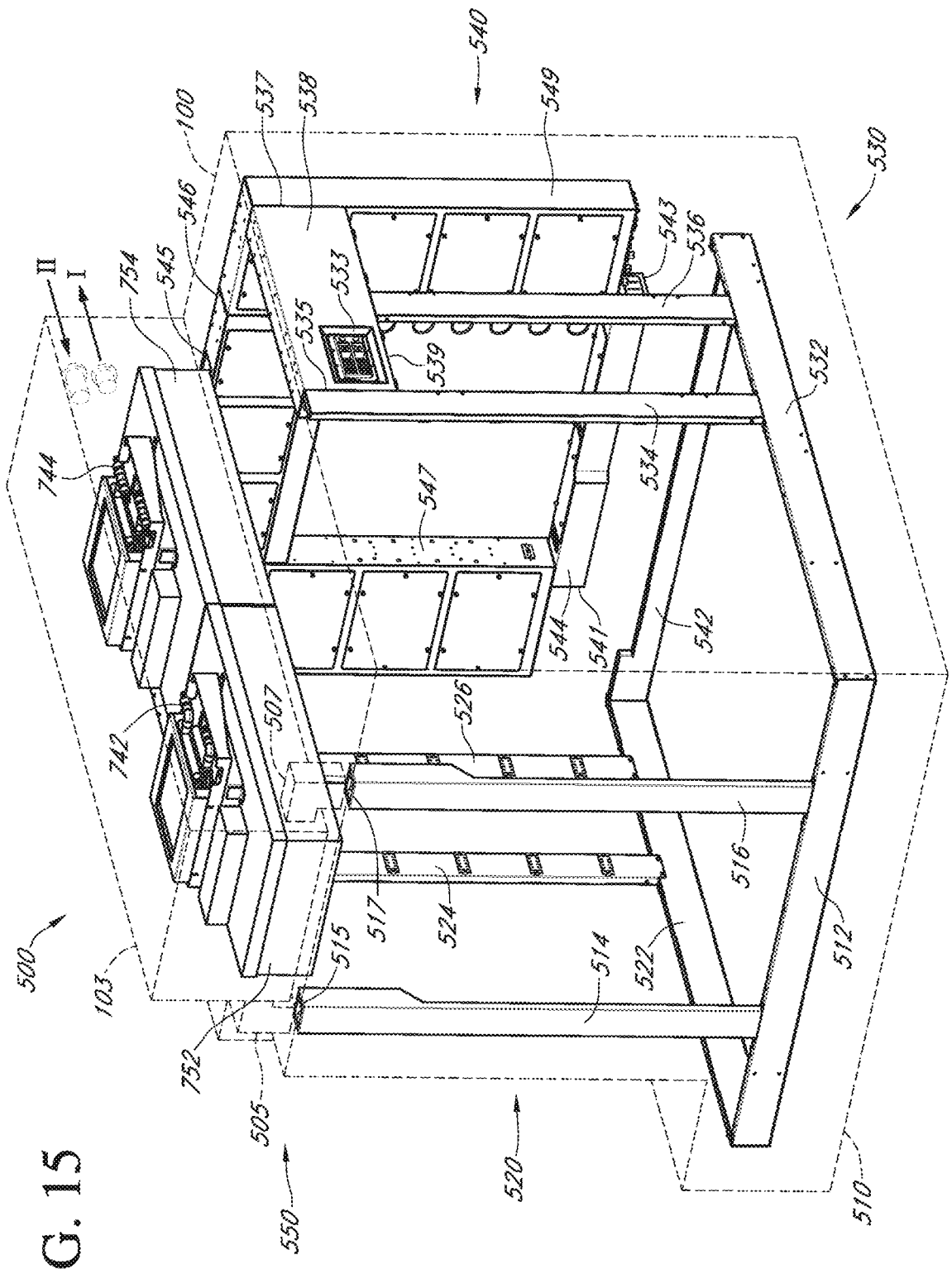
FIG. 15 is a phantom front perspective view of a gas enclosure assembly, which depicts ductwork installed in the interior of a gas enclosure assembly in accordance with various embodiments of the present teachings.
Figure 16:
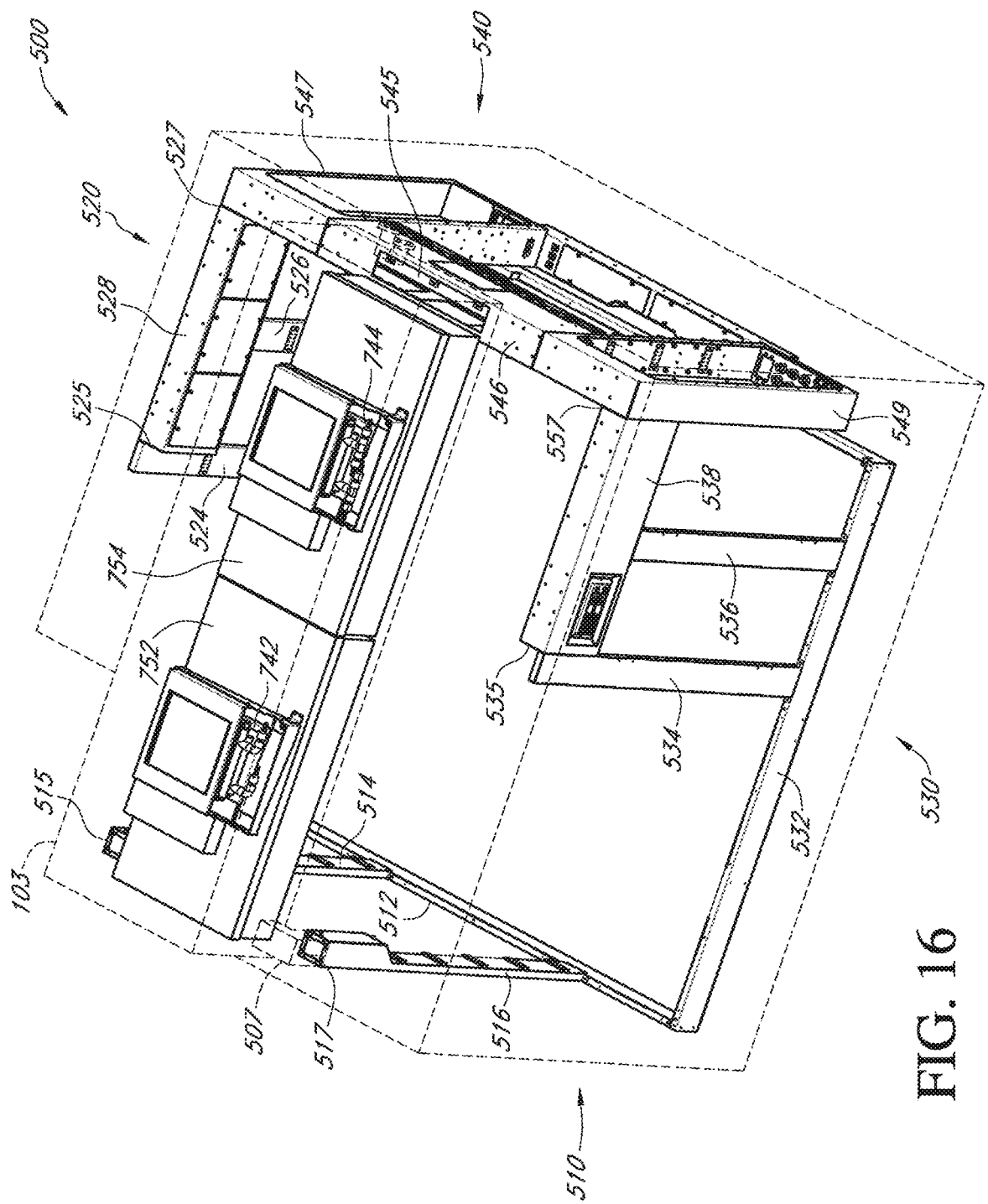
FIG. 16 is a phantom top perspective view of a gas enclosure assembly, which depicts ductwork installed in the interior of a gas enclosure assembly in accordance with various embodiments of the present teachings.
Figure 17:
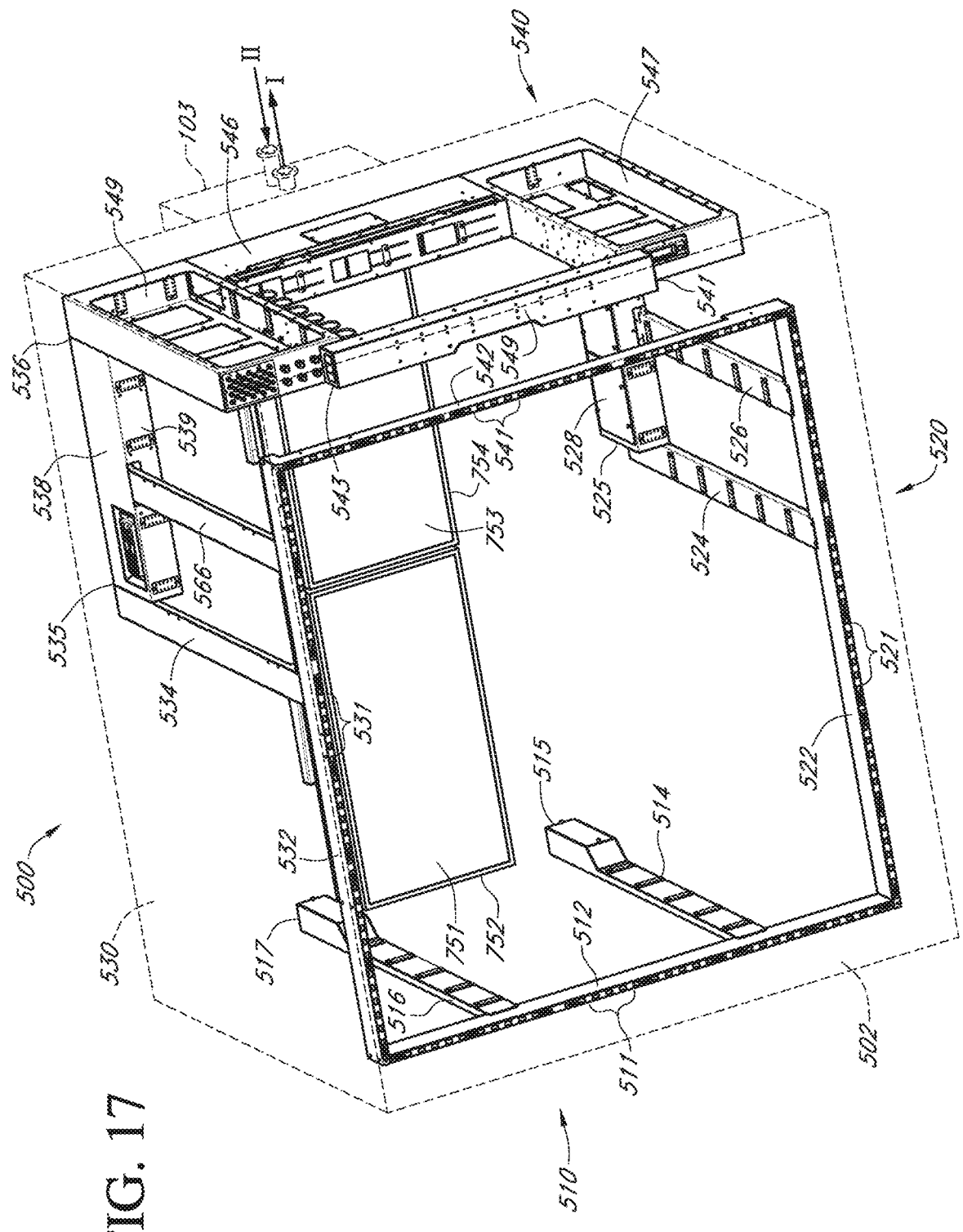
FIG. 17 is a phantom bottom perspective view of a gas enclosure assembly, which depicts ductwork installed in the interior of a gas enclosure assembly in accordance with various embodiments of the present teachings.

As depicted in FIGS. 15-17, for various embodiments of a method for the construction of a gas enclosure, ductwork can be installed in an interior portion formed by the joining of wall frame and ceiling frame members. For various embodiments of a gas enclosure assembly, ductwork may be installed during the construction process. According to various embodiments of the present teachings, ductwork may be installed within a gas enclosure frame assembly, which has been constructed from a plurality of frame members. In various embodiments, ductwork can be installed on a plurality of frame members before they are joined to form a gas enclosure frame assembly. Ductwork for various embodiments of a gas enclosure assembly and system can be configured such that substantially all gas drawn into the ductwork from one or more ductwork inlets is moved through various embodiments of a gas circulation and filtration loop for removing particulate matter internal a gas enclosure assembly. Additionally, ductwork of various embodiments of a gas enclosure assembly and system can be configured to separate the inlets and outlets of a gas purification loop external to a gas enclosure assembly from the gas circulation and filtration loop for removing particulate matter internal to a gas enclosure assembly. Various embodiments of ductwork in accordance with the present teachings can be fabricated from metal sheet, for example, but not limited by, aluminum sheet having a thickness of about 80 mil.

FIG. 15 depicts a right front phantom perspective view of ductwork assembly 500 of gas enclosure assembly 100. Enclosure ductwork assembly 500 can have front wall panel ductwork assembly 510. As shown front wall panel ductwork assembly 510 can have front wall panel inlet duct 512, first front wall panel riser 514 and second front wall panel riser 516, both of which are in fluid communication with front wall panel inlet duct 512. First front wall panel riser 514 is shown having outlet 515, which is sealably engaged with ceiling duct 505 of fan filter unit cover 103. In a similar fashion, second front wall panel riser 516 is shown having outlet 517, which is sealably engaged with ceiling duct 507 of fan filter unit cover 103. In that regard, front wall panel ductwork assembly 510 provides for circulating inert gas with a gas enclosure assembly from the bottom, utilizing front wall panel inlet duct 512, through each front wall panel riser, 514 and 516, and delivering the air through outlets 505 and 507, respectively, so that the air can be filtered by, for example, fan filter unit 752. As will be discussed in more detail subsequently, the number, size and shape of fan filter units can be selected in accordance with the physical position of a substrate in a printing system during processing. Proximal fan filter unit 752 is heat exchanger 742, which as part of a thermal regulation system, can maintain inert gas circulating through gas enclosure assembly 100 at a desired temperature.

Right wall panel ductwork assembly 530 can have right wall panel inlet duct 532, which is in fluid communication with right wall panel upper duct 538 through right wall panel first riser 534 and right wall panel second riser 536. Right wall panel upper duct 538, can have first duct inlet end 535 and second duct outlet end 537, which second duct outlet end 537 is in fluid communication with rear wall panel upper duct 536 of rear wall ductwork assembly 540. Left wall panel ductwork assembly 520 can have the same components as described for right wall panel assembly 530, of which left wall panel inlet duct 522, which is in fluid communication with left wall panel upper duct (not shown) through first left wall panel riser 524 and first left wall panel riser 524 are apparent in FIG. 15. Rear wall panel ductwork assembly 540 can have rear wall panel inlet duct 542, which is in fluid communication with left wall panel assembly 520 and right wall panel assembly 530. Additionally, rear wall panel ductwork assembly 540, can have rear wall panel bottom duct 544, which can have rear wall panel first inlet 541 and rear wall panel second inlet 543. Rear wall panel bottom duct 544 can be in fluid communication with rear wall panel upper duct 536 via first bulkhead 547 and second bulkhead 549, which bulkhead structures can be used to feed, for example, but not limited by, various bundles of cables, wires, and tubings and the like, from the exterior of gas enclosure assembly 100 into the interior. Duct opening 533 provides for moving bundles of cables, wires, and tubings and the like, out of rear wall panel upper duct 536, which can be passed through upper duct 536 via bulkhead 549. Bulkhead 547 and bulkhead 549 can be hermetically sealed on the exterior using a removable inset panel, as previously described. Rear wall panel upper duct is in fluid communication with, for example, but not limited by, fan filter unit 754 through vent 545, of which a corner is shown in FIG. 15. In that regard, left wall panel ductwork assembly 520, right wall panel ductwork assembly 530, and rear wall panel ductwork assembly 540 provide for circulating inert gas within a gas enclosure assembly from the bottom, utilizing wall panel inlet ducts 522, 532, and 542, respectively, as well as rear panel lower duct 544, which are in fluid communication with vent 545 through various risers, ducts, bulkhead passages, and the like as previously described, so that the air can be filtered by, for example, fan filter unit 754. Proximal fan filter unit 754 is heat exchanger 744, which as part of a thermal regulation system, can maintain inert gas circulating through gas enclosure assembly 100 at a desired temperature.

In FIG. 15, cable feed through opening 533 is shown. As will be discussed in more detail subsequently, various embodiments of a gas enclosure assembly of the present teachings provide for bringing bundles of cables, wires, and tubings and the like through ductwork. In order to eliminate leak paths formed around such bundles, various approaches for sealing differently sized cables, wires, and tubings in a bundle using conforming material can be used. Also shown in FIG. 15 for enclosure ductwork assembly 500 is conduit I and conduit II, which are shown as part of fan filter unit cover 103. Conduit 1 provides an outlet of inert gas to an external gas purification system, while conduit II provides a return of purified inert gas to the gas circulation and particle filtration loop internal gas enclosure assembly 100.

In FIG. 16, a top phantom perspective view of enclosure ductwork assembly 500 is shown. The symmetric nature of left wall panel ductwork assembly 520 and right wall panel ductwork assembly 530 can be seen. For right wall panel ductwork assembly 530, right wall panel inlet duct 532, is in fluid communication with right wall panel upper duct 538 through right wall panel first riser 534 and right wall panel second riser 536. Right wall panel upper duct 538, can have first duct inlet end 535 and second duct outlet end 537, which second duct outlet end 537 is in fluid communication with rear wall panel upper duct 536 of rear wall ductwork assembly 540. Similarly, left wall panel ductwork assembly 520 can have left wall panel inlet duct 522, which is in fluid communication with left wall panel upper duct 528 through left wall panel first riser 524 and left wall panel second riser 526. Left wall panel upper duct 528, can have first duct inlet end 525 and second duct outlet end 527, which second duct outlet end 527 is in fluid communication with rear wall panel upper duct 536 of rear wall ductwork assembly 540. Additionally, rear wall panel ductwork assembly can have rear wall panel inlet duct 542, which is in fluid communication with left wall panel assembly 520 and right wall panel assembly 530. Additionally, rear wall panel ductwork assembly 540, can have rear wall panel bottom duct 544, which can have rear wall panel first inlet 541 and rear wall panel second inlet 543. Rear wall panel bottom duct 544 can be in fluid communication with rear wall panel upper duct 536 via first bulkhead 547 and second bulkhead 549. Ductwork assembly 500 as shown in FIG. 15 and FIG. 16 can provide effective circulation of inert gas from front wall panel ductwork assembly 510, which circulates inert gas from front wall panel inlet duct 512 to ceiling panel ducts 505 and 507 via front wall panel outlets 515 and 517, respectively, as well as from left wall panel assembly 520, right wall panel assembly 530 and rear wall panel ductwork assembly 540, which circulate air from inlet ducts 522, 532, and 542, respectively to vent 545. Once inert gas is exhausted via ceiling panel ducts 505 and 507 and vent 545 into the enclosure area under fan filter unit cover 103 of enclosure 100, the inert gas so exhausted can be filtered through fan filter units 752 and 754. Additionally, the circulated inert gas can be maintained at a desired temperature by heat exchangers 742 and 744, which are part of a thermal regulation system.

FIG. 17 is a bottom phantom view of enclosure ductwork assembly 500. Inlet ductwork assembly 502 includes front wall panel inlet duct 512, left wall panel inlet duct 522, right wall panel inlet duct 532, and rear wall panel inlet duct 542, which are in fluid communication with one another. For each inlet duct included in inlet ductwork assembly 502, there are apparent openings evenly distributed across the bottom of each duct, sets of which are specifically highlighted for the purpose of the present teachings, as openings 511 of front wall panel inlet duct 512, openings 521 of left wall panel inlet duct 522, openings 531 of right wall panel inlet duct 532, and openings 541 of right wall panel inlet duct 542. Such openings, as are apparent across the bottom of each inlet duct, provide for effective uptake of inert gas within enclosure 100 for continual circulation and filtration. The continual circulation and filtration of inert gas various embodiments of a gas enclosure assembly provide for maintaining a substantially particle-free environment within various embodiments of a gas enclosure assembly system. Various embodiments of a gas enclosure assembly system can be maintained at ISO 14644 Class 4 for particulate matter. Various embodiments of a gas enclosure assembly system can be maintained at ISO 14644 Class 3 specifications for processes that are particularly sensitive to particle contamination. As previously discussed, conduit I provides an outlet of inert gas to an external gas purification system, while conduit II provides a return of purified inert gas to the filtration and circulation loop internal to gas enclosure assembly 100.

In various embodiments of a gas enclosure assembly and system according to the present teachings, bundles of cables, wires, and tubings and the like, can be operatively associated with an electrical system, a mechanical system, a fluidic system, and a cooling system disposed within the interior of a gas enclosure assembly and system, for example, for the operation of an OLED printing system. Such bundles can be fed through ducting in order to purge reactive atmospheric gases, such as water vapor and oxygen, which are occluded in dead spaces of bundles of cables, wires, and tubings and the like. Dead spaces formed within bundles of cables, wires, and tubings have been found, according to the present teachings, to create reservoirs of occluded reactive species that can significantly prolong the time it can take to bring a gas enclosure assembly within the specifications for performing an air-sensitive process. For various embodiments of a gas enclosure assembly and system of the present teachings useful for printing OLED devices, each species of various reactive species, including various reactive atmospheric gases, such as water vapor and oxygen, as well as organic solvent vapors can be maintained at 100 ppm or lower, for example, at 10 ppm or lower, at 1.0 ppm or lower, or at 0.1 ppm or lower.

Figure 18B:
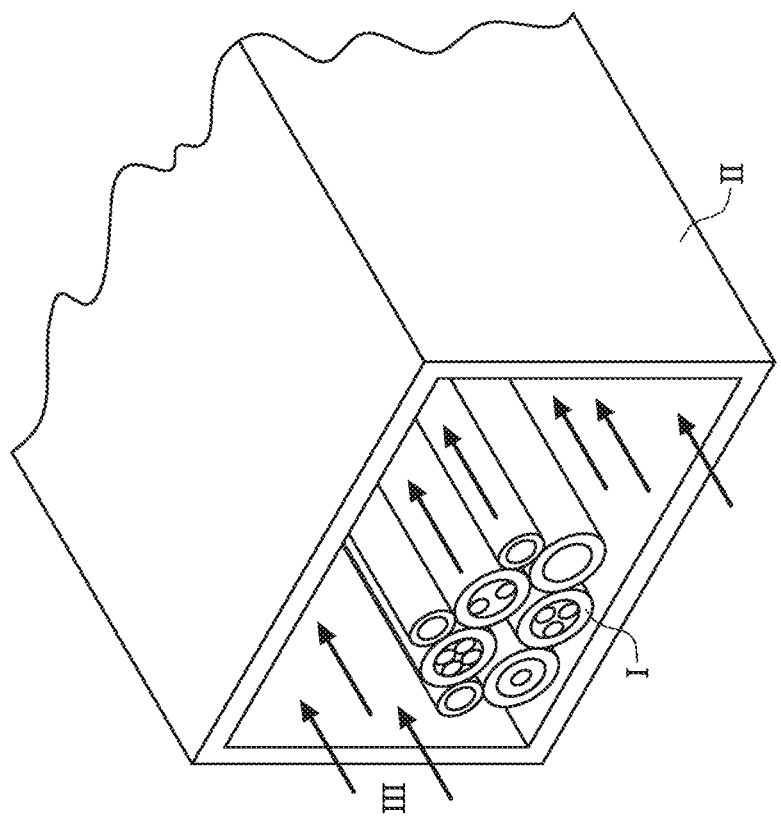
FIG. 18B depicts gas sweeping past such bundles that are fed through various embodiments of ductwork according to the present teachings.
Figure 18A:
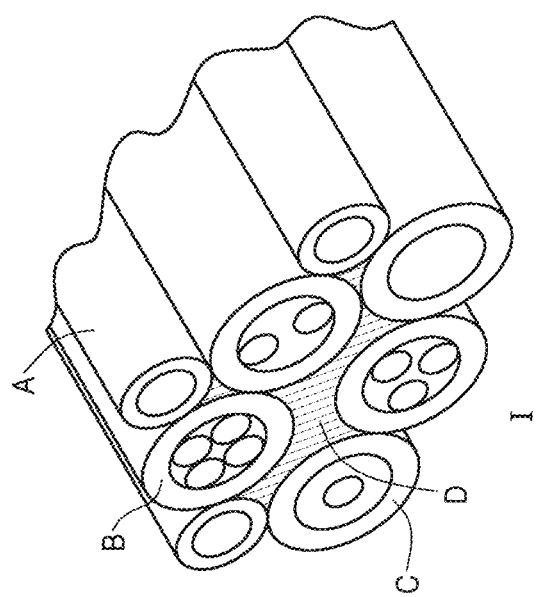
Figure 19:
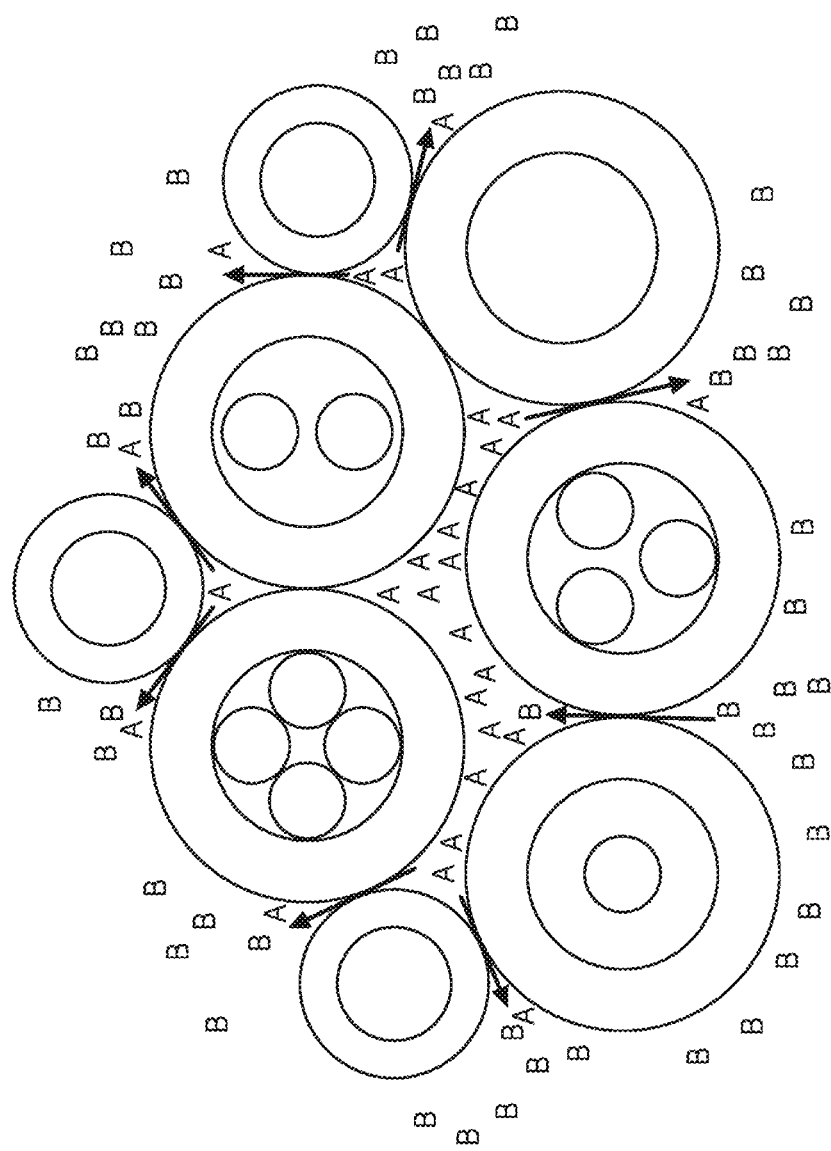
FIG. 19 is a schematic representation showing how reactive species (A) occluded in dead-spaces of bundles of cables, wires, and tubings and the like are actively purged from inert gas (B) sweeping through a duct through which the bundles have been routed.

To understand how cabling fed through ducting can result in decreasing the time it takes to purge occluded reactive atmospheric gases from dead volumes in bundled cables, wires, and tubings and the like, reference is made to FIGS. 18A-19. FIG. 18A depicts an expanded view of bundle I, which can be a bundle that can include tubing, such as tubing A for delivering various inks, solvents and the like, to a printing system, such as printing system 50 of FIG. 13. Bundle 1 of FIG. 18A can additionally include electrical wiring, such as electrical wire B or cabling, such as coaxial cable C. Such tubings, wires and cables can be bundled together and routed from the exterior to the interior to be connected to various devices and apparatuses comprising an OLED printing system. As seen in the hatched area of FIG. 18A, such bundles can create an appreciable dead space D. In the schematic perspective view of FIG. 18B, when cable, wire, and tubing bundle I is fed through duct II, inert gas III can continuously sweep past the bundle. The expanded section view of FIG. 19 depicts how effectively inert gas continuously sweeping past bundled tubings, wires and cables can increase the rate of removal of occluded reactive species from dead volume formed in such bundles. The rate of diffusion of a reactive species A out of a dead volume, indicated in FIG. 19 by the collective area occupied by species A, is inversely proportional to the concentration of the reactive species outside of the dead volume, indicated in FIG. 19 by the collective area occupied by inert gas species B. That is, if the concentration of a reactive species is high in a volume just outside the dead volume, then the rate of diffusion is decreased. If a reactive species concentration in such an area is continuously decreased from the volume just outside dead volume space by a flow stream of inert gas, then by mass action, the rate at which the reactive species diffuses from the dead volume is increased. Additionally, by the same principle, inert gas can diffuse into the dead volume as occluded reactive species are effectively removed out of those spaces.

Figure 20A:
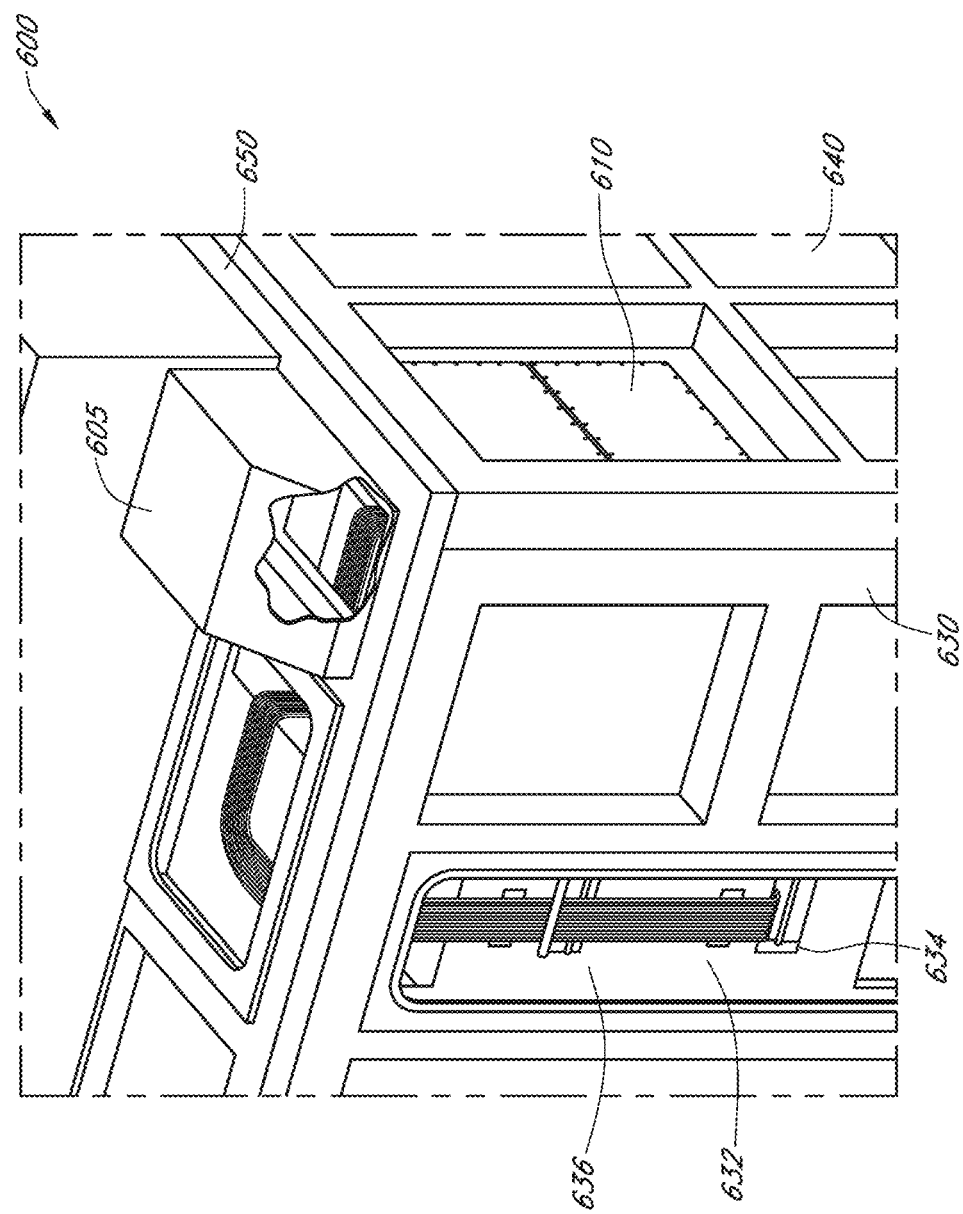
FIG. 20A is a phantom perspective view of cables and tubing routed through ducting according to various embodiments of a gas enclosure assembly and system of the present teachings.
Figure 20B:
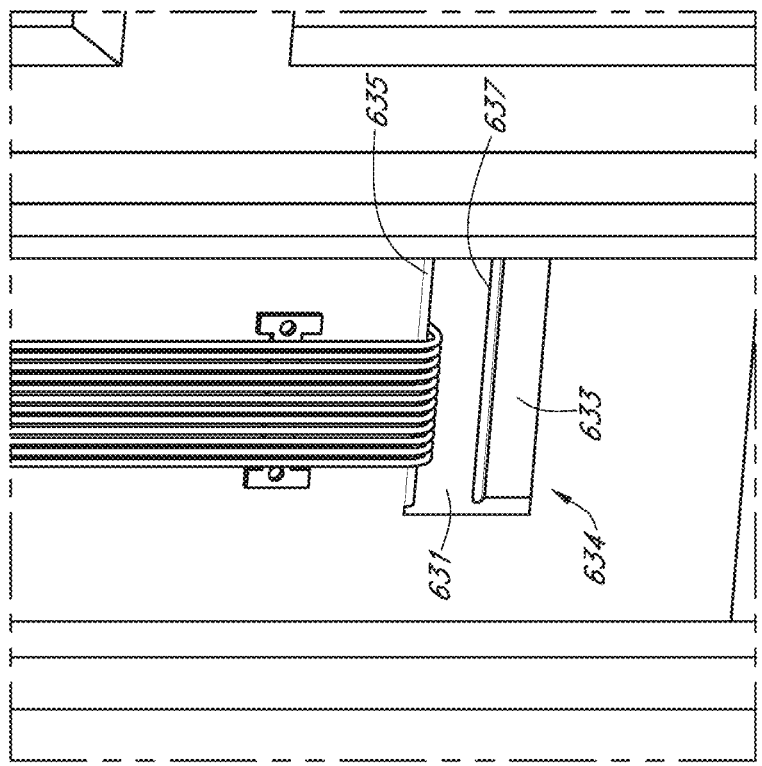
FIG. 20B is an enlarged view of an opening shown in FIG. 20A, showing detail of a cover for closure over the opening, according to various embodiments of a gas enclosure assembly of the present teachings.

FIG. 20A is a perspective view of a rear corner of various embodiments of gas enclosure assembly 600, with a phantom view through return duct 605 into the interior of gas enclosure assembly 600. For various embodiments of gas enclosure assembly 600, rear wall panel 640 can have inset panel 610, which is configured to provide access to, for example, an electrical bulkhead. A bundle of cables, wires, and tubings and the like can be fed through a bulkhead into a cable routing duct, such as duct 632 shown in right wall panel 630, for which a removable inset panel has been removed to reveal a bundle routed into a first cable, wire, and tubing bundle duct entry 636. From there, the bundle can be fed into the interior of gas enclosure assembly 600, and is shown in the phantom view through return duct 605 in the interior of gas enclosure assembly 600. Various embodiments of a gas enclosure assembly for cable, wire, and tubing bundle routing can have more than one cable, wire, and tubing bundle entry, such as shown in FIG. 20A, which depicts a first bundle duct entry 634 and a second bundle duct entry 636, for still another bundle. FIG. 20B depicts an expanded view of bundle duct entry 634 for a cable, wire, and tubing bundle. Bundle duct entry 634 can have opening 631, which is designed to form a seal with sliding cover 633. In various embodiments, opening 631 can accommodate a flexible sealing module, such as those provided by Roxtec Company for cable entry seals, which can accommodate various diameters of cable, wire, and tubing and the like in a bundle. Alternatively, top 635 of sliding cover 633 and upper portion 637 of opening 631 may have a conforming material disposed on each surface, so that the conforming material can form a seal around various-sized diameters of cable, wire, and tubing and the like in a bundle fed through an entry, such as bundle duct entry 634.

Figure 21:
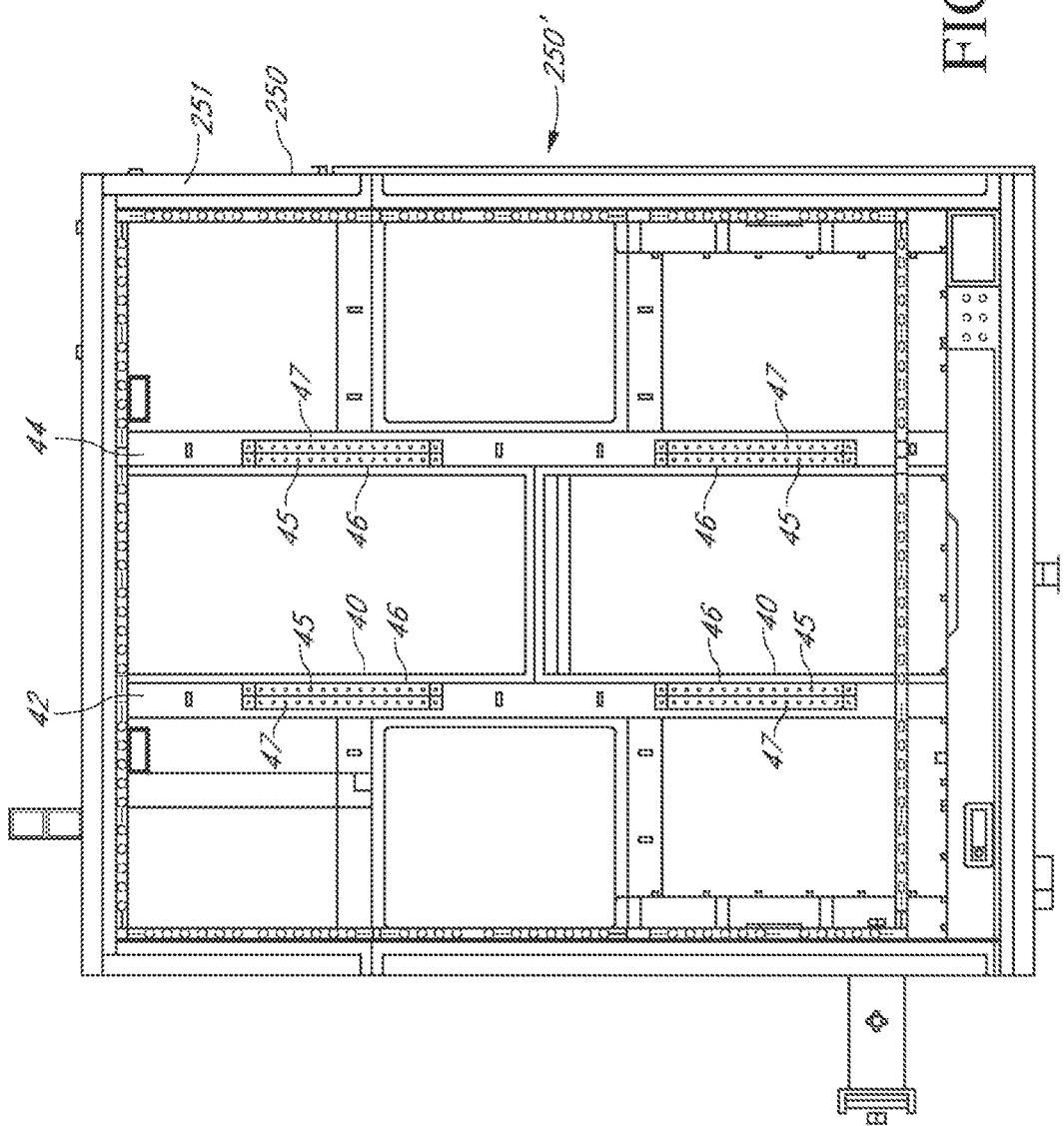
FIG. 21 is a view of a ceiling including a lighting system for a gas enclosure assembly and system in accordance with various embodiments of the present teachings.

FIG. 21 is a bottom view of various embodiments of a ceiling panel of the present teaching, for example, such as ceiling panel 250' of gas enclosure assembly and system 100 of FIG. 3. According to various embodiments of the present teachings for the assembly of a gas enclosure, lighting can be installed on the interior top surface of a ceiling panel, such as ceiling panel 250' of gas enclosure assembly and system 100 of FIG. 3. As depicted in FIG. 21, ceiling frame 250, having interior portion 251, can have lighting installed on the interior portion of various frame members. For example, ceiling frame 250 can have two ceiling frame sections 40, which have in common two ceiling frame beams 42 and 44. Each ceiling frame section 40 can have a first side 41, positioned towards the interior of ceiling frame 250, and a second side 43, positioned towards the exterior of ceiling frame 250. For various embodiments according to the present teaching of providing lighting for a gas enclosure, pairs of lighting elements 46 can be installed. Each pair of lighting elements 46 can include a first lighting element 45, proximal to first side 41 and second lighting element 47 proximal to second side 43 of a ceiling frame section 40. The number, positioning, and grouping of lighting elements shown in FIG. 21 are exemplary. The number and grouping of lighting elements can be varied in any desired or suitable manner. In various embodiments, the lighting elements can be mounted flat, while in other embodiments that can be mounted so that they can be moved to a variety of positions and angles. The placement of lighting elements is not limited to the top panel ceiling 433 but can located, in addition or in the alternative, on any other interior surface, exterior surface, and combination of surfaces of gas enclosure assembly and system 100 shown in FIG. 3.

Figure 22:
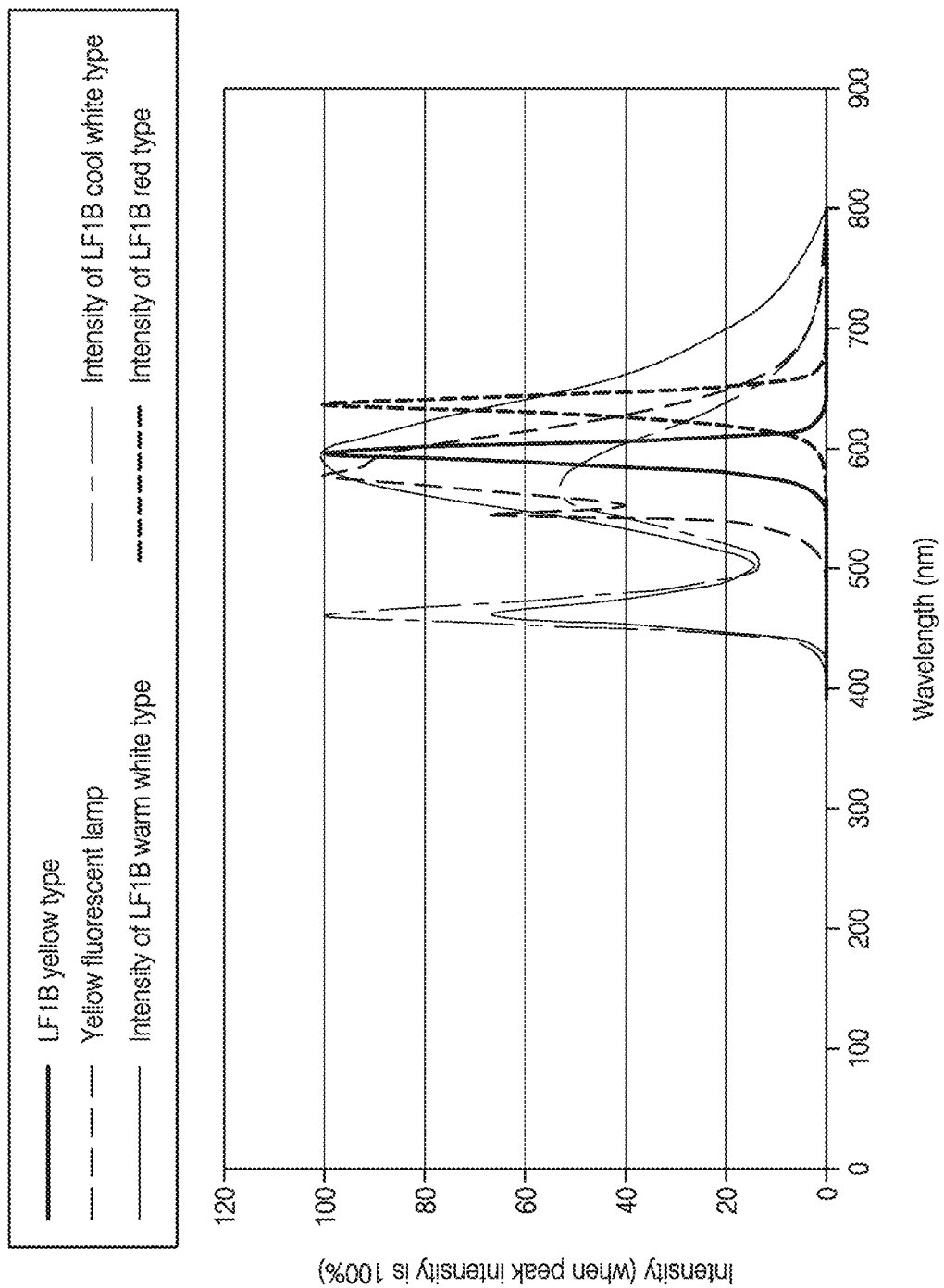
FIG. 22 is a graph depicting a LED light spectrum of a lighting system for a gas enclosure assembly and system components in accordance with various embodiments of the present teachings.

The various lighting elements can comprise any number, type, or combination of lights, for example, halogen lights, white lights, incandescent lights, arc lamps, or light emitting diodes or devices (LEDs). For example, each lighting element can comprise from 1 LED to about 100 LEDs, from about 10 LEDs to about 50 LEDs, or greater than 100 LEDs. LED or other lighting devices can emit any color or combination of colors in the color spectrum, outside the color spectrum, or a combination thereof. According to various embodiments of a gas enclosure assembly used for inkjet printing of OLED materials, as some materials are sensitive to some wavelengths of light, a wavelength of light for lighting devices installed in a gas enclosure assembly can be specifically selected to avoid material degradation during processing. For example, a 4× cool white LED can be used as can a 4× yellow LED or any combination thereof. An example of a 4× cool white LED is an LF1B-D4S-2THWW4 available from IDEC Corporation of Sunnyvale, California. An example of a 4× yellow LED that can be used is an LF1B-D4S-2SHY6 also available from IDEC Corporation. LEDs or other lighting elements can be positioned or hung from any position on interior portion 251 of ceiling frame 250 or on another surface of a gas enclosure assembly. Lighting elements are not limited to LEDs. Any suitable lighting element or combination of lighting elements can be used. FIG. 22 is a graph of an IDEC LED light spectra and shows the x-axis corresponding to intensity when peak intensity is 100% and the y-axis corresponding to wavelength in nanometers. Spectra for LF1B yellow type, a yellow fluorescent lamp, a LF1B white type LED, a LF1B cool white type LED, and an LF1B red type LED are shown. Other light spectra and combinations of light spectra can be used in accordance with various embodiments of the present teachings.

Recalling, various embodiments of a gas enclosure assembly be constructed in a fashion minimizes the internal volume of a gas enclosure assembly, and at the same time optimizes the working space to accommodate various footprints of various OLED printing systems. Various embodiments of a gas enclosure assembly so constructed additionally provide ready access to the interior of a gas enclosure assembly from the exterior during processing and readily access to the interior for maintenance, while minimizing downtime. In that regard, various embodiments of a gas enclosure assembly according to the present teachings can be contoured with respect to various footprints of various OLED printing systems.

One of ordinary skill may appreciate that the present teachings for frame member construction, panel construction, frame and panel sealing, as well as construction of a gas enclosure assembly, such as gas enclosure assembly 100 of FIG. 3, can be applied to a gas enclosure assembly of a variety of sizes and designs. For example, but not limited by, various embodiments of a contoured gas enclosure assembly of the present teachings covering substrate sizes from Gen 3.5 to Gen 10 can have an internal volume of between about 6 m$^3$ to about 95 m$^3$, which can be between about 30% to about 70% savings in volume for an enclosure not contoured and having comparative gross dimensions. Various embodiments of a gas enclosure assembly can have various frame members that are constructed to provide contour for a gas enclosure assembly, in order to accommodate an OLED printing system for its function and at the same time optimize the working space to minimize inert gas volume, and also allow ready access to an OLED printing system from the exterior during processing. In that regard, various gas enclosure assemblies of the present teachings can vary in contoured topology and volume.

Figure 23:
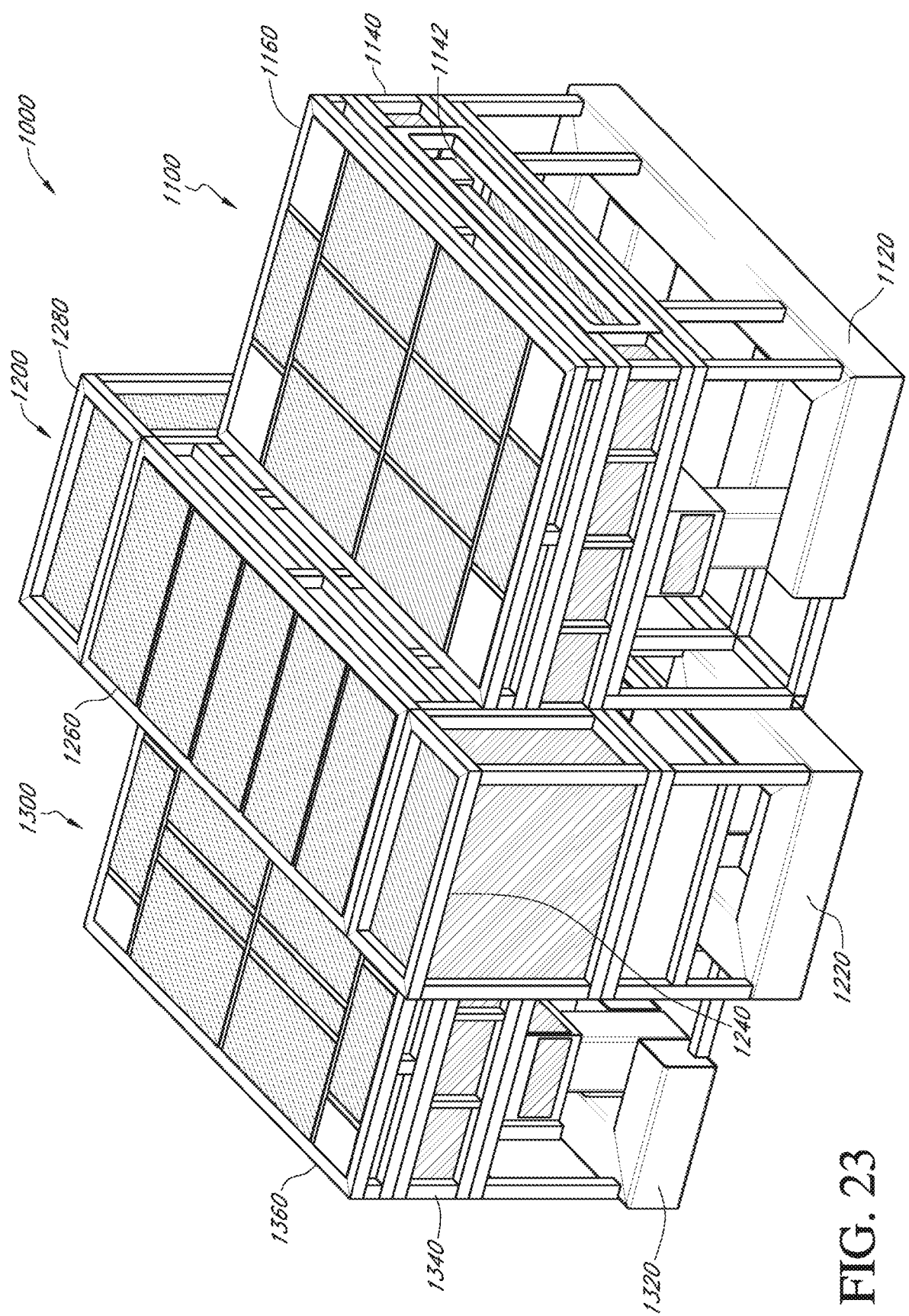
FIG. 23 is a front perspective view of view of a gas enclosure assembly in accordance with various embodiments of the present teachings.

FIG. 23 provides an example of a gas enclosure assembly according to the present teachings. Gas enclosure assembly 1000 can include front frame assembly 1100, middle frame assembly 1200, and rear frame assembly 1300. Front frame assembly 1100 can include front base frame 1120, front wall frame 1140, which can have opening 1142 for receiving a substrate, and front ceiling frame 1160. Middle frame assembly 1200 can include first middle enclosure frame assembly 1240, middle wall and ceiling frame assembly 1260 and second middle enclosure frame assembly 1280. Rear frame assembly 1300 can include rear base frame 1320, rear wall frame 1340, and rear ceiling frame 1360. The areas shown in hatching depict the available working volume of gas assembly 1000, which is the volume that is available to accommodate an OLED printing system. Various embodiments of gas enclosure assembly 1000 are contoured so as to minimize the volume of recirculated inert gas required to operate an air-sensitive process, such as an OLED printing process, and at the same time allow ready access to an OLED printing system; either remotely during operation or directly by easy access through readily-removable panels. Various embodiments of a contoured gas enclosure assembly according to the present teachings can have a gas enclosure volume of between about 6 $m^3$ to about 95 $m^3$ for various embodiments of a gas enclosure assembly of the present teachings covering substrate sizes from Gen 3.5 to Gen 10 m, and of for example, but not limited by, of between about 15 $m^3$ to about 30 $m^3$, which might be useful for OLED printing of, for example, Gen 5.5 to Gen 8.5 substrate sizes.

Gas enclosure assembly 1000 can have all the features recited in the present teachings for exemplary gas enclosure assembly 100. For example, but not limited by, gas enclosure assembly 1000 can utilize the sealing according to the present teachings that provide an hermetic-sealed enclosure through cycles of construction and deconstruction. Various embodiments of a gas enclosure system based on gas enclosure assembly 1000 can have a gas purification system that can maintain levels for each species of various reactive species, including various reactive atmospheric gases, such as water vapor and oxygen, as well as organic solvent vapors at 100 ppm or lower, for example, at 10 ppm or lower, at 1.0 ppm or lower, or at 0.1 ppm or lower.

Further, various embodiments of a gas enclosure assembly and system based on gas enclosure assembly 1000 can have a circulation and filtration system that can provide a particle-free environment meeting ISO 14644 Class 3 and Class 4 clean room standards. Additionally, as will be discussed in more detail subsequently, a gas enclosure assembly system based on a gas enclosure assembly of the present teachings, such as gas enclosure assembly 100 and gas enclosure assembly 1000, can have a various embodiments of a pressurized inert gas recirculation system, which can be used to operate, for example, but not limited by, one or more of a pneumatic robot, a substrate floatation table, an air bearing, an air bushing, a compressed gas tool, a pneumatic actuator, and combinations thereof. For various embodiments of a gas enclosure and system of the present teachings, the use of various pneumatically operated devices and apparatuses can be provide low-particle generating performance, as well as being low maintenance.

Figure 24:
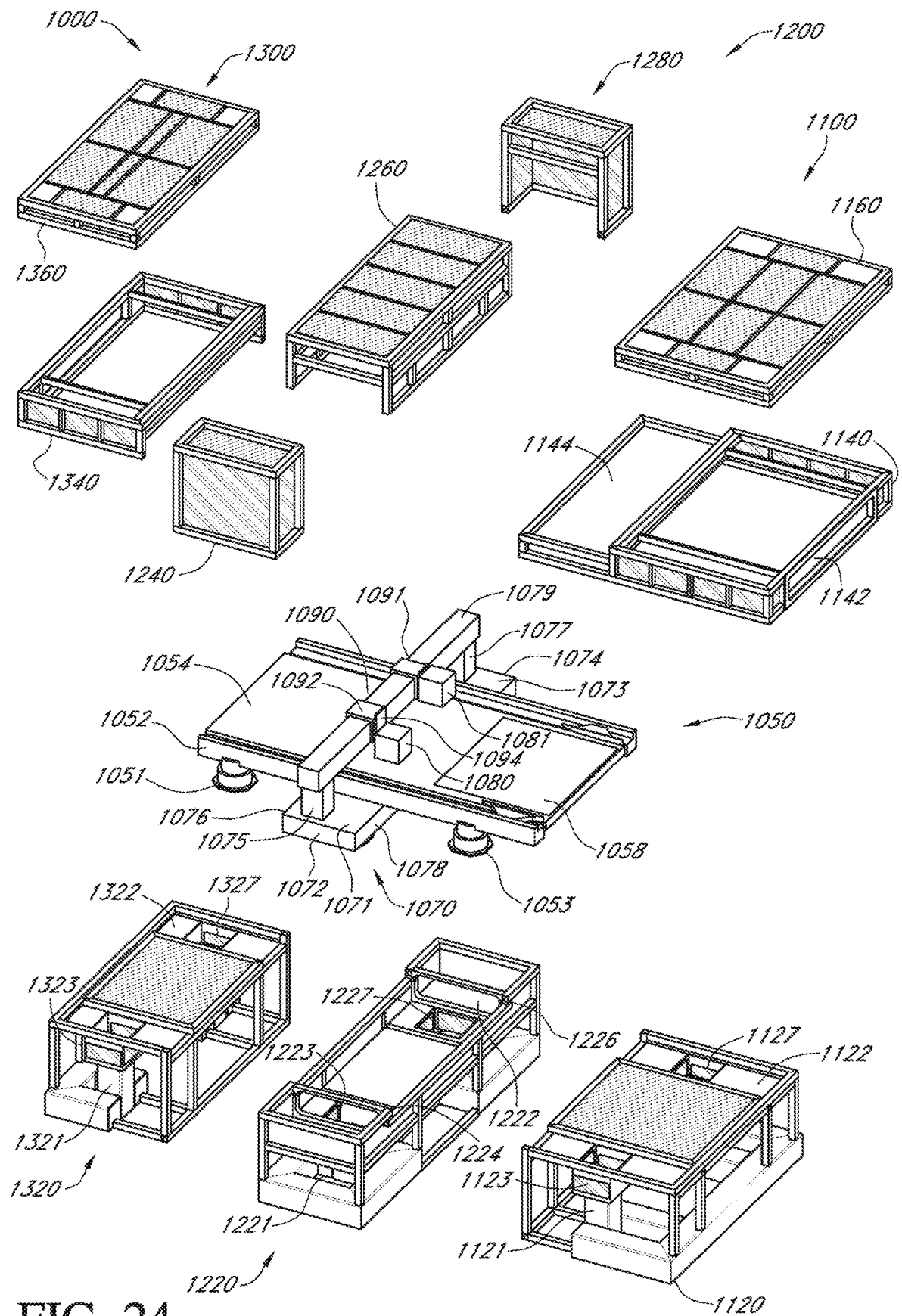
FIG. 24 depicts an exploded view of various embodiments of a gas enclosure assembly as depicted in FIG. 23 in accordance with various embodiments of the present teachings.

FIG. 24 is an exploded view of gas enclosure assembly 1000, depicting various frame members that can be constructed to provide for an hermetically-sealed gas enclosure, according to the present teachings. As previously discussed for various embodiments of gas enclosure 100 of FIG. 3 and FIG. 13, OLED inkjet printing system 1050 can be comprised of several devices and apparatuses, which allow the reliable placement of ink drops onto specific locations on a substrate, such as substrate 1058, shown supported by substrate floatation table 1054. Substrate floatation table 1054 can be used for supporting substrate 1058, as well as providing for the frictionless conveyance of substrate 1058. Substrate floatation table 1054 of OLED printing system can define the travel over which substrate 1058 can be moved through system 1000 during the OLED printing of a substrate. Given the variety of components that can comprise OLED printing system 1050, various embodiments of OLED printing system 1050 can have a variety of footprints and form factors. According to various embodiments of an OLED inkjet printing system, a variety of substrate materials can be used for substrate 1058, for example, but not limited by, a variety of glass substrate materials, as well as a variety of polymeric substrate materials.

According to various embodiments of a gas enclosure assembly of the present teachings, as previously described for gas enclosure assembly 100, construction of a gas enclosure assembly can be done around the entirety of an OLED printing system to minimize the volume of a gas enclosure assembly, as well as providing ready access to the interior. In FIG. 24, an example of contouring can be given in consideration OLED printing system 1050.

As shown in FIG. 24, there can be six isolators on OLED printing system 1050; first isolator set 1051 (second isolator in the set not shown on opposing side) and second isolator set 1053 (second isolator in the set not shown on opposing side), which support substrate floatation table 1054 of OLED printing system 1050. Floatation table 1054 is supported on floatation table base 1052. In addition to the two isolators not visible in FIG. 24, and located opposite first isolator 1051 and second isolator 1053, there is a set of two isolators supporting the OLED printing system base 1070. Front enclosure base 1120 can have first front enclosure isolator mount 1121, which supports first front enclosure isolator wall frame 1123. Second front enclosure isolator wall frame 1127 is supported by second front enclosure isolator mount (not shown). Similarly, middle enclosure base 1220 can have first middle enclosure isolator mount 1221, which supports first middle enclosure isolator wall frame 1223. Second middle enclosure isolator wall frame 1227 is supported by second middle enclosure an isolator mount (not shown). Finally, rear enclosure base 1320 can have first rear enclosure isolator mount 1321, which supports rear middle enclosure isolator wall frame 1323. Second rear enclosure isolator wall frame 1327 is supported by second rear enclosure isolator mount (not shown). Various embodiments of isolator wall frame members have been contoured around each isolator, thereby minimizing the volume around each isolator support member. Additionally, the shaded panel sections shown for each isolator wall frame for base 1120, 1220, and 1320 are removable panels that can be removed, for example, to service an isolator. Front enclosure assembly base 1120 can have pan 1122, while middle enclosure assembly base 1220 can have pan 1222, and rear enclosure assembly base 1320 can have pan 1322. When the bases are fully-constructed to form a contiguous base, an OLED printing system can be mounted on a contiguous pan formed thereby, in a similar fashion to the mounting of OLED printing system 50 on pan 204 of FIG. 13. As previously described, wall and ceiling frame members, such as wall frame 1140, ceiling frame 1160, of front frame assembly 1100, first middle enclosure frame assembly 1240, middle wall and ceiling frame assembly 1260 and second middle enclosure frame assembly 1280' of middle frame assembly 1200, as well as wall frame 1340 and ceiling frame 1360, of rear frame assembly 1300, can then be joined around OLED printing system 1050. As such, various embodiments of hermetically-sealed contoured frame member assemblies of the present teachings effectively decrease the volume of inert gas in gas enclosure assembly 1000, while at the same time providing ready access to various devices and apparatuses of an OLED printing system.

Further, various embodiments of a gas enclosure assembly of the present teachings can be constructed in a fashion to provide for separately-functioning frame member assembly sections. Recalling, with respect to FIG. 5, a frame member assembly according to various embodiments of a gas enclosure assembly and system of the present teachings, can include a frame member having various panels sealably mounted onto a frame member. For example, but not limited by, a wall frame member assembly, or wall panel assembly, can be a wall frame member including various panels sealably mounted onto the wall frame member. Accordingly, various fully constructed panel assemblies, such as, but not limited by, wall panel assemblies, ceiling panel assemblies, wall and ceiling panel assemblies, base support panel assemblies, and the like are various types of frame member assemblies. The modular nature of various embodiments of a gas enclosure assembly of the present teachings can provide for embodiments of a gas enclosure assembly having various frame member assembly sections, where each frame member assembly section is a proportion of the total volume of a gas enclosure assembly. Various frame member assembly sections comprising various embodiments of a gas enclosure assembly can have at least one frame member in common. For various embodiments of a gas enclosure assembly, various frame member assembly sections comprising a gas enclosure assembly can have at least one frame member assembly in common. Various frame member assembly sections comprising various embodiments of a gas enclosure assembly can have a combination of at least one frame member and one frame member assembly in common.

According to the present teachings, various frame member assembly sections can be separated into sections through, for example, but not limited by, closure of an opening or passage, or combination thereof, common to each of a frame member assembly section. For example, in various embodiments, frame member assembly sections can be separated by covering an opening or passage, or combination thereof, in a frame member or frame member panel common to each frame member assembly section; effectively closing the opening or passage, or combination thereof thereby. In various embodiments, frame member assembly sections can be separated by sealing an opening or passage, or combination thereof, common to each frame member assembly section; effectively thereby closing the passage or opening, or combination thereof. Sealably closing an opening or passage, or combination thereof, can result in separation that disrupts the fluid communication between each volume of each frame member assembly section, where each volume is a proportion of the total volume contained within a gas enclosure assembly. Sealably closing an opening or passage can thereby isolate each volume contained within each frame member assembly section.

Accordingly, with reference to FIG. 24, base 1070 can have a first end 1072 and a second end 1074, defining a width, and a first side 1076 and a second side 1078, defining a length. Orthogonal to base 1070 and mounted upon it can be first riser 1075 and second riser 1077, upon which bridge 1079 is mounted. For various embodiments of OLED printing system 1050, bridge 1079 can support a first printhead assembly positioning system 1090 and a second printhead assembly positioning system 1091 for controlling the X-Z axis movement of first printhead assembly 1080 and second printhead assembly 1081, respectively, over substrate floatation table 1054. Though FIG. 24 depicts two positioning systems and two printhead assemblies, for various embodiments of OLED printing system 1050, there can be a single positioning system and a single printhead assembly. Further, for various embodiments of OLED printing system 1050, there can be a single printhead assembly, for example, either of first printhead assembly 1080 and second printhead assembly 1081 mounted on a positioning system, while a camera system for inspecting features of substrate 1058 can be mounted on a second positioning system. According to various embodiments of gas enclosure assembly 1000, a printhead maintenance system can be mounted proximal to a printhead assembly, for example, but not limited by, upon first upper surface 1071 and second upper surface 1073 of base 1070.

Further, with respect to FIG. 24, a panel can be mounted onto first frame member 1224 and second frame member 1226 of base 1220, and onto each panel a gasket can be affixed. The gaskets can be used to close each of a passage between the panels and base 1070. Additionally, bridge frame 1144 can support middle frame assembly 1200, as well as providing a framework for supporting various embodiments of an inset frame. Various embodiments of an inset frame inserted into bridge frame 1144 can have an opening that allows for printhead assembly travel, and also can support a gate valve door assembly for closing the opening that allows printhead assembly travel. By sealably closing the passage around the base, as well as sealably closing the opening that allows printhead assembly travel, the volume roughly defined by middle frame assembly 1200 around bridge 1079 mounted on base 1070 can be isolated from the remaining proportional volume of gas enclosure assembly 1000.

An exemplary use of separating discrete sections of a gas enclosure can be to perform various maintenance procedures on a printhead assembly, such as first printhead assembly 1080 and second printhead assembly 1081 of printing system 1050. Such maintenance procedures can include, for example, but not limited by, changing a printhead within a printhead assembly without the need for opening a gas enclosure assembly to the atmosphere. Moreover, as the proportional volume roughly defined by middle frame assembly 1200 around bridge 1079 mounted on base 1070 can be fully isolated from the remaining volume of gas enclosure assembly 1000, that proportional volume can be opened to atmospheric species, such as, but not limited by, water vapor and oxygen, without contaminating the remaining larger volume of gas enclosure assembly. By limiting the volume that can be exposed to atmospheric species, system recovery can be completed in a significantly shorter time. One of ordinary skill in the art will appreciate that, while the example of the maintenance of a printhead assembly is presented as exemplary, various processes requiring a gas enclosure assembly can readily utilize a gas enclosure assembly in which sections can be discretely separated to provide for separately-functioning frame member assembly sections, where at least one section can have a substantially smaller proportional volume of a total enclosure volume.

Figure 25:
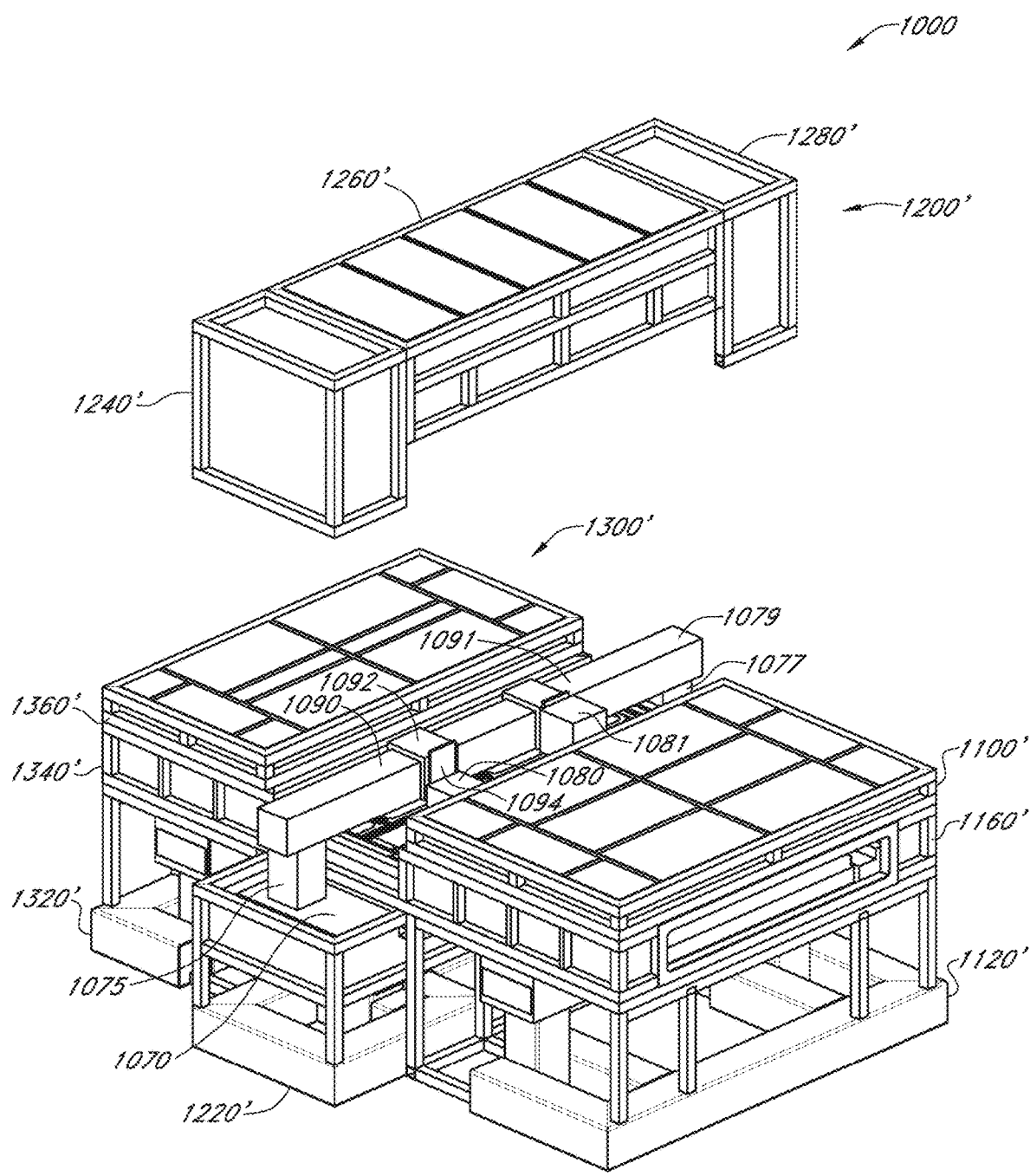
FIG. 25 depicts a partially exploded front perspective view of various embodiments of a gas enclosure assembly in accordance with various embodiments of the present teachings.

FIG. 25 depicts a partially exploded perspective of in accordance with various embodiments of gas enclosure assembly 1000 of FIG. 23 and FIG. 24. In FIG. 25, various intact panel assemblies are indicated, which panel assembles can be separated in a variety of ways to define a first frame member assembly section, defining a first volume and a second frame member assembly section defining a second volume.

For example, but not limited by, in FIG. 25, gas enclosure assembly 1000 can include front panel assembly 1100', middle panel assembly 1200' and rear panel assembly 1300'. Front panel assembly 1100' can include front ceiling panel assembly 1160', front wall panel assembly 1140' and front base panel assembly 1120', while rear panel assembly 1300' can include rear ceiling panel assembly 1360', rear wall panel assembly 1340' and rear base panel assembly 1320'. As can be seen from the exploded view of FIG. 24 for front frame assembly 1100 and middle panel frame 1200, front panel assembly 1100' and middle panel assembly 1200' of FIG. 25 have bridge frame 1144 in common. Middle panel assembly 1200' can first middle enclosure panel assembly 1240', middle wall and ceiling panel assembly 1260' and second middle enclosure panel assembly 1280', which when sealably mounted on middle base panel assembly 1220', can cover base 1070, including first riser 1075 and second riser 1077, upon which bridge 1079 is mounted. As previously discussed, bridge 1079 can support first printhead assembly positioning system 1090, which can control the movement of printhead assembly 1080 over substrate floatation table 1054 (see FIG. 24). First printhead assembly positioning system 1090, for positioning printhead assembly 1080 over substrate floatation table 1054 (see FIG. 24), can include first X-axis carriage 1092 and first Z-axis moving plate 1094, onto which first printhead assembly 1080 can be mounted. Second printhead assembly positioning system 1091 can be similarly configured for controlling the X-Z axis movement of second printhead assembly 1081 over substrate floatation table 1054 (see FIG. 24).

Figure 26:
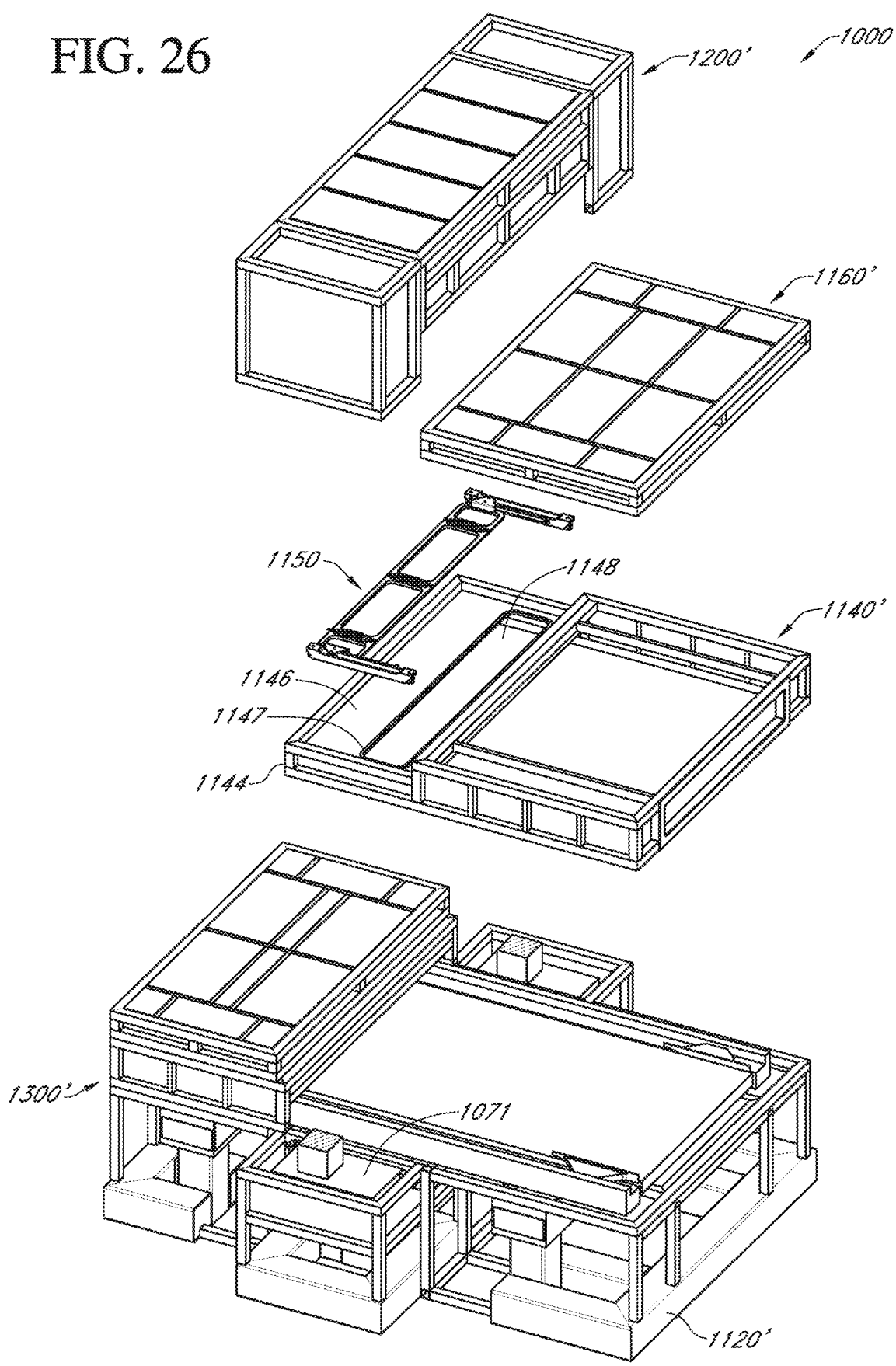
FIG. 26 depicts a partially exploded side perspective view of various embodiments of a gas enclosure assembly as depicted in FIG. 25 in accordance with various embodiments of the present teachings.
Figure 27A:
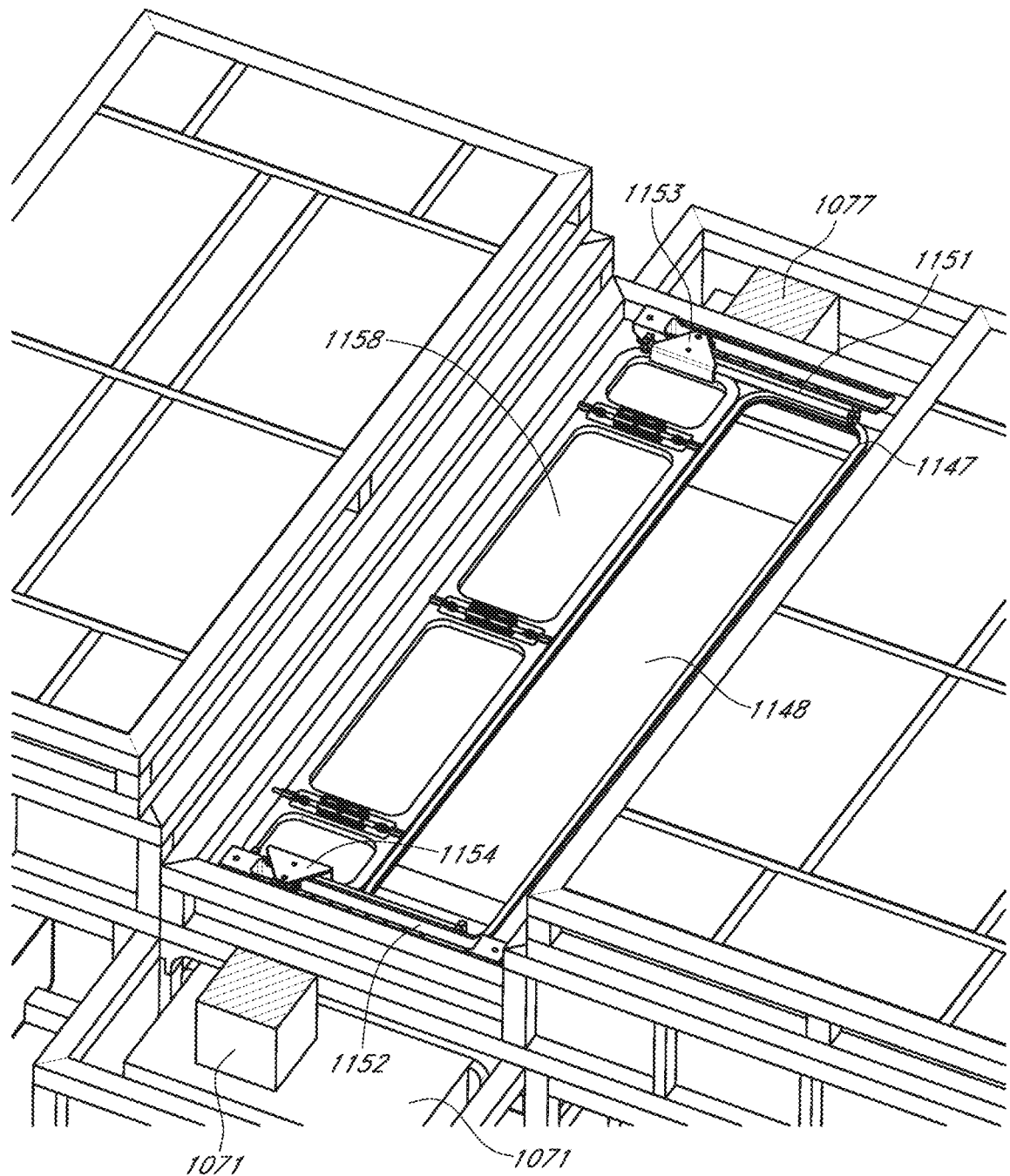
FIG. 27A and FIG. 27B depict expanded view of a gas enclosure assembly as depicted in FIG. 26 in accordance with various embodiments of the present teachings.
Figure 27B:
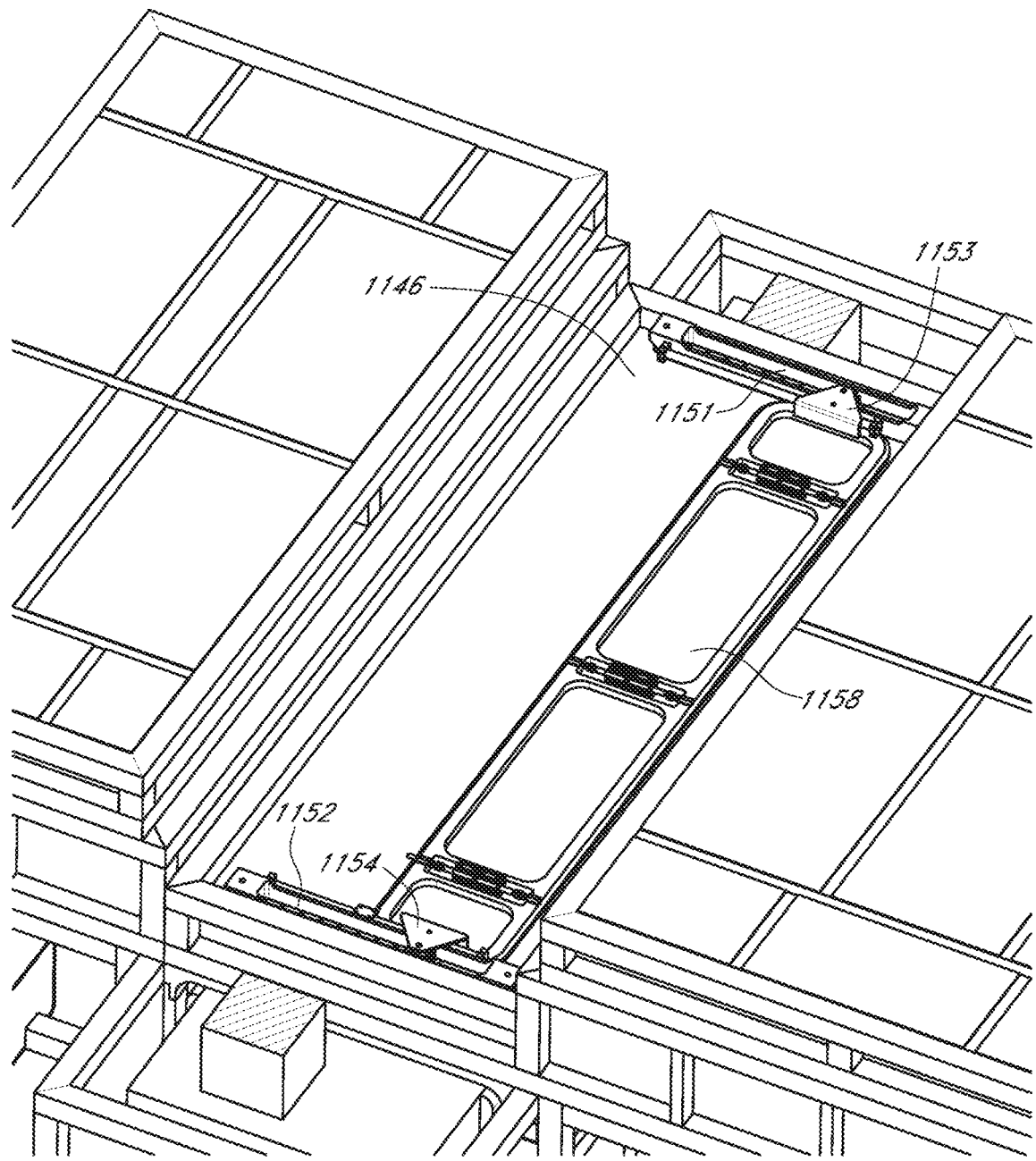

FIG. 26 depicts a partially exploded side perspective view of gas enclosure assembly 1000, including various sections of front panel assembly 1100', as well as middle panel assembly 1200' and rear panel assembly 1300'. Front panel assembly 1100' can include in which inset frame 1146 can be seen mounted in bridge frame 1144, which a frame member common to both front panel assembly 1100' and middle panel assembly 1200'. Inset frame 1146 can include opening 1148, around which gasket 1147 can be affixed. Above inset frame 1146, gate valve door assembly 1150 is indicated. Gate valve door assembly 1150 can be mounted over inset frame 1146. As can be seen in FIG. 27A and FIG. 27B, gate valve door assembly 1150 can have door 1158 mounted via first carriage 1153 and second carriage 1154 to a Y-Z positioning system for moving door 1158 over opening 1148 of inset frame 1146, as well as for engaging door 1158 to sealably cover opening 1148. In FIG. 27A, a positioning system including first track 1151 and second track 1152 can have first carriage 1153 and second carriage 1154, respectively, which can engage with a rail guideway system. As one of ordinary skill in the art is apprised, a rail guideway system can include components such as, for example, but not limited by, rails, bearings and actuators for controlling the positioning system movement, and hence the movement of door 1158. In FIG. 27A, gasket 1147 is shown around opening 1148. Gasket 1147 can be any of a gasket material as previously described for sealing frame member assemblies. In FIG. 27A, door 1158 is retracted, so that printhead assemblies 1080 and 1081, can be moved by first and second printhead assembly positioning systems 1090 and 1091, respectively over floatation table 1054 by travel within opening 1148 (see FIG. 24 and FIG. 25). In FIG. 27B, door 1158 is shown covering opening 1148. The positioning system, including first carriage 1153 and second carriage 1154, to which door 1158 is mounted, can position door 1158 over opening 1148 so as to sealably engage gasket 1147, thereby sealably closing opening 1148.

Figure 28:
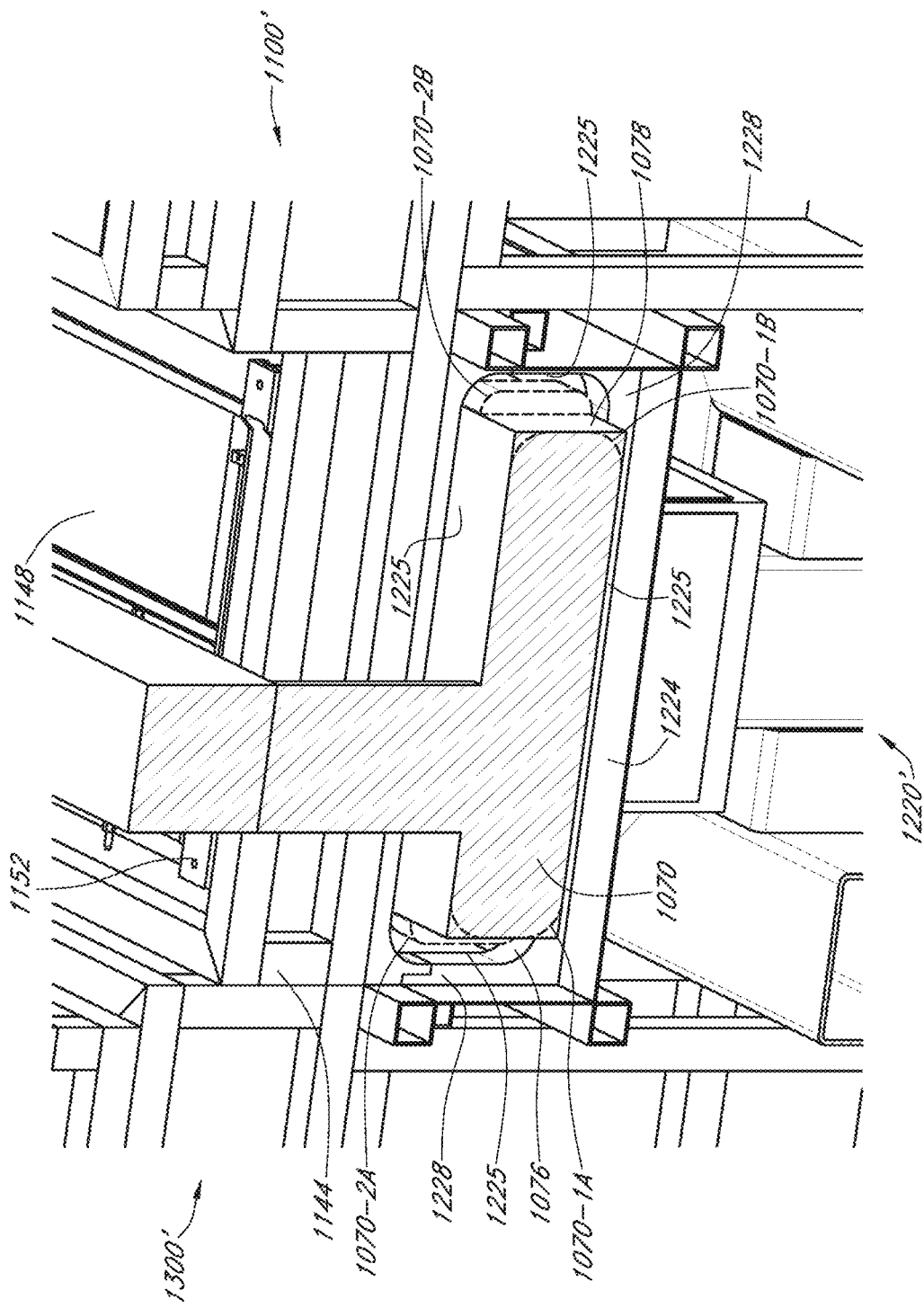
FIG. 28 is a section view through a frame member assembly including a base and risers in accordance with various embodiments of the present teachings.

FIG. 28 depicts a section view of through middle base panel assembly 1220' in relationship to front panel assembly 1100' and rear panel assembly 1300'. As indicated in FIG. 28, passage 1225 can be located around base 1070; where base 1070 extends through first frame member 1224. Within frame member 1224, a panel providing a frame structure, such as panel 1228, can be sealably mounted in frame member 1224. It is contemplated that a variety of gaskets providing a mechanical seal can be used for sealing passage 1225. In various embodiments, an inflatable gasket for sealing passage 1225 can be used. Various embodiments of an inflatable gasket can be a made from a reinforced elastomeric material into a hollow molded structure, which when not inflated can be in a concave, convoluted or flat configuration. In various embodiments, a gasket can be mounted on panel 1228 for sealably closing passage 1225 around base 1070. As such, when inflated using any of a variety of appropriate fluid media, for example, but not limited by, an inert gas, various embodiments of an inflatable gasket for sealably closing passage 1225 around base 1070, can form a tight barrier between a mounting surface, such as the inner surface of panel 1228, and a striking surface, such as the surface of base 1070. In various embodiments, an inflatable gasket can be mounted on base 1070 for sealably closing passage 1225 around base 1070 so that base 1070 can be a mounting surface and the inner surface of panel 1228 can be a striking surface. In that regard, a conforming seal can sealably close passage 1225.

In addition to various embodiments of an inflatable gasket, a flexible seal permanently attached, for example, attached to panel 1228, as well as to base 1070, such as a bellows seal or a lip seal, can also be used for sealing passage 1225. Such a permanently attached seal can provide the flexibility needed to provide for the various translational and vibrational movements of base 1070, while at the same time providing a hermetic seal for passage 1225.

As one of ordinary skill in the art can appreciate, forming a conforming seal around a well-defined edge can be problematic. In various embodiments of a gas enclosure in which sealing around a structure, such as base 1070, is indicated, such a structure can be fabricated to eliminate well-defined edges where sealing is desired. In various embodiments of printing system 1050 of FIG. 24, base 1070 can be initially fabricated to have rounded lateral edges of base 1070 for promoting sealing, as indicated by the hatched line 1070-1A for first side 1076 having and by the hatched 1070-1B for second side 1078. In various embodiments of printing system 1050 of FIG. 24, base 1070 can be later modified to have structures mounted to provide rounded lateral edges of base 1070 for promoting sealing, as indicated by the hatched line structure 1070-2A for first side 1076 having and by the hatched line structure 1070-2B for second side 1078. Base 1070 can be made of a material that can provide the stability needed for supporting a printing system, for example, but not limited by, granite and steel. Such materials can be readily modified as indicated in FIG. 28. While an example is given of the use of a gasket for closure or passage 1225 around base 1070 in middle base panel assembly 1220', one of ordinary skill in the art will appreciate that closure around base 1070 spanning frame assembly 1226 of base assembly 1220' (see FIG. 24) can be done using the same principles.

As previously discussed, maintenance of a printhead assembly can include various calibration and maintenance procedures. For example, for the printing of an OLED display panel substrate, each printhead assembly, such as first printhead assembly 1080 and second printhead assembly 1081 of FIG. 24, can have a plurality of printheads mounted in at least one printhead device. In various embodiments, a printhead device can include, for example, but not limited by, fluidic and electronic connections to at least one printhead; each printhead having a plurality of nozzles or orifices capable of ejecting ink at a controlled rate, velocity and size. For various embodiments of first printhead assembly 1080 and second printhead assembly 1081 of FIG. 24, each printhead assembly can include between about 1 to about 60 printhead devices, where each printhead device can have between about 1 to about 30 printheads in each printhead device. A printhead, for example, an industrial inkjet head, can have between about 16 to about 2048 nozzles, which can expel a droplet volume of between about 0.1 pL to about 200 pL. Calibrating a printhead can include, for example, but not limited by, checking for nozzle firing, measuring drop volume, velocity and direction, as well as tuning a printhead so that each nozzle ejects a droplet of uniform volume. Maintaining a printhead can include, for example, but not limited by, procedures such as printhead priming, which requires collection and containment of the ink expelled from a printhead, removal excess ink after the priming procedure, as well as printhead replacement. In a printing process, for example, for the printing of an OLED display panel substrate, reliable firing of the nozzles is critical for ensuring that a printing process can manufacture quality OLED panel displays. Therefore, it is necessary that the various procedures associated with printhead maintenance be readily and reliably implemented; especially without the need for exposing the interior of a gas enclosure assembly to various reactive constituents such as, for example, but not limited by, oxygen and water vapor from the atmosphere, as well as, for example, but not limited by, organic solvent vapors from a printing process.

In that regard, for various embodiments of a gas enclosure assembly of FIG. 24, a maintenance system can be mounted, for example, but not limited by, proximal to first printhead assembly 1080 on top surface 1071 of base 1070, as well as proximal to second printhead assembly 1081 on top surface 1073 of base 1070. Such a maintenance system can include, for example, but not limited by, a drop calibration station for performing various printhead calibration procedures, a purge station for collection and containment of the ink expelled from a printhead during a purging or priming procedure, and a blotting station for removal of the excess ink after a purging or priming procedure has been conducted at a purge station. During routine maintenance, such procedures can be conducted in a fully-automated mode In some instances, where a certain degree of human intervention may be indicated during a maintenance procedure, end-user access can be done externally through, for example, the use of gloveports. As previously discussed, various embodiments of gas enclosure assembly 1000 of FIGS. 23-28 effectively decrease the volume of inert gas required during an OLED printing process, while at the same time provide ready access to the interior of gas enclosure.

Moreover, should printhead maintenance require direct access to a printhead assembly or any of the various maintenance stations, sealably closing door 1158 over opening 1148, as described for FIG. 27A and FIG. 27B, as well as sealably closing the passages around base 1070, as described for FIG. 28, can isolate the volume defined by a frame member assembly section including middle panel assembly 1200' and the isolated portions of middle base panel assembly 1220' from the remaining volume of gas enclosure assembly 1000. Further, one of ordinary skill in the art will understand that sealably closing door 1158 over opening 1148, as described for FIG. 27A, FIG. 27B and FIG. 28 as well as sealably closing the passages around base 1070, as described for FIG. 28, can be done remotely and automatically. For various embodiments of gas enclosure assembly 1000, a proportional volume of such an isolated volume for such a maintenance frame member assembly section can, be less than or equal to about 20% of the total volume of various embodiments of a contoured gas enclosure assembly. For various embodiments of gas enclosure assembly 1000, a proportional volume of such an isolated volume for such a maintenance frame member assembly section can, be less than or equal to about 50% of the total volume of various embodiments of a contoured gas enclosure assembly. By substantially reducing the portion of a gas enclosure assembly requiring direct access to an end-user for printhead maintenance, system recover time can be substantially decreased.

Figure 29:
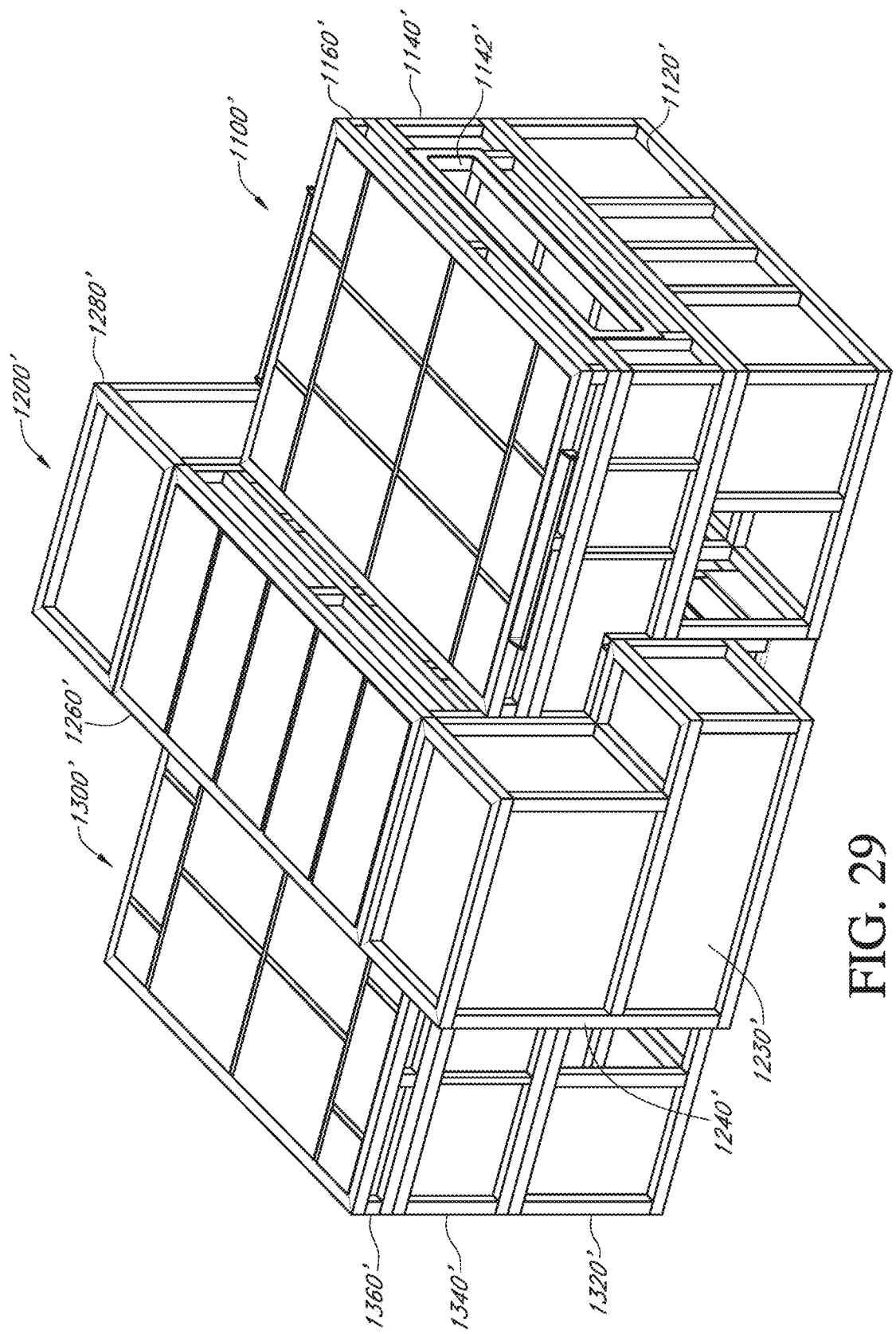
FIG. 29 is a front perspective view of view of a gas enclosure assembly in accordance with various embodiments of the present teachings.

FIG. 29 depicts a perspective view gas enclosure assembly 1010 in accordance with various embodiments of a gas enclosure assembly of the present teachings. Gas enclosure assembly 1010 can include front panel assembly 1100', middle panel assembly 1200' and rear panel assembly 1300'. Front panel assembly 1100' can include front ceiling panel assembly 1160', front wall panel assembly 1140', which can have opening 1142 for receiving a substrate, and front base panel assembly 1120'. Rear panel assembly 1300' can include rear ceiling panel assembly 1360', rear wall panel assembly 1340' and rear base panel assembly 1320'. Middle panel assembly 1200' can include first middle enclosure panel assembly 1240', middle wall and ceiling panel assembly 1260' and second middle enclosure panel assembly 1280', as well as middle base panel assembly 1220'. Additionally, middle panel assembly 1200' can include first middle maintenance system panel assembly 1230', as well as a second middle maintenance system panel assembly (not shown).

Figure 30:
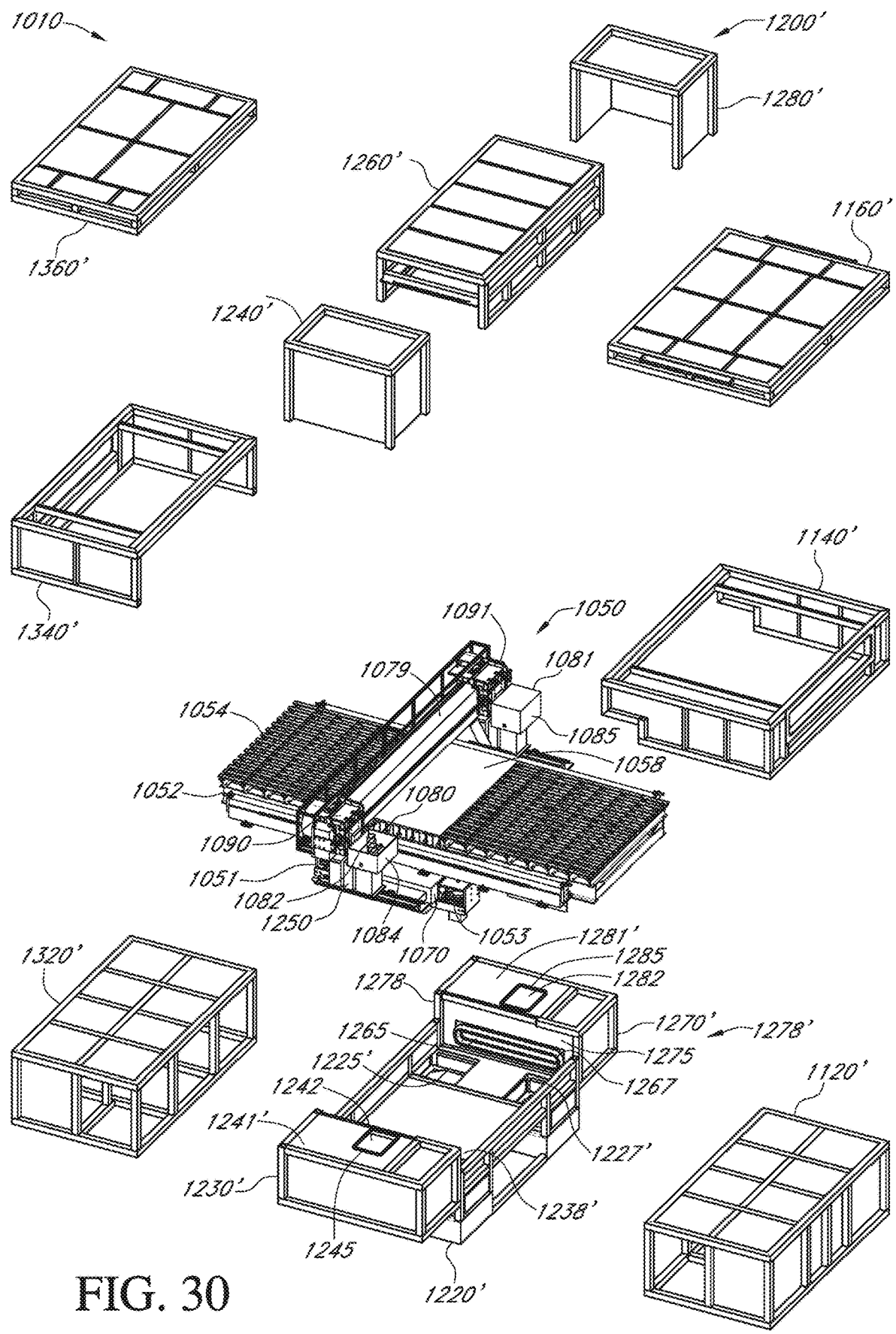
FIG. 30 depicts an exploded view of various embodiments of a gas enclosure assembly as depicted in FIG. 29 in accordance with various embodiments of the present teachings.

FIG. 30 depicts an exploded perspective view of gas enclosure 1010 in accordance with various embodiments of a gas enclosure assembly of the present teachings. Gas enclosure assembly 1010 can house OLED printing system 1050, which can include substrate floatation table 1054, supported by substrate floatation table base 1052. Substrate floatation table base 1052 can be mounted on base 1070. Substrate floatation table 1054 of OLED printing system can support substrate 1058, as well as defining the travel over which substrate 1058 can be moved through system 1010 during the OLED printing of a substrate. Substrate floatation table 1054 can provide frictionless conveyance of substrate 1058. For gas enclosure assembly 1010 of FIG. 30, there can be four isolators on OLED printing system 1050; first isolator set 1051 (second not shown on opposing side) and second isolator set 1053 (second not shown on opposing side), which support substrate floatation table 1054 of OLED printing system 1050. Base 1070, can include first riser 1075 and second riser 1077, upon which bridge 1079 is mounted. For various embodiments of OLED printing system 1050, bridge 1079 can support first printhead assembly positioning system 1090 and second positioning system 1091, which can control the movement of first printhead assembly 1080 and second printhead assembly 1081, respectively. For various embodiments of OLED printing system 1050, there can be a single positioning system and a single printhead assembly. For various embodiments of OLED printing system 1050, there can be a single printhead assembly, for example, either of first printhead assembly 1080 and second printhead assembly 1081, while a camera system for inspecting features of substrate 1058 can be mounted to a second positioning system.

First printhead assembly positioning system 1090, for positioning first printhead assembly 1080 over substrate floatation table 1054, can include first X-axis carriage 1092 and first Z-axis moving plate 1094, onto which first printhead assembly enclosure 1084 can be mounted. Second printhead assembly positioning system 1091 can be similarly configured for controlling the X-Z axis movement of second printhead assembly 1081, which can include second printhead assembly enclosure 1085. As depicted in FIG. 30 for first printhead assembly 1080, where first printhead assembly enclosure 1084, is depicted in partial view, various embodiments of a printhead assembly can have a plurality of printhead devices 1082 mounted therein. For various embodiments of printing system 1050, a printhead assembly can include between about 1 to about 60 printhead devices, where each printhead device can have between about 1 to about 30 printheads in each printhead device. As will be discussed in more detail subsequently, given the sheer number of printhead devices and printheads requiring continual maintenance, first maintenance system assembly 1250 can be seen positioned for ready access to first printhead assembly 1080.

As depicted in FIG. 30, gas enclosure assembly 1010 can include front base panel assembly 1120', middle base panel assembly 1220', and rear base panel assembly 1320', which when fully-constructed form a contiguous base on which OLED printing system 1050 can be mounted on a contiguous pan formed thereby, in a similar fashion to the mounting of OLED printing system 50 on pan 204 of FIG. 13. First isolator set 1051 and second isolator set can be mounted in each of a respective isolator well panel, such as first isolator wall panel 1225' and second isolator wall panel 1227' of middle base panel assembly 1220'. In a similar fashion as that described for the construction of gas enclosure assembly 100 of FIG. 3, the various frame members and panels comprising front panel assembly 1100', middle panel assembly 1200', and rear panel assembly 1300' can then be joined around OLED printing system 1050 to form various embodiments of gas enclosure assembly 1050.

For gas enclosure assembly 1010 of FIG. 30, middle base assembly 1220' can include first middle maintenance system panel assembly 1230', as well as second middle maintenance system panel assembly 1270'. First middle maintenance system panel assembly 1230' and second middle maintenance system panel assembly 1270' can include first printhead assembly opening 1242 of first floor panel assembly 1241' and second printhead assembly opening 1282 of second floor panel assembly 1281'; respectively. First floor panel assembly 1241' is depicted in FIG. 30 as part of first middle enclosure panel assembly 1240' of middle panel assembly 1200'. First floor panel assembly 1241' is a panel assembly in common with both first middle enclosure panel assembly 1240' and first middle maintenance system panel assembly 1230'. Second floor panel assembly 1281' is depicted in FIG. 30 as part of second middle enclosure panel assembly 1280' of middle panel assembly 1200'. Second floor panel assembly 1281' is a panel assembly in common with both second middle enclosure panel assembly 1280' and second middle maintenance system panel assembly 1270'.

As previously mentioned, first printhead assembly 1080 can be housed in first printhead assembly enclosure 1084, and second printhead assembly 1081 can be housed in second printhead assembly enclosure 1085. As will be discussed in more detail subsequently, first printhead assembly enclosure 1084 and second printhead assembly enclosure 1085 can have an opening at the bottom that can have a rim (not shown), so that various printhead assemblies can be positioned for printing during a printing process. Additionally, the portions of first printhead assembly enclosure 1084 and second printhead assembly enclosure 1085 forming a housing can be constructed as previously described for various panel assemblies, so that the frame assembly members and panels are capable of providing an hermetic enclosure. A compressible gasket can be affixed around each of first printhead assembly opening 1242 and second printhead assembly opening 1282, or alternatively around the rim of first printhead assembly enclosure 1084 and second printhead assembly enclosure 1085. As depicted in FIG. 30, first printhead assembly docking gasket 1245 and second printhead assembly docking gasket 1285 can be affixed around first printhead assembly opening 1242 and second printhead assembly opening 1282, respectively. First printhead assembly positioning system 1090 and second printhead assembly positioning system 1091 can dock first printhead assembly enclosure 1084 and second printhead assembly enclosure 1085, respectively, with first middle maintenance system panel assembly 1230' and second middle maintenance system panel assembly 1270', respectively. For various printhead maintenance procedures, the docking can include the formation of a gasket seal between each of the printhead assembly enclosures and the maintenance system panel assemblies. When first printhead assembly enclosure 1084 and second printhead assembly enclosure 1085 are docked with first middle maintenance system panel assembly 1230' and second middle maintenance system panel assembly 1270' to sealably close first printhead assembly opening 1242 and second printhead assembly opening 1282, the combined structures so formed are hermetically sealed.

During various printhead maintenance procedures, first printhead assembly 1080 and second printhead assembly 1081 can be positioned by first printhead assembly positioning system 1090 and second printhead assembly positioning system 1091, respectively, over first printhead assembly opening 1242 of first floor panel assembly 1241' and second printhead assembly opening 1282 of second floor panel assembly 1281', respectively. In that regard, for various printhead maintenance procedures, first printhead assembly 1080 and second printhead assembly 1081 can be positioned over first printhead assembly opening 1242 of first floor panel assembly 1241' and second printhead assembly opening 1282 of second floor panel assembly 1281', respectively, without covering or sealing first printhead assembly opening 1242 and second printhead assembly opening 1282. Further, for various printhead maintenance procedures, closure of first printhead assembly opening 1242 and second printhead assembly opening 1282 can separate first middle maintenance system panel assembly 1230' as a section and second middle maintenance system panel assembly 1270' as a section from the remaining volume of gas enclosure assembly 1010. For various printhead maintenance procedures, first printhead assembly 1080 and second printhead assembly 1081 can be docked upon a gasket in a Z-axis direction over first printhead assembly opening 1242 and second printhead assembly opening 1282, respectively, thereby closing first printhead assembly opening 1242 and second printhead assembly opening 1282. According to the present teachings, depending on the force applied to first printhead assembly enclosure 1084 and second printhead assembly enclosure 1085 in the Z-axis direction, first printhead assembly opening 1242 and second printhead assembly opening 1282 can be either be covered or sealed. In that regard, a force applied to first printhead assembly enclosure 1084 in the Z-axis direction that can seal first printhead assembly opening 1242 can isolate first middle maintenance system panel assembly 1230' as a section from the remaining frame member assembly sections comprising gas enclosure assembly 1010. Similarly, a force applied to second printhead assembly enclosure 1085 in the Z-axis direction that can second printhead assembly opening 1282 can isolate second middle maintenance system panel assembly 1270' as a section from the remaining frame member assembly sections comprising gas enclosure assembly 1010.

It is contemplated that in various embodiments of gas enclosure assembly 1010, a covering, such as, for example, but not limited by, a gate valve assembly previously described for FIG. 26, as well as FIGS. 27A and 27B, can be mounted in first middle maintenance system panel assembly 1230' and second middle maintenance system panel assembly 1270'. Such a covering can be used to cover first printhead assembly opening 1242 and second printhead assembly opening 1282 of first middle maintenance system panel assembly 1230' and second middle maintenance system panel assembly 1270', respectively. As will be discussed in more detail subsequently, the use of a covering, such as, for example, but not limited by, a gate valve assembly, for closing first printhead assembly opening 1242 and second printhead assembly opening 1282 can allow for isolating a first frame member assembly section from a second frame member assembly section without docking a printhead assembly. In that regard, various maintenance procedures can be executed without disruption of a printing process.

FIG. 30 of gas enclosure assembly 1010 depicts first middle maintenance system panel assembly 1230' that can include first back wall panel assembly 1238'. Similarly, also depicted is second middle maintenance system panel assembly 1270' that can include second back wall panel assembly 1278'. First back wall panel assembly 1238' of first middle maintenance system panel assembly 1230' can be constructed in a similar fashion as shown for second back wall panel assembly 1278'. Second back wall panel assembly 1278' of second middle maintenance system panel assembly 1270' can be constructed from second back wall frame assembly 1278 having second seal-support panel 1275 sealably mounted to second back wall frame assembly 1278. Second seal-support panel 1275 can have second passage 1265, which is proximal to a second end (not shown) of base 1070. Second seal 1267 can be mounted second seal-support panel 1275 around second passage 1265.

FIGS. 31A-31F are schematic cross-section views of gas enclosure assembly 1010 that can further illustrate various aspects of first middle maintenance system panel assembly 1230' and second middle maintenance system panel assembly 1270'. As one of ordinary skill in the art can appreciate, given the symmetry of printing system 1050, which can have first printhead assembly positioning system 1090 and second printhead assembly positioning system 1091 for positioning first printhead assembly 1080 and second printhead assembly 1081, respectively (see FIG. 30), the following teachings illustrated for FIGS. 31A-31D for first middle maintenance system panel assembly 1230' can apply to second middle maintenance system panel assembly 1270'.

Figure 31A:
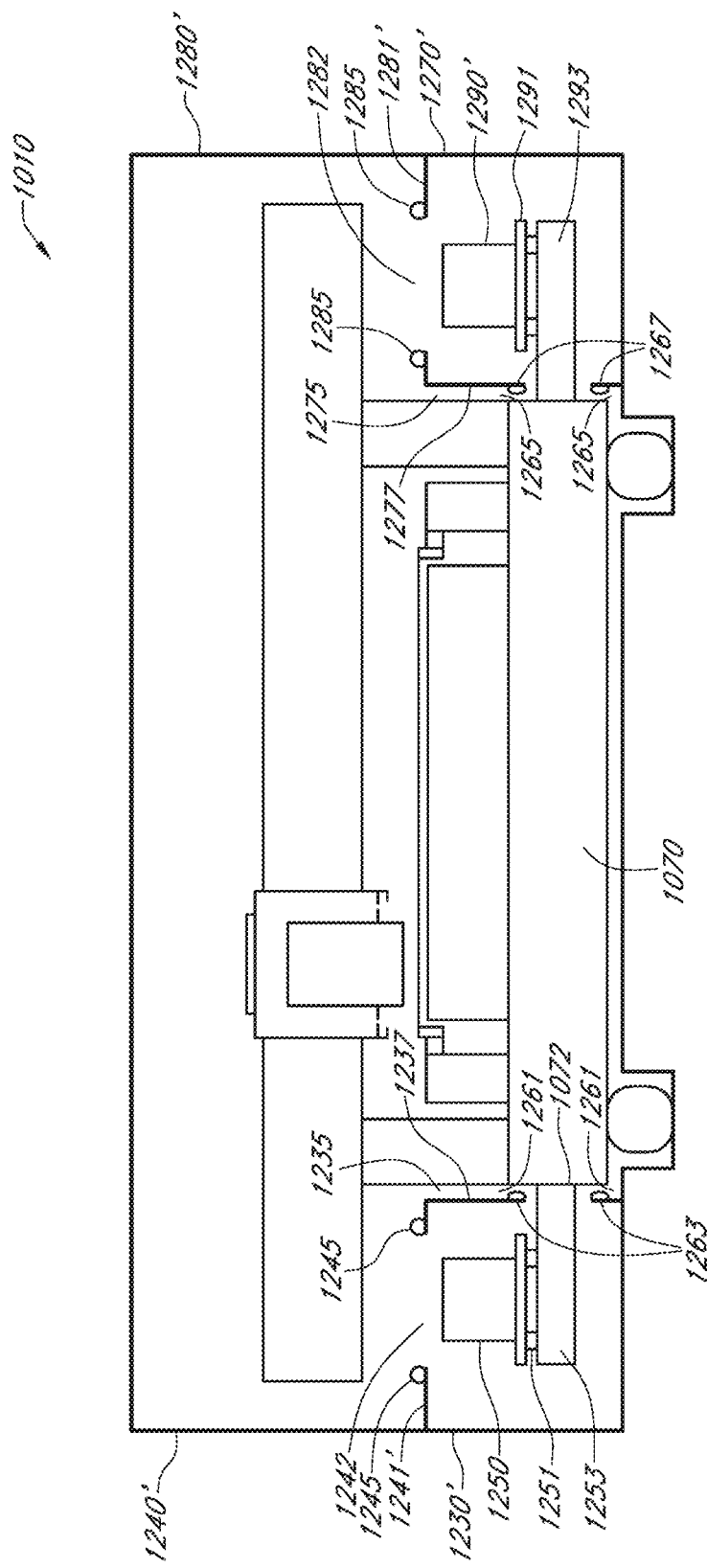
FIG. 31A is a cross-sectional views of a gas enclosure assembly according to various embodiments of a gas enclosure depicted in FIG. 29.

FIG. 31A depicts a schematic cross-section view of gas enclosure assembly 1010, showing first middle maintenance system panel assembly 1230' and second middle maintenance system panel assembly 1270'. First middle maintenance system panel assembly 1230' of FIG. 31A can house first maintenance system assembly 1250, which can be positioned in relationship to first printhead assembly opening 1242 by first maintenance system positioning system 1251. First printhead assembly opening 1242 is an opening in first floor panel assembly 1241', which is a panel in common with first middle maintenance system panel assembly 1230' and first middle enclosure panel assembly 1240'. First maintenance system positioning system 1251 can be mounted on first maintenance system assembly platform 1253, which can be stably mounted to base 1070 on first end 1072. First maintenance system assembly platform 1253 can extend through first passage 1261 from first end 1072 of base 1070 into first middle maintenance system panel assembly 1230'. Similarly, as depicted in FIG. 31A, second middle maintenance system panel assembly 1270' of FIG. 31A can house second maintenance system assembly 1290, which can be positioned in relationship to second printhead assembly opening 1282 by second maintenance system positioning system 1291. Second printhead assembly opening 1282 is an opening in first floor panel assembly 1281', which is a panel in common with second middle maintenance system panel assembly 1270' and second middle enclosure panel assembly 1280'. Second maintenance system positioning system 1291 can be mounted on second maintenance assembly system platform 1293, which can extend through second passage 1265 from second end 1074 of base 1070 into second middle maintenance system panel assembly 1270'. First seal 1263 can be mounted on first outer surface 1237 of first seal-support panel 1235 around first passage 1261. Similarly, second seal 1267 can be mounted on second outer surface 1277 of second seal-support panel 1275 around second passage 1265. First seal 1263 and second seal 1267 can be an inflatable gasket, as previously described for FIG. 28. Various embodiments of first seal 1263 and second seal 1267 can be a flexible seal permanently attached, for example, to first outer surface 1237 and second outer surface 1277 as well as to base first end 1072 of base 1070 and second end 1074 of base 1070, respectively. As previously discussed, a flexible seal can be a seal such as a bellows seal or a lip seal. Such a permanently attached seal can provide the flexibility needed to provide for the various translational and vibrational movements of base 1070, while at the same time providing a hermetic seal for first passage 1261 and second passage 1265.

Figure 31B:
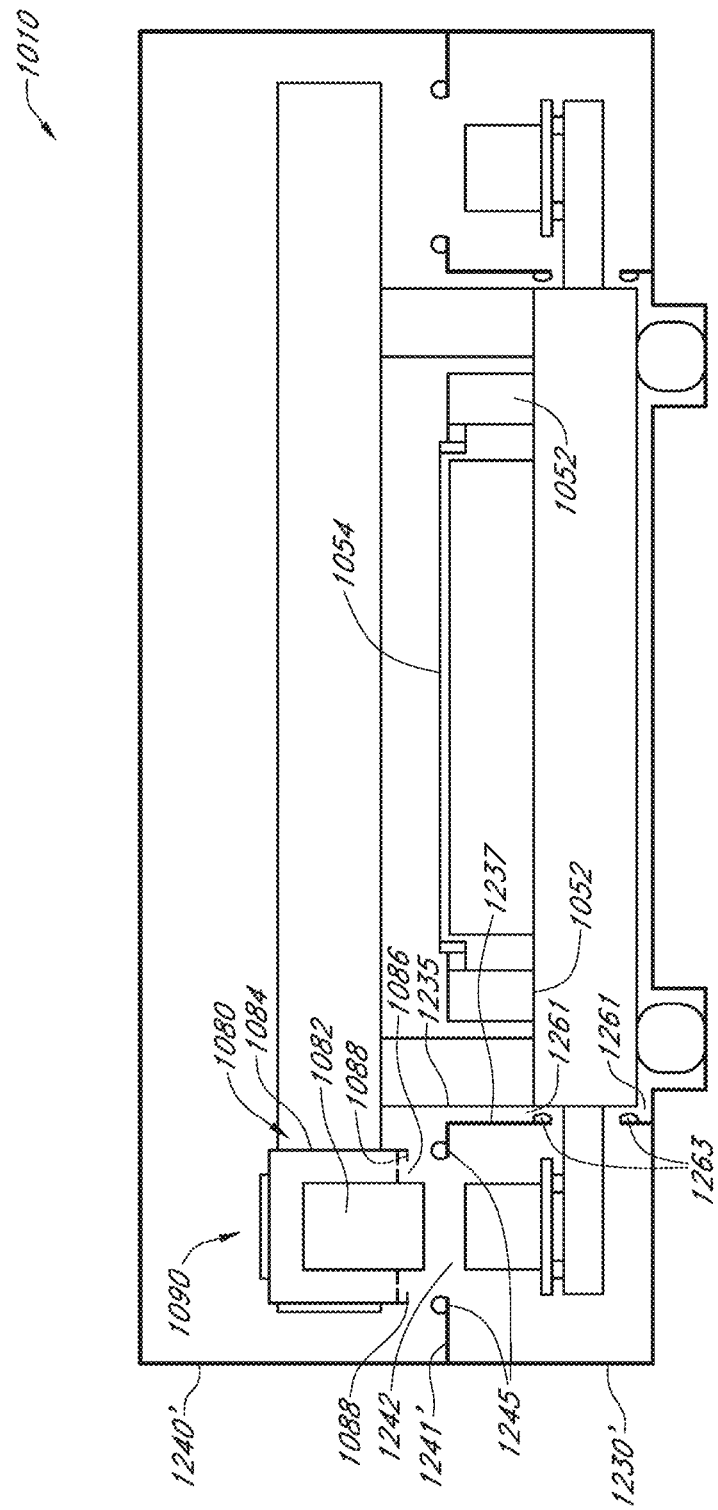
FIG. 31B and FIG. 31C are cross-sectional views of a gas enclosure assembly as depicted in FIG. 29 depicting the successive movement of a printhead assembly moving into position for maintenance in accordance with various embodiments of the present teachings.
Figure 31C:
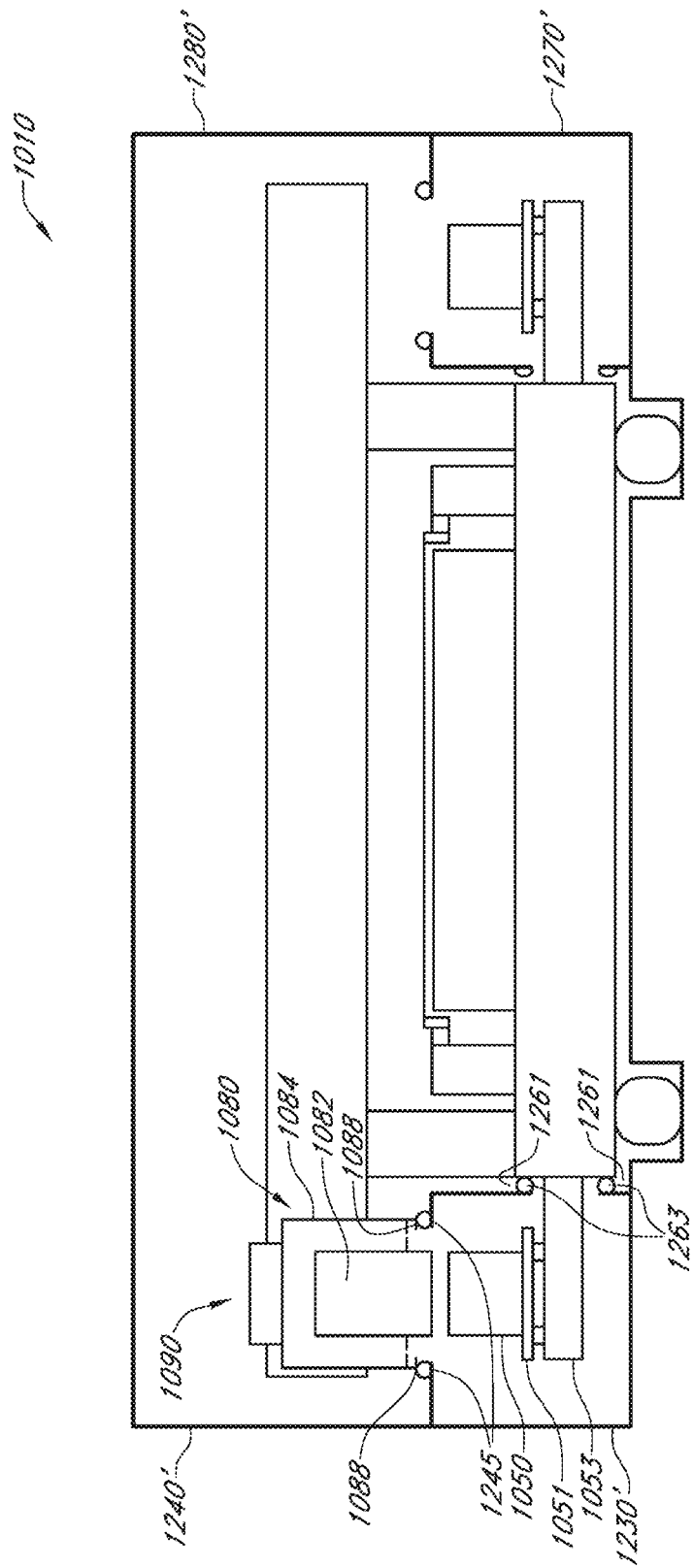

FIGS. 31B and 31C illustrate covering and sealing of various openings and passages of gas enclosure assembly 1010 of the present teachings, which illustrates positioning of first printhead assembly 1080 with respect to first middle maintenance system panel assembly 1230' for various maintenance procedures. As previously mentioned, the following teachings for first middle maintenance system panel assembly 1230' can apply to second middle maintenance system panel assembly 1270', as well.

In FIG. 31B, first printhead assembly 1080 can include a printhead device 1082, having at least one printhead, which includes a plurality of nozzles or orifices. Printhead device 1082 can be housed in first printhead assembly enclosure 1084, which can have first printhead assembly enclosure opening 1086 from which printhead device 1082 can be positioned so that during printing the nozzles eject ink at a controlled rate, velocity and size onto a substrate mounted on floatation table 1054; supported by floatation table support 1052. As previously discussed, first printhead assembly positioning system 1090 can be controlled during a printing process to position first printhead assembly 1080 over a substrate for printing. Additionally, as depicted in FIG. 31B, for various embodiments of gas enclosure assembly 1010, first printhead assembly positioning system 1090, which has controllable X-Z axis movement, can position first printhead assembly 1080 in over first printhead assembly opening 1242. As depicted in FIG. 31B, first printhead assembly opening 1242 of first floor panel assembly 1241' is common to first middle enclosure panel assembly 1240' and first middle maintenance system panel assembly 1230'.

First printhead assembly enclosure 1084 of FIG. 31B can include first printhead assembly enclosure rim 1088, which can be a docking surface with first floor panel assembly 1241' around first printhead assembly opening 1242. First printhead assembly enclosure rim 1088 can engage first printhead assembly docking gasket 1245, which is depicted in FIG. 31B affixed around first printhead assembly opening 1242. One of ordinary skill in the art will appreciate that, though first printhead assembly enclosure rim 1088 is shown depicted as an inwardly projecting structure, that any of variety of rims can be constructed on first printhead assembly enclosure 1084. Additionally, though first printhead assembly docking gasket 1245 is depicted in FIG. 31B to be affixed around first printhead assembly opening 1242, the ordinary practitioner will appreciate that gasket 1245 can be affixed to first printhead assembly enclosure rim 1088. First printhead assembly docking gasket 1245 can be any of a gasket material as previously described for sealing frame member assemblies. In various embodiments of gas enclosure assembly 1010 of FIG. 31B, first printhead assembly docking gasket 1245 can be an inflatable gasket, such as gasket 1263. In that regard, first printhead assembly docking gasket 1245 can be an inflatable gasket, as previously described for FIG. 28. As previously presented, first seal 1263 can be mounted on first outer surface 1237 of first seal-support panel 1235 around first passage 1261.

As depicted in FIG. 31B and FIG. 31C, for various maintenance procedures that can be conducted in a fully-automated mode, first printhead assembly 1080 can remain positioned over first printhead assembly opening 1242. In that regard, first printhead assembly 1080 can be adjusted in the Z-axis direction by first printhead assembly positioning system 1090 for positioning printhead device 1082 over first printhead assembly opening 1242 with respect to first maintenance system assembly 1250. Additionally, first maintenance system assembly 1250 can be adjusted in the Y-X direction on first maintenance system positioning system 1251 for positioning first maintenance system assembly 1250 with respect to printhead device 1082. During various maintenance procedures, first printhead assembly 1080 can be placed into contact with first printhead assembly docking gasket 1245 by further adjustment in the Z-axis direction by first printhead assembly positioning system 1090 to place first printhead assembly enclosure 1084 in a position to cover first printhead assembly opening 1242 (not shown). As depicted in FIG. 31C, for various maintenance procedures, for example, but not limited by, maintenance procedures requiring direct access to the interior of first middle maintenance system panel assembly 1230', first printhead assembly 1080 can be docked with first printhead assembly docking gasket 1245 by still further adjustment in the Z-axis direction by first printhead assembly positioning system 1090 to seal first printhead assembly opening 1242. As previously mentioned, first printhead assembly docking gasket 1245 can be either a compressible gasket material as previously described for the hermetic sealing of various frame members, or an inflatable gasket, as previously described for FIG. 28. Additionally, as depicted in FIG. 31C, inflatable gasket 1263 can be inflated, thereby sealably closing first passage 1261. Moreover, the portions of first printhead assembly enclosure 1084 forming a housing can be constructed as previously described for various panel assemblies, so that the frame assembly members and panels are capable of providing an hermetic enclosure. As such, for FIG. 31C, when first printhead assembly opening 1242 and first passage 1261 are sealably closed, first middle maintenance system panel assembly 1230' can be isolated from the remaining volume of gas enclosure assembly 1010.

Figure 31D:
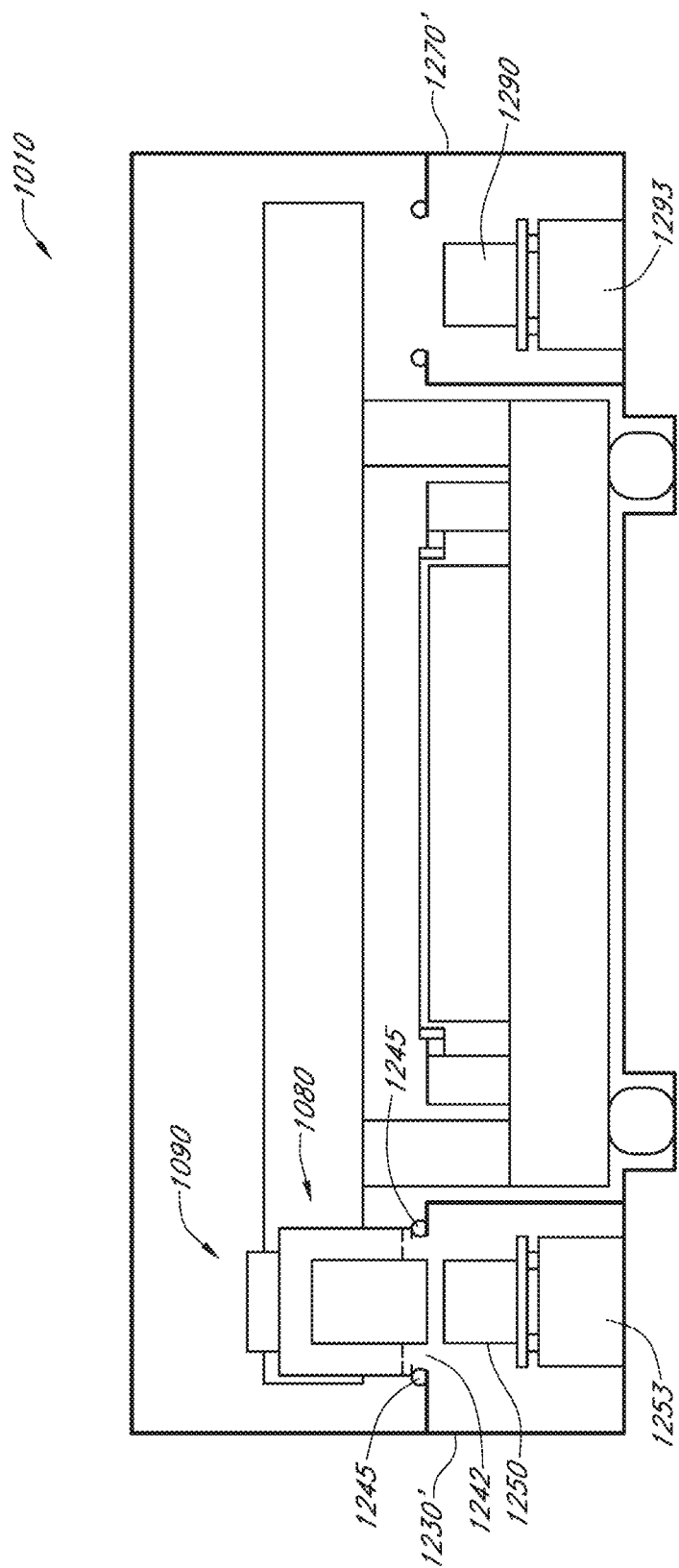
FIG. 31D-FIG. 31F are cross-sectional views of a gas enclosure assembly according to various embodiments of a gas enclosure depicted in FIG. 29.
Figure 31E:
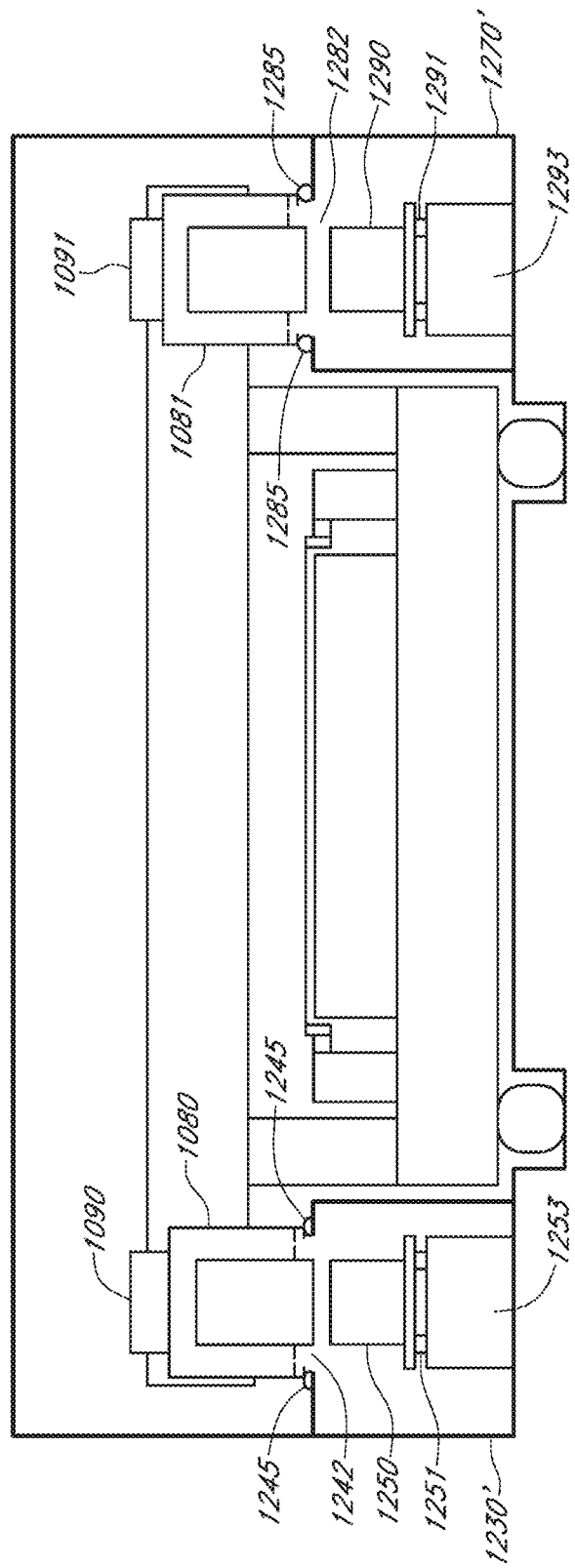

In FIG. 31D and FIG. 31E, various embodiments of gas enclosure 1010 are depicted in which first maintenance system assembly 1250 and second maintenance system assembly 1290 can be mounted on first maintenance system assembly platform 1253 and second maintenance system assembly platform 1293, respectively. In 31D and FIG. 31E, first maintenance system assembly platform 1253 and second maintenance system assembly platform 1293 are enclosed within first middle maintenance system panel assembly 1230' and second middle maintenance system panel assembly 1270', respectively. As previously mentioned, the following teachings for first middle maintenance system panel assembly 1230' can apply to second middle maintenance system panel assembly 1270', as well. In that regard, as indicated in FIG. 31D, first printhead assembly 1080 can be docked with first printhead assembly docking gasket 1245 with enough force applied the Z-axis direction by first printhead assembly positioning system 1090 so that first printhead assembly opening 1242 can be sealed. As such, for FIG. 31D, when first printhead assembly opening 1242 is sealably closed, first middle maintenance system panel assembly 1230' can be isolated from the remaining volume of gas enclosure assembly 1010.

As previously taught for various embodiments of gas enclosure assembly 1010 of FIGS. 31A-31C, a printhead can remain positioned over first printhead assembly opening 1242 to during various maintenance procedures without covering or sealing first printhead assembly opening 1242 so as to close first printhead assembly opening 1242. In various embodiments of gas enclosure assembly 1010, for various maintenance procedures, a printhead assembly enclosure can be placed into contact with a gasket by adjusting the Z-axis to cover a printhead assembly opening. In this regard, FIG. 31E can be interpreted in two ways. In a first interpretation, first printhead assembly docking gasket 1245 and second printhead assembly docking gasket 1285 can made from a compressible gasket material, such as previously described for the hermetic sealing of various frame members. In FIG. 31E, first printhead assembly 1080 has been positioned in the Z-axis direction over first maintenance system assembly 1250 so that gasket 1245 has been compressed, thereby sealably closing first printhead assembly opening 1242. In comparison, second printhead assembly 1081 has been positioned in the Z-axis direction over second maintenance system assembly 1290 to contact second printhead assembly docking gasket 1285, thereby covering second printhead assembly opening 1282. In a second interpretation, first printhead assembly docking gasket 1245 and second printhead assembly docking gasket 1285 can be an inflatable gasket, as previously described for FIG. 28. In FIG. 31E, first printhead assembly 1080 can be positioned in the Z-axis direction over first maintenance system assembly 1250 to contact first printhead assembly docking gasket 1245 before it is inflated, thereby covering first printhead assembly opening 1242. In comparison, second printhead assembly 1081 has been positioned in the Z-axis direction over second maintenance system assembly 1290 so that when second printhead assembly docking gasket 1285 is inflated, second printhead assembly opening 1282 is sealably closed.

Figure 31F:
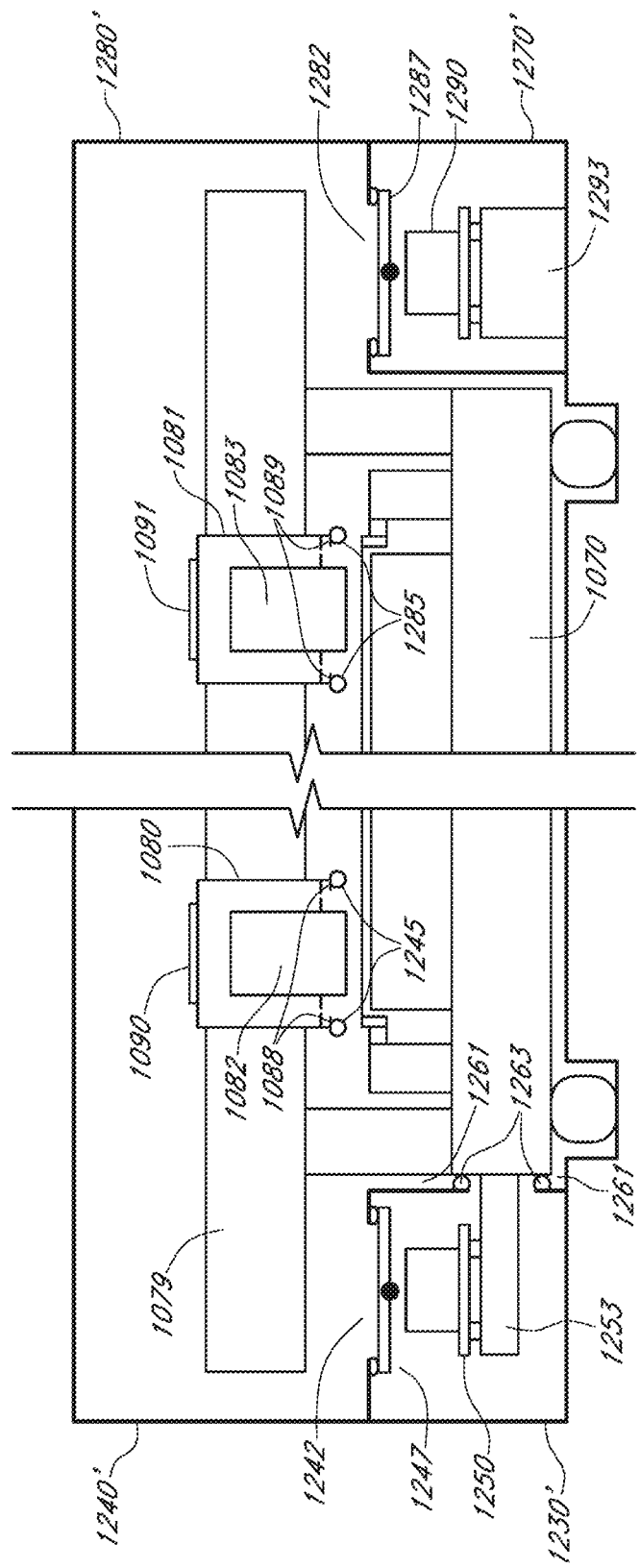

FIG. 31F depicts that maintenance volumes, for example, illustrated using first middle maintenance system panel assembly 1230' and second middle maintenance system panel assembly 1270', can be sealed using a covering such as, for example, but not limited by, a gate-valve assembly. The following teachings for first middle maintenance system panel assembly 1230' and second middle maintenance system panel assembly 1270' can apply to various embodiments of maintenance system panel assemblies and gas enclosure assemblies. As depicted in FIG. 31F, closing first printhead assembly opening 1242 and second printhead assembly opening 1282 using, for example, but not limited by, first printhead assembly gate valve 1247 and second printhead assembly gate valve 1287, respectively, can provide for continued operation of first printhead assembly 1080 and second printhead assembly 1081, respectively. As depicted for first middle maintenance system panel assembly 1230' of FIG. 31F, sealably closing first printhead assembly opening 1242 using first printhead assembly gate valve 1247, as described for FIG. 27A, and FIG. 27B as well as sealably closing first passage 1261 around base 1070, as described for FIG. 28, can be done remotely and automatically. Similarly, as depicted for second middle maintenance system panel assembly 1270' of FIG. 31F, sealably closing second printhead assembly opening 1282 using second printhead assembly gate valve 1287, as described for FIG. 27A and FIG. 27B, can be done remotely and automatically. It is contemplated that various printhead maintenance procedures can be facilitated by isolation of maintenance volumes, for example, as defined by first middle maintenance system panel assembly 1230' and second middle maintenance system panel assembly 1270', while still providing for the continuation of printing processes utilizing first printhead assembly 1080 and second printhead assembly 1081.

As previously mentioned, first printhead assembly docking gasket 1245 and second printhead assembly docking gasket 1285 can be affixed around first printhead assembly opening 1242 and second printhead assembly opening 1282, respectively. Additionally, as depicted in FIG. 31F, first printhead assembly docking gasket 1245 and second printhead assembly docking gasket 1285 can be affixed around first printhead assembly enclosure rim 1088 and second printhead assembly enclosure rim 1089, respectively. When maintenance of first printhead assembly 1080 and second printhead assembly 1081 is indicated, first printhead assembly gate valve 1247 and second printhead assembly gate valve 1287 can be opened, and first printhead assembly 1080 and second printhead assembly 1081 can dock with first middle maintenance system panel assembly 1230' and second middle maintenance system panel assembly 1270' as previously described.

For example, but not limited by, any maintenance procedure that can provide maintenance on first maintenance system assembly 1250 and second maintenance system assembly 1290 can be done by isolating first middle maintenance system panel assembly 1230' and second middle maintenance system panel assembly 1270,' respectively, without interrupting printing processes. It is further contemplated that loading of new printheads or printhead assembles into the system, or removal of printheads or printhead assemblies from the system can be done by isolating first middle maintenance system panel assembly 1230' and second middle maintenance system panel assembly 1270,' respectively, without interrupting printing processes. Such activities may be facilitated automatically, for example, but not limited by, the use of robots. For example, but not limited by, robotic retrieval of a printhead stored in a maintenance volume, such as first middle maintenance system panel assembly 1230' and second middle maintenance system panel assembly 1270' of FIG. 31F could be done, followed by robotic changing of a malfunctioning printhead on printhead device 1082 of first printhead assembly 1080 or on printhead device 1083 of second printhead assembly 1081 for a functioning printhead. This could then be followed by robotic deposition of a malfunctioning printhead into a module in either first maintenance system assembly 1250 or second maintenance system assembly 1290. Such maintenance procedures can be carried out in an automated mode without disrupting ongoing printing processes.

After robotic deposition of a malfunctioning printhead in either first maintenance system assembly 1250 or second maintenance system assembly 1290, a maintenance volume, such as first middle maintenance system panel assembly 1230' and second middle maintenance system panel assembly 1270', respectively can be sealably closed and isolated by closing first printhead assembly opening 1242 and second printhead assembly opening 1282 using, for example, but not limited by, first printhead assembly gate valve 1247 and second printhead assembly gate valve 1287, respectively. Moreover a maintenance volume can then be opened to the atmosphere, for example, in accordance with the preceding teachings, so that malfunctioning printheads can be retrieved and replaced. As will be discussed in more detail subsequently, as various embodiments of a gas purification system are designed with respect to the volume of an entire gas enclosure assembly, gas purification resources can be devoted to purging the significantly reduced volume of a maintenance volume space, thereby significantly reducing system recovery time for the maintenance volume. In that regard, maintenance procedures requiring opening a maintenance volume to the atmosphere can be carried out with either no or minimal disruption to ongoing printing processes.

Figure 32:
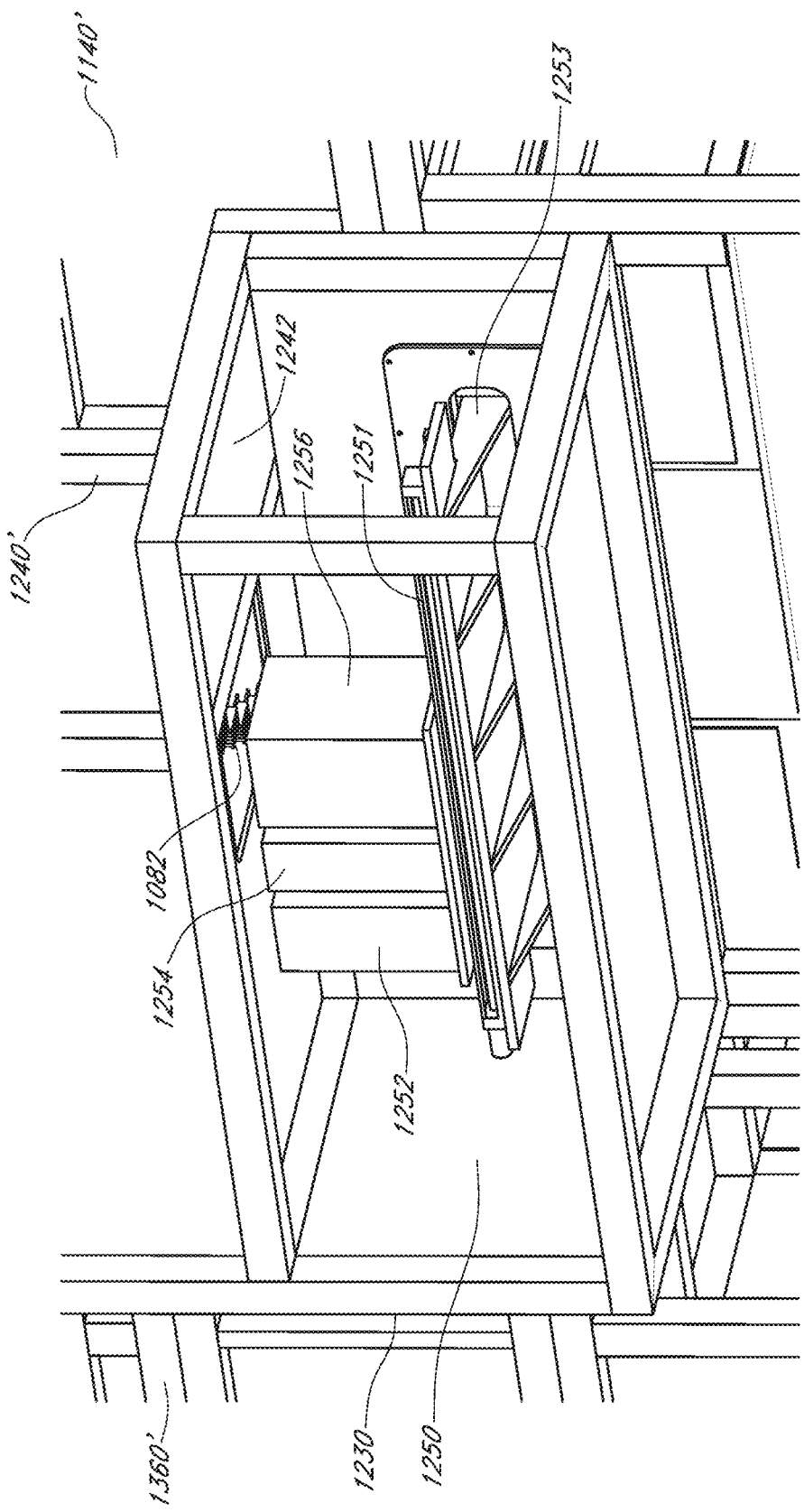
FIG. 32 depicts a perspective view of a maintenance station mounted in a frame assembly section of a gas enclosure assembly as depicted in FIG. 29 in accordance with various embodiments of the present teachings.

FIG. 32 depicts an expanded view of first maintenance system assembly 1250 in accordance with various embodiments of a gas enclosure assembly and system of the present teachings. As previously discussed, a maintenance system can include, for example, but not limited by, a drop calibration station for performing various printhead calibration procedures, a purge station for collection and containment of the ink expelled from a printhead during a purging or priming procedure, and a blotting station for removal of the excess ink after a purging or priming procedure has been conducted at a purge station. Additionally, a maintenance system can include one or more stations for receiving one or more print heads or printhead devices that have been removed from first printhead assembly 1080 and second printhead assembly 1081 or for storing printheads or printhead devices that can be loaded into first printhead assembly 1080 and second printhead assembly 1081 during a maintenance procedure.

Various embodiments of a maintenance system assembly according to the present teachings, such as first maintenance system assembly 1250 of FIG. 32, can include drop calibration module 1252, purge basin module 1254 and blotter module 1256. First maintenance system assembly 1250 can be mounted on first maintenance system positioning system 1251. First maintenance system positioning system 1251 can provide Y-axis movement to selectively align each of the various modules with a printhead assembly having a printhead device with at least one printhead, such as printhead device 1082 of FIG. 31B, with first printhead assembly opening 1242. Positioning of various modules with a printhead assembly having a printhead device with at least one printhead can be done using a combination of maintenance system positioning system 1251, as well as first printhead assembly positioning system 1090. Maintenance system positioning system 1251 can provide Y-X positioning of various modules of first maintenance system assembly 1250 relative to first printhead assembly opening 1242, while first printhead assembly positioning system 1090 can provide X-Z positioning of first printhead assembly 1080 over first printhead assembly opening 1242. In that regard, a printhead device with at least one printhead can be positioned over or within first printhead assembly opening 1242 to receive maintenance.

Figure 33:
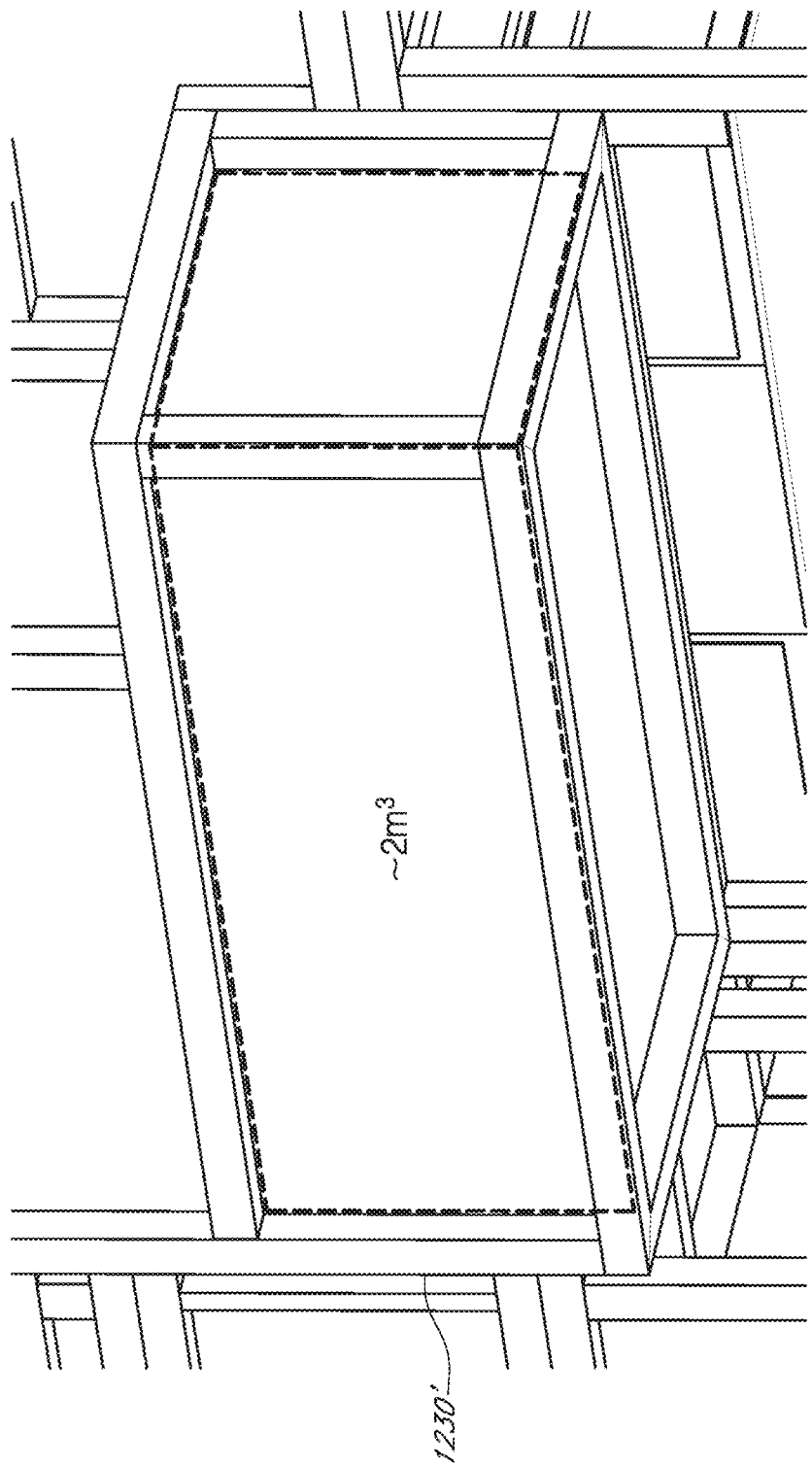
FIG. 33 is a perspective view of a frame assembly section of a gas enclosure assembly as depicted in FIG. 29 in accordance with various embodiments of the present teachings.

FIG. 33 illustrates expanded perspective view of first middle maintenance system panel assembly 1230', in which gloveports can be capped as shown or with gloves attached (not shown). As indicated, it is contemplated that the volume of various maintenance system panel assemblies, such as first middle maintenance system panel assembly 1230', can be about 2 m$^3$. It is contemplated that various embodiments of maintenance system panel assemblies can have a volume of about 1 m$^3$, while in various embodiments of a maintenance system panel assembly, the volume can be about 10 m$^3$. For various embodiments of a gas enclosure assembly, such as gas enclosure assembly 1010 of FIG. 29, a frame member assembly section can less than or equal to about 1% of the total volume of a gas enclosure assembly. In various embodiments of a gas enclosure assembly, a frame member assembly section can be less than or equal to about 2% of the total volume of a gas enclosure assembly. In various embodiments of a gas enclosure assembly, a frame member assembly section can be less than or equal to about 10% of the total volume of a gas enclosure assembly. For various embodiments of a gas enclosure assembly, a frame member assembly section can be less than or equal to about 50% of the total volume of a gas enclosure assembly.

A gas enclosure assembly and system according to the present teachings can have a gas circulation and filtration system internal a gas enclosure assembly. Such an internal filtration system can have a plurality of fan filter units within the interior, and can be configured to provide a laminar flow of gas within the interior. The laminar flow can be in a direction from a top of the interior to a bottom of the interior, or in any other direction. Although a flow of gas generated by a circulating system need not be laminar, a laminar flow of gas can be used to ensure thorough and complete turnover of gas in the interior. A laminar flow of gas can also be used to minimize turbulence, such turbulence being undesirable as it can cause particles in the environment to collect in such areas of turbulence, preventing the filtration system from removing those particles from the environment. Further, to maintain a desired temperature in the interior, a thermal regulation system utilizing a plurality of heat exchangers can be provided, for example, operating with, adjacent to, or used in conjunction with, a fan or another gas circulating device. A gas purification loop can be configured to circulate gas from within the interior of a gas enclosure assembly through at least one gas purification component exterior the enclosure. In that regard, a filtration and circulation system internal a gas enclosure assembly in conjunction with a gas purification loop external a gas enclosure assembly can provide continuous circulation of a substantially low-particulate inert gas having substantially low levels of reactive species throughout a gas enclosure assembly. The gas purification system can be configured to maintain very low levels of undesired components, for example, organic solvents and vapors thereof, as well as water, water vapor, oxygen, and the like.

Figure 34A:
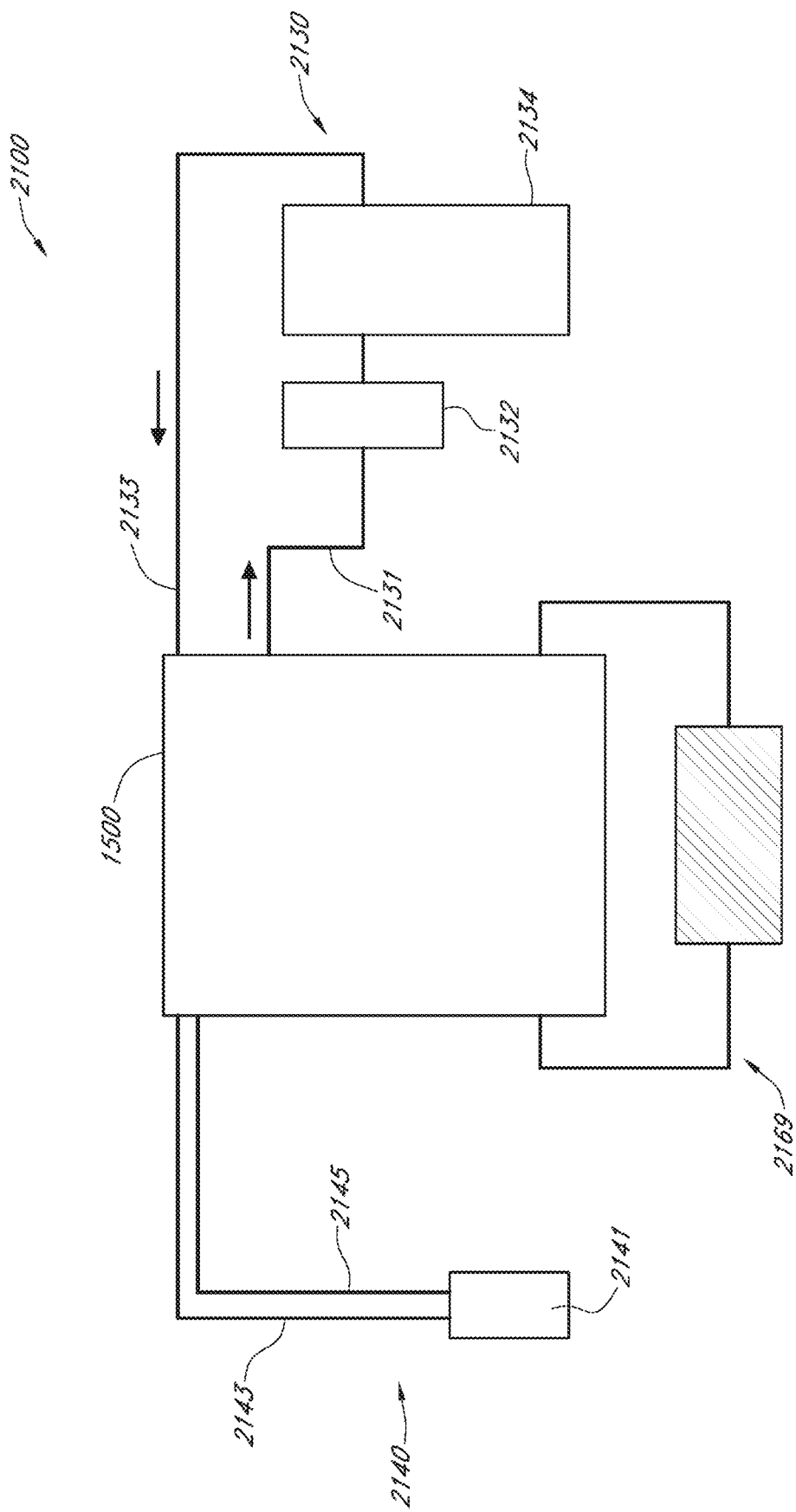
FIG. 34A and FIG. 34B are schematic views of for various embodiments of gas enclosure assembly and related system components the present teachings.

FIG. 34A is a schematic diagram showing a gas enclosure assembly and system 2100. Various embodiments of a gas enclosure assembly and system 2100 can comprise a gas enclosure assembly 1500 according to the present teachings, a gas purification loop 2130 in fluid communication gas enclosure assembly 1500, and at least one thermal regulation system 2140. Additionally, various embodiments of a gas enclosure assembly and system can have pressurized inert gas recirculation system 2169, which can supply inert gas for operating various devices, such as a substrate floatation table for an OLED printing system. Various embodiments of a pressurized inert gas recirculation system 2169 can utilize a compressor, a blower and combinations of the two as sources for various embodiments of inert gas recirculation system 2169, as will be discussed in more detail subsequently. Additionally, gas enclosure assembly and system 2100 can have a filtration and circulation system internal to gas enclosure assembly and system 2100 (not shown).

For various embodiments of a gas enclosure assembly according to the present teachings, the design of the ducting can separate the inert gas circulated through gas purification loop 2130 of FIG. 34A from the inert gas that is continuously filtered and circulated internally for various embodiments of a gas enclosure assembly. Gas purification loop 2130 includes outlet line 2131 from gas enclosure assembly 1500, to a solvent removal component 2132 and then to gas purification system 2134. Inert gas purified of solvent and other reactive gas species, such as oxygen and water vapor, are then returned to gas enclosure assembly 1500 through inlet line 2133. Gas purification loop 2130 may also include appropriate conduits and connections, and sensors, for example, oxygen, water vapor and solvent vapor sensors. A gas circulating unit, such as a fan, blower or motor and the like, can be separately provided or integrated, for example, in gas purification system 2134, to circulate gas through gas purification loop 2130. According to various embodiments of a gas enclosure assembly, though solvent removal system 2132 and gas purification system 2134 are shown as separate units in the schematic shown in FIG. 33, solvent removal system 2132 and gas purification system 2134 can be housed together as a single purification unit. Thermal regulation system 2140 can include at least one chiller 2141, which can have fluid outlet line 2143 for circulating a coolant into a gas enclosure assembly, and fluid inlet line 2145 for returning the coolant to the chiller.

Gas purification loop 2130 of FIG. 34A can have solvent removal system 2132 placed upstream of gas purification system 2134, so that inert gas circulated from gas enclosure assembly 1500 passes through solvent removal system 2132 via outlet line 2131. According to various embodiments, solvent removal system 2132 may be a solvent trapping system based on adsorbing solvent vapor from an inert gas passing through solvent removal system 2132 of FIG. 34A. A bed or beds of a sorbent, for example, but not limited by, such as activated charcoal, molecular sieves, and the like, may effectively remove a wide variety of organic solvent vapors. For various embodiments of a gas enclosure assembly cold trap technology may be employed to remove solvent vapors in solvent removal system 2132. As previously mentioned, for various embodiments of a gas enclosure assembly according to the present teachings, sensors, such as oxygen, water vapor and solvent vapor sensors, may be used to monitor the effective removal of such species from inert gas continuously circulating through a gas enclosure assembly system, such as gas enclosure assembly system 2100 of FIG. 34. Various embodiments of a solvent removal system can indicate when sorbent, such as activated carbon, molecular sieves, and the like, has reached capacity, so that the bed or beds of sorbent can be regenerated or replaced. Regeneration of a molecular sieve can involve heating the molecular sieve, contacting the molecular sieve with a forming gas, a combination thereof, and the like. Molecular sieves configured to trap various species, including oxygen, water vapor, and solvents, can be regenerated by heating and exposure to a forming gas that comprises hydrogen, for example, a forming gas comprising about 96% nitrogen and 4% hydrogen, with said percentages being by volume or by weight. Physical regeneration of activated charcoal can be done using a similar procedure of heating under an inert environment.

Any suitable gas purification system can be used for gas purification system 2134 of gas purification loop 2130 of FIG. 34A. Gas purification systems available, for example, from MBRAUN Inc., of Statham, New Hampshire, or Innovative Technology of Amesbury, Massachusetts, may be useful for integration into various embodiments of a gas enclosure assembly according to the present teachings. Gas purification system 2134 can be used to purify one or more inert gases in gas enclosure assembly and system 2100, for example, to purify the entire gas atmosphere within a gas enclosure assembly. As previously mentioned, in order to circulate gas through gas purification loop 2130, gas purification system 2134 can have a gas circulating unit, such as a fan, blower or motor, and the like. In that regard, a gas purification system can be selected depending on the volume of the enclosure, which can define a volumetric flow rate for moving an inert gas through a gas purification system. For various embodiments of gas enclosure assembly and system having a gas enclosure assembly with a volume of up to about 4 $m^3$; a gas purification system that can move about 84 $m^3$/h can be used. For various embodiments of gas enclosure assembly and system having a gas enclosure assembly with a volume of up to about 10 $m^3$; a gas purification system that can move about 155 $m^3$/h can be used. For various embodiments of a gas enclosure assembly having a volume of between about 52-114 $m^3$, more than one gas purification system may be used.

Any suitable gas filters or purifying devices can be included in the gas purification system 2134 of the present teachings. In some embodiments, a gas purification system can comprise two parallel purifying devices, such that one of the devices can be taken off line for maintenance and the other device can be used to continue system operation without interruption. In some embodiments, for example, the gas purification system can comprise one or more molecular sieves. In some embodiments, the gas purification system can comprise at least a first molecular sieve, and a second molecular sieve, such that, when one of the molecular sieves becomes saturated with impurities, or otherwise is deemed not to be operating efficiently enough, the system can switch to the other molecular sieve while regenerating the saturated or non-efficient molecular sieve. A control unit can be provided for determining the operational efficiency of each molecular sieve, for switching between operation of different molecular sieves, for regenerating one or more molecular sieves, or for a combination thereof. As previously mentioned, molecular sieves may be regenerated and reused.

Regarding thermal regulation system 2140 of FIG. 34A, at least one fluid chiller 2141 can be provided for cooling the gas atmosphere within gas enclosure assembly and system 2100. For various embodiments of a gas enclosure assembly of the present teachings, fluid chiller 2141 delivers cooled fluid to heat exchangers within the enclosure, where inert gas is passed over a filtration system internal the enclosure. At least one fluid chiller can also be provided with gas enclosure assembly and system 2100 to cool heat evolving from an apparatus enclosed within gas enclosure 2100. For example, but not limited by, at least one fluid chiller can also be provided for gas enclosure assembly and system 2100 to cool heat evolving from an OLED printing system. Thermal regulation system 2140 can comprise heat-exchange or Peltier devices and can have various cooling capacities. For example, for various embodiments of a gas enclosure assembly and system, a chiller can provide a cooling capacity of from between about 2 kW to about 20 kW. Fluid chillers 1136 and 1138 can chill one or more fluids. In some embodiments, the fluid chillers can utilize a number of fluids as coolant, for example, but not limited by, water, antifreeze, a refrigerant, and a combination thereof as a heat exchange fluid. Appropriate leak-free, locking connections can be used in connecting the associated conduits and system components.

Various embodiments of a gas enclosure assembly as depicted for gas enclosure assembly 1000 of FIG. 23 and FIG. 24, or for gas enclosure assembly 1010 of FIG. 29 and FIG. 30, can have a first frame member assembly section defining a first volume and a second frame member assembly section defining a second volume, where each volume can be separated from the other volume. For various embodiments of gas enclosure assembly 1000 of FIG. 23 and FIG. 24, or for gas enclosure assembly 1010 of FIG. 29 and FIG. 30, all the system features described for a gas enclosure assembly of FIG. 34A can be included as system features for such embodiments having. a first frame member assembly section defining a first volume and a second frame member assembly section defining a second volume, where each volume can be separated from the other volume. Additionally, as depicted in FIG. 34B, for gas assembly and system 2150, for various embodiments of a gas enclosure assembly that have a first frame member assembly section defining a first volume and a second frame member assembly section defining a second volume, each volume can be placed in separate fluid communication with gas purification loop 2130.

Figure 34B:
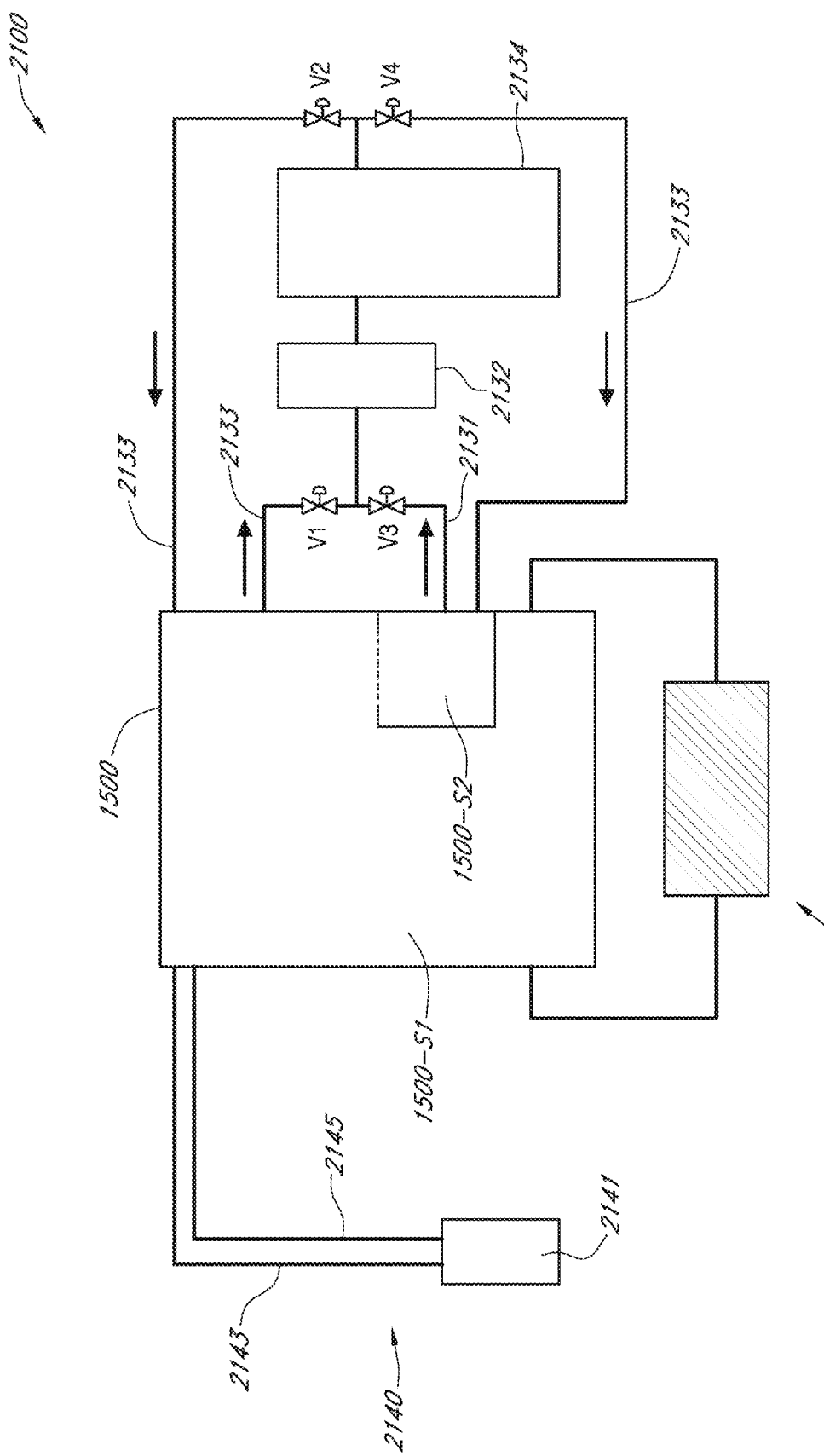

As depicted in FIG. 34B, gas enclosure assembly 1500 of gas enclosure assembly and system 2150, can have first frame member assembly section 1500-S1 defining a first volume and second frame member assembly section 1500-S2 defining a second volume. If all valves, $V_1$, $V_2$, $V_3$ and $V_4$ are opened, then gas purification loop 2130 operates essentially as previously described for gas enclosure assembly and system 1500 of FIG. 34A. With closure of $V_3$ and $V_4$, only first frame member assembly section 1500-S1 is in fluid communication with gas purification loop 2130. This valve state may be used, for example, but not limited by, when second frame member assembly section 1500-S2 is sealably closed and thereby isolated from frame member assembly section 1500-S1 during a maintenance procedure requiring that second frame member assembly section 1500-S2 be opened to the atmosphere. With closure of $V_1$ and $V_2$, only second frame member assembly section 1500-S2 is in fluid communication with gas purification loop 2130. This valve state may be used, for example, but not limited by, during recovery of second frame member assembly section 1500-S2 after the section has been opened to the atmosphere. As previously mentioned, the requirements for gas purification loop 2130 are specified with respect to the total volume of gas enclosure assembly 1500. Therefore, by devoting the resources of a gas purification system to the recovery of a frame member assembly section, such as second frame member assembly section 1500-S2, which is depicted in FIG. 34B to be significantly less in volume than the total volume of gas enclosure 1500, the recovery time can be substantially reduced.

Figure 35:
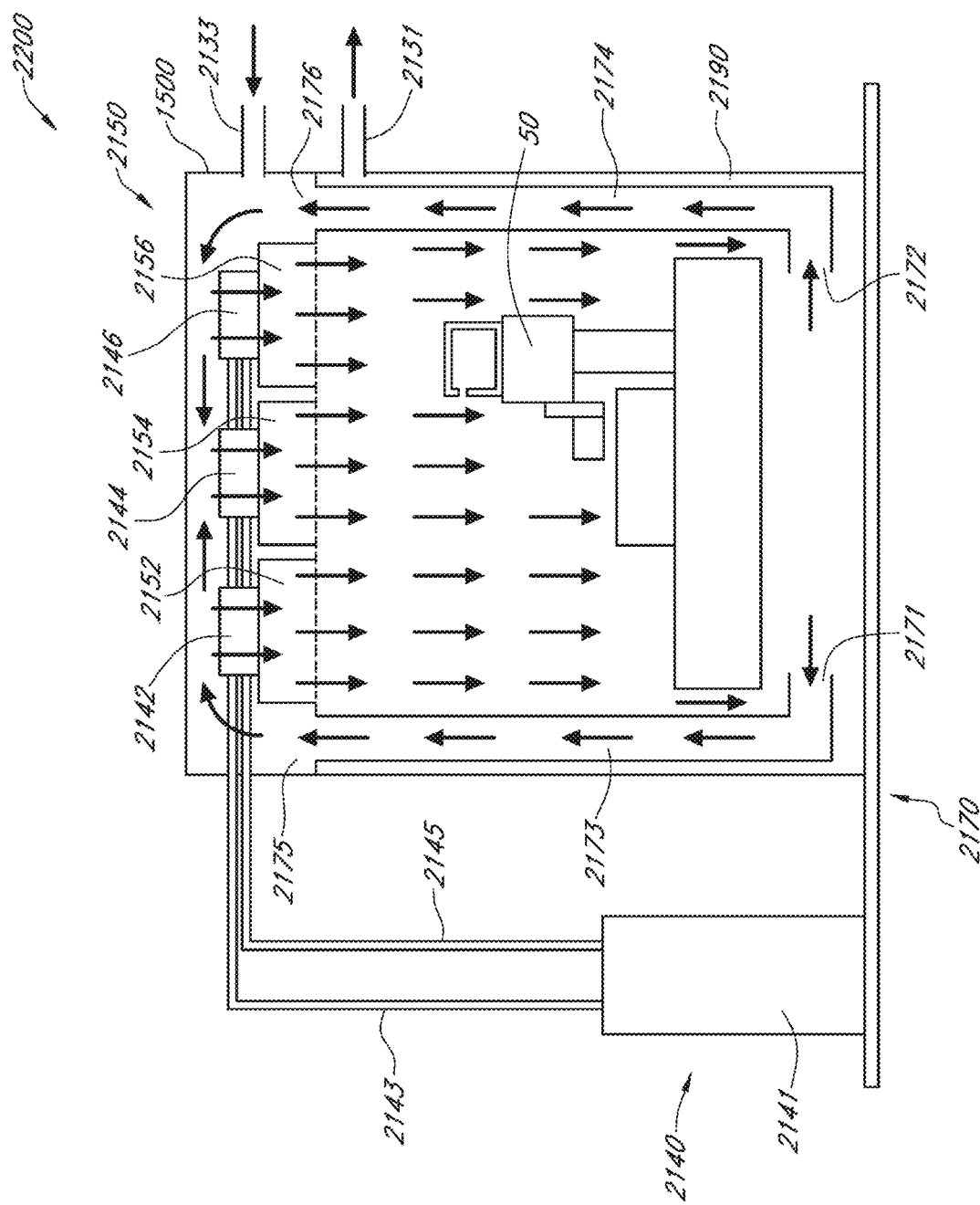
FIG. 35 is a schematic diagram of a gas enclosure assembly and system depicting an embodiment of gas circulation through a gas enclosure assembly according to various embodiments of the present teachings.
Figure 36:
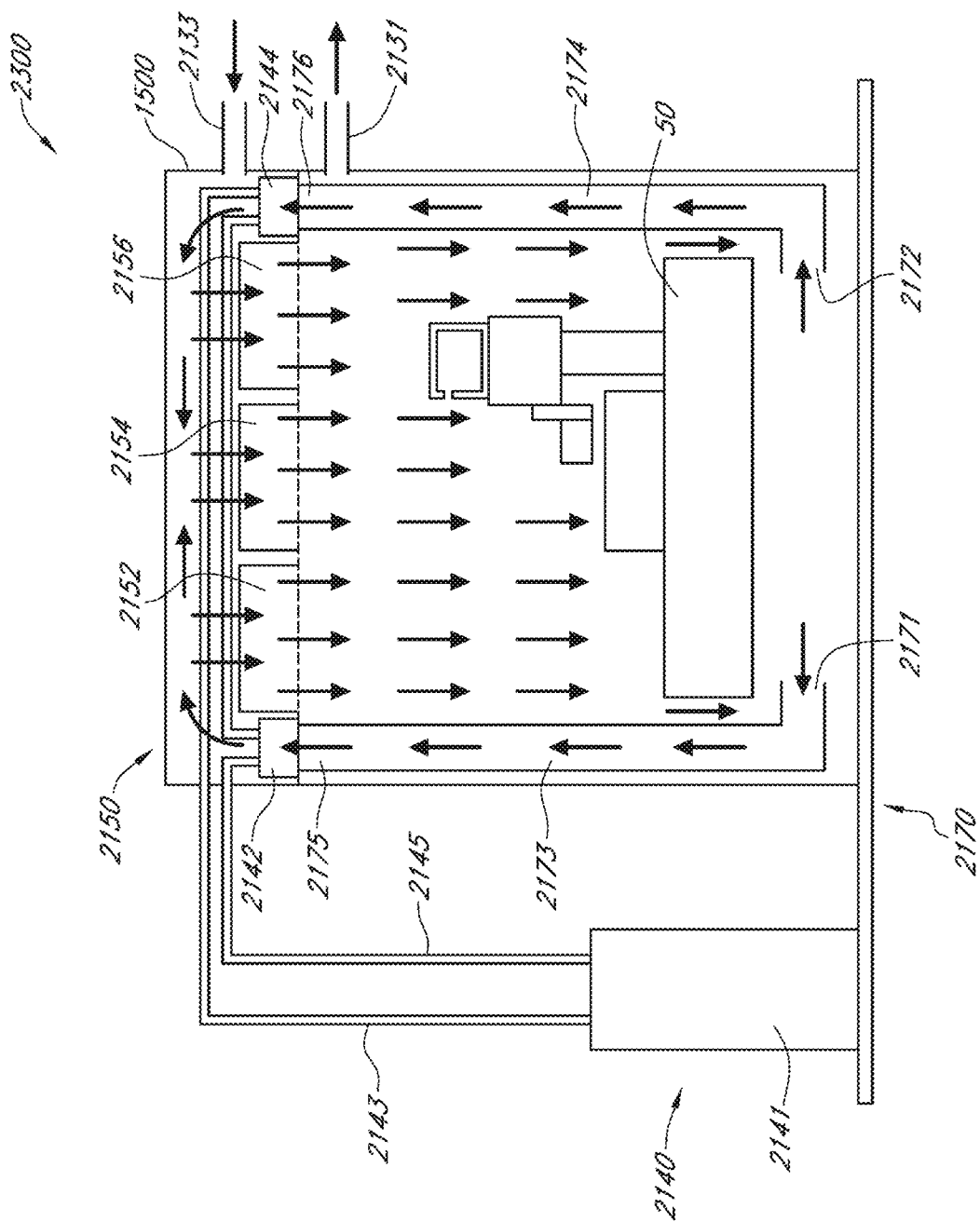
FIG. 36 is a schematic diagram of a gas enclosure assembly and system depicting an embodiment of gas circulation through a gas enclosure assembly according to various embodiments of the present teachings.

As depicted in FIG. 35 and FIG. 36, the one or more fan filter units can be configured to provide a substantially laminar flow of gas through the interior. According to various embodiments of a gas enclosure assembly according to the present teachings, one or more fan units are disposed adjacent a first interior surface of the gas atmosphere enclosure, and the one or more ductwork inlets are disposed adjacent a second, opposite interior surface of the gas atmosphere enclosure. For example, the gas atmosphere enclosure can comprise an interior ceiling and a bottom interior periphery, the one or more fan units can be disposed adjacent the interior ceiling, and the one or more ductwork inlets can comprise a plurality of inlet openings disposed adjacent the bottom interior periphery that are part of a ductwork system, as shown in FIGS. 15-17.

FIG. 35 is a cross-sectional view taken along the length of a gas enclosure assembly and system 2200, according to various embodiments of the present teachings. Gas enclosure assembly and system 2200 of FIG. 35 can include a gas enclosure 1500, which can house an OLED printing system 50, as well as gas purification system 2130 (see also FIG. 34), thermal regulation system 2140, filtration and circulation system 2150 and ductwork system 2170. Thermal regulation system 2140 can include fluid chiller 2141, which is in fluid communication with chiller outlet line 2143 and with chiller inlet line 2145. Chilled fluid can exit fluid chiller 2141, flow through chiller outlet line 2143, and be delivered heat exchangers, which for various embodiments of a gas enclosure assembly and system, as shown in FIG. 35, can be located proximal to each of a plurality of fan filter units. Fluid to can be returned from the heat exchangers proximal to the fan filter unit to chiller 2141 through chiller inlet line 2145 to be maintained at a constant desired temperature. As previously mentioned, chiller outlet line 2141 and chiller inlet line 2143 are in fluid communication with a plurality of heat exchangers including first heat exchanger 2142, second heat exchanger 2144, and third heat exchanger 2146. According to various embodiments of a gas enclosure assembly and system as shown in FIG. 34, first heat exchanger 2142, second heat exchanger 2144, and third heat exchanger 2146 are in thermal communication with a first fan filter unit 2152, a second fan filter unit 2154, and a third fan filter unit 2156, respectively, of filtration system 2150.

In FIG. 35, the many arrows depict flow to and from the various fan filter units and also depict flow within ductwork system 2170 that includes first ductwork conduit 2173 and second ductwork conduit 2174 as depicted in the simplified schematic of FIG. 34. First ductwork conduit 2173 can receive gas through a first duct inlet 2171 and can exit through a first duct outlet 2175. Similarly, second ductwork conduit 2174 can receive gas through second duct inlet 2172 exit through second duct outlet 2176. Additionally, as shown in FIG. 34, ductwork system 2170 separates inert gas that is recirculated internally through filtration system 2150 by effectively defining space 2180, which is in fluid communication with gas purification system 2130 via gas purification outlet line 2131. Such a circulatory system including various embodiments of a ductwork system as described for FIGS. 15-17, provides substantially laminar flow, minimizes turbulent flow, promotes circulation, turnover and filtration of particulate matter of the gas atmosphere in the interior of the enclosure and provides for circulation through a gas purification system exterior to a gas enclosure assembly.

FIG. 36 is a cross-sectional view taken along the length of a gas enclosure assembly and system 2300, according to various embodiments of a gas enclosure assembly according to the present teachings. Like gas enclosure assembly 2200 of FIG. 35, gas enclosure assembly system 2300 of FIG. 36 can include a gas enclosure 1500, which can house an OLED printing system 50, as well as gas purification system 2130 (see also FIG. 34), thermal regulation system 2140, filtration and circulation system 2150 and ductwork system 2170. For various embodiments of gas enclosure assembly 2300, thermal regulation system 2140, which can include fluid chiller 2141 in fluid communication with chiller outlet line 2143 and with chiller inlet line 2145, can be in fluid communication with a plurality of heat exchangers, for example, first heat exchanger 2142, and second heat exchanger 2144, as depicted in FIG. 36. According to various embodiments of a gas enclosure assembly and system as shown in FIG. 36, various heat exchangers, such as first heat exchanger 2142 and second heat exchanger 2144, can be in thermal communication with circulating inert gas by being positioned proximal to duct outlets, such as first duct outlet 2175 and second duct outlet 2176 of ductwork system 2170. In that regard, inert gas being returned for filtration from duct inlets, such as duct inlets, such as first duct inlet 2171 and second duct inlet 2172 of ductwork system 2170 can be thermally regulated prior to being circulated through, for example, a first fan filter unit 2152, a second fan filter unit 2154, and a third fan filter unit 2156, respectively, of filtration system 2150 of FIG. 36.

As can be seen from the arrows showing direction of inert gas circulation through the enclosure in FIG. 35 and FIG. 36 the fan filter units are configured to provide substantially laminar flow downwardly from a top of the enclosure toward the bottom. Fan filter units available, for example, from Flanders Corporation, of Washington, North Carolina, or Envirco Corporation of Sanford, North Carolina, may be useful for integration into various embodiments of a gas enclosure assembly according to the present teachings Various embodiments of a fan filter unit can exchange between about 350 cubic feet per minute (CFM) to about 700 CFM of inert gas through each unit. As shown in FIGS. 35 and 36, as the fan filter units are in a parallel and not series arrangement, the amount of inert gas that can be exchanged in a system comprising a plurality of fan filter units is proportional to the number of units used. Near the bottom of the enclosure the flow of gas is directed toward a plurality of ductwork inlets, indicated schematically in FIG. 35 and FIG. 36 as first duct inlet 2171 and second duct inlet 2172. As previously discussed for FIGS. 15-17, positioning the duct inlets substantially at the bottom of the enclosure, and causing downward flow of gas from upper fan filter units facilitates good turnover of the gas atmosphere within the enclosure and promotes thorough turnover and movement of the entire gas atmosphere through the gas purification system used in connection with the enclosure. By circulating the gas atmosphere through the ductwork and promoting laminar flow and thorough turnover of the gas atmosphere in the enclosure using filtration and circulation system 2150, which ductwork separates the inert gas flow for circulation through gas purification loop 2130, levels of each of a reactive species, such as water and oxygen, as well as each of a solvent can be maintained in various embodiments of a gas enclosure assembly at 100 ppm or lower, for example 1 ppm or lower, for example, at 0.1 ppm or lower.

Figure 37:
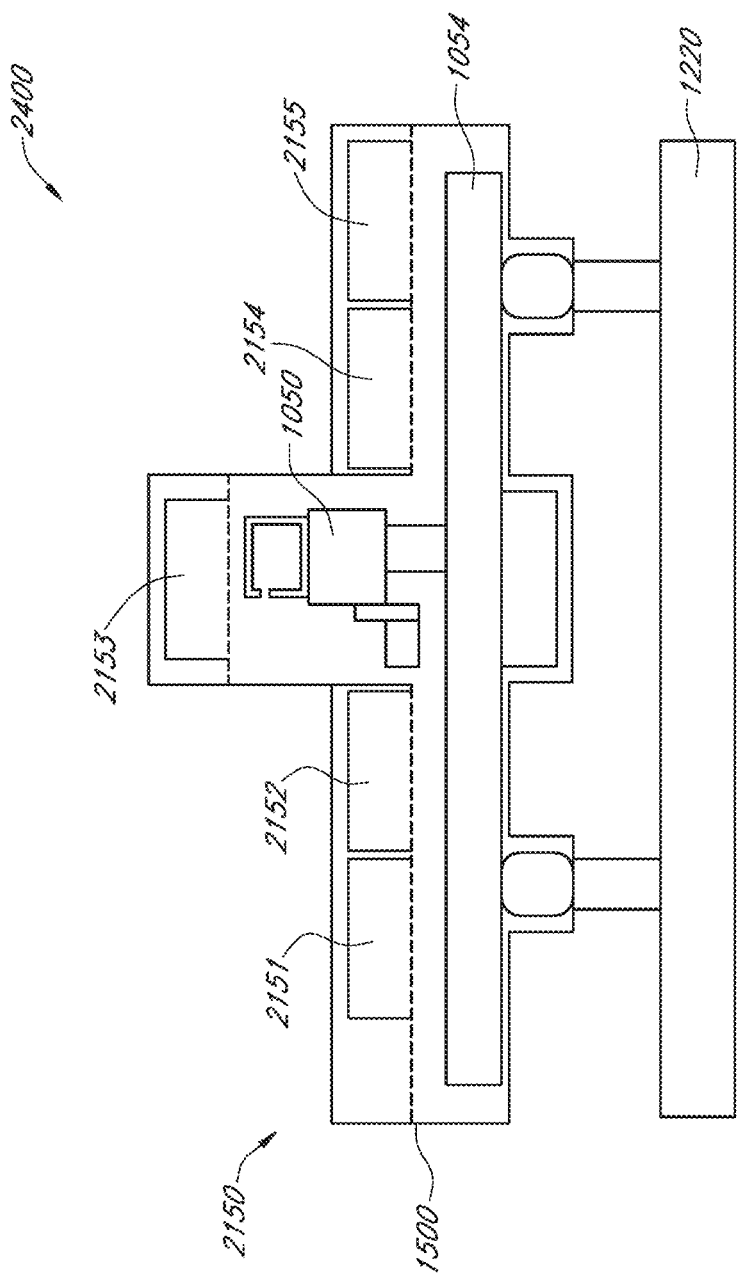
FIG. 37 is a cross-sectional schematic view of a gas enclosure assembly in accordance with various embodiments of the present teachings.

According to various embodiments of a gas enclosure assembly system used for OLED printing systems, the number of fan filter units can be selected in accordance with the physical position of a substrate in a printing system during processing. Accordingly, though 3 fan filter units are shown in FIGS. 35 and 36, the number of fan filter units can vary. For example, FIG. 37 is a cross-sectional view taken along the length of a gas enclosure assembly and system 2400, which is a gas enclosure assembly and system similar to that depicted in FIG. 23 and FIG. 24, and FIG. 29 and FIG. 30. Gas enclosure assembly and system 2400 can include gas enclosure assembly 1500, which houses OLED printing system 1050 supported on base 1220. Substrate floatation table 1054 of OLED printing system defines the travel over which a substrate can be moved through system 2400 during the OLED printing of a substrate. As such, filtration system 2150 of gas enclosure assembly and system 2400 has an appropriate number of fan filter units; shown as 2151-2155, corresponding to the physical travel of a substrate through OLED printing system 1050 during processing. Additionally, the schematic section view of FIG. 37 depicts the contouring of various embodiments of a gas enclosure, which can effectively decrease the volume of inert gas required during an OLED printing process, and at the same time provide ready access to the interior of gas enclosure 1500; either remotely during processing, for example, using gloves installed in various gloveports, or directly by various removable panels in the case of a maintenance operation.

Various embodiments of a gas enclosure and system can utilize a pressurized inert gas recirculation system for the operation of a variety of pneumatically operated devices and apparatuses. Additionally, as previous discussed, embodiments of a gas enclosure assembly of the present teachings can be maintained at a slight positive pressure relative to the external environment, for example, but not limited by between about 2 mbarg to about 8 mbarg. Maintaining a pressurized inert gas recirculation system within a gas enclosure assembly system can be challenging, as it presents a dynamic and ongoing balancing act regarding maintaining a slight positive internal pressure of a gas enclosure assembly and system, while at the same time continuously introducing pressurized gas into a gas enclosure assembly and system. Further, variable demand of various devices and apparatuses can create an irregular pressure profile for various gas enclosure assemblies and systems of the present teachings. Maintaining a dynamic pressure balance for a gas enclosure assembly held at a slight positive pressure relative to the external environment under such conditions can provide for the integrity of an ongoing OLED printing process.

Figure 38:
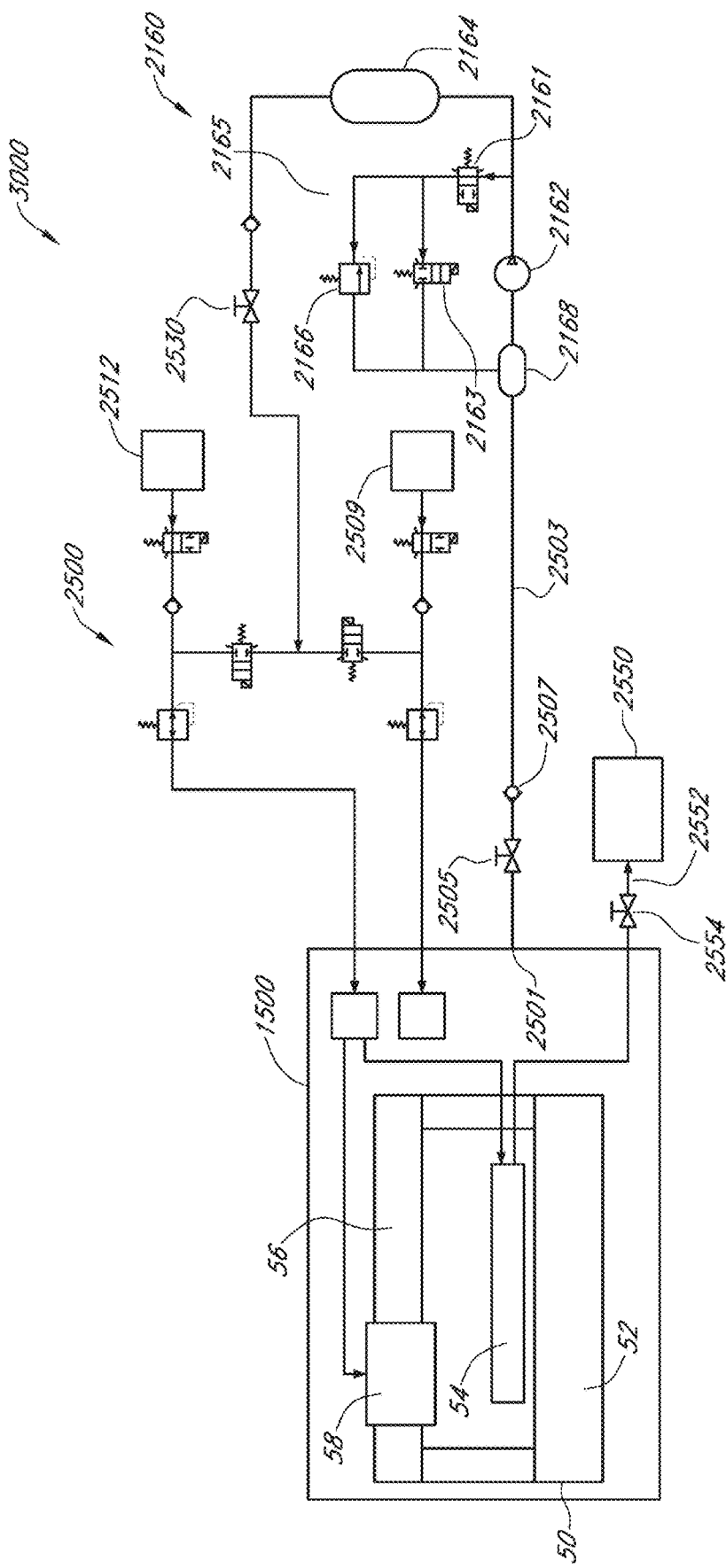
FIG. 38 is a schematic of a gas enclosure assembly and system in accordance with various embodiments of the present teachings.

As shown in FIG. 38, various embodiments of gas enclosure assembly and system 3000 can have external gas loop 2500 for integrating and controlling inert gas source 2509 and clean dry air (CDA) source 2512 for use in various aspects of operation of gas enclosure assembly and system 3000. One of ordinary skill in the art will appreciate that gas enclosure assembly and system 3000 can also include various embodiments of an internal particle filtration and gas circulation system, as well as various embodiments of an external gas purification system, as previously described. In addition to external loop 2500 for integrating and controlling inert gas source 2509 and CDA source 2512, gas enclosure assembly and system 3000 can have compressor loop 2160, which can supply inert gas for operating various devices and apparatuses that can be disposed in the interior of gas enclosure assembly and system 3000.

Compressor loop 2160 of FIG. 38 can include compressor 2162, first accumulator 2164 and second accumulator 2168, which are configured to be in fluid communication. Compressor 2162 can be configured to compress inert gas withdrawn from gas enclosure assembly 1500 to a desired pressure. An inlet side of compressor loop 2160 can be in fluid communication with gas enclosure assembly 1500 via gas enclosure assembly outlet 2501 through line 2503, having valve 2505 and check valve 2507. Compressor loop 2160 can be in fluid communication with gas enclosure assembly 1500 on an outlet side of compressor loop 2160 via external gas loop 2500. Accumulator 2164 can be disposed between compressor 2162 and the junction of compressor loop 2160 with external gas loop 2500 and can be configured to generate a pressure of 5 psig or higher. Second accumulator 2168 can be in compressor loop 2160 for providing dampening fluctuations due to compressor piston cycling at about 60 Hz. For various embodiments of compressor loop 2160, first accumulator 2164 can have a capacity of between about 80 gallons to about 160 gallons, while second accumulator can have a capacity of between about 30 gallons to about 60 gallons. According to various embodiments of gas enclosure assembly and system 3000, compressor 2162 can be a zero ingress compressor. Various types of zero ingress compressors can operate without leaking atmospheric gases into various embodiments of a gas enclosure assembly and system of the present teachings. Various embodiments of a zero ingress compressor can be run continuously, for example, during an OLED printing process utilizing the use of various devices and apparatuses requiring compressed inert gas.

Accumulator 2164 can be configured to receive and accumulate compressed inert gas from compressor 2162. Accumulator 2164 can supply the compressed inert gas as needed in gas enclosure assembly 1500. For example, accumulator 2164 can provide gas to maintain pressure for various components of gas enclosure assembly 1500, such as, but not limited by, one or more of a pneumatic robot, a substrate floatation table, an air bearing, an air bushing, a compressed gas tool, a pneumatic actuator, and combinations thereof. As shown in FIG. 38 for gas enclosure assembly and system 3000, gas enclosure assembly 1500 can have an OLED printing system 50 enclosed therein. As shown in FIG. 24 and FIG. 30, OLED printing system 50 can be supported by granite stage 70 and can include substrate floatation table 54 for transporting a substrate into position in a print head chamber, as well supporting a substrate during an OLED printing process. Additionally, air bearing 58 supported on bridge 56 can be used in place of, for example, a linear mechanical bearing. For various embodiments of a gas enclosure and system of the present teachings, the use of a variety of pneumatically operated devices and apparatuses can be provide low-particle generating performance, as well as being low maintenance. Compressor loop 2160 can be configured to continuously supply pressurized inert gas to various devices and apparatuses of gas enclosure apparatus 3000. In addition to a supply of pressurized inert gas, substrate floatation table 54 of OLED printing system 50, which utilizes air bearing technology, also utilizes vacuum system 2550, which is in communication with gas enclosure assembly 1500 through line 2552 when valve 2554 is in an open position.

A pressurized inert gas recirculation system according to the present teachings can have pressure-controlled bypass loop 2165 as shown in FIG. 38 for compressor loop 2160, which acts to compensate for variable demand of pressurized gas during use, thereby providing dynamic balance for various embodiments of a gas enclosure assembly and system of the present teachings. For various embodiments of a gas enclosure assembly and system according to the present teachings, a bypass loop can maintain a constant pressure in accumulator 2164 without disrupting or changing the pressure in enclosure 1500. Bypass loop 2165 can have first bypass inlet valve 2161 on an inlet side of bypass loop 2165, which is closed unless bypass loop 2165 is used. Bypass loop 2165 can also have back pressure regulator, which can be used when second valve 2163 is closed.

Bypass loop 2165 can have second accumulator 2168 disposed at an outlet side of bypass loop 2165. For embodiments of compressor loop 2160 utilizing a zero ingress compressor, bypass loop 2165 can compensate for small excursions of pressure that can occur over time during use of a gas enclosure assembly and system. Bypass loop 2165 can be in fluid communication with compressor loop 2160 on an inlet side of bypass loop 2165 when bypass inlet valve 2161 is in an opened position. When bypass inlet valve 2161 is opened, inert gas shunted through bypass loop 2165 can be recirculated to the compressor if inert gas from compressor loop 2160 is not in demand within the interior of gas enclosure assembly 1500. Compressor loop 2160 is configured to shunt inert gas through bypass loop 2165 when a pressure of the inert gas in accumulator 2164 exceeds a pre-set threshold pressure. A pre-set threshold pressure for accumulator 2164 can be from between about 25 psig to about 200 psig at a flow rate of at least about 1 cubic feet per minute (cfm), or from between about 50 psig to about 150 psig at a flow rate of at least about 1 cubic feet per minute (cfm), or from between about 75 psig to about 125 psig at a flow rate of at least about 1 cubic feet per minute (cfm) or between about 90 psig to about 95 psig at a flow rate of at least about 1 cubic feet per minute (cfm).

Various embodiments of compressor loop 2160 can utilize a variety of compressors other than a zero ingress compressor, such as a variable speed compressor or a compressor that can be controlled to be in either an on or off state. As previously discussed, a zero ingress compressor ensures that no atmospheric reactive species can be introduced into a gas enclosure assembly and system. As such, any compressor configuration preventing atmospheric reactive species from being introduced into a gas enclosure assembly and system can be utilized for compressor loop 2160. According to various embodiments, compressor 2162 of gas enclosure assembly and system 3000 can be housed in, for example, but not limited by, an hermetically-sealed housing. The housing interior can be configured in fluid communication with a source of inert gas, for example, the same inert gas that forms the inert gas atmosphere for gas enclosure assembly 1500. For various embodiments of compressor loop 2160, compressor 2162 can be controlled at a constant speed to maintain a constant pressure. In other embodiments of compressor loop 2160 not utilizing a zero ingress compressor, compressor 2162 can be turned off when a maximum threshold pressure is reached, and turned on when a minimum threshold pressure is reached In FIG. 39 for gas enclosure assembly and system 3100, blower loop 2190 and blower vacuum loop 2550 are shown for the operation of substrate floatation table 1054 of OLED printing system 1050, which are housed in gas enclosure assembly 1500. As previously discussed for compressor loop 2160, blower loop 2190 can be configured to continuously supply pressurized inert gas to a substrate floatation table 54.

Figure 39:
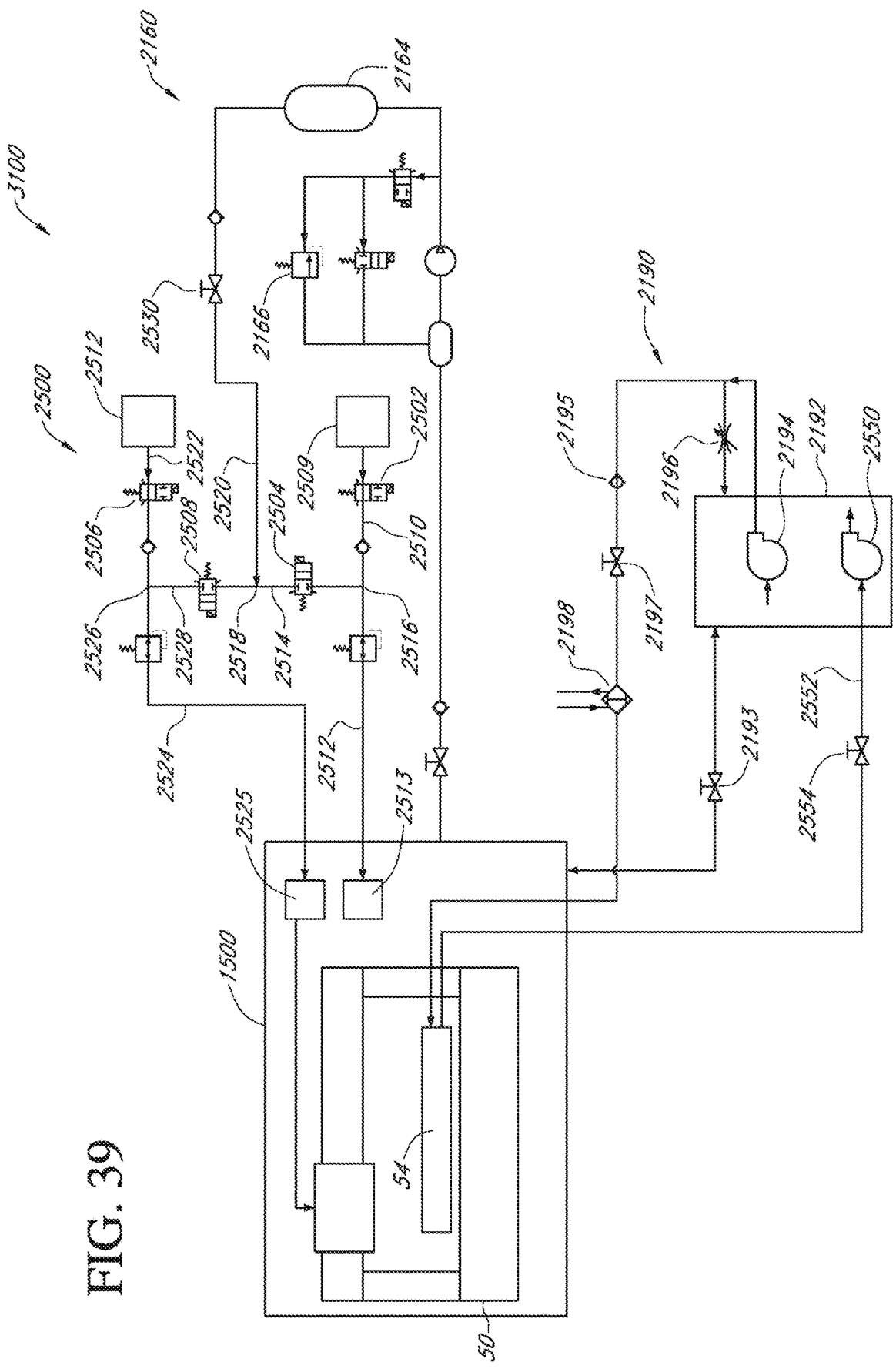
FIG. 39 is a schematic of a gas enclosure assembly and system in accordance with various embodiments of the present teachings.

Various embodiments of a gas enclosure assembly and system that can utilize a pressurized inert gas recirculation system can have various loops utilizing a variety of pressurized gas sources, such as at least one of a compressor, a blower, and combinations thereof. In FIG. 39 for gas enclosure assembly and system 3100, compressor loop 2160 can be in fluid communication with external gas loop 2500, which can be used for the supply of inert gas for high consumption manifold 2525, as well as low consumption manifold 2513. For various embodiments of a gas enclosure assembly and system according to the present teachings as shown in FIG. 39 for gas enclosure assembly and system 3000, high consumption manifold 2525 can be used to supply inert gas to various devices and apparatuses, such as, but not limited by, one or more of a substrate floatation table, a pneumatic robot, an air bearing, an air bushing, and a compressed gas tool, and combinations thereof. For various embodiments of a gas enclosure assembly and system according to the present teachings, low consumption 2513 can be used to supply inert gas to various apparatuses and devises, such as, but not limited by, one or more of an isolator, and a pneumatic actuator, and combinations thereof.

For various embodiments of gas enclosure assembly and system 3100, blower loop 2190 can be utilized to supply pressurized inert gas to various embodiments of substrate floatation table 1054, while compressor loop 2160; in fluid communication with external gas loop 2500, can be utilized to supply pressurized inert gas to, for example, but not limited by, one or more of a pneumatic robot, an air bearing, an air bushing, and a compressed gas tool, and combinations thereof. In addition to a supply of pressurized inert gas, substrate floatation table 54 of OLED printing system 1050, which utilizes air bearing technology, also utilizes blower vacuum 2550, which is in communication with gas enclosure assembly 1500 through line 2552 when valve 2554 is in an open position. Housing 2192 of blower loop 2190 can maintain first blower 2194 for supplying a pressurized source of inert gas to substrate floatation table 1054, and second blower 2550, acting as a vacuum source for substrate floatation table 1054, in an inert gas environment. Attributes that can make blowers suitable for use as a source of either pressurized inert gas or vacuum for various embodiments a substrate floatation table include, for example, but not limited by, that they have high reliability; making them low maintenance, have variable speed control, and have a wide range of flow volumes; various embodiments capable of providing a volume flow of between about 100 m$^3$/h to about 2,500 m$^3$/h. Various embodiments of blower loop 2190 additionally can have first isolation valve 2193 at an inlet end of blower loop 2190, as well as check valve 2195 and a second isolation valve 2197 at an outlet end of compressor loop 2190. Various embodiments of blower loop 2190 can have adjustable valve 2196, which can be, for example, but not limited by, a gate, butterfly, needle or ball valve, as well as heat exchanger 2198 for maintaining inert gas from blower assembly 2190 to substrate floatation system 1054 at a defined temperature.

FIG. 39 depicts external gas loop 2500, also shown in FIG. 38, for integrating and controlling inert gas source 2509 and clean dry air (CDA) source 2512 for use in various aspects of operation of gas enclosure assembly and system 3000 of FIG. 38 and gas enclosure assembly and system 3100 of FIG. 39. External gas loop 2500 of FIG. 38 and FIG. 39 can include at least four mechanical valves. These valves comprise first mechanical valve 2502, second mechanical valve 2504, third mechanical valve 2506, and fourth mechanical valve 2508. These various valves are located at positions in various flow lines that allow control of both an inert gas, for example, such as nitrogen, any of the noble gases, and any combination thereof, and an air source such as clean dry air (CDA). From a house inert gas source 2509, a house inert gas line 2510 extends. House inert gas line 2510 continues to extend linearly as low consumption manifold line 2512, which is in fluid communication with low consumption manifold 2513. A cross-line first section 2514 extends from a first flow juncture 2516, which is located at the intersection of house inert gas line 2510, low consumption manifold line 2512, and cross-line first section 2514. Cross-line first section 2514 extends to a second flow juncture 2518. A compressor inert gas line 2520 extends from accumulator 2164 of compressor loop 2160 and terminates at second flow juncture 2518. A CDA line 2522 extends from a CDA source 2512 and continues as high consumption manifold line 2524, which is in fluid communication with high consumption manifold 2525. A third flow juncture 2526 is positioned at the intersection of a cross-line second section 2528, clean dry air line 2522, and high consumption manifold line 2524. Cross-line second section 2528 extends from second flow juncture 2518 to third flow juncture 2526.

With respect to the description of external gas loop 2500 and in reference to FIG. 40, which is a table of valve positions for various modes of operation of a gas enclosure assembly and system, the following are an overview of some various modes of operation.

The table of FIG. 40 indicates a process mode, in which the valve states create an inert gas compressor only mode of operation. In a process mode, as shown in FIG. 38, and indicted for valve states in FIG. 40, first mechanical valve 2502 and third mechanical valve 2506 are in closed configurations. Second mechanical valve 2504 and fourth mechanical valve 2508 are in open configurations. As a result of these particular valve configurations, compressed inert gas is allowed to flow to both the low consumption manifold 2513 and to the high consumption manifold 2525. Under normal operation, inert gas from a house inert gas source and clean dry air from a CDA source are prevented from flowing to either of the low consumption manifold 2513 and to the high consumption manifold 2525.

As indicated in FIG. 40, and in reference to FIG. 39, there are a series of valve states for maintenance and recovery. Various embodiments of a gas enclosure assembly and system of the present teachings may require maintenance from time to time, and additionally, recovery from system failure. In this particular mode, second mechanical valve 2504 and fourth mechanical valve 2508 are in a closed configuration. First mechanical valve 2502 and third mechanical valve 2506 are in open configurations. A house inert gas source and a CDA source provide inert gas to be supplied by low consumption manifold 2513 to those components that are low consumption, and additionally have dead volumes that would be difficult to effectively purge during recovery. Examples of such components include pneumatic actuators, in contrast, those components that are high consumption can be supplied CDA during maintenance, by means high consumption manifold 2525. Isolating the compressor using valves 2504, 2508, 2530 prevents reactive species, such as oxygen and water vapor from contaminating an inert gas within the compressor and accumulator.

After maintenance or recovery has been completed, a gas enclosure assembly must be purged through several cycles until various reactive atmospheric species, such as oxygen and water, have reached sufficiently low levels for each species of, for example, 100 ppm or lower, for example, at 10 ppm or lower, at 1.0 ppm or lower, or at 0.1 ppm or lower. As indicated in FIG. 40, and in reference to FIG. 39, during a purge mode, third mechanical valve 2506 is closed and also a fifth mechanical valve 2530 is in a closed configuration. First mechanical valve 2502, second mechanical valve 2504, and fourth mechanical valve 2508 are in an open configuration. As a result of this particular valve configuration, only house inert gas is allowed to flow and is allowed to flow to both low consumption manifold 2513 and high consumption manifold 2525.

Both the "no flow" mode and the leak test mode, as indicated in FIG. 40, and in reference to FIG. 38, are modes which are used according to need. The "no flow" mode is a mode having a valve state configuration in which first mechanical valve 2502, second mechanical valve 2504, third mechanical valve 2506, and fourth mechanical valve 2508 are all in a closed configuration. This closed configuration results in a "no flow" mode of the system in which no gas from any of the inert gas, CDA, or compressor sources can reach either low consumption manifold 2513 or high consumption manifold 2525. Such a "no flow mode" can be useful when the system is not in use, and may remain idle for an extended period. The leak test mode can be used for detecting leaks in the system. The leak test mode uses exclusively compressed inert gas, which isolates the system from high consumption manifold 2525 of FIG. 39 in order to leak check low consumption components, such as isolators and pneumatic actuators, of low consumption manifold 2513. In this leak test mode, first mechanical valve 2502, third mechanical valve 2506, and fourth mechanical valve 2508 are all in a closed configuration. Only second mechanical valve 2504 is in an open configuration. As a result, compressed nitrogen gas is able to flow from the compressor inert gas source 2519 to low consumption manifold 2513, and there is no gas flow to high consumption manifold 5525.

Various embodiments of a floatation table can be used in any of the various embodiments of a gas enclosure assembly and system of the present teachings for the stable conveyance of a load, such as an OLED flat panel display substrate. It is contemplated that a frictionless floatation table may provide for the stable conveyance for the printing of a load, such as an OLED substrate, in any of the various embodiments of an inert gas enclosure of the present teachings For example, in FIG. 1, gas enclosure assembly and system 2000 can include gas enclosure assembly 1500, having an inlet gate 1512 and an outlet gate 1522 for moving a substrate, such as an OLED flat panel display substrate, in and out of gas enclosure system 2000. In FIG. 37, gas enclosure assembly and system 2400 can have shown gas enclosure assembly 1500 supported on base 1200, which can house OLED printing system 50. Substrate floatation table 54 of OLED printing system 50 defines the travel over which a substrate (not shown) can be moved through inert gas enclosure assembly and system 2400 during the inkjet printing of an OLED flat panel display substrate. As previously discussed with respect to FIG. 38, various embodiments of a gas enclosure assembly and system can have an external loop including, for example, but not limited by, a compressor loop and a vacuum source that can provide pressurized inert gas as well as a vacuum used in the operation of a floatation table. Various embodiments of an external loop utilizing blower technology, as previously discussed with respect to FIG. 39, can provide pressurized inert gas as well as a vacuum source used for operating a floatation table.

As previously discussed, various embodiments of a gas enclosure assembly and system of the present teachings can process a range of sizes of OLED flat panel display substrates from smaller than a Gen 3.5 substrate, which has dimensions of about 61 cm×72 cm, as well as the progression of larger generation sizes. It is contemplated that various embodiments of gas enclosure assembly and system can process mother glass sizes of Gen 5.5, having dimensions of about 130 cm×150 cm, as well as Gen 7.5, having dimensions of about 195 cm×225 cm, and can be cut into eight 42" or six 47" flat panels per substrate and larger. As previously discussed, Gen 8.5 is approximately 220 cm×250 cm, and can be cut to six 55" or eight 46" flat panels per substrate. However, substrate generation sizes keep advancing, so that currently-available Gen 10, having dimensions of about 285 cm×305 cm, does not appear to be the ultimate generation of substrate sizes. Additionally, sizes recited from the terminology arising from the use of glass-based substrates can be applied to substrates of any material suitable for use in OLED printing. Accordingly, there are a variety of substrate sizes and materials requiring stable conveyance during printing in various embodiments of gas enclosure assemblies and systems of the present teachings.

Figure 41:
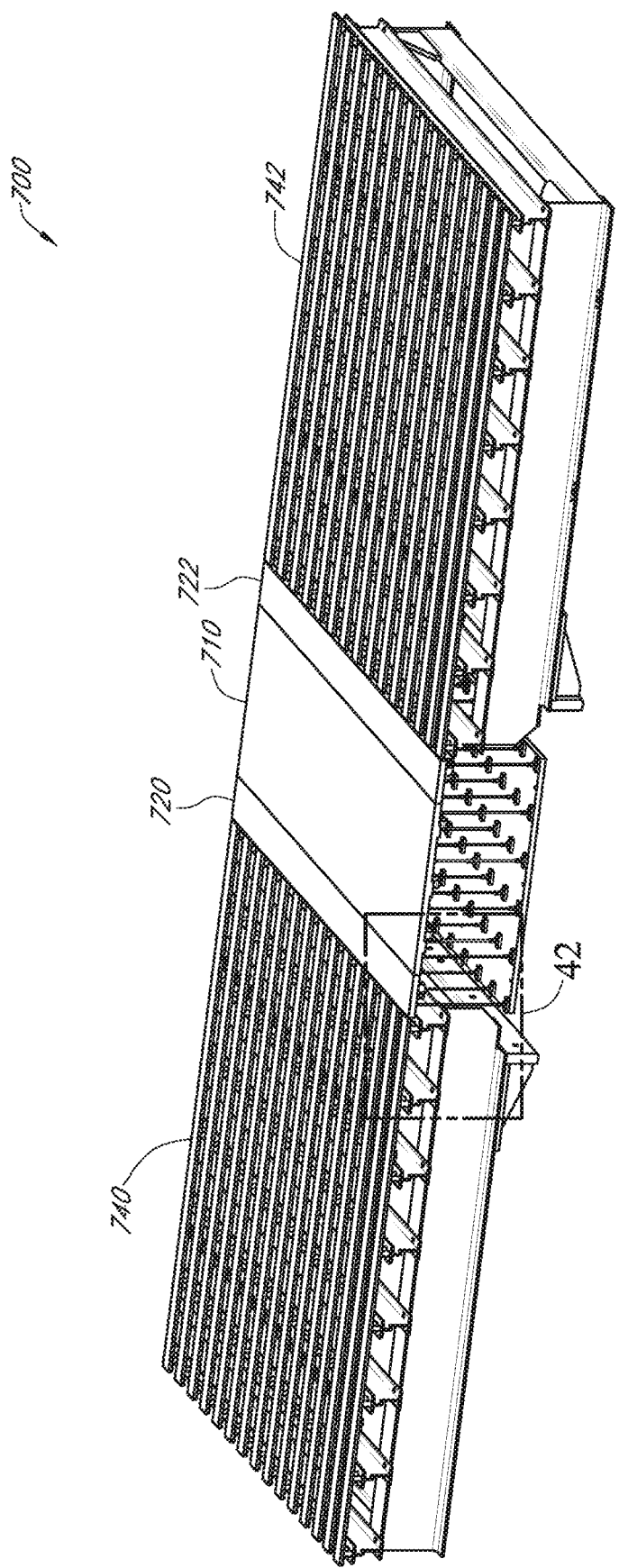
FIG. 41 is a front perspective view depicting a floatation table in accordance with various embodiments of the present teachings.

A floatation table according to various embodiments of the present teachings is depicted in FIG. 41. Floatation table 700 of the current art can have zone 710 in which both pressure and vacuum can be applied through a plurality of ports. Such a zone having both pressure and vacuum control can effectively provide a fluidic spring between zone to 710 and a substrate (not shown) having bidirectional stiffness, thereby creating substantial control over the gap between a substrate and zone 710. The gap that exits between a load and a floatation table surface is referred to as the fly height. A zone such as zone 710 of floatation table 700 of FIG. 41, in which a fluidic spring having bidirectional stiffness is created using a plurality of pressure and vacuum ports, can provide a controllable fly height for a load, such as a substrate.

Figure 42:
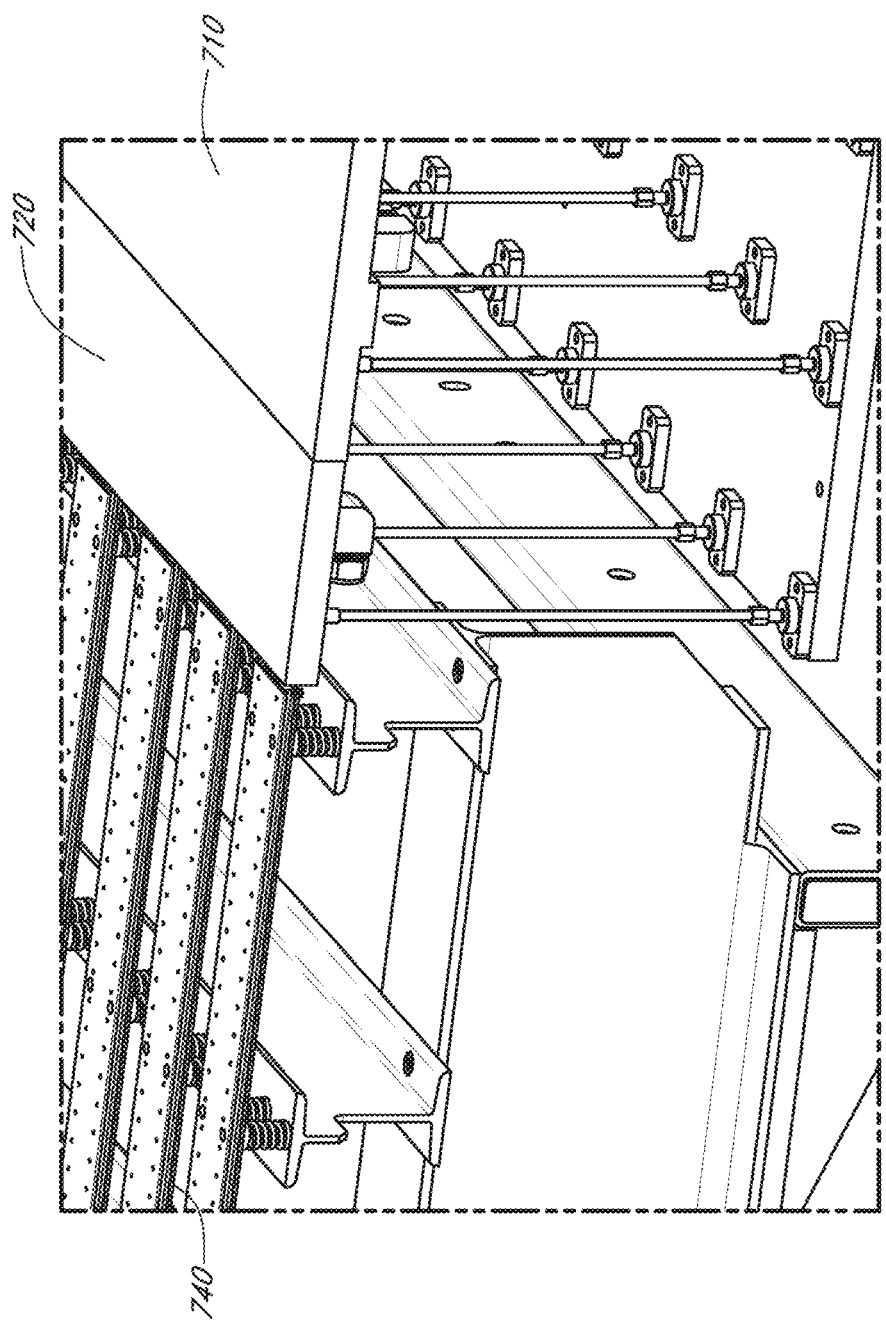
FIG. 42 is an expanded view of the area indicated in FIG. 40 for a floatation table according to various embodiments of the present teachings.

Proximal to zone 710 are a first and second transition zone; 720 and 722, respectively, and then proximal first and second transition zones 720 and 722 are pressure-only zones, 740 and 742, respectively. In the transition zones, the ratio of pressure to vacuum nozzles increases gradually towards the pressure only zones to provide for a gradual transition from zone 710 to zones 740 and 7422. As indicated in FIG. 41, FIG. 42 depicts an expanded view of the three zones. For various embodiments of a substrate floatation table, for example, as depicted in FIG. 41, pressure-only zones 740, 742 are depicted as comprised of rail structures. For various embodiments of a substrate floatation table, pressure only zones, such as pressure-only zones 740, 742 of FIG. 41, can be comprised of a continuous plate, such as that depicted for pressure-vacuum zone 710 of FIG. 41.

For various embodiments of a floatation table as depicted in FIG. 41, there can be essentially uniform height between the pressure-vacuum zone, the transition zone, and the pressure only zone, so that within tolerances, the three zones lie essentially in one plane. One of ordinary skill in the art will appreciate that the various zones can vary in length. For example, but not limited by, in order to provide a sense of scale and proportion, for various substrates a transition zone can be about 400 mm, while the pressure-only zone can be about 2.5 m, and the pressure-vacuum zone can be about 800 mm.

In FIG. 41, the pressure-only zones 740 and 742 do not provide a fluidic spring having bidirectional stiffness, and therefore do not provide the control that zone 710 can provide. Accordingly, the fly height of a load is typically greater over pressure-only zones than the fly height of a substrate over a pressure-vacuum zone, in order to allow enough height so that a load will not collide with a floatation table in the pressure-only zones. For example, but not limited by, it can be desirable for processing an OLED panel substrate to have a fly height of between about 150μ to about 300μ above pressure-only zones, such as zones 740 and 742, and then between about 30μ to about 50μ above a pressure-vacuum zone, such as zone 710.

Figure 43A:
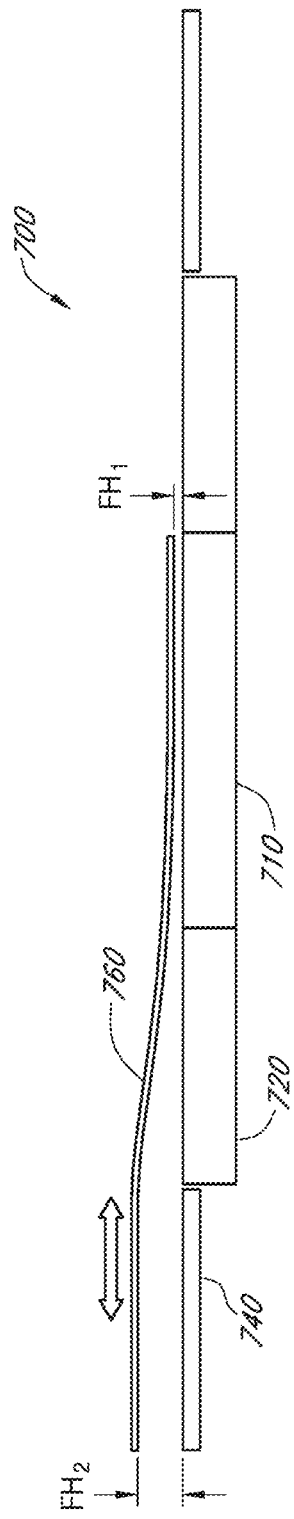
FIG. 43A and FIG. 43B are schematic section views showing the flection resulting in a substrate during travel over a floatation table as depicted in FIG. 40.
Figure 43B:
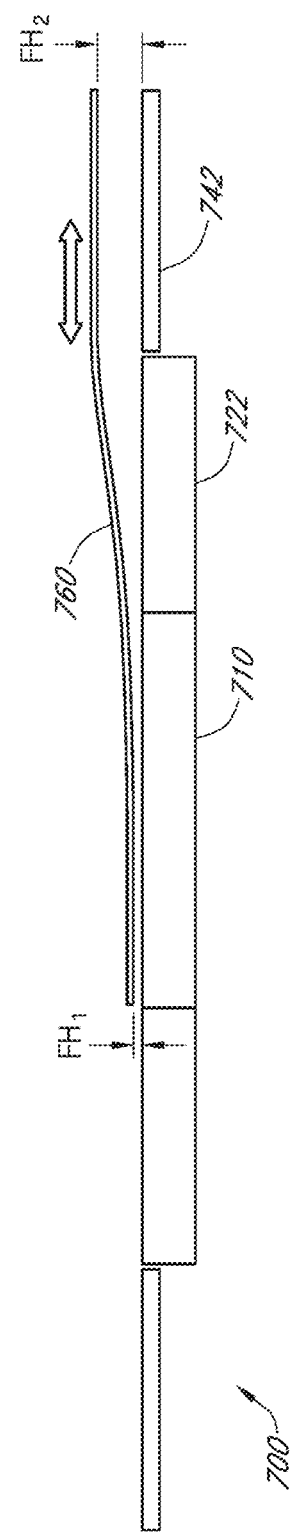

For various embodiments of floatation table 700, the result of having a combination of different zones providing variable fly heights, as well as uniform height across the floatation table for all zones is that substrate flection can occur as a substrate travels over a flotation table. FIG. 43A and FIG. 43B depict substrate flection as substrate 760 travels over floatation table 700. In FIG. 43A, as substrate 760 travels over floatation table 700, the portion of substrate 760 residing over pressure-vacuum zone 710 has a first fly height, $FH_1$, while the portion of substrate 760 residing over pressure-only zone 740 has a second fly height, $FH_2$, and the portion of substrate 760 residing over transition zone 720 has a variable fly height. In FIG. 43B, as substrate 760 travels over floatation table 700 in the opposite direction, the portion of substrate 760 residing over pressure-vacuum zone 710 has a first fly height, $FH_1$, while the portion of substrate 760 residing over pressure-only zone 742 has a second fly height, $FH_2$, and the portion of substrate 760 residing over transition zone 722 can have a variable fly height. As a result, flection in substrate 760 is apparent in either direction of travel for substrate 150 over floatation table 200.

In various embodiments of a gas enclosure assembly and system according to the present teachings, which can house a printing system for printing, for example, but not limited by, an OLED display panel substrate, some degree of substrate flection may have no adverse impact on the article of manufacture. However, for various embodiments of a printing process utilizing a gas enclosure assembly and system according to the present teachings, substrate flection can have an adverse impact for an article of manufacture.

Figure 44:
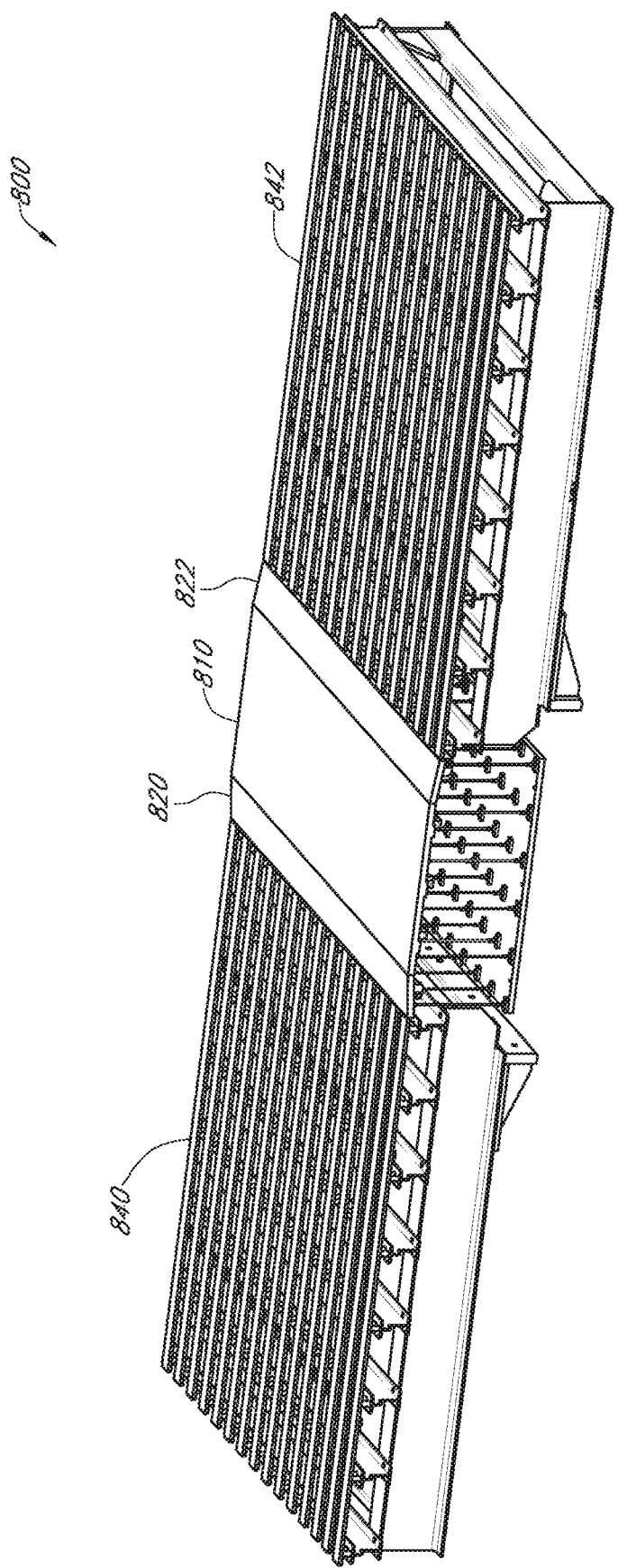
FIG. 44 is a front perspective view that depicts a floatation table according to various embodiments of a floatation table of the present teachings.

As such, various embodiments of a floatation table as depicted in FIG. 44 can have a variable transition zone height in order to maintain a load, such as an OLED flat panel display substrate, as substantially flat while the substrate is moved over a floatation table. FIG. 44 depicts first transition zone 820 and second transition zone 822 having a sloping disposition between pressure-vacuum zone 810 and first pressure-only zone 840 and second first pressure-only zone 842, respectively. The sloping disposition for first transition zone 820 and second transition zone 822 provides for a height difference between pressure-vacuum zone 810, and first pressure-only zone 820 and second pressure-only zone 822. As depicted in FIG. 44, within tolerances, first pressure-only zone 820 and second pressure-only zone 822 lie essentially in the same plane, while the pressure-vacuum zone 810 lies essentially in a plane parallel to the pressure-only zone. The essentially parallel planes defined by pressure-vacuum zone 810 relative to first pressure-only zone 820 and second pressure-only zone 822 are offset by a height difference that compensates for the difference in fly heights over the various zones.

As previously discussed for various embodiments of a substrate floatation table as depicted in FIG. 41, pressure-only zones 840, 642 are depicted in FIG. 44 as comprised of rail structures. For various embodiments of a substrate floatation table, pressure only zones, such as pressure-only zones 840, 842 of FIG. 44, can be comprised of a continuous plate, such as that depicted for pressure-vacuum zone 810 of FIG. 44.

Figure 45A:
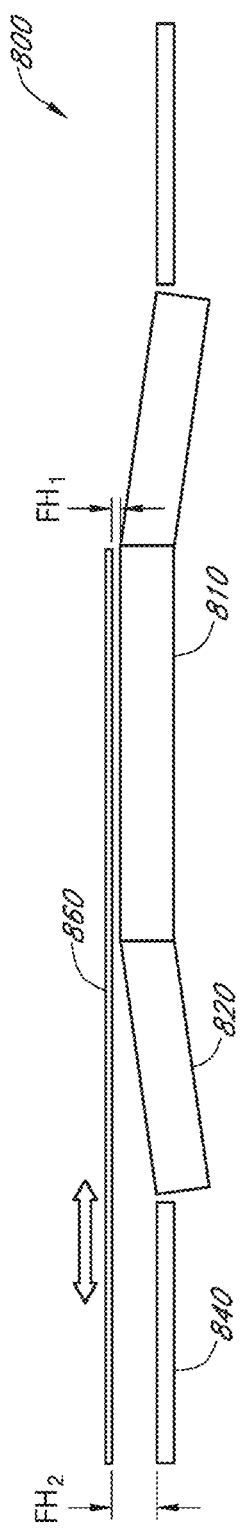
FIG. 45A and FIG. 45B are schematic section views showing the substantially flat disposition of a substrate during travel over a floatation table as depicted in FIG. 43.
Figure 45B:
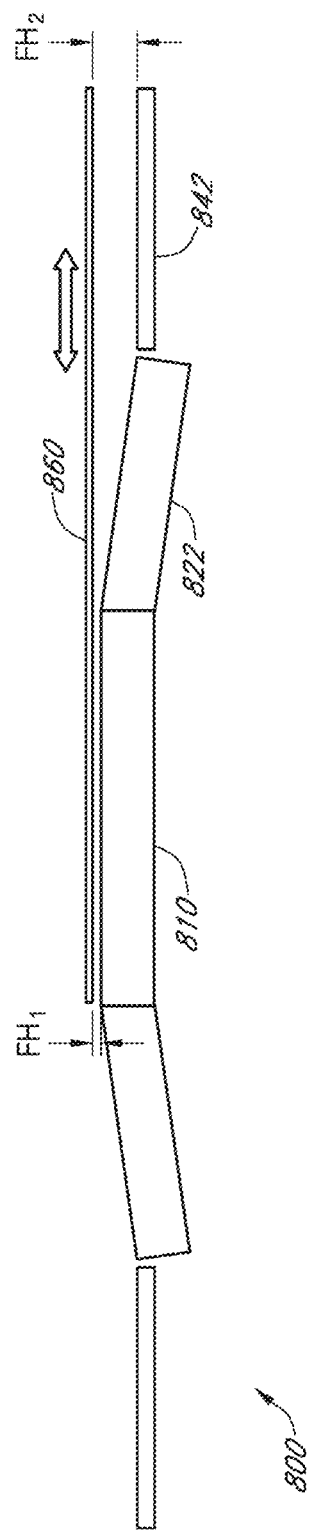

As depicted in FIG. 45A and FIG. 45B, for various embodiments of floatation table 700 according to the present teachings, the result of having a combination of different zones providing variable fly heights, as well as different heights across the floatation table for all zones is that a substrate can maintain a substantially flat disposition as it travels over a flotation table.

In FIG. 45A, as substrate 860 travels over floatation table 800, the portion of substrate 860 residing over pressure-vacuum zone 810 has a first fly height, $FH_1$, while the portion of substrate 860 residing over pressure-only zone 840 has a second fly height, $FH_2$. However, transition zone 820 has a sloping disposition providing a height difference between pressure-vacuum zone 810 and pressure-only zone 840 that can compensate for the fly height differences between pressure-vacuum zone 810 and pressure-only zone 840, substrate 860 maintains a substantially flat disposition as it travels over the three different zones. In FIG. 45B, as substrate 860 travels over floatation table 800, the portion of substrate 860 residing over pressure-vacuum zone 810 has a first fly height, $FH_1$, while the portion of substrate 860 residing over pressure-only zone 842 has a second fly height, $FH_2$. However, transition zone 842 has a sloping disposition providing a height difference between pressure-vacuum zone 810 and pressure-only zone 842 that can compensate for the fly height differences between pressure-vacuum zone 810 and pressure-only zone 842, substrate 860 maintains a substantially flat disposition as it travels over the three different zones As a result, substrate 860 can maintain a substantially flat disposition in either direction of travel for substrate 860 over floatation table 800.

Various embodiments of floatation table 700 and floatation table 800 can be accommodated in a gas enclosure, including gas enclosure assemblies of the present teachings, for example, but not limited by those depicted and described for FIG. 3, FIG. 23 and FIG. 29, which can be integrated with various system functions as those described for FIG. 34. Various embodiments of a gas enclosure and various embodiments of a gas enclosure and system that can have various embodiments of an external loop that can provide pressurized inert gas as well a vacuum, such as, but not limited by, those described for FIG. 38 and FIG. 39, can utilize various embodiments of a floatation table for conveying a load in an inert gas environment according to the present teachings.

All publications, patents, and patent applications mentioned in this specification are herein incorporated by reference to the same extent as if each individual publication, patent, or patent application was specifically and individually indicated to be incorporated by reference.

While embodiments of the present disclosure have been shown and described herein, it will be obvious to those skilled in the art that such embodiments are provided by way of example only. Numerous variations, changes, and substitutions will now occur to those skilled in the art without departing from the disclosure. It should be understood that various alternatives to the embodiments of the disclosure described herein may be employed in practicing the disclosure. It is intended that the following claims define the scope of the disclosure and that methods and structures within the scope of these claims and their equivalents be covered thereby.

What is claimed is:

1. An inkjet printer, comprising:
a printing system comprising a printhead;
a main enclosure surrounding the printing system to isolate an environment around the printing system;
a first enclosure within the main enclosure, the first enclosure housing the printing system;
a second enclosure within the main enclosure;
a sealable opening between the first enclosure and the second enclosure; and
a maintenance system within the second enclosure.

2. The inkjet printer of claim 1, further comprising a gas circulation loop, wherein sealing the sealable opening isolates the second enclosure from the gas circulation loop.

3. The inkjet printer of claim 2, further comprising a gas purification system coupled to the main enclosure.

4. The inkjet printer of claim 3, wherein the gas purification system is coupled to the gas circulation loop.

5. The inkjet printer of claim 3, wherein the gas purification system is coupled to one or more of the first enclosure and the second enclosure.

6. The inkjet printer of claim 1, further comprising a motion system coupled to the printhead to position the printhead to access the maintenance system.

7. The inkjet printer of claim 6, further comprising a floatation table support, wherein the motion system comprises a bridge that extends across the flotation table support and a carriage that couples the printhead to the bridge.

8. The inkjet printer of claim 7, wherein the second enclosure is located at a side of the floatation table support and the bridge extends to a location adjacent to the second enclosure.

9. The inkjet printer of claim 1, wherein the second enclosure comprises a second sealable opening that is operable to expose the second enclosure to an environment external to the main enclosure.

10. A method comprising:
operating a motion system to move a printhead assembly from a first enclosure located within a main enclosure across a substrate support table to a second enclosure located within the main enclosure at a side of the substrate support table, wherein:
the first enclosure houses a printing system comprising the printhead assembly, and
the second enclosure houses a subsystem used to perform at least one of printhead maintenance and printhead calibration;
positioning the printhead assembly to access the subsystem;
isolating the second enclosure from the first enclosure; and
performing at least one of a maintenance procedure and a calibration procedure on the printhead assembly while the second enclosure is isolated from the first enclosure.

11. The method of claim 10, wherein moving the printhead assembly comprises operating a carriage assembly that couples the printhead assembly to a bridge that extends across the substrate support table.

12. The method of claim 11, further comprising, while performing printhead maintenance or printhead calibration, controlling a processing environment within the first enclosure according to a defined specification that is different from an environment external to the gas enclosure.

13. The method of claim 12, wherein controlling the processing environment comprises controlling a level of one or more reactive species within the first enclosure.

14. The method of claim 12, wherein controlling the processing environment comprises providing an inert gas processing environment within the first enclosure.

15. The method of claim 12, wherein controlling the processing environment comprises controlling an amount of particulates within the first enclosure.

16. The method of claim 10, further comprising accessing the second enclosure from an environment external to the gas enclosure while the second enclosure is isolated from the first enclosure.

17. The method of claim 16, further comprising loading at least one of a replacement printhead and a replacement printhead assembly into the second enclosure while the second enclosure is isolated from the first enclosure.

18. The method of claim 16, further comprising removing at least one of a malfunctioning printhead and a malfunctioning printhead assembly from the second enclosure while the second enclosure is isolated from the first enclosure.

19. A method, comprising:
- operating a motion system to move a printhead assembly from a first enclosure located within a main enclosure across a substrate support table to a second enclosure located within the main enclosure at a side of the substrate support table, wherein:
  - the first enclosure houses a printing system comprising the printhead assembly, and
  - the second enclosure houses a subsystem used to perform at least one of printhead maintenance and printhead calibration;
- positioning the printhead assembly to access the subsystem;
- isolating the second enclosure from the first enclosure;
- accessing the second enclosure from an environment external to the main enclosure while the second enclosure is isolated from the first enclosure;
- controlling a processing environment within the first enclosure according to a defined specification that is different from an environment external to the main enclosure while the second enclosure is isolated from the first enclosure; and
- performing at least one of a maintenance procedure and a calibration procedure on the printhead assembly while the second enclosure is isolated from the first enclosure.

20. The method of claim 19, wherein moving the printhead assembly to the second enclosure seals an opening between the first enclosure and the second enclosure.

* * * * *